United States Patent
Noda et al.

(10) Patent No.: US 7,562,198 B2
(45) Date of Patent: Jul. 14, 2009

(54) SEMICONDUCTOR DEVICE AND SEMICONDUCTOR SIGNAL PROCESSING APPARATUS

(75) Inventors: Hideyuki Noda, Hyogo (JP); Kazunori Saitoh, Hyogo (JP); Kazutami Ariomoto, Hyogo (JP); Katsumi Dosaka, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 98 days.

(21) Appl. No.: 11/148,369

(22) Filed: Jun. 9, 2005

(65) Prior Publication Data

US 2005/0285862 A1    Dec. 29, 2005

(30) Foreign Application Priority Data

| Jun. 9, 2004 | (JP) | 2004-171658 |
| Jun. 14, 2004 | (JP) | 2004-175193 |
| Sep. 28, 2004 | (JP) | 2004-282449 |
| May 16, 2005 | (JP) | 2005-143109 |

(51) Int. Cl.
*G06F 21/22* (2006.01)
(52) U.S. Cl. .................................... 711/154
(58) Field of Classification Search .................. 711/145
See application file for complete search history.

(56) References Cited

U.S. PATENT DOCUMENTS 4,811,297 A * 3/1989 Ogawa ................. 365/189.02
6,694,422 B1 * 2/2004 Kim ............................ 711/217

FOREIGN PATENT DOCUMENTS

| JP | 05-197550 | 8/1993 |
| JP | 06-324862 | 11/1994 |
| JP | 10-074141 | 3/1998 |
| JP | 10-254843 | 9/1998 |
| JP | 2003-114797 | 4/2003 |

* cited by examiner

*Primary Examiner*—Hyung S Sough
*Assistant Examiner*—Hamdy S Ahmed
(74) *Attorney, Agent, or Firm*—McDermott Will & Emery LLP

(57) ABSTRACT

A memory cell mat is divided into a plurality of entries, and an arithmetic logic unit is arranged corresponding to each entry. Between the entries and the corresponding arithmetic logic units, arithmetic/logic operation is executed in bit-serial and entry-parallel manner. Where parallel operation is not very effective, data is transferred in entry-serial and bit-parallel manner to a group of processors provided at a lower portion of the memory mat. In this manner, a large amount of data can be processed at high speed regardless of the contents of operation or data bit width.

22 Claims, 94 Drawing Sheets

FIG.8

| CYCLE | EVENT | REGISTER VALUE | | | |
|---|---|---|---|---|---|
| | | X | A | C | M |
| k-1 | SET 1 IN M-REGISTER, CLEAR C-REGISTER TO 0 | 0 | 0 | 0 | 1 |
| k | READ a[i] | 0 | 0 | 0 | 1 |
| k+1 | READ b[i] | a[i] | 0 | 0 | 1 |
| k+2 | EXECUTE ARITHMETIC/LOGIC OPERATION AT ALU PORTION | a[i] | b[i] | 0 | 1 |
| k+3 | WRITE RESULT OF ADDITION TO c[i] | a[i]+b[i] | b[i] | c[i] | 1 |
| k+4 | READ a[i+1] | a[i]+b[i] | b[i] | c[i] | 1 |
| k+5 | READ b[i+1] | a[i+1] | b[i] | c[i] | 1 |
| k+6 | EXECUTE ARITHMETIC/LOGIC OPERATION AT ALU PORTION | a[i+1] | b[i+1] | c[i] | 1 |
| k+7 | WRITE RESULT OF ADDITION TO c[i+1] | a[i+1]+b[i+1] | b[i+1] | c[i+1] | 1 |

REGISTER INSTRUCTION

| INSTRUCTION | OPERATION |
|---|---|
| reg.set n,rx | rx ← #n (0<n<MAX_BIT,x=0...3)<br>: SET AN ARBITRARY VALUE IN REGISTER rx |
| reg.cpy rx,ry | ry ← rx (x,y=0...3)<br>: COPY BETWEEN TWO REGISTERS |
| reg.inc rx | rx ← rx+1 (x=0...3)<br>: INCREMENT rx VALUE |
| reg.dec rx | rx ← rx−1 (x=0...3)<br>: DECREMENT rx VALUE |
| reg.sft rx | rx ← rx<<1 (x=0...3)<br>: BIT SHIFT OF rx VALUE |

FIG.36

ALU INSTRUCTION (SET/CLEAR)

| ALU INSTRUCTION | OPERATION |
|---|---|
| alu.set.X<br>alu.set.C<br>alu.set.M | $X_j \leftarrow 1$ (j=0...MAX_ENTRY)<br>$C_j \leftarrow 1$ (j=0...MAX_ENTRY)<br>$M_j \leftarrow 1$ (j=0...MAX_ENTRY) |
| | : SET 1 IN REGISTER OF ENTRY j |
| alu.clr.X | $X_j \leftarrow 0$ (j=0...MAX_ENTRY) |
| alu.clr.C | $C_j \leftarrow 0$ (j=0...MAX_ENTRY) |
| alu.clr.M | $M_j \leftarrow 0$ (j=0...MAX_ENTRY) |
| | : CLEAR REGISTER OF ENTRY j TO 0 |
| alu.cpy.XM | $M_j \leftarrow X_j$ (j=0...MAX_ENTRY) |
| alu.cpy.CX | $X_j \leftarrow C_j$ (j=0...MAX_ENTRY) |
| alu.cpy.CM | $M_j \leftarrow C_j$ (j=0...MAX_ENTRY) |
| | : MOVE/COPY DATA BETWEEN REGISTERS |

FIG.37

ALU INSTRUCTION (LOAD/STORE)

| ALU INSTRUCTION | OPERATION |
|---|---|
| mem.ld@rx | $X_j \leftarrow A_j(rx)$ (j=0...MAX_ENTRY, x=0...3)<br>: LOAD FROM MEMORY POSITION INDICATED BY BIT POINTER rx |
| mem.st@rx | $A_j(rx) \leftarrow X_j$ if $M_j$<br>(j=0...MAX_ENTRY, x=0...3)<br>: STORE TO MEMORY POSITION INDICATED BY BIT POINTER rx<br>NOT EXECUTED WHEN MASK REGISTER IS 0 |

FIG.38

ALU INSTRUCTION (MOVE DATA BETWEEN ENTRIES)

| ALU INSTRUCTION | OPERATION |
|---|---|
| ecm.mv.n#n | $X_j \leftarrow X_{j+n}$ $(0 < n < 128)$<br>: move WITH AMOUNT OF MOVEMENT DESIGNATED BY NUMERICAL VALUE<br>: VALUE OF X-REGISTER OF ENTRY j+n IS MOVED TO X-REGISTER OF ENTRY j |
| ecm.mv.r rx | $X_j \leftarrow X_{j+rx}$ $(0 < x < 3)$<br>: MOVE IN ACCORDANCE WITH VALUE STORED IN REGISTER rx |

FIG.39

ALU INSTRUCTION (ARITHMETIC OPERATION)

| ALU INSTRUCTION | OPERATION |
|---|---|
| alu.op.adc@rx | $X_j = A_j[rx]\^X_j\^C_j,$<br>$C_j = A_j[rx] \& X_j + A_j[rx] \& C_j + X_j \& C_i$ if $M_j$<br>$(j=0...MAX\_ENTRY)$<br>: ADDITION INSTRUCTION<br>  ADD DATA OF MEMORY ADDRESS INDICATED BY POINTER REGISTER rx TO X-REGISTER VALUE, STORE RESULT IN X-REGISTER<br>: VALUE AFTER ADDITION IS STORED IN X-REGISTER, CARRY IS STORED IN C-REGISTER |
| alu.op.sbb@rx | $X_j = A_j[rx]\^!X_j\^C_j,$<br>$C_j = A_j[rx] \& !X_j + A_j[rx] \& C_j + !X_j \& C_i$ if $M_j$<br>$(j=0...MAX\_ENTRY)$<br>: SUBTRACTION INSTRUCTION<br>  SUBTRACT X-REGISTER VALUE FROM DATA AT MEMORY ADDRESS INDICATED BY POINTER REGISTER rx, STORE RESULT IN X-REGISTER<br>: VALUE AFTER SUBTRACTION IS STORED IN X-REGISTER, BORROW IS STORED IN C-REGISTER |

FIG.40

ALU INSTRUCTION (LOGIC OPERATION)

| ALU INSTRUCTION | OPERATION |
|---|---|
| alu.op.and@rx<br>AND INSTRUCTION<br>(LOGICAL PRODUCT<br>INSTRUCTION) | Xj=Aj[rx]&Xj if Mj    (j=0...MAX_ENTRY)<br>: PERFORM AND OPERATION ON DATA OF MEMORY ADDRESS INDICATED BY POINTER REGISTER rx AND X-REGISTER VALUE, STORE RESULT IN X-REGISTER. NOT EXECUTED WHEN MASK REGISTER VALUE IS 0 |
| alu.op.or@rx<br>OR INSTRUCTION<br>(LOGICAL SUM<br>INSTRUCTION) | Xj=Aj[rx]\|Xj if Mj    (j=0...MAX_ENTRY)<br>: PERFORM OR OPERATION ON DATA OF MEMORY ADDRESS INDICATED BY POINTER REGISTER rx AND X-REGISTER VALUE, STORE RESULT IN X-REGISTER. NOT EXECUTED WHEN MASK REGISTER VALUE IS 0 |
| alu.op.eq@rx<br>EX-OR INSTRUCTION<br>(EXCLUSIVE LOGICAL<br>SUM INSTRUCTION) | Xj=Aj[rx]^Xj if Mj    (j=0...MAX_ENTRY)<br>: PERFORM EX-OR OPERATION ON DATA OF MEMORY ADDRESS INDICATED BY POINTER REGISTER rx AND X-REGISTER VALUE, STORE RESULT IN X-REGISTER. NOT EXECUTED WHEN MASK REGISTER VALUE IS 0 |
| alu.op.not<br>NOT INSTRUCTION<br>(INVERSION<br>INSTRUCTION) | Xj=!Xj if Mj    (j=0...MAX_ENTRY)<br>: INVERT X-REGISTER VALUE, STORE RESULT IN X-REGISTER NOT EXECUTED WHEN MASK REGISTER VALUE IS 0 |

FIG.41

```
LINE#   INSTRUCTION                              COMMENT

0 :  alu.set.M; alu.clr.C;                      //set mask & clear carry
1 :  reg.set#as,r0;reg.set#bs,r1;reg.set#cs,r2; //set address registor
2 :  for(i=0;i<bit_count;i++) {    //bit loop
        mem.ld@r0+;alu.op.adc@r1+; mem.st@r2+;
3 :  }
4 :  alu.cpy.CX; mem.st@r2;        //copy back carry
```

FIG.42 a+b=c:

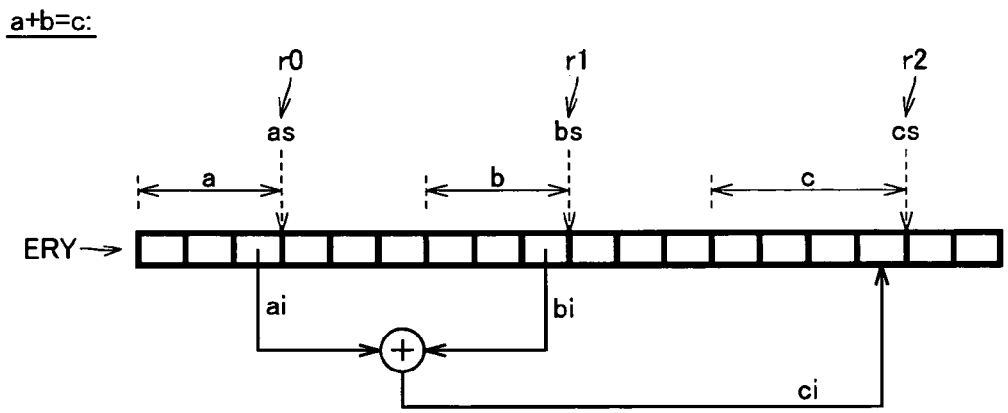

FIG.43 a-b=c:

```
0 :  alu.set.M; alu.clr.C;                      //set mask & clear carry
1 :  reg.set#as,r0;reg.set#bs,r1;reg.set#cs,r2; //set address registor
2 :  for(i=0;i<bit_count;i++) {    //bit loop
        mem.ld@r0+;alu.op.sbb@r1+; mem.st@r2+;
3 :  }
4 :  alu.cpy.CX; mem.st@r2;        //copy back carry
``` a·b=c

```
 0 :   reg.set#as,r2;reg.set#cs,r3;
 1 :   for(j=0;j<a_bit_count;j++) {          //multiplicand loop
 2 :     mem.ld@r2+; alu.cpy.XM;             //get multiplicand bit
 3 :     reg.cpy r3,r0;reg.set#bs,r1;        //set load/store address
 4 :     alu.clr.C;
 5 :     for(i=0;i<b_bit_count;i++) {        //multiplying loop
 6 :        mem.ld@r0,alu.op.adc@r1+; mem.st@r0+;
 7 :     }
 8 :     alu.cpy.CX; mem.st@r0;              //copy back carry bit
 9 :     reg.inc r3;
10 :   }
```

FIG.46

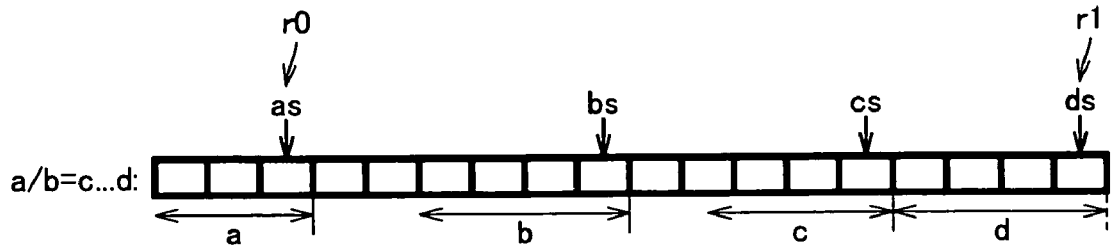

FIG.47

```
0 :   alu.set.M;reg.set#as,r0;reg.set#ds,r1;
1 :   for(i=0;i<bit_count;i++) { mem.ld@r0+;mem.st@r1+;}
2 :   reg.set#(cs+bit_count-1),r3;reg.set#(ds+bit_count-1),r2;
3 :   for(j=0;j<bit_count;j++) {
4 :     alu.set.M;alu.clr.X;mem.st@r3;      //clear result
5 :     reg.cpy r2,r0;reg.set#bs,r1;alu.clr.C;
6 :     for(i=0;i<bit_count;i++) {          //compare loop
7 :       mem.ld@r0+;alu.op.sbb@r1+;
8 :     }
9 :     alu.cpy.CX;alu.op.not;alu.cpy.XM;
10:     reg.cpy r2,r0;reg.set#bs,r1;alu.clr.C;
11:     for(i=0;i<bit_count;i++) {          //substruction loop
12:       mem.ld@r0;alu.op.sbb@r1+; mem.st@r0+;
13:     }
14:     reg.dec r2;
15:     alu.set.X;mem.st@r3-                //store result
16:   }
```

$X \cdot (y_{2j-1}+y_{2j}-2 \cdot y_{2j+1}) \cdot 2^{2j}$:

| y2j+1 | y2j | y2j-1 | PROCEDURE FOR PARTIAL PRODUCT GENERATION |
|---|---|---|---|
| 0 | 0 | 0 | SHIFT-UP UNNECESSARY |
| 0 | 0 | 1 | SHIFT UP BY 2j BITS |
| 0 | 1 | 0 | SHIFT UP BY 2j BITS |
| 0 | 1 | 1 | SHIFT UP BY (2j+1) BITS |
| 1 | 0 | 0 | SHIFT UP BY (2j+1) BITS<br>OBTAIN 2'S COMPLEMENT OF RESULT |
| 1 | 0 | 1 | SHIFT UP BY 2j BITS<br>OBTAIN 2'S COMPLEMENT OF RESULT |
| 1 | 1 | 0 | SHIFT UP BY 2j BITS<br>OBTAIN 2'S COMPLEMENT OF RESULT |
| 1 | 1 | 1 | SHIFT-UP UNNECESSARY |

FIG.53

REGISTER INSTRUCTION

| INSTRUCTION | OPERATION |
|---|---|
| reg.set n,rx | $rx \leftarrow \#n$ (0<n<MAX_BIT,x=0...3)<br>: SET ARBITRARY VALUE IN REGISTER $rx$ |
| reg.cpy rx,ry | $ry \leftarrow rx$ (x,y=0...3)<br>: COPY BETWEEN TWO REGISTERS |
| reg.inc rx | $rx \leftarrow rx+1$ (x=0...3)<br>: INCREMENT $rx$ VALUE |
| reg.inc2 rx | $rx \leftarrow rx+2$ (x=0...3)<br>: INCREMENT $rx$ VALUE BY 2 |
| reg.dec rx | $rx \leftarrow rx-1$ (x=0...3)<br>: DECREMENT $rx$ VALUE |
| reg.sft rx | $rx \leftarrow rx<<1$ (x=0...3)<br>: BIT SHIFT $rx$ VALUE |

FIG.54

ALU INSTRUCTION (SET/CLEAR)

| INSTRUCTION | OPERATION |
|---|---|
| alu.set.X<br>alu.set.V<br>alu.set.N | $Xj \leftarrow 1$ (j=0...MAX_ENTRY)<br>$Vj \leftarrow 1$ (j=0...MAX_ENTRY)<br>$Nj \leftarrow 1$ (j=0...MAX_ENTRY)<br>SET 1 IN REGISTER OF ENTRY $j$ |
| alu.clr.X<br>alu.clr.C<br>alu.clr.F | $Xj \leftarrow 0$ (j=0...MAX_ENTRY)<br>$Cj \leftarrow 0$ (j=0...MAX_ENTRY)<br>$Fj \leftarrow 0$ (j=0...MAX_ENTRY)<br>CLEAR REGISTER OF ENTRY $j$ TO 0 |

FIG.55

ALU INSTRUCTION (SET/CLEAR)

| INSTRUCTION | OPERATION |
|---|---|
| alu.cpy.XV | $V_j \leftarrow X_j$ (j=0...MAX_ENTRY) |
| alu.cpy.XN | $N_j \leftarrow X_j$ (j=0...MAX_ENTRY) |
| alu.cpy.XZ | $Z_j \leftarrow X_j$ (j=0...MAX_ENTRY) |
| alu.cpy.YZ | $Z_j \leftarrow Y_j$ (j=0...MAX_ENTRY) |
| alu.cpy.CZ | $Z_j \leftarrow C_j$ (j=0...MAX_ENTRY) |
| alu.cpy.NZ | $Z_j \leftarrow N_j$ (j=0...MAX_ENTRY)<br>: COPY DATA BETWEEN REGISTERS |

FIG.56

ALU INSTRUCTION (LOAD/STORE)

| INSTRUCTION | OPERATION |
|---|---|
| mem.ld.X@rx<br>mem.ld.Y@rx | $X_j \leftarrow A_j[rx]$ (j=0...MAX_ENTRY,x=0...3)<br>$Y_j \leftarrow A_j[rx]$ (j=0...MAX_ENTRY,x=0...3)<br>: LOAD FROM MEMORY POSITION INDICATED BY BIT POINTER rx |
| mem.st@rx | $A_j[rx] \leftarrow Z_j$ if $V_j$<br>(j=0...MAX_ENTRY,x=0...3)<br>: STORE TO MEMORY POSITION INDICATED BY BIT POINTER rx<br>NOT EXECUTED WHEN MASK REGISTER IS 0 |

FIG.57

ALU INSTRUCTION (MOVE DATA BETWEEN ENTRIES)

| INSTRUCTION | OPERATION |
|---|---|
| ecm.mov.n#n | $X_j \leftarrow Z_{j+n}$ (0<=n<MAX_ENTRY)<br>: VALUE OF Z-REGISTER OF ENTRY j+n IS MOVED TO X-REGISTER OF ENTRY j |
| ecm.mov.r rn | $X_j \leftarrow Z_{j+rn}$ (0<=n<4)<br>: MOVE CONTENTS OF Z-REGISTER OF ENTRY j+rn APART BY VALUE rn STORED IN REGISTER rx TO X-REGISTER OF ENTRY j |

FIG.58

ALU INSTRUCTION (ARITHMETIC OPERATION)

| INSTRUCTION | OPERATION |
|---|---|
| alu.op.adc | $Z_j = X_j \wedge Y_j \wedge C_j$      if $N_j \& V_j$<br>$C_j = Y_j \& X_j + Y_j \& C_j + X_j \& C_i$      if $N_j \& V_j$<br>(j=0...MAX_ENTRY)<br>: ADDITION INSTRUCTION<br>  ADD DATA OF MEMORY ADDRESS INDICATED BY POINTER REGISTER rx TO X-REGISTER VALUE, STORE RESULT IN X-REGISTER<br>: VALUE AFTER ADDITION IS STORED IN Z-REGISTER, CARRY IS STORED IN C-REGISTER |
| alu.op.sbb | $Z_j = X_j \wedge Y_j \wedge C_j$      if $N_j \& V_j$<br>$C_j = Y_j \& !X_j + Y_j \& C_j + !X_j \& C_i$      if $N_j \& V_j$<br>(j=0...MAX_ENTRY)<br>: SUBTRACTION INSTRUCTION<br>  SUBTRACT X-REGISTER VALUE FROM DATA AT MEMORY ADDRESS INDICATED BY POINTER REGISTER rx, STORE RESULT IN X-REGISTER<br>: VALUE AFTER SUBTRACTION IS STORED IN Z-REGISTER, BORROW IS STORED IN C-REGISTER |

FIG.59

ALU INSTRUCTION (ARITHMETIC OPERATION)

| INSTRUCTION | OPERATION |
|---|---|
| alu.op.booth | $N_j = (Y_j \& (!X_j + !F_j)) + (!Y_j \& (X_j + F_j))$  if $V_j$<br>$D_j = (Y_j \& !X_j \& !F_j) + (!Y_j \& X_j \& F_j)$  if $V_j$<br>$F_j = Y_j$  if $V_j$<br>($j=0...$MAX_ENTRY)<br><br>: BOOTH INSTRUCTION<br>  DETERMINE N, D, F (FOR NEXT OPERATION)<br>  FROM X, Y AND F REGISTER VALUES |
| alu.op.exe | $Z_j = X_j \char`\^ (D_j ? Y_{aj} : Y_j) \char`\^ C_j$  if $N_j \& V_j$<br>$C_j = (D_j ? Y_{aj} : Y_j) \& (F_j ?! X_j : X_j) + (D_j ? Y_{aj} : Y_j) \& C_j$<br>       $+ (F_j ?! X_j : X_j) \& C_j$  if $N_j \& V_j$<br>$Y_{aj} = Y_j;$<br>($j=0...$MAX_ENTRY)<br><br>: EXE INSTRUCTION<br>  OPERATION INSTRUCTION HAVING CONDITIONAL<br>  BRANCHING DEPENDENT ON D-REGISTER AND<br>  F-REGISTER VALUES<br>  WHEN D-REGISTER IS 1, REFER TO Ya REGISTER SIDE<br>  (BRANCH AS TO 1 BIT SHIFT OR NOT)<br>  WHEN F-REGISTER IS 0, ADDITION INSTRUCTION<br>  WHEN F-REGISTER IS 1, SUBTRACTION INSTRUCTION |

FIG.60

| $Y_{(y2j+1)}$ | $X_{(y2j)}$ | $F_{(y2j-1)}$ | D | N | PROCEDURE FOR PARTIAL PRODUCT GENERATION |
|---|---|---|---|---|---|
| 0 | 0 | 0 | 0 | 0 | SHIFT-UP UNNECESSARY |
| 0 | 0 | 1 | 0 | 1 | SHIFT UP BY 2j BITS |
| 0 | 1 | 0 | 0 | 1 | SHIFT UP BY 2j BITS |
| 0 | 1 | 1 | 1 | 1 | SHIFT UP BY (2j+1) BITS |
| 1 | 0 | 0 | 1 | 1 | SHIFT UP BY (2j+1) BITS<br>OBTAIN 2'S COMPLEMENT OF RESULT |
| 1 | 0 | 1 | 0 | 1 | SHIFT UP BY 2j BITS<br>OBTAIN 2'S COMPLEMENT OF RESULT |
| 1 | 1 | 0 | 0 | 1 | SHIFT UP BY 2j BITS<br>OBTAIN 2'S COMPLEMENT OF RESULT |
| 1 | 1 | 1 | 0 | 0 | SHIFT-UP UNNECESSARY |

FIG.61

ALU INSTRUCTION (LOGIC OPERATION)

| INSTRUCTION | OPERATION | |
|---|---|---|
| alu.op.and | $Zj = Yj \& Xj$ if $Vj$ | (j=0...MAX_ENTRY) |
| alu.op.or | $Zj = Yj|Xj$ if $Vj$ | (j=0...MAX_ENTRY) |
| alu.op.exor | $Zj = Yj \hat{} Xj$ if $Vj$ | (j=0...MAX_ENTRY) |
| alu.op.not | $Zj = !Xj$ if $Vj$ | (j=0...MAX_ENTRY) |
| alu.op.LT | $Nj = (Cj?0:1);$ | (j=0...MAX_ENTRY) |

FIG.62

```
//a·b=c (SIGNED)

0: alu.set.V;
 1: reg.set#bs,r2;reg.set#cs,r3;alu.clr.F;
 2: for(j=0;j<a_bit_count;j+=2) {        //multiplicand loop
 3:   mem.ld.X@r2+; mem.ld.Y@r2+;        //get multiplicand bit
 4:   alu.op.booth;
 5:   reg.cpy r3,r0;reg.set#as,r1;       //set load/store address
 6:   for(i=0;i<b_bit_count;i++) {       //multiplyer loop
 7:     mem.ld.X@r0; mem.ld.Y@r1+;alu.op.exe; mem.st@r0+;
 8:   }
 9:   for(i=0;i<b_bit_count-j;i++) {     //sign extention
10:     mem.ld.X@r0;alu.op.exe; mem.st@r0+;
11:   }
12:   reg.inc2 r3;
13: }
```

FIG.66A a+b=c

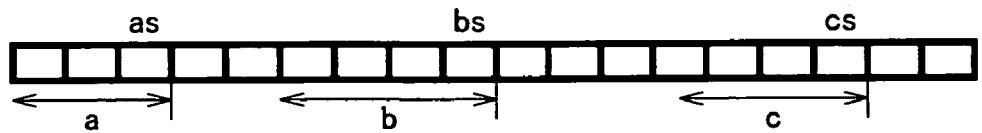

FIG.66B

```
alu.set.V; alu.clr.C;          //set mask & clear carry
reg.set#as,r0;reg.set#bs,r1;reg.set#cs,r2;   //set address registor
for(i=0;i<bit_count;i++) {     //bit loop
    mem.ld.X@r0+; mem.ld.Y@r1+;alu.op.adc; mem.st@r2+;
}
```

FIG.67A a-b=c

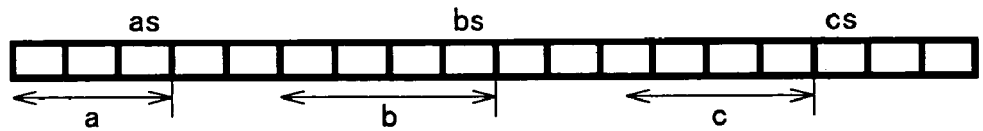

FIG.67B

```
alu.set.V; alu.clr.C;          //set mask & clear carry
reg.set#as,r0;reg.set#bs,r1;reg.set#cs,r2;   //set address registor
for(i=0;i<bit_count;i++) {     //bit loop
    mem.ld.X@r0+; mem.ld.Y@r1+;alu.op.sbb; mem.st@r2+;
}
```

FIG.68

```
//a·b=c (SIGN-LESS)

alu.set.V;
reg.set#as,r2;reg.set#cs,r3;
for(j=0;j<a_bit_count;j++) {            //multiplicand loop
  mem.ld.X@r2+; alu.cpy.XN;             //get multiplicand bit
  reg.cpy r3,r0;reg.set#bs,r1;          //set load/store address
  alu.clr.C;
  for(i=0;i<b_bit_count;i++) {          //multiplying loop
    mem.ld.X@r0; mem.ld.Y@r1+;alu.op.adc; mem.st@r0+;
  }
  alu.cpy.CZ; mem.st@r0;
  reg.inc r3;
}
```

FIG.69

```
//a/b=c...d alu.set.V;alu.set.N;reg.set#as,r0;reg.set#ds,r1;
for(i=0;i<bit_count;i++) { mem.ld.X@r0+;alu.cpy.XZ; mem.st@r1+;}
reg.set#(cs+bit_count-1),r3;reg.set#(ds+bit_count-1),r2;
for(j=0;j<bit_count;j++) {
  alu.clr.Z; mem.st@r3;                 //clear result
  reg.cpy r2,r0;reg.set#bs,r1;alu.clr.C;alu.set.N;
  for(i=0;i<bit_count;i++) {            //compare loop
    mem.ld.X@r0+; mem.ld.Y@r1+;alu.op.sbb;
  }
  alu.op.LT;alu.clr.C;
  reg.cpy r2,r0;reg.set#bs,r1;
  for(i=0;i<bit_count;i++) {            //substruction loop
    mem.ld.X@r0, mem.ld.Y@r1+;alu.op.sbb; mem.st@r0+;
  }
  reg.dec r2;
  alu.cpy.NZ; mem.st@r3-                //store result
}
```

FIG.71

POINTER REGISTER INSTRUCTION

| INSTRUCTION | OPERATION |
|---|---|
| ptr.set n,px | px ← #n (0<n<MAX_BIT,x=0...3)<br>: SET ARBITRARY VALUE IN REGISTER px |
| ptr.cpy px,py | py ← px (x,y=0...3)<br>: COPY BETWEEN TWO REGISTERS |
| ptr.inc px | px ← px+1 (x=0...3)<br>: INCREMENT px VALUE |
| ptr.inc2 px | px ← px+2 (x=0...3)<br>: INCREMENT px VALUE BY 2 |
| ptr.dec px | px ← px-1 (x=0...3)<br>: DECREMENT px VALUE |
| ptr.dec2 px | px ← px-2 (x=0...3)<br>: 2-BIT SHIFT px VALUE |
| ptr.sft px | px ← px<<1 (x=0...3)<br>: 1-BIT SHIFT px VALUE |

FIG.72

ALU INSTRUCTION FOR 1-BIT OPERATION (LOAD/STORE)

| INSTRUCTION | OPERATION | |
|---|---|---|
| mem.ld.X@px | Xj ← Aj[px] | (j=0...MAX_ENTRY,x=0...3) |
| mem.ld.N@px | Nj ← Aj[px] | (j=0...MAX_ENTRY,x=0...3) |
| mem.ld.V@px | Vj ← Aj[px] | (j=0...MAX_ENTRY,x=0...3) |
| mem.ld.F@px | Fj ← Aj[px] | (j=0...MAX_ENTRY,x=0...3) |
| mem.ld.D@px | Dj ← Aj[px] | (j=0...MAX_ENTRY,x=0...3) |
| mem.ld.C@px | Cj ← Aj[px] | (j=0...MAX_ENTRY,x=0...3) |
| | : LOAD FROM MEMORY CELL POSITION INDICATED BY PX | |
| mem.st.X@px | Aj[px] ← Xj if Vj | (j=0...MAX_ENTRY,x=0...3) |
| mem.st.N@px | Aj[px] ← Nj if Vj | (j=0...MAX_ENTRY,x=0...3) |
| mem.st.V@px | Aj[px] ← Vj if Vj | (j=0...MAX_ENTRY,x=0...3) |
| mem.st.F@px | Aj[px] ← Fj if Vj | (j=0...MAX_ENTRY,x=0...3) |
| mem.st.D@px | Aj[px] ← Dj if Vj | (j=0...MAX_ENTRY,x=0...3) |
| mem.st.C@px | Aj[px] ← Cj if Vj | (j=0...MAX_ENTRY,x=0...3) |
| | : STORE TO MEMORY CELL POSITION INDICATED BY px<br>NOT EXECUTED WHEN MASK REGISTER (V) IS CLEARED | |
| mem.swp.X@px | Aj[px] ⇔ Xj if Vj &Nj | (j=0...MAX_ENTRY,x=0...3) |
| | : SWAP DATA OF MEMORY CELL POSITION INDICATED<br>BY px WITH REGISTER DATA | |

FIG.73

ALU INSTRUCTION FOR 2-BIT OPERATION (LOAD/STORE)

| INSTRUCTION | OPERATION |
|---|---|
| mem2.ld.X@px | $XLj \leftarrow Aj[px]$      (j=0...MAX_ENTRY, x=0...3)<br>$XHj \leftarrow Aj[px+1]$      (j=0...MAX_ENTRY, x=0...3)<br>: LOAD FROM MEMORY POSITION INDICATED BY px<br>CONTINUOUS 2 BITS ON MEMORY ARE LOADED SIMULTANEOUSLY<br>AND STORED IN XH/XL-REGISTERS |
| mem2.st.X@px | $Aj[px] \leftarrow XLj$ if $Vj$      (j=0...MAX_ENTRY, x=0...3)<br>$Aj[px+1] \leftarrow XHj$ if $Vj$      (j=0...MAX_ENTRY, x=0...3)<br>: STORE TO MEMORY POSITION INDICATED BY px<br>CONTINUOUS 2 BITS ON MEMORY ARE STORED SIMULTANEOUSLY<br>FROM XH/XL-REGISTERS<br>NOT EXECUTED WHEN MASK REGISTER (V) IS CLEARED |
| mem2.swp.X@px | $Aj[px] \Leftrightarrow XLj$ if $Vj \& Nj$      (j=0...MAX_ENTRY, x=0...3)<br>$Aj[px+1] \Leftrightarrow XHj$ if $Vj \& Nj$      (j=0...MAX_ENTRY, x=0...3)<br>: SWAP DATA OF MEMORY POSITION INDICATED BY px WITH DATA<br>OF XH/XL-REGISTERS<br>CONTINUOUS 2 BITS ON MEMORY ARE SWAPPED SIMULTANEOUSLY<br>WITH DATA OF XH/XL-REGISTERS<br>NOT EXECUTED WHEN MASK REGISTER (V) OR N-REGISTER IS 0 |

FIG.74

ALU INSTRUCTION FOR 1-BIT OPERATION (MOVE DATA BETWEEN ENTRIES)

| INSTRUCTION | OPERATION |
|---|---|
| ecm.mv.n#n | $X_j \leftarrow X_{j+n}$ (0<=n<MAX_ENTRY)<br>: VALUE OF X-REGISTER OF ENTRY j+n IS MOVED TO X-REGISTER OF ENTRY j |
| ecm.mv.r rn | $X_j \leftarrow X_{j+rn}$ (0<=n<4)<br>: MOVE X-REGISTER OF ENTRY j+rn APART BY VALUE STORED IN REGISTER rn TO X-REGISTER OF ENTRY j |
| ecm.swp | $X_j \Leftrightarrow X_{j+1}$<br>: SWAP VALUES OF X-REGISTERS IN NEIGHBORING ENTRIES |

FIG.75

ALU INSTRUCTION FOR 2-BIT OPERATION (MOVE DATA BETWEEN ENTRIES)

| INSTRUCTION | OPERATION |
|---|---|
| ecm2.mv.n#n | $XL_j \leftarrow XL_{j+n}$ (0<=n<MAX_ENTRY)<br>$XH_j \leftarrow XH_{j+n}$ (0<=n<MAX_ENTRY)<br>: VALUES OF XH/XL-REGISTER OF ENTRY j+n ARE MOVED TO XH/XL-REGISTERS OF ENTRY j |
| ecm2.mv.r rn | $XL_j \leftarrow XL_{j+rn}$ (0<=n<4)<br>$XH_j \leftarrow XH_{j+rn}$ (0<=n<4)<br>: VALUES OF XL/XH-REGISTER OF ENTRY j+rn ARE MOVED TO XL/XH-REGISTERS OF ENTRY j |
| ecm2.swp | $XL_j \Leftrightarrow XL_{j+1}$<br>$XH_j \Leftrightarrow XH_{j+1}$<br>: SWAP VALUES OF XH/XL-REGISTERS IN NEIGHBORING ENTRIES |

FIG.76

ALU INSTRUCTION FOR 1-BIT OPERATION (ARITHMETIC OPERATION)

| INSTRUCTION | OPERATION |
|---|---|
| alu.adc@px | $z = Aj[px] \wedge Xj \wedge Cj$ <br> $Cj = Aj[px] \& Xj + Xj \& Ci + Cj \& Aj[px]$ <br> $Aj[px] = z;$    if $Nj \& Vj$          (j=0...MAX_ENTRY) <br> : ADDITION INSTRUCTION <br>    ADD DATA OF MEMORY ADDRESS INDICATED <br>    BY POINTER REGISTER px TO X-REGISTER <br>    VALUE, RETURN RESULT TO MEMORY <br>    VALUE AFTER ADDITION IS STORED IN MEMORY <br>    CELL Aj, CARRY IS STORED IN C-REGISTER |
| alu.sbc@px | $z = Aj[px] \wedge !Xj \wedge Cj$ <br> $Cj = Aj[px] \& !Xj + !Xj \& Cj + Cj \& Aj[px]$ <br> $Aj[px] = z;$    if $Nj \& Vj$          (j=0...MAX_ENTRY) <br> : SUBTRACTION INSTRUCTION <br>    SUBTRACT X-REGISTER VALUE FROM DATA <br>    AT MEMORY ADDRESS INDICATED BY POINTER <br>    REGISTER px, RETURN RESULT TO MEMORY <br>    VALUE AFTER SUBTRACTION IS STORED <br>    IN MEMORY Aj, BORROW IS STORED <br>    IN C-REGISTER |
| alu.inv@px | $Aj[px] = !Aj[px];$ if $Nj \& Vj$          (j=0...MAX_ENTRY) <br> : INVERSION INSTRUCTION <br>    INVERT DATA OF MEMORY ADDRESS INDICATED <br>    BY POINTER REGISTER px, RETURN RESULT <br>    TO MEMORY |
| alu.let f | $f = (F*8 + D*4 + N*2 + C)$ <br> SET F, D, N AND C REGISTERS IN ACCORDANCE <br> WITH GIVEN VALUE |

FIG.77

ALU INSTRUCTION FOR 2-BIT OPERATION (ARITHMETIC OPERATION)

| INSTRUCTION | OPERATION | |
|---|---|---|
| alu2.booth | $N_j = (XH_j \& (!XL_j + !F_j)) + (!XH_j \& (XL_j + F_j))$ | if $V_j$ |
| | $D_j = (XH_j \& !XL_j \& !F_j) + (!XH_j \& XL_j \& F_j)$ | if $V_j$ |
| | $F_j = C_j = XH_j;$ | if $V_j$ |
| | | (j=0...MAX_ENTRY) |
| | : BOOTH INSTRUCTION<br>  DETERMINE N, D, F (FOR NEXT OPERATION)<br>  FROM XH, XL AND F REGISTER VALUES | |
| alu2.exe@px | $x1 = (D_j ? XH_j : XL_j); x1 = (F ? !x1 : x1);$ | |
| | $x2 = (D_j ? X_j : XH_j); x2 = (F ? !x2 : x2);$ | |
| | $zz = A_j[px]\wedge x1 \wedge C_j$ | |
| | $cc = A_j[px] \& x1 + x1 \& C_j + C_j \& A_j[px]$ | |
| | $A_j[px] = zz;$ | if $N_j \& V_j$ |
| | $zz = A_j[px+1] \wedge x2 \wedge cc$ | |
| | $C_j = A_j[px+1] \& x2 + x2 \& cc + cc \& A_j[px+1]$ | if $N_j \& V_j$ |
| | $A_j[px+1] = zz$ | if $N_j \& V_j$ |
| | $X_j = (D_j ? XL_j : X_j)$ | (j=0...MAX_ENTRY) |
| | : EXE INSTRUCTION<br>  OPERATION INSTRUCTION HAVING CONDITIONAL<br>  BRANCHING DEPENDENT ON D-REGISTER AND<br>  F-REGISTER VALUES | |

FIG.78

REGISTER VALUES WHEN BOOTH INSTRUCTION IS EXECUTED

| XH(y2j+1) | XL(y2j) | F(y2j-1) | D | N | PROCEDURE FOR PARTIAL PRODUCT GENERATION |
|---|---|---|---|---|---|
| 0 | 0 | 0 | 0 | 0 | SHIFT-UP UNNECESSARY |
| 0 | 0 | 1 | 0 | 1 | SHIFT UP BY 2j BITS |
| 0 | 1 | 0 | 0 | 1 | SHIFT UP BY 2j BITS |
| 0 | 1 | 1 | 1 | 1 | SHIFT UP BY (2j+1) BITS |
| 1 | 0 | 0 | 1 | 1 | SHIFT UP BY (2j+1) BITS OBTAIN 2'S COMPLEMENT OF RESULT |
| 1 | 0 | 1 | 0 | 1 | SHIFT UP BY 2j BITS OBTAIN 2'S COMPLEMENT OF RESULT |
| 1 | 1 | 0 | 0 | 1 | SHIFT UP BY 2j BITS OBTAIN 2'S COMPLEMENT OF RESULT |
| 1 | 1 | 1 | 0 | 0 | SHIFT-UP UNNECESSARY |

FIG.79

//a•b=c (SIGNED)

```
 0 : ptr.set#bs,p2; ptr.set#cs,p3;
 1 : for(i=0;i<bit_count;i+=2) {
 2 :     mem2.ld.X@p2++; alu2.booth;
 3 :     ptr.cpy p3,p0; ptr.set#as,p1;
 4 :     for(j=0;j<bit_count;j+=2) {
 5 :         mem2.ld.X@p1++; alu2.exe@p0++;
 6 :     }
 7 :     for(j=0;j<bit_count-i;j+=2) {
 8 :         alu2.exe@p0++;
 9 :     }
10 :     ptr.inc2 p3;
11 : }
```

```
mem.ld.C 0;                        //clear carry
ptr.set#as,p0; ptr.set#bs,p1;      //set address registor
for(i=0;i<bit_count;i++) {         //bit loop
    mem.ld.X@p1+,alu.adc@p0+;
}
```

```
mem.ld.C 1;                        //set carry
ptr.set#as,p0; ptr.set#b,p1;       //set address registor
for(i=0;i<bit_count;i++) {         //bit loop
    mem.ld.X@p1+,alu.sbc@p0+;
}
```

FIG.86

//a·b=c (SIGN-LESS)

```
ptr.set#bs,p2; ptr.set#cs,p3;
for(i=0;i<bit_count;i++) {
      mem.ld.N@p2+;
      ptr.cpy p3,p0; mem.ld.C 0;
      ptr.set#as,p1;
      for(j=0;j<bit_count;j++) {
            mem.ld.X@p1+; alu.adc@p0+;
      }
      mem.st.C@p0;
      ptr.inc p3;
}
```

```
//a/b=c...d ptr.set#as,p0; ptr.set#ds,p1;
for(i=0;i<n;i+=2) { mem2.ld.X@p0++; mem.st.X@p1++;}
ptr.set#(pc+bit_count-1),p3; ptr.set#(pd+bit_count-1),p2;
for(j=0;j<n;j++) {
        ptr.set#bs,p1; ptr.cpy p2,p0;alu.let(0b0011);
        for(i=0;i<n;i++) {
                mem.ld.X@p1+; alu.sbc@p0+;
        }
        ptr.cpy p2,p0; mem.st.C tp; alu.inv tp; mem.ld.N tp;
        ptr.set#bs,p1; mem.ld.C 0;
        for(i=0;i<n;i++) {
                mem.ld.X@p1+; alu.adc@p0+;
        }
        mem.st.N@p3;alu.inv@p3;
        ptr.dec p2; ptr.dec p3;
}
```

: INTERRUPTING STATE: ITP

: THROUGH STATE: THR

: INTERRUPTING/DUMMY STATE: IRD

SEMICONDUCTOR DEVICE AND SEMICONDUCTOR SIGNAL PROCESSING APPARATUS

BACKGROUND OF THE INVENTION

1. Field of the Invention

The present invention relates to a semiconductor device and, more specifically, to a configuration of a processing circuit using a semiconductor memory performing arithmetic/logic operation on a large amount of data at high speed.

2. Description of the Background Art

Recently, along with wide spread use of portable terminal devices, digital signal processing allowing high speed processing of a large amount of data including voice and image comes to have higher importance. For such digital signal processing, generally, a DSP (Digital Signal Processor) is used as a dedicated semiconductor device. Digital signal processing of audio and image includes data processing such as filtering, which frequently requires arithmetic operations with repetitive product and sum operations. Therefore, a DSP is generally configured to contain a multiplication circuit, an adder circuit and a register for accumulation. When such a dedicated DSP is used, the product and sum operation can be executed in one machine cycle, enabling a high-speed arithmetic/logic operation.

Prior art Reference 1 (Japanese Patent Laying-Open No. 06-324862) shows an arrangement that uses a register file to perform such a sum-of-products operation. According to Reference 1, two terms of operand data stored in the register file are read, added by a processor, and again written to the register file through a write data register. In the arrangement shown in Reference 1, a write address and a read address are simultaneously given to the register file to execute data writing and data reading simultaneously, and therefore, time of processing can be made shorter than an arrangement having a data write cycle and a data read cycle provided separately for an arithmetic/logic operation.

Prior art Reference 2 (Japanese Patent Laying-Open No. 05-197550) shows an arrangement aimed at high speed processing of a large amount of data. In this arrangement shown in FIG. 2, a plurality of processors are arranged in parallel, with each processor containing a memory. To achieve high speed parallel operations, each processor individually generates a memory address.

Further, prior art Reference 3 (Japanese Patent Laying-Open No. 10-074141) shows a signal processing apparatus aimed at high speed processing such as DCT (Discrete Cosine Transform) of image data. In the arrangement shown in Reference 3, image data are input in a bit-parallel and word-serial sequence, that is, by the word (pixel data) unit, and therefore, the data are converted to word-parallel and bit-serial data by a serial/parallel converter circuit and written to a memory array. Then, the data are transferred to processors (ALUs) arranged corresponding to the memory array, and parallel operations are executed. The memory array is divided into blocks corresponding to image data blocks, and in each block, pixel data forming the corresponding image block are stored word by word in each row.

In the arrangement shown in Reference 3, data are transferred on the word by word (data corresponding to one pixel) basis between the memory block and the corresponding processor. To achieve high speed filtering such as DCT, the same process is performed on the transferred word in the corresponding processor in each block. The results of arithmetic/logic operations are again written to the memory array, subjected to parallel/serial conversion so that the bit-serial and word-parallel data are converted to bit-parallel and word-serial data, and the resulting data are output successively line by line. In a general processing, bit positions of data are not converted, and general arithmetic/logic operations are executed on a plurality of data in parallel by the processors.

Prior art Reference 4 (Japanese Patent Laying-Open No. 2003-114797) shows a data processing apparatus aimed at executing a plurality of different arithmetic/logic operations in parallel. According to Reference 4, a plurality of logic modules each having limited functions are connected to multi-port type data memories. As to the connection between the logic modules and the multi-port data memories, the ports and memories of the multi-port memories to be connected to the logic modules are limited. Therefore, an address area available for data reading and writing by each logic module accessing the multi-port data memory is limited. The result of operation by each logic module is written to a data memory to which access is allowed, and through the multi-port data memories, data are successively transferred through the logic modules, to achieve data processing in a pipe-line manner.

When the amount of data to be processed is very large, even a dedicated DSP is insufficient to attain dramatic improvement in performance. By way of example, when the data to be operated includes 10,000 sets and an operation of each data can be executed in one machine cycle, at least 10,000 cycles are necessary to finish the operation. Therefore, though each process can be done at high speed in an arrangement that performs the sum-of-products operation using a register file such as described in Reference 1, when the amount of data increases, the time of processing increases in proportion thereto as the data are processed in series, and therefore, such an arrangement cannot achieve high speed processing.

When such a dedicated DSP is used, the processing performance greatly depends on operating frequency, and therefore, if high speed processing were given priority, power consumption would considerably be increased.

Use of a register file and processors as described in Reference 1 is often designed for a specific application, so that the operation bit width and configuration of processing circuit tend to be fixed. When the arrangement is to be diverted to another application, the bit width, configuration of processing circuit and others be re-designed, and hence, it lacks flexibility for different applications of arithmetic/logic operations.

In the arrangement described in Reference 2, each processor contains a memory, and each processor accesses a different memory address area for processing. The data memory and the processor are arranged in separate areas, and in a logic module, address transfer and data access must be performed between the processor and the memory. This means that data transfer takes time, machine cycle cannot be made shorter and hence, high speed processing is hindered.

The arrangement described in Reference 3 is to increase speed of processing such as DCT of image data, and in this arrangement, pixel data of one line of an image plane are stored in one row of memory cells, and image blocks aligned along the row direction are subjected to parallel processing. Therefore, when the number of pixels per line increases to achieve very fine images, the memory array arrangement would be of a formidable size. Assume that data of one pixel consists of 8 bits and one line has 512 pixels, the number of memory cells of one row in the memory array will be 8×512=4 k bits, resulting in very significant load on a row selecting line (word line) to which one row of memory cells are connected. Thus, it becomes impossible to select, at high speed, a memory cell to transfer data between the operating portion and the memory cell, hindering high speed processing.

Though Reference 3 shows an arrangement in which the memory cell arrays are positioned on opposite sides of a group of processing circuits, specific configuration of the memory array is not shown. Further, though the reference shows an arrangement of processors in an array, specific arrangement of the group of processors is not shown at all.

The arrangement described in Reference 4 is provided with a plurality of multi-port data memories and a plurality of processors (ALUs) of low function that can access only limited areas of the respective multi-port memories. The processors (ALUs) and the memories, however, are arranged on different areas. Therefore, because of line capacitance and the like, high speed data transfer is difficult, and even when pipeline processing is performed, the machine cycle of the pipeline cannot be made shorter.

References 1 to 4 do not consider at all how to accommodate data as the object of arithmetic/logic operation having different word configurations.

In an arrangement in which a number of processors are arranged and data are transferred among the group of processors to achieve parallel operations, it is possible to flexibly accommodate for the change in processing contents by switching a data transfer path. As regards such a switching of data transfer path, a cross bar switch is used for line exchange in the field of communication or a router in a parallel computer. Prior art Reference 5 (Japanese Patent Laying-Open No. 10-254843) discloses an exemplary configuration of the cross bar switch.

In the cross bar switch configuration according to Reference 5, switches are arranged along paths that allow connection of functional blocks, and in accordance with path designating information, the switches are selectively made conductive to set a data transfer path. When such a switch matrix is used, however, as the number of processors (functional blocks) to be connected increases, possible number of connectable paths increases, the layout area of switch circuits increases and in addition, the arrangement of switch control signal lines becomes complicated.

SUMMARY OF THE INVENTION

An object of the present invention is to provide a semiconductor device capable of processing a large amount of data at high speed.

Another object of the present invention is to provide a semiconductor device capable of executing an arithmetic/logic operation at high speed, regardless of word configuration of data or contents of arithmetic/logic operation.

A still further object of the present invention is to provide a semiconductor device having arithmetic/logic operation function allowing flexible change in contents of processing.

A further object is to provide a cross bar switch that can set connection path among a group of processors with a small area of occupation.

The present invention provides a semiconductor device, including: a memory cell array having a plurality of memory cells arranged in a matrix of rows and columns and divided into a plurality of entries; a plurality of first processing circuits arranged corresponding to the entries respectively, each performing a designated arithmetic/logic operation on data of the corresponding entry; a plurality of data transfer lines transferring data between each of the entries and the corresponding one of the first processing circuits; and a plurality of data transfer circuits arranged corresponding to the plurality of data transfer lines respectively, transferring data on a bit-by-bit basis in entry-parallel manner to and from the corresponding data transfer lines.

Each of the entries stores multi-bit data, and each of the first processing circuits executes an arithmetic/logic operation in bit-serial manner on the multi-bit data of the corresponding entry.

The semiconductor processing device according to the present invention further includes: a memory cell array divided into a plurality of entries; a plurality of processing circuits arranged corresponding to respective entries; and a control circuit controlling arithmetic/logic operation by the processing circuits. The processing circuits each includes a processor, first and second registers, and a mask register. The control circuit controls such that an operand bit from a corresponding entry is stored in the first register, an arithmetic/logic operation is performed on the operand bit of the first register and a second operand bit from the memory array, the result of the arithmetic/logic operation is stored in the first register, and the value stored in the first register is stored in the corresponding position of the memory cell array.

According to a second aspect, the present invention provides a semiconductor signal processing device, including a memory cell mat divided into a plurality of entries and a plurality of processing circuits arranged corresponding to the respective entries. The processing circuit includes a Booth register circuit storing a result of decoding a set of data bits from a first area of the corresponding entry in accordance with second order Booth's algorithm, a processor receiving data bits from corresponding positions of the second and third areas of the corresponding entry and performing an arithmetic/logic operation on the received data in accordance with the data stored in the Booth register, and a result register storing an output data of the processor.

The semiconductor signal processing apparatus in accordance with the second aspect of the present invention further includes a control circuit for transferring data of the first, second and third areas from each entry of the memory cell mat, to the corresponding processing circuit, transferring and writing the output data of the processor to the third area of the corresponding entry, and controlling the arithmetic/logic operation of the processing circuit.

According to a third aspect, the present invention provides a semiconductor signal processing device including a memory cell mat divided into a plurality of entries, a plurality of processing circuits arranged corresponding to the entries, and an operation control signal line provided corresponding to each prescribed number of the plurality of processing circuits, transmitting an operation control signal to the corresponding processing circuits.

According to a fourth aspect, the present invention provides a semiconductor signal processing device including a plurality of basic operation blocks each including a memory cell mat divided into a plurality of entries and a plurality of processing circuits arranged corresponding to the respective entries and being capable of executing arithmetic operations independently from others; an internal data bus arranged commonly to the basic operation blocks; a large capacity memory coupled to the internal data bus; and a control circuit for performing data transfer on the basis of data of one row of the large capacity memory, between the large capacity memory and a selected basic operation block.

According to a fifth aspect, the present invention provides a semiconductor signal processing device including: a plurality of operation blocks each including a memory cell mat divided into a plurality of entries and processing circuits arranged corresponding to the respective entries; a neighboring block connecting bus interconnecting corresponding entries of neighboring operation blocks; and a bit transfer circuit for interconnecting the processors in the operation block.

According to a sixth aspect, the present invention provides a semiconductor signal processing device including a plurality of operation circuit blocks including a memory cell mat divided into a plurality of entries and processors arranged corresponding to respective entries; a global data bus arranged common to the plurality of operation circuit blocks; a system data bus coupled to an external processing device; an orthogonal transformation circuit arranged between the system bus and a first internal transfer bus, changing the configuration of data transferred over these buses; a cross bar switch connected between the first internal data transfer bus and a second internal data transfer bus and changing a connection path of the first and second internal data transfer buses; and a selecting circuit connected between the second internal transfer bus and the global data bus and selectively connecting these buses.

The present invention further provides a cross bar switch, provided between a plurality of first functional blocks arranged in a line and a plurality of second functional blocks arranged opposing to the plurality of first functional blocks respectively, for connecting the plurality of first functional blocks and the plurality of second functional blocks in one-to-one relationship and a given combination, including: a first data signal line provided corresponding to each of the first functional blocks, connected to a data signal terminal of the corresponding first functional block, and extending in the same direction as direction of arrangement of the plurality of first functional blocks; and a selecting circuit provided corresponding to each first data signal line, selecting any second functional block among the plurality of second functional blocks in accordance with a select signal from the corresponding first functional block, and connecting a data signal terminal of the selected second functional block to the corresponding first data signal line.

The memory cell array is divided into a plurality of entries, and for each entry, the first processing circuit is arranged, so that arithmetic/logic operations on data of a plurality of entries can be performed in parallel, and high speed processing becomes possible.

Further, data transfer between the first processing circuit and the data transfer line is executed bit by bit, and arithmetic/logic operation is performed in bit-serial manner in the first processing circuit, and therefore, designated arithmetic/logic operation can be executed on multi-bit data of the corresponding entry, regardless of the word configuration of the data to be processed. Specifically, by an arrangement in which each entry stores a significant data word and each of the first processors performs arithmetic/logic operation in the bit-serial manner, even when the data word configuration (bit width) is changed, it becomes possible to perform arithmetic/logic operation correspondingly without much changing the hardware, and hence, it becomes possible to flexibly adapt to various applications.

As the processor and a register are arranged in the processing circuit, it becomes possible to execute various arithmetic/logic operations in the bit-serial manner, by storing the data as the object of arithmetic/logic operation in the register.

Further, by providing a plurality of register circuits in the processing circuit, multiplication in accordance with second-order Booth's algorithm becomes possible, even when multiplication is performed in the bit-serial manner.

Further, by transmitting a control signal commonly to every prescribed number of operation blocks among the operation blocks, an arithmetic/logic operation required by the unit of a prescribed number of operation blocks can be executed. Consequently, operation control becomes easier than in an arrangement in which each of the operation blocks is controlled individually, and a plurality of data can be processed easily by a single instruction.

Further, by providing a memory of large capacity commonly for a plurality of operation blocks, band width for data transfer between the large capacity memory and the operation blocks can be enlarged, and therefore, data transfer does not pose a bottle neck to the arithmetic/logic operation in each of the operation blocks.

Further, because of an arrangement allowing data transfer among operation blocks and processors, arithmetic/logic operation between neighboring pixels and the like can be executed easily.

As a data conversion circuit is arranged at the input/output interface portion, a word-serial and bit-parallel data string and a bit-serial and word-parallel data string can be converted easily to each other, and therefore, it becomes possible to perform data processing in bit-serial manner in a processor and word-by-word outside the processor.

In the cross bar switch in accordance with the present invention, a first data signal line is provided corresponding to each of the first functional blocks, and the first data signal line is connected to a second functional block designated by a select signal. Therefore, the arrangement can be simplified, and only a small layout area is necessary.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 8 shows internal timings in an arithmetic/logic operation of a main processing circuitry of the semiconductor device in accordance with Embodiment 1 of the present invention.

FIG. 36 shows, in the form of a list, ALU instructions in accordance with Embodiment 11 of the present invention.

FIG. 37 shows, in the form of a list, ALU load/store instructions in accordance with Embodiment 11 of the present invention.

FIG. 38 shows, in the form of a list, instructions for moving data between entries in accordance with Embodiment 11 of the present invention.

FIG. 39 shows, in the form of a list, ALU arithmetic/logic operation instructions in accordance with Embodiment 11 of the present invention.

FIG. 40 shows, in the form of a list, ALU logic operation instructions in accordance with Embodiment 11 of the present invention.

FIG. 41 shows an exemplary program in accordance with Embodiment 11 of the present invention.

FIG. 42 schematically shows a data flow of an addition program of FIG. 41.

FIG. 43 shows a subtraction program in accordance with Embodiment 11 of the present invention.

FIG. 46 shows entry address allocation at the time of division in accordance with Embodiment 11 of the present invention.

FIG. 47 shows a division program in accordance with Embodiment 11 of the present invention.

FIG. 53 shows, in the form of a list, register instructions in accordance with Embodiment 12 of the present invention.

FIG. 54 shows, in the form of a list, ALU instructions in accordance with Embodiment 12 of the present invention.

FIG. 55 shows, in the form of a list, ALU set/clear instructions in accordance with Embodiment 12 of the present invention.

FIG. 56 shows, in the form of a list, ALU load/store instructions in accordance with Embodiment 12 of the present invention.

FIG. 57 shows, in the form of a list, instructions for moving data between entries in accordance with Embodiment 12 of the present invention.

FIG. 58 shows, in the form of a list, ALU arithmetic operation instructions in accordance with Embodiment 12 of the present invention.

FIG. 59 shows, in the form of a list, ALU arithmetic operation instructions in accordance with Embodiment 12 of the present invention.

FIG. 60 shows, in the form of a list, values stored in the register and corresponding data processing in accordance with Embodiment 12 of the present invention.

FIG. 61 shows, in the form of a list, ALU logic operation instructions in accordance with Embodiment 12 of the present invention.

FIG. 62 shows a signed multiplication program in accordance with Embodiment 12 of the present invention.

FIG. 66A shows an entry pointer in addition operation in accordance with Embodiment 12 of the present invention.

FIG. 66B shows an addition program.

FIG. 67A shows an entry pointer in subtraction operation in accordance with Embodiment 12 of the present invention.

FIG. 67 B shows a subtraction program.

FIG. 68 shows an unsigned multiplication program in accordance with Embodiment 12 of the present invention.

FIG. 69 shows a division program in accordance with Embodiment 12 of the present invention.

FIG. 71 shows, in the form of a list, pointer register instructions in accordance with Embodiment 13 of the present invention.

FIG. 72 shows, in the form of a list, instructions for 1-bit operation of the ALU in accordance with Embodiment 13 of the present invention.

FIG. 73 shows, in the form of a list, ALU load/store instructions for 2-bit operation in accordance with Embodiment 13 of the present invention.

FIG. 74 shows, in the form of a list, instructions for moving data between entries for 1-bit operation in accordance with Embodiment 13 of the present invention.

FIG. 75 shows, in the form of a list, instructions for moving data between entries for 2-bit operation in accordance with Embodiment 13 of the present invention.

FIG. 76 shows, in the form of a list, ALU arithmetic operation instructions for 1-bit operation in accordance with Embodiment 13 of the present invention.

FIG. 77 shows, in the form of a list, ALU arithmetic operation instructions for 2-bit operation in accordance with Embodiment 13 of the present invention.

FIG. 78 shows, in the form of a list, register bit values and corresponding data processing in accordance with Embodiment 13 of the present invention.

FIG. 79 shows a multiplication program in accordance with Embodiment 13 of the present invention.

FIG. 84 shows an addition program in accordance with Embodiment 13 of the present invention.

FIG. 85 shows a subtraction program in accordance with Embodiment 13 of the present invention.

FIG. 86 shows an unsigned multiplication program in accordance with Embodiment 13 of the present invention.

Figure 117:
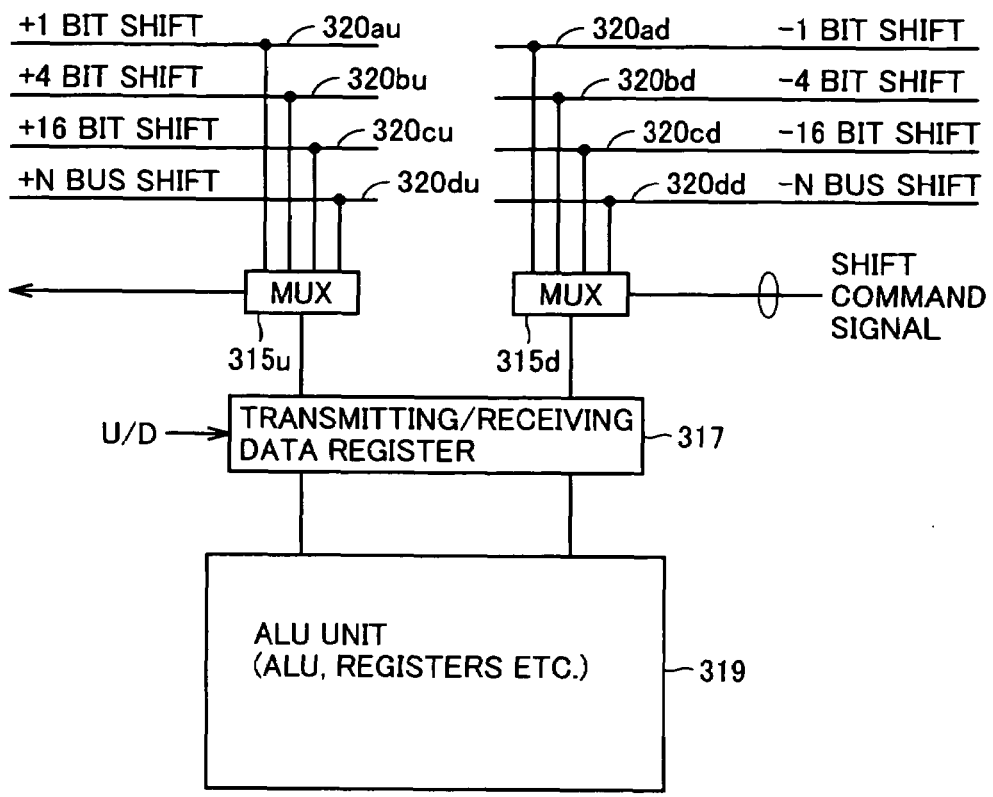
FIG. 117 schematically shows a configuration of a programmable switch in accordance with a fifth modification of Embodiment 19 of the present invention.
Figure 118:
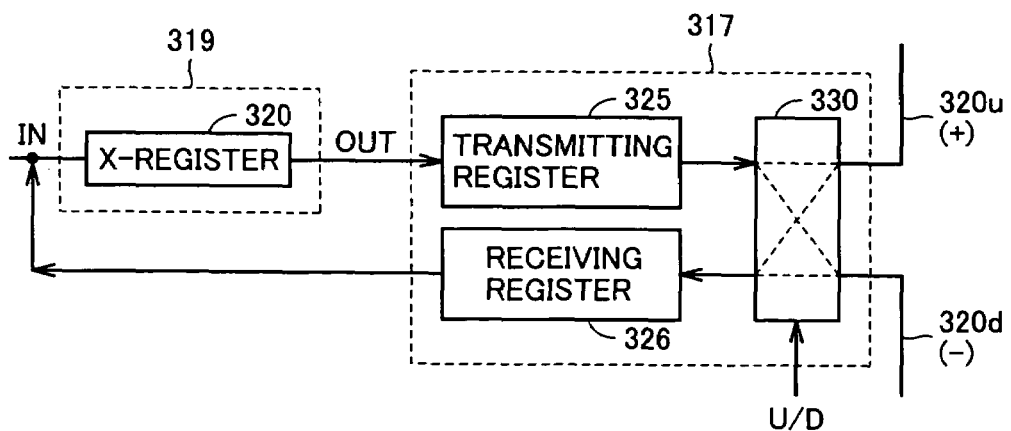

FIG. 118 schematically shows an exemplary configuration of a transmission/reception data register shown in FIG. 117.

Figure 119:
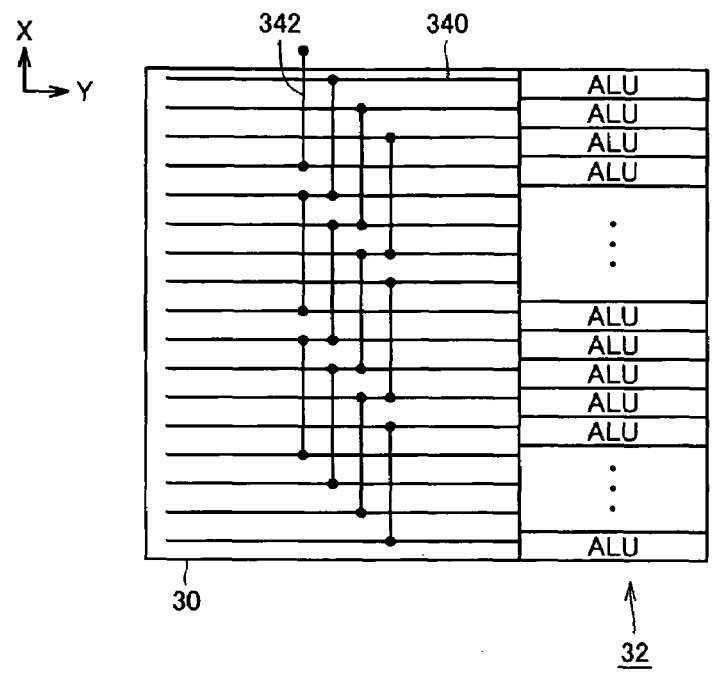

FIG. 119 schematically shows a configuration of a bus connecting ALUs in accordance with a sixth modification of Embodiment 19 of the present invention.

Figure 120:
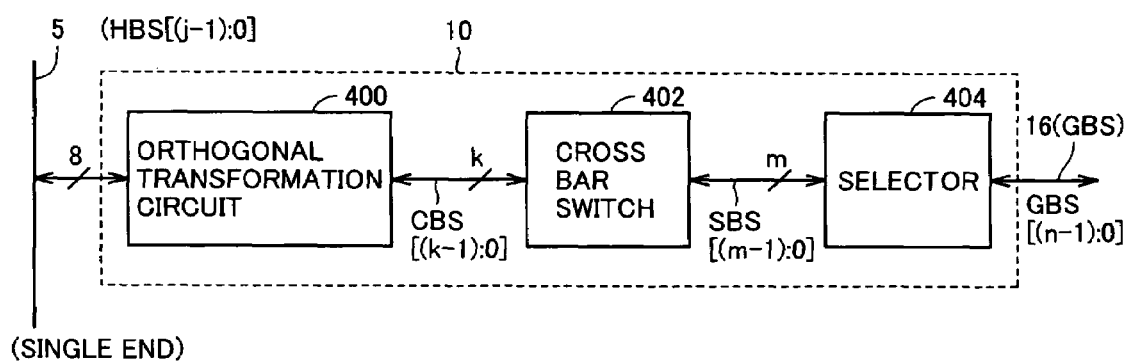

FIG. 120 schematically shows a configuration of an input/output circuit in accordance with Embodiment 20 of the present invention.

Figure 121:
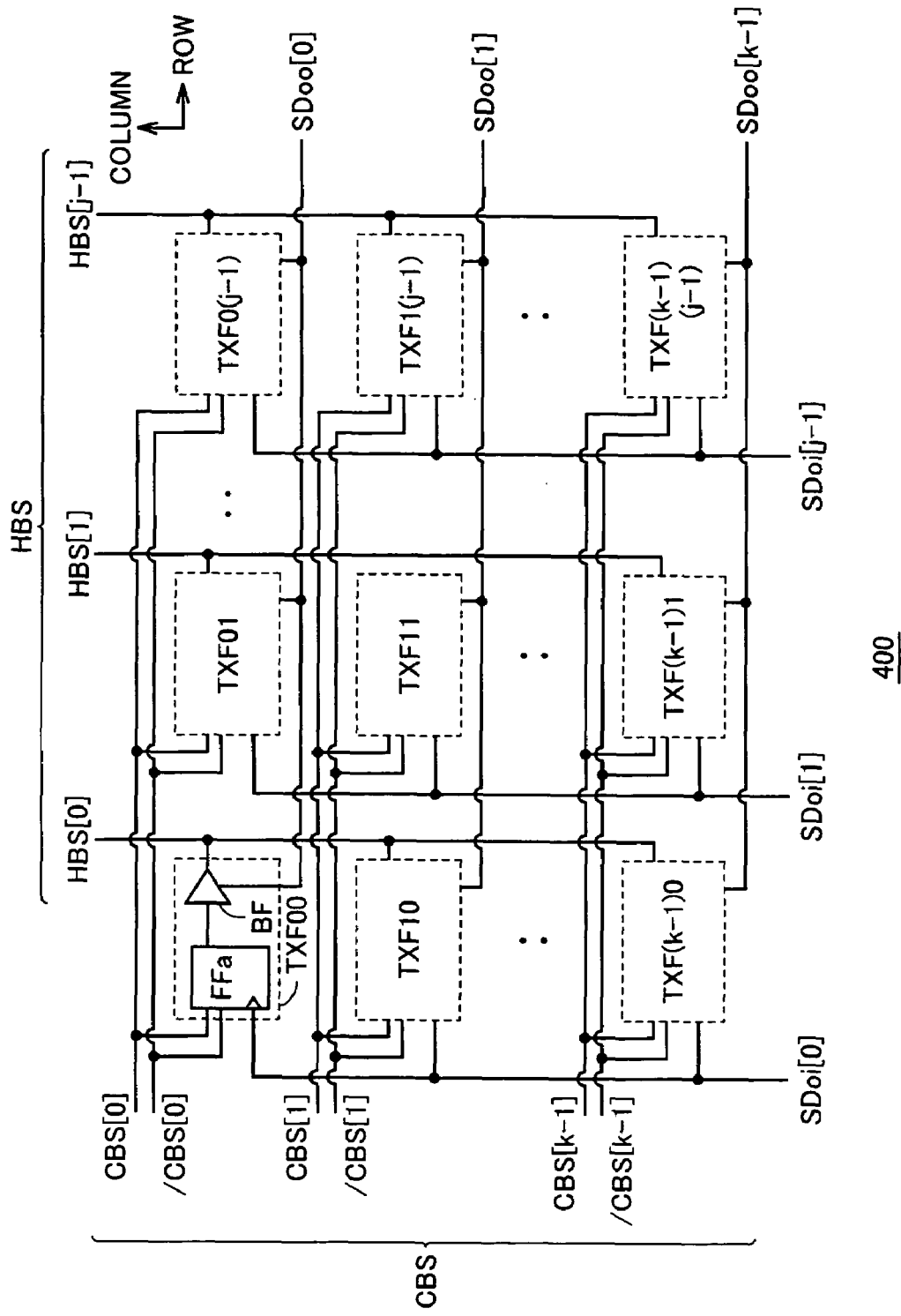

FIG. 121 schematically shows a configuration of a data output portion of an orthogonal transformation circuit shown in FIG. 120.

Figure 122:
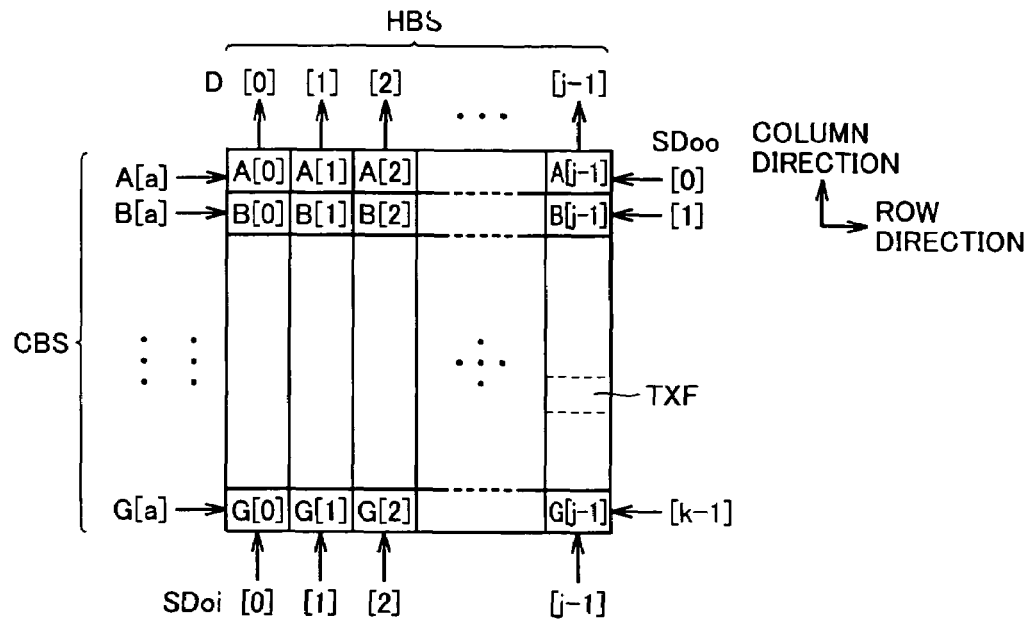

FIG. 122 schematically represents a data transformation operation by the orthogonal transformation circuit shown in FIG. 121.

Figure 123:
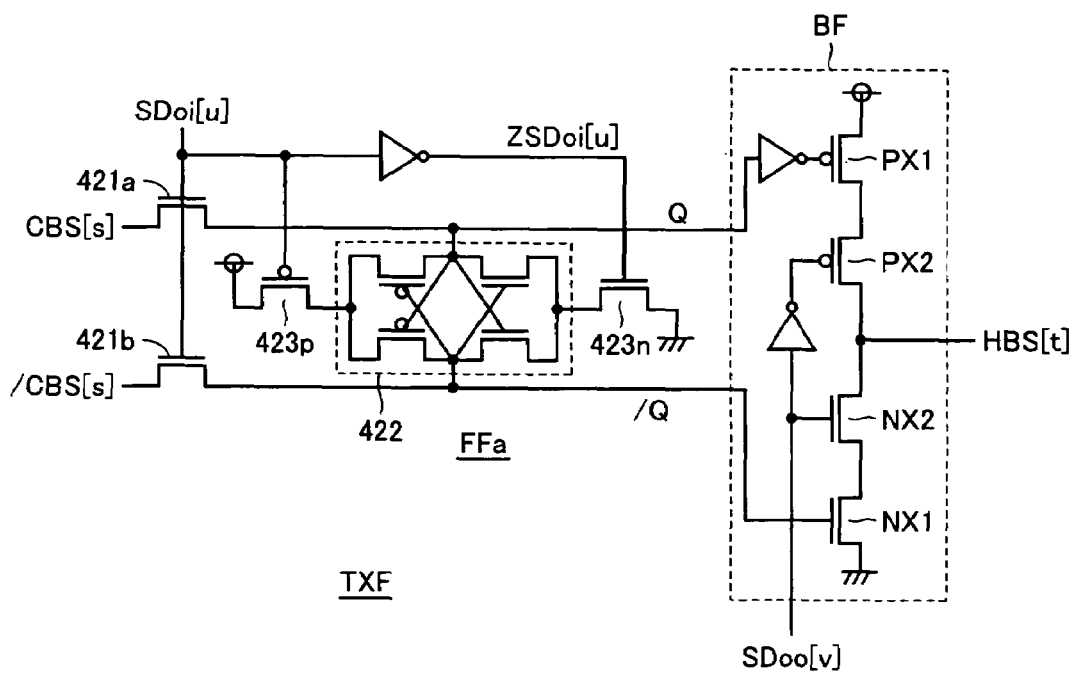

FIG. 123 schematically shows a structure of transforming element shown in FIG. 121.

Figure 124:
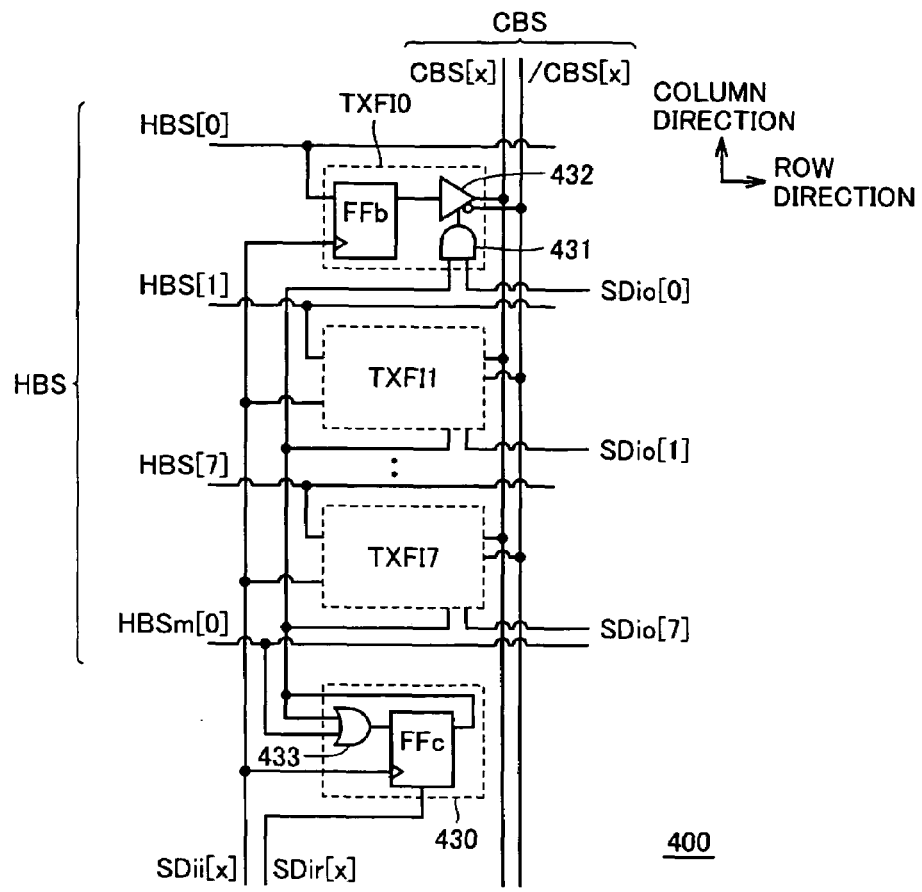

FIG. 124 schematically shows a configuration of a data input portion of the orthogonal transformation circuit shown in FIG. 120.

Figure 125:
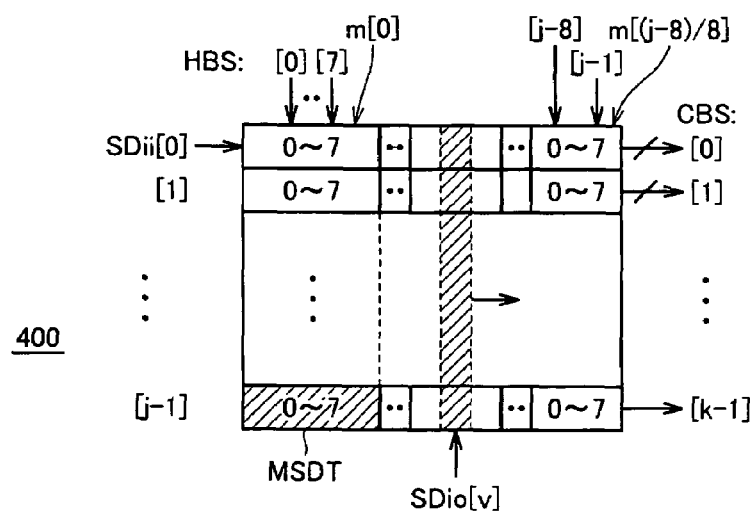

FIG. 125 schematically shows a data transforming operation by the data input portion of the orthogonal transformation circuit shown in FIG. 124.

Figure 126:
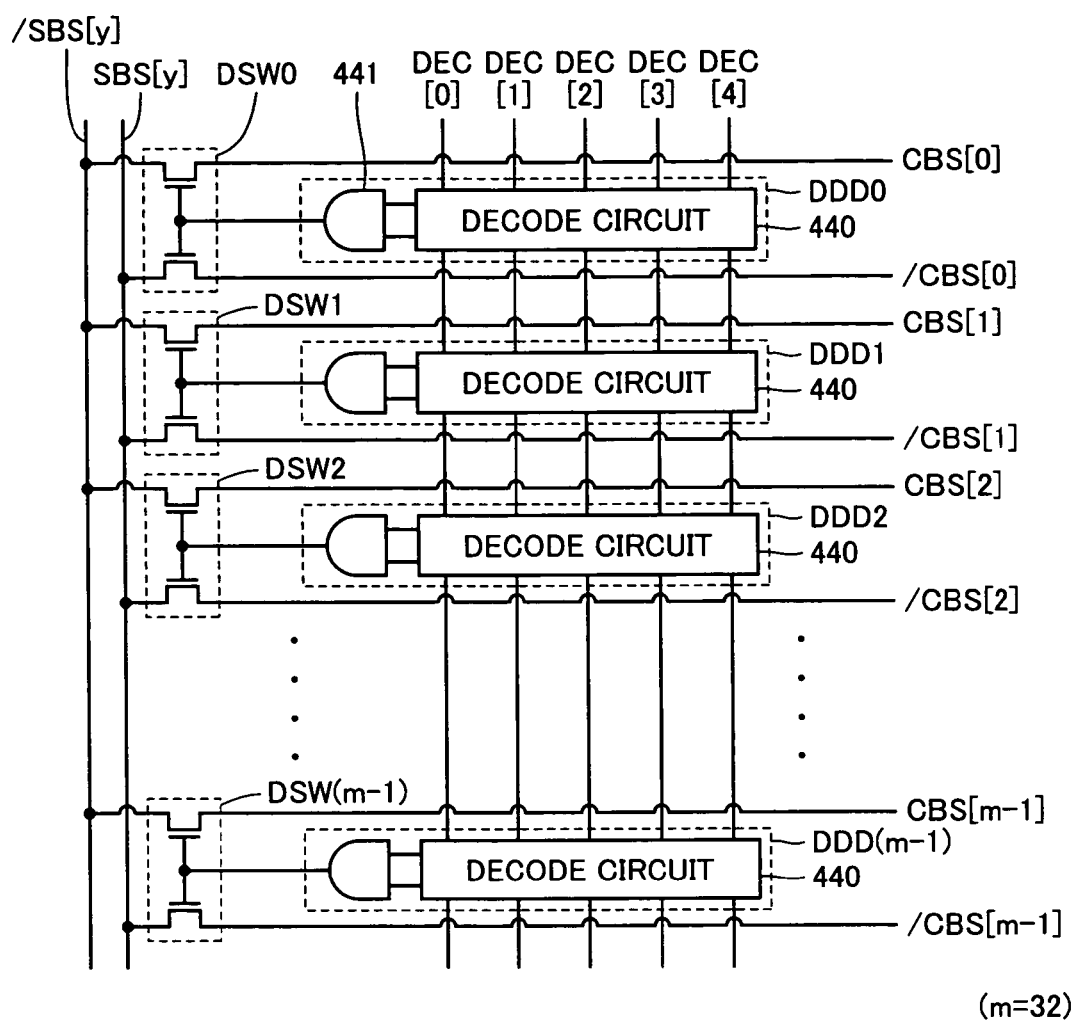

FIG. 126 schematically shows a structure of a main portion of a cross bar switch shown in FIG. 120.

Figure 127:
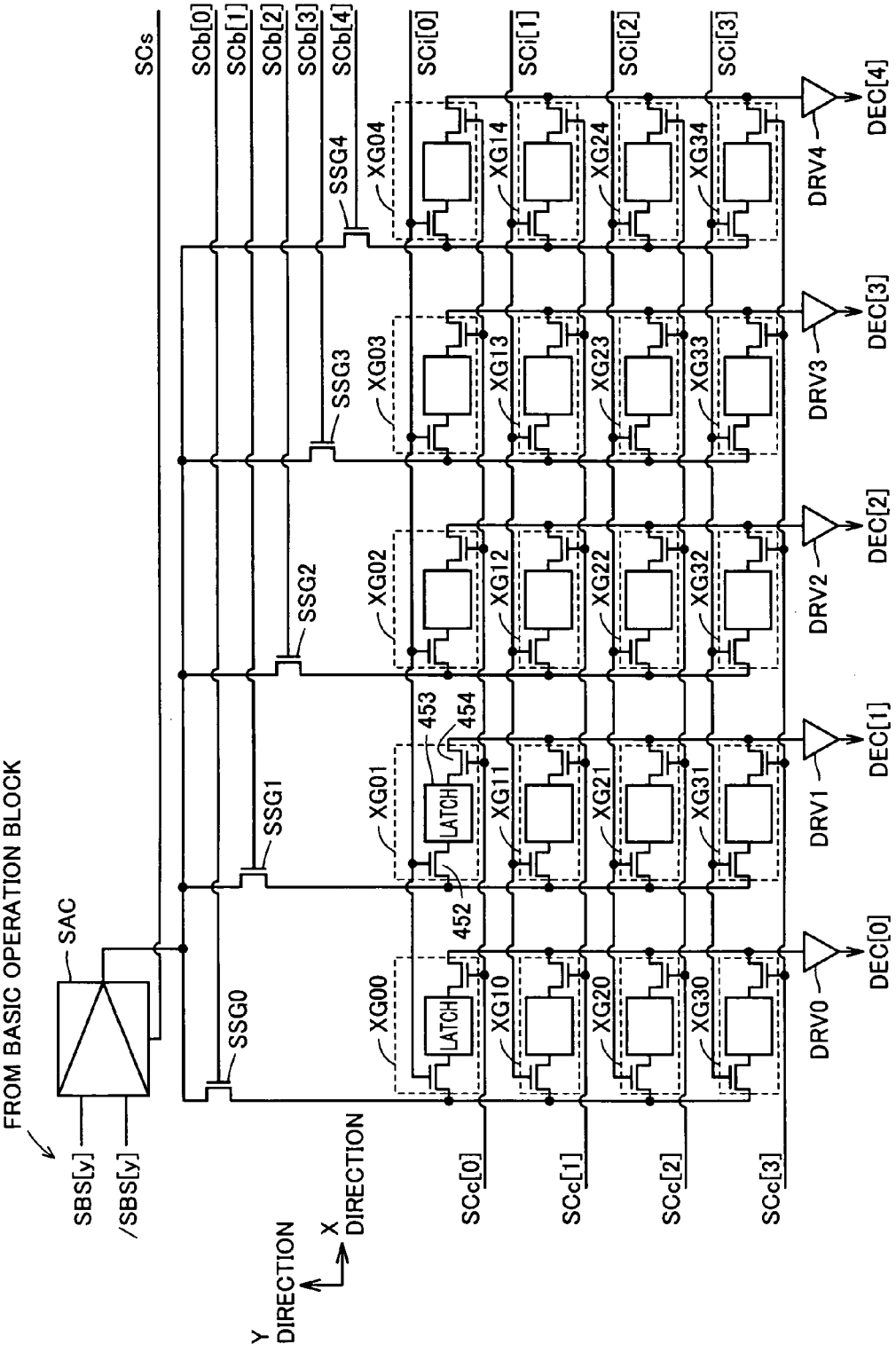

FIG. 127 schematically shows a structure of a connection control signal generating portion of the cross bar switch shown in FIG. 120.

Figure 128:
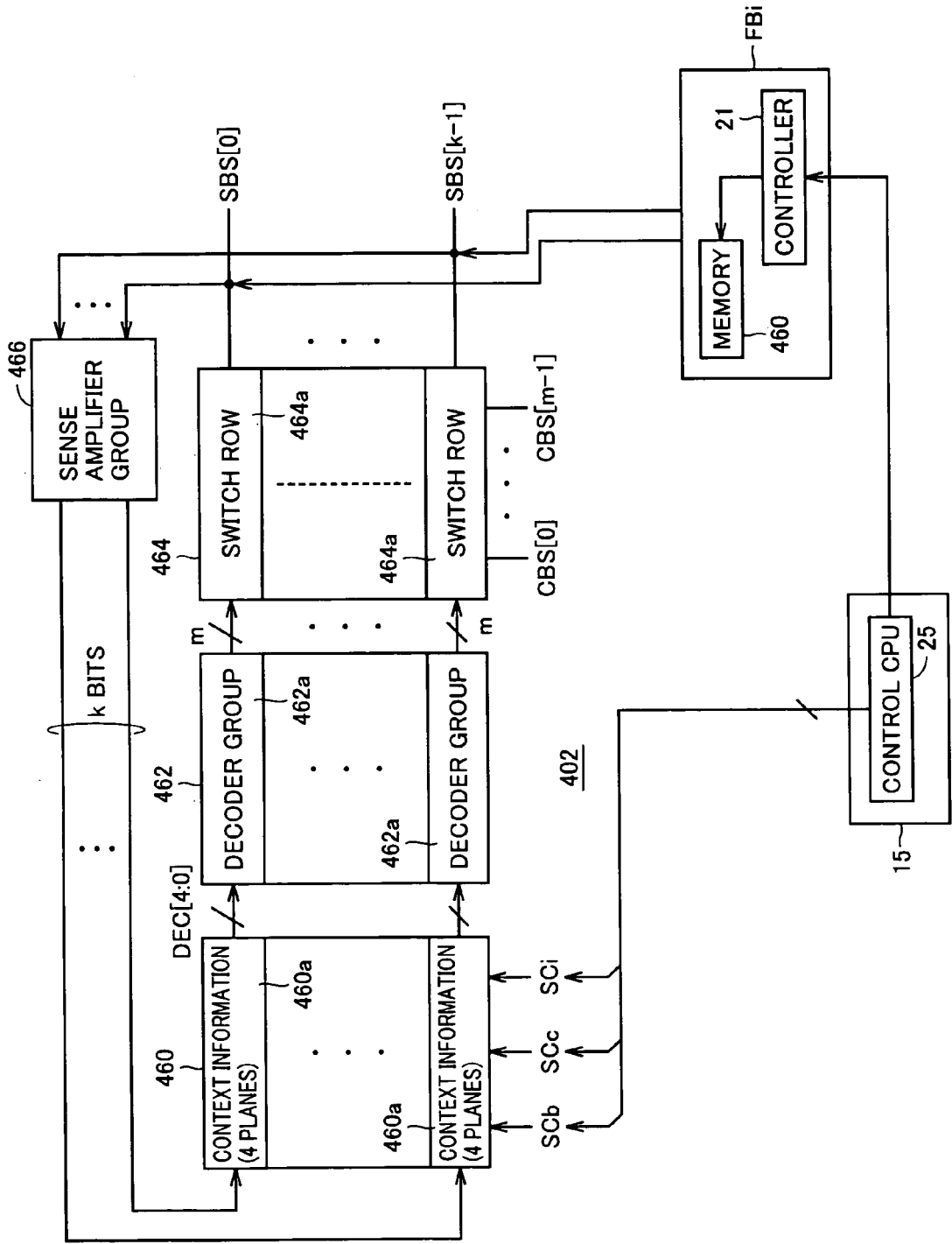

FIG. 128 schematically shows an overall configuration of the cross bar switch shown in FIG. 124.

Figure 129:
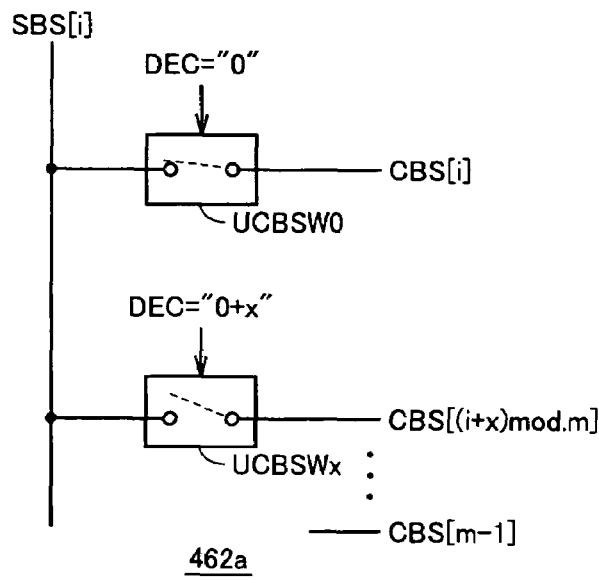

FIG. 129 shows correspondence between decode signals of a decoder shown in FIG. 126 and connection buses.

Figure 130:
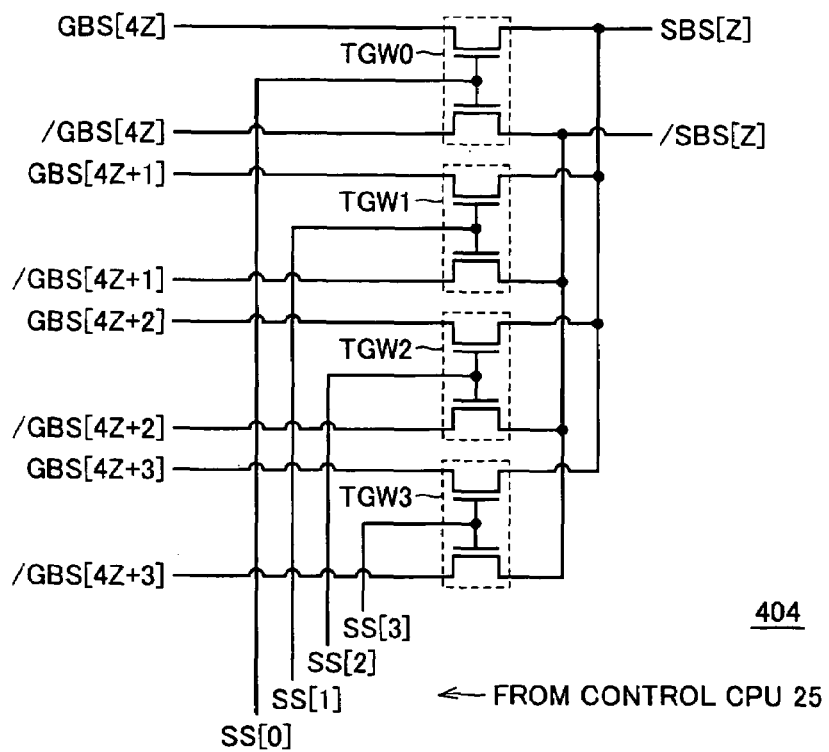

FIG. 130 shows an exemplary structure of a selector shown in FIG. 120.

Figure 131:
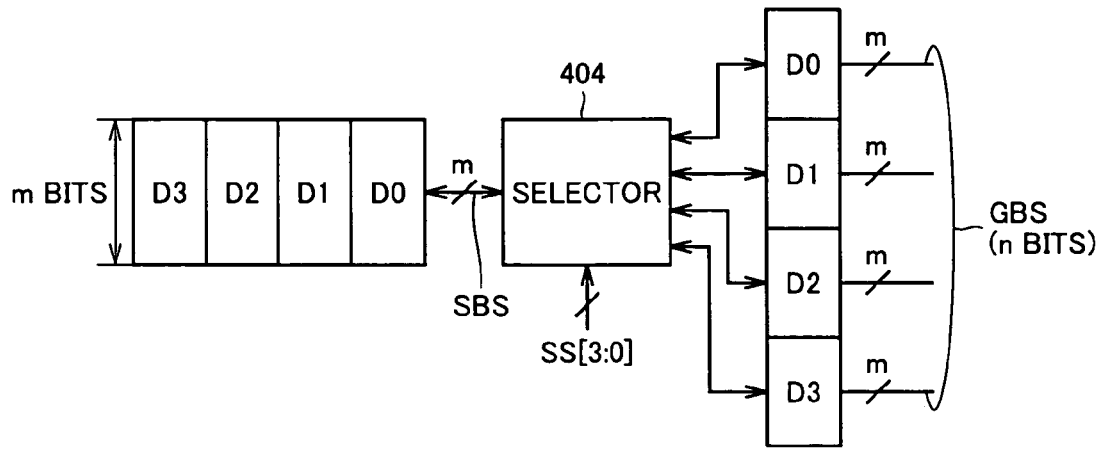

FIG. 131 shows an example of a data transfer path of the selector shown in FIG. 130.

Figure 132:
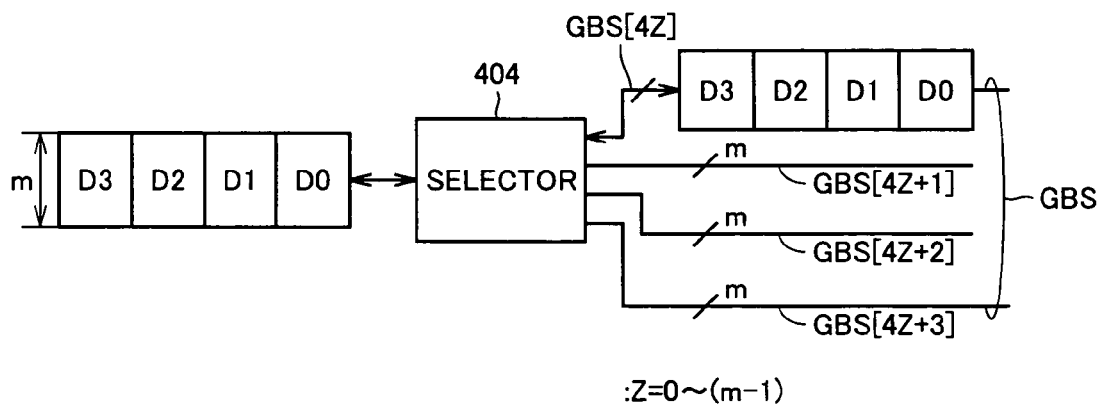

FIG. 132 shows another example of the data transfer path of the selector shown in FIG. 130.

Figure 133:
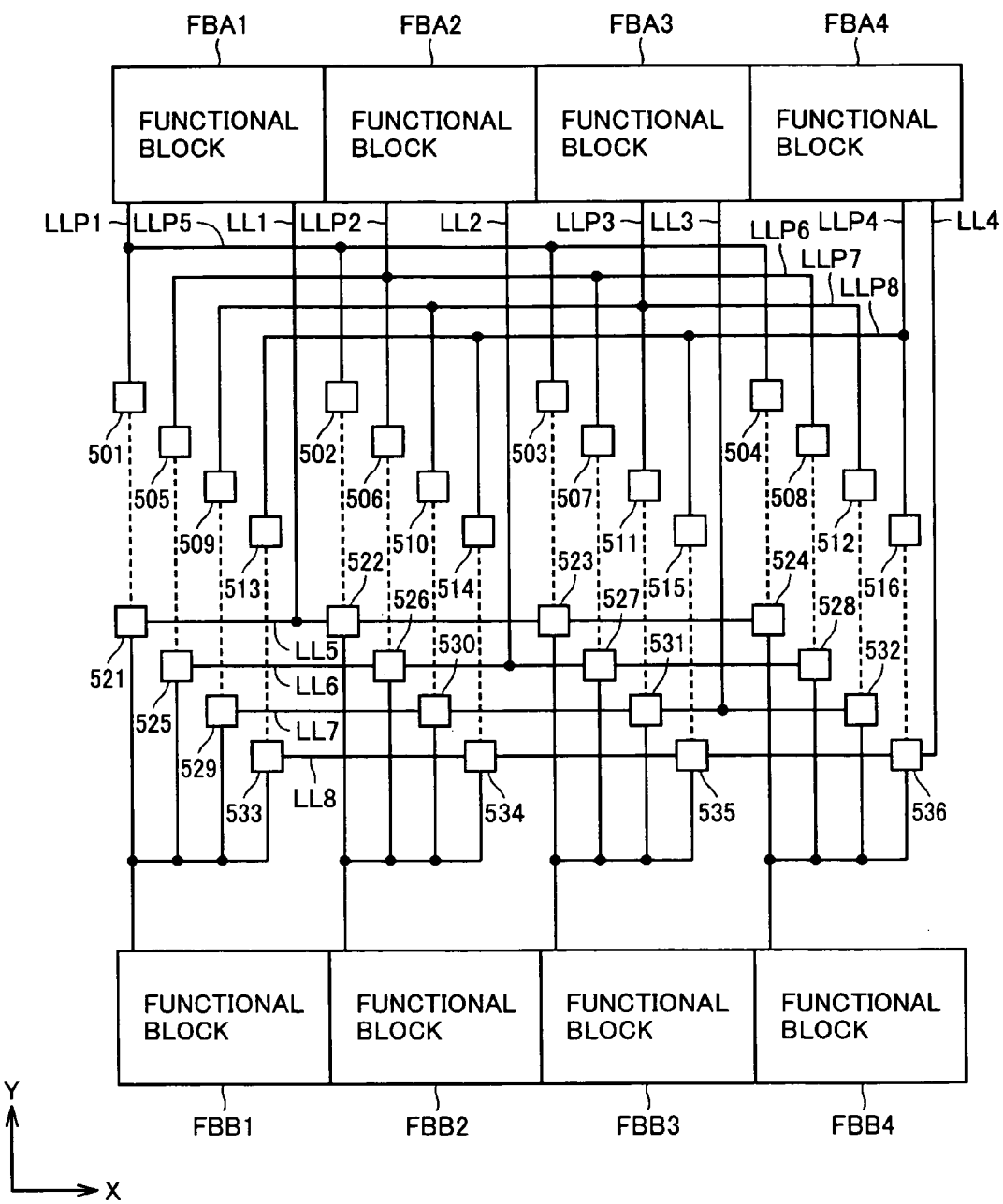

FIG. 133 is a block diagram representing a configuration of a semiconductor integrated circuit device in accordance with Embodiment 21 of the present invention.

Figure 134:
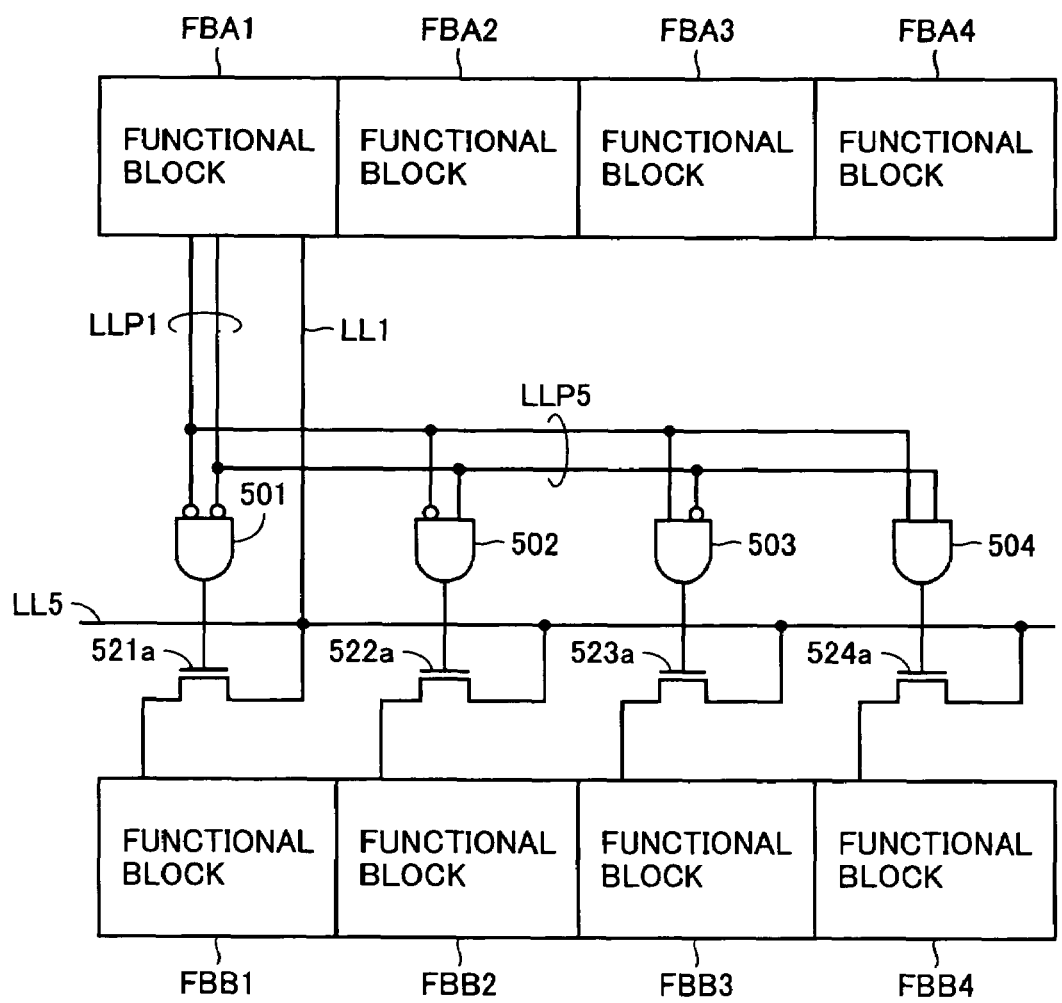

FIG. 134 is a circuit diagram showing configurations of a decode circuit and a wired OR switch shown in FIG. 133.

Figure 135:
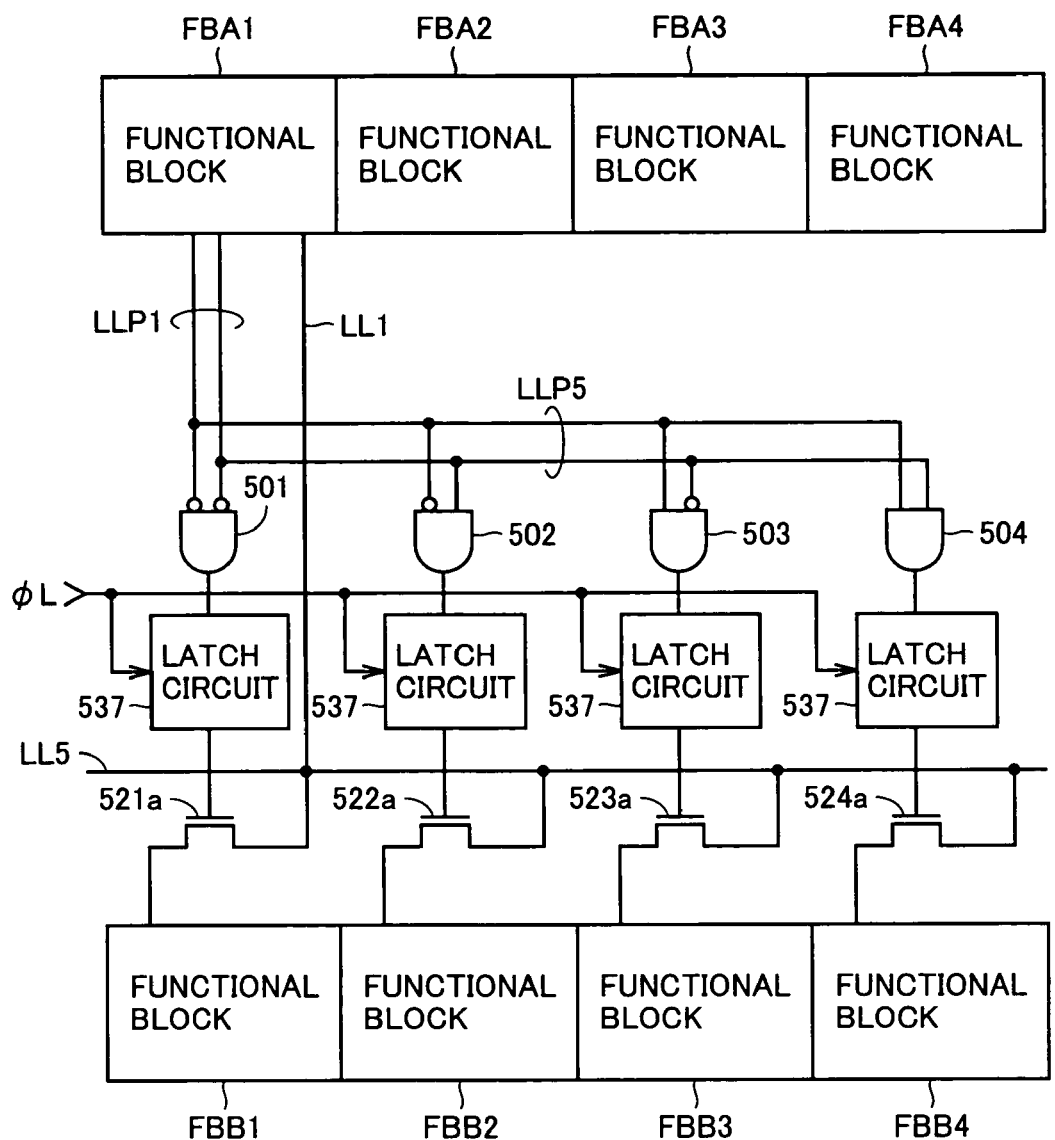

FIG. 135 is a block diagram showing a main portion of a semiconductor integrated circuit device in accordance with Embodiment 22 of the present invention.

Figure 136:
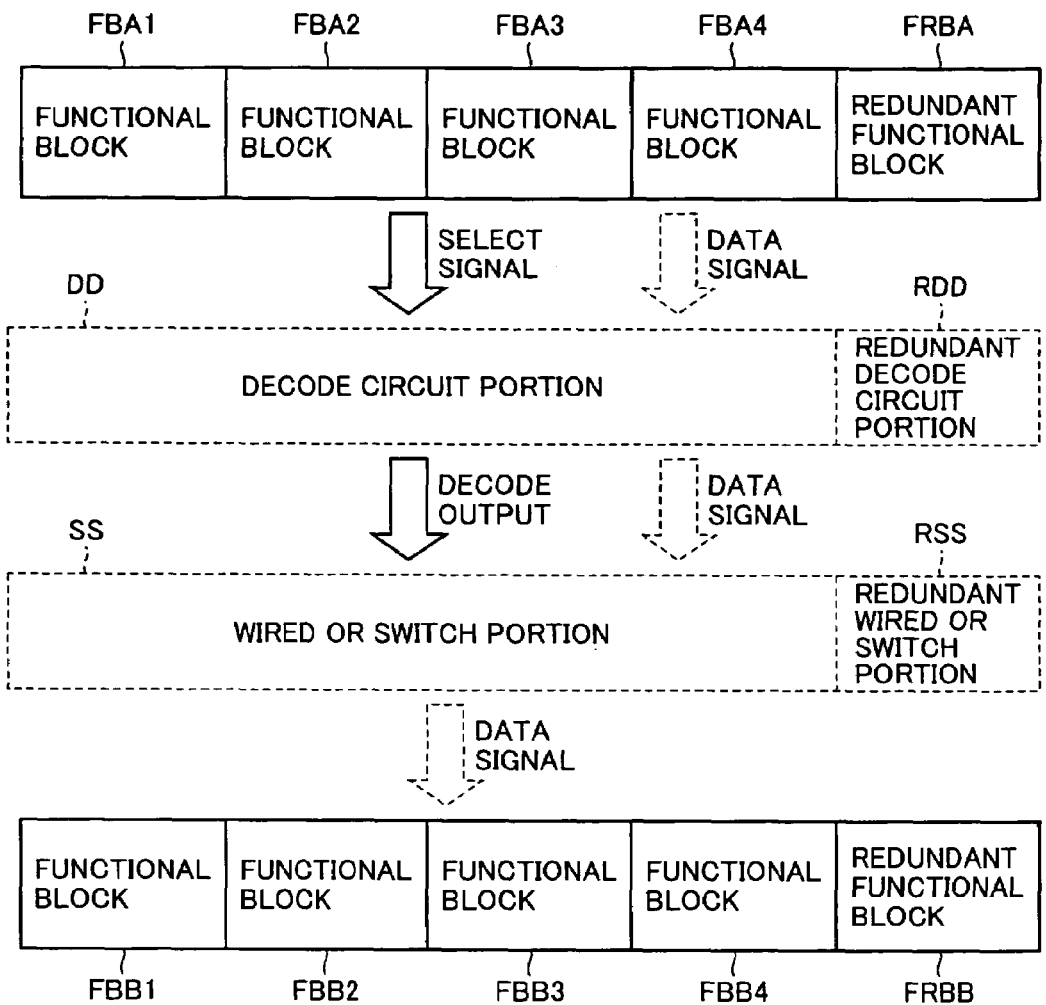

FIG. 136 is a block diagram showing a main portion of a semiconductor integrated circuit device in accordance with Embodiment 23 of the present invention.

Figure 137:
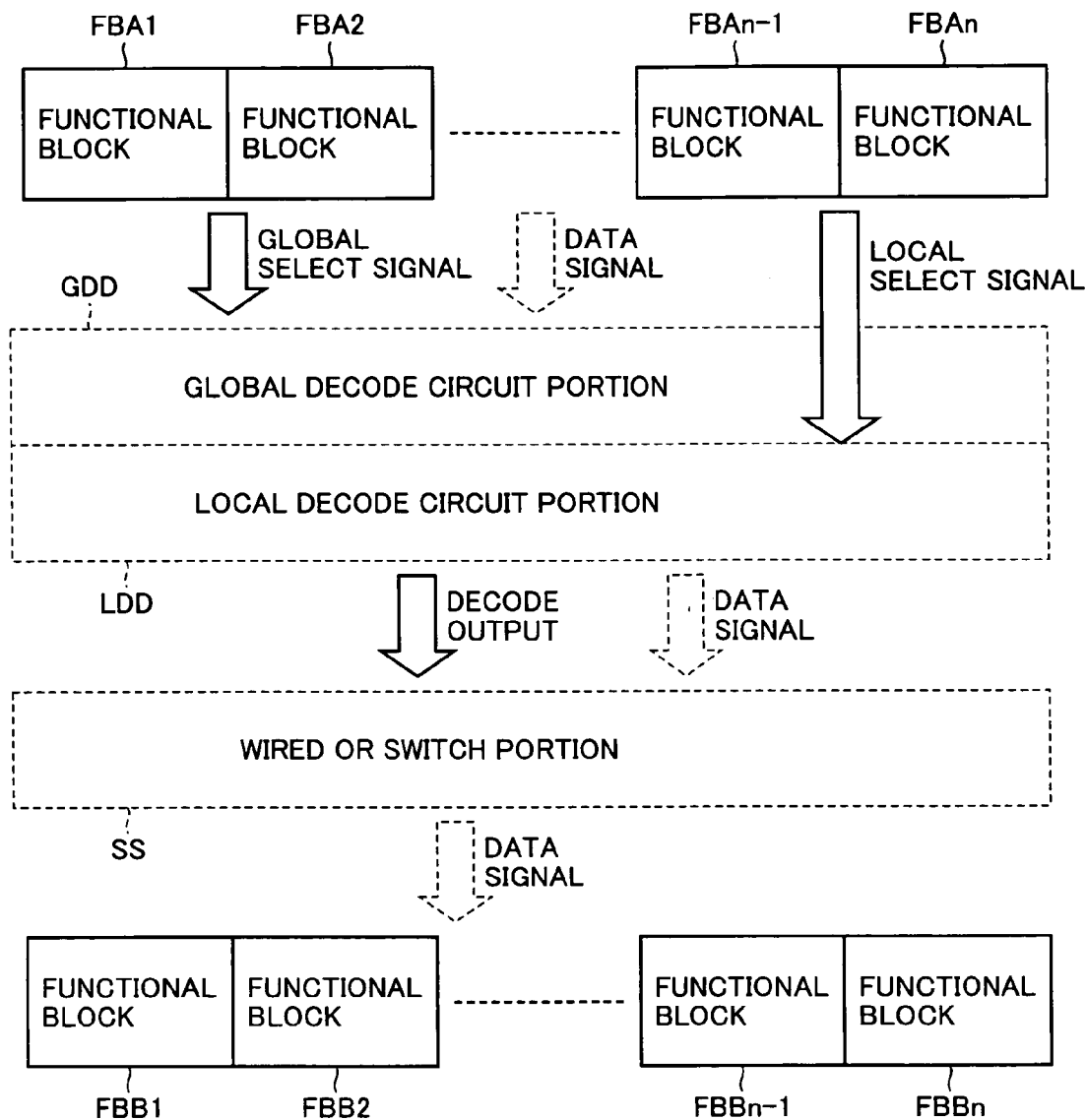

FIG. 137 is a block diagram showing a main portion of a semiconductor integrated circuit device in accordance with Embodiment 24 of the present invention.

Figure 138:
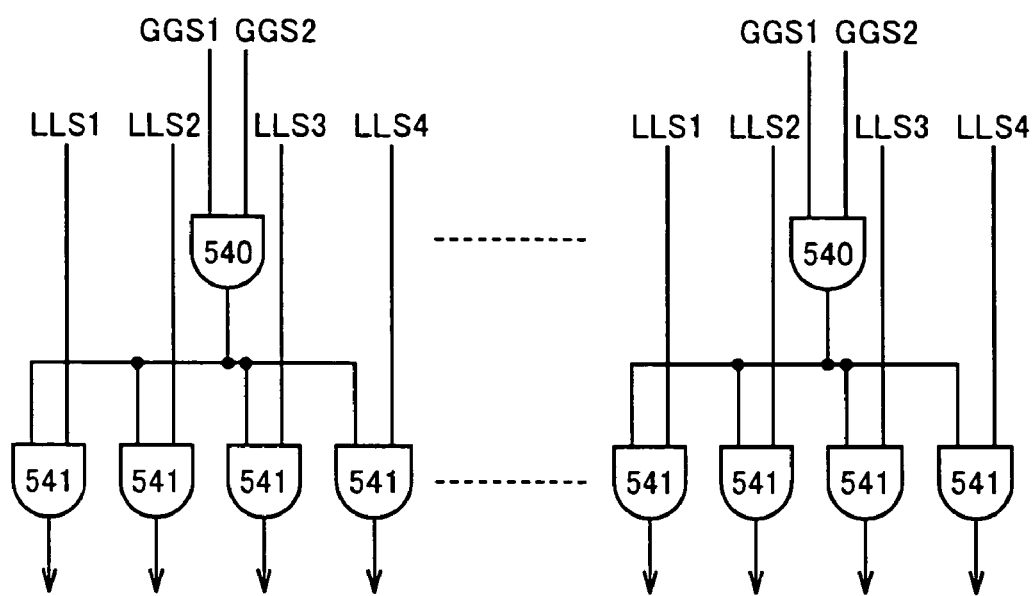

FIG. 138 is a circuit diagram showing configurations of a global decode circuit portion and a local decode circuit shown in FIG. 137.

Figure 139:
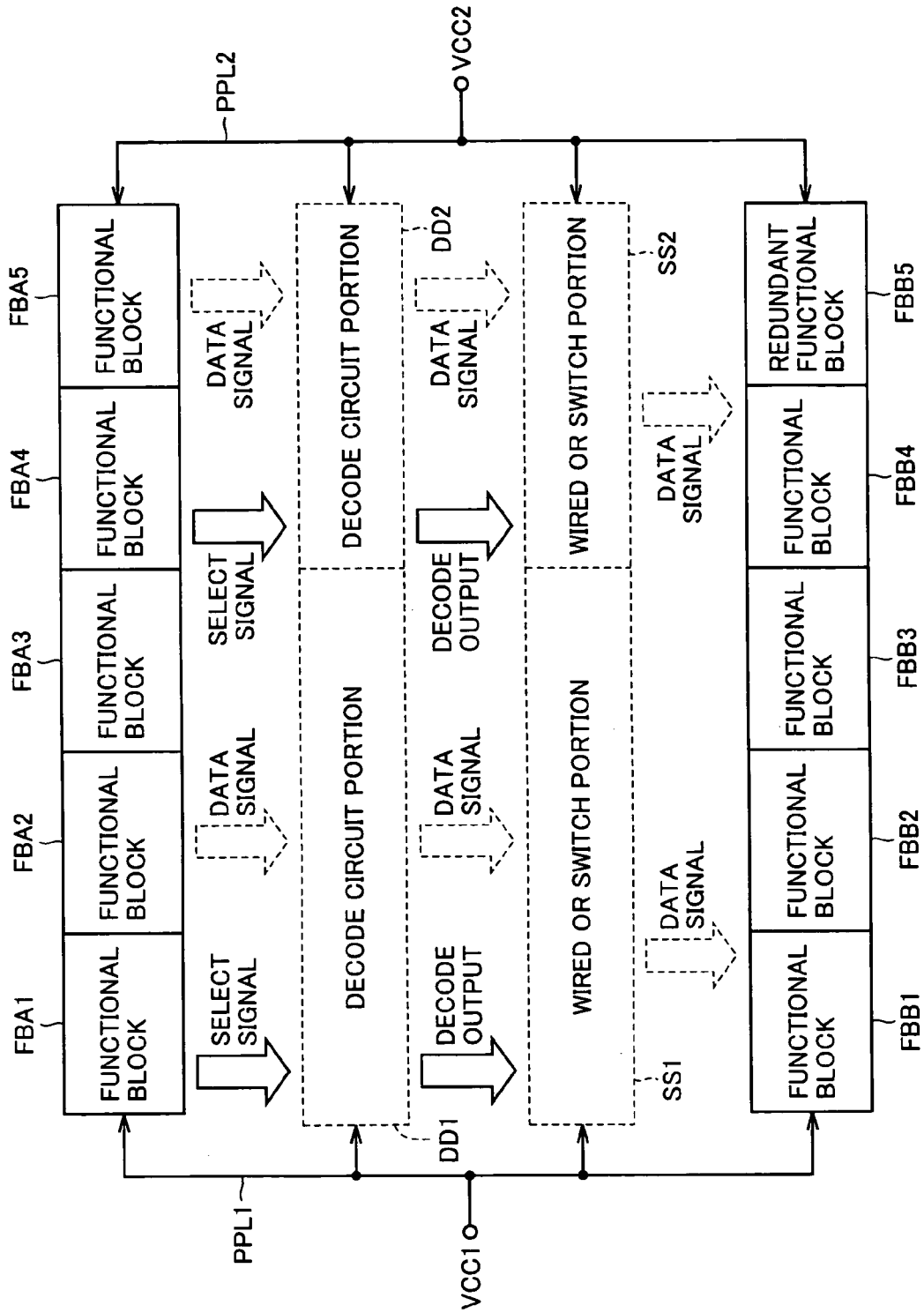

FIG. 139 is a block diagram showing a main portion of a semiconductor integrated circuit device in accordance with Embodiment 25 of the present invention.

DESCRIPTION OF THE PREFERRED EMBODIMENTS

Embodiment 1

Figure 1:
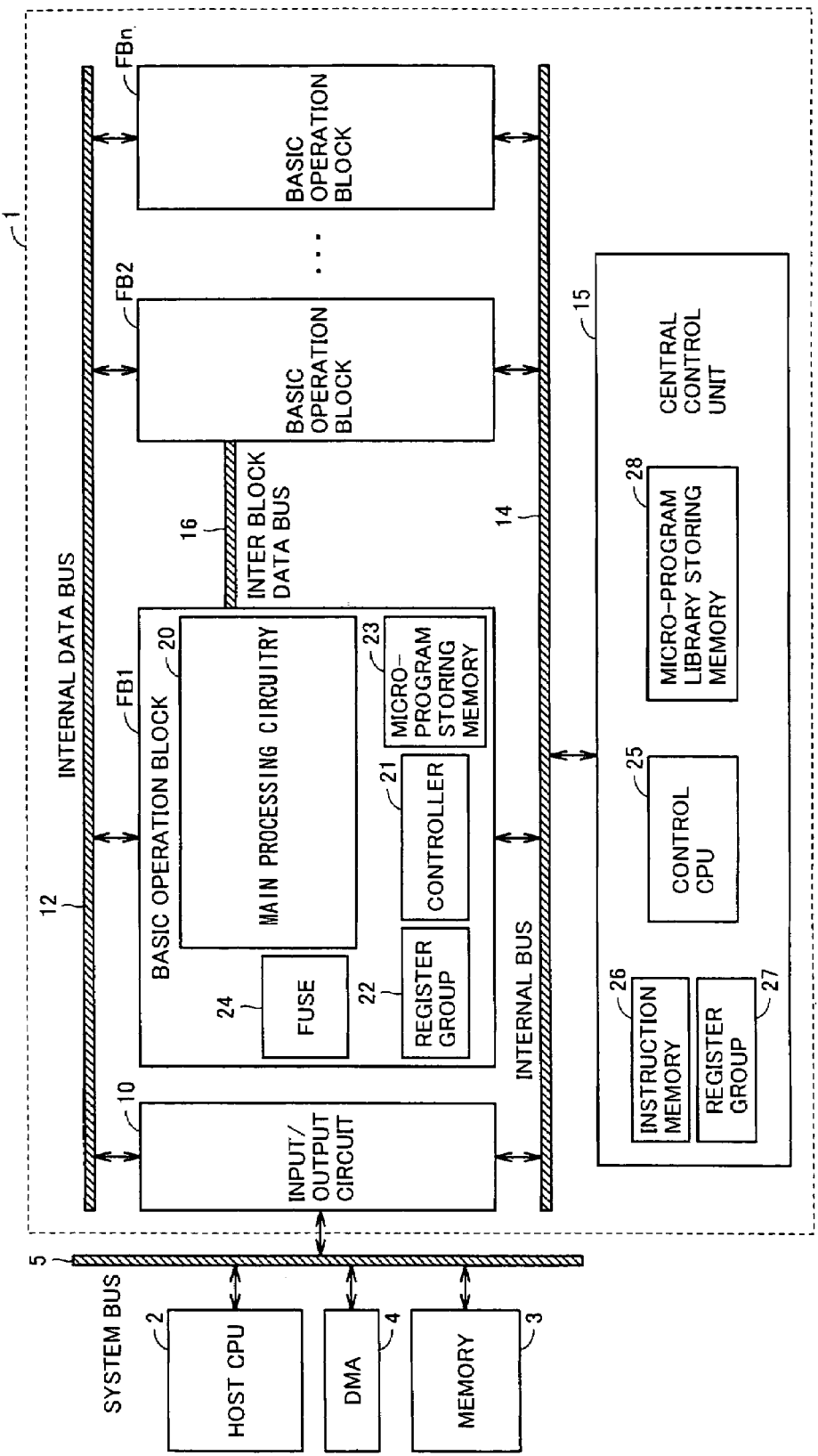
FIG. 1 schematically shows an overall configuration of a semiconductor device in accordance with the present invention.

FIG. 1 schematically shows configuration of a processing system utilizing a semiconductor processing device in accordance with Embodiment 1 of the present invention. Referring to FIG. 1, the processing system includes a semiconductor processing device 1; a host CPU 2 performing process control in semiconductor processing device 1, control of the system as a whole and data processing; a memory 3 used as a main storage of the system and storing various necessary data; and a DMA (Direct Memory Access) circuit 4 directly accessing memory 3 without communication through host CPU 2. By the control of DMA circuit 4, data can be transferred between memory 3 and semiconductor processing device 1, and semiconductor processing device can be accessed directly.

Host CPU 2, memory 3, DMA circuit 4 and semiconductor processing device 1 are connected to each other through a system bus 5. Semiconductor processing device 1 includes a plurality of basic operation blocks FB1 to FBn provided in parallel, an input/output circuit 10 transferring data/instruction to/from system bus 5, and a central control unit 15 controlling operations and processes in semiconductor processing device 1.

Basic operation blocks FB1 to FBn and input/output circuit 10 are coupled to an internal data bus 12, and central control unit 15, input/output circuit 10 and basic operation blocks FB1 to FBn are coupled to an internal bus 14. Between adjacent basic operation blocks FB (generally representing blocks FB1 to FBn), an inter-block data bus 16 is provided (in FIG. 1, an inter-block data bus 16 arranged between neighboring basic operation blocks FB1 and FB2 is shown as a representative).

By providing basic operation blocks FB1 to FBn in parallel, same or different arithmetic/logic operations are executed in semiconductor processing device 1. These basic operation blocks FB1 to FBn are of the same configuration, and therefore, the configuration of basic operation block FB1 is shown as a representative example in FIG. 1.

Basic operation block FB1 includes a main processing circuitry 20 including a memory and a processor; a micro program storing memory 23 storing an execution program provided as a micro code; a controller 21 controlling an internal operation of basic operation block FB1; a register group 22 used as an address pointer or the like; and a fuse circuit 24 for executing a fuse program for repairing any defect of main processing circuitry 20.

Controller 21 controls operations of basic operation blocks FB1 to FBn, as control is handed over by a control instruction given from host CPU through system bus 5 and input/output circuit 10. These basic operation blocks FB1 to FBn are each provided with micro program storing memory 23, and controller 21 stores an execution program in memory 23. Consequently, the contents of processing to be executed in each of basic operation blocks FB1 to FBn can be changed, and the contents of processing of arithmetic or logical operations to be executed in each of basic operation blocks FB1 to FBn can be changed.

Inter-block data buses 16 for neighboring blocks are provided for data transfer among basic operation blocks FB1 to FBn. Inter-block data bus 16 allows high speed data transfer between basic operation blocks without occupying internal data bus 12. By way of example, while a data is being transferred to a certain basic operation block through internal data bus 12, data can be transferred between different basic operation blocks.

Central control unit 15 includes: a control CPU 25; an instruction memory 26 storing an instruction to be executed by the control CPU; a group of registers 27 including a working register for control CPU 25 or a register for storing a pointer; and a micro program library storing memory 23 storing a library of micro programs. Central control unit 15 receives control from host CPU 28 through internal bus 14, and controls processing operations of basic operation blocks FB1 to FBn through internal bus 14.

Micro programs describing various sequential processes in a code form are stored as a library in micro program library storing memory 23, and therefore, it becomes possible for central control unit 15 to select a necessary micro program and to change the micro program to be stored in micro program storing memory 23 of basic operation blocks FB1 to FBn. Thus, it becomes possible to address any change in the contents of processing in a flexible manner.

Further, by the use of fuse circuit 24, any defect in basic operation blocks FB1 to FBn can be repaired through spare (redundancy) replacement, so that production yield can be improved.

Figure 2:
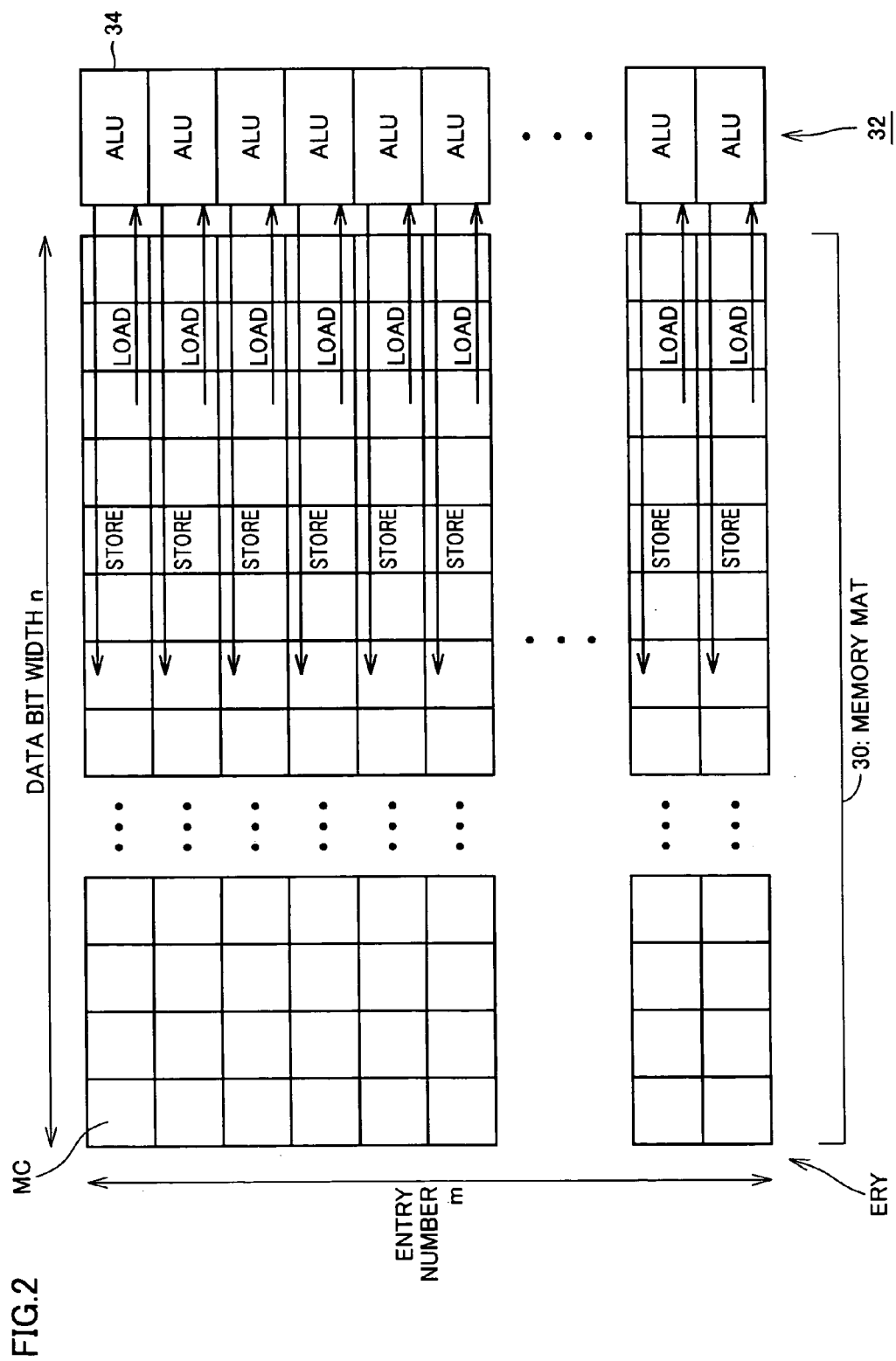
FIG. 2 schematically shows a configuration of a main processing circuitry shown in FIG. 1.

FIG. 2 schematically shows a configuration of a main portion of a main processing circuitry 20 included in each of basic operation blocks FB1 to FBn shown in FIG. 1. Referring to FIG. 2, main processing circuitry 20 includes a memory mat 30 in which memory cells MC are arranged in a matrix of rows and columns, and a group of arithmetic logic units (ALUs) arranged on one end side of memory mat 30.

In memory mat 30, memory cells MC arranged in rows and columns are divided into m entries ERY. Entry ERY has a bit width of n bits. In Embodiment 1, one entry ERY consists of one column of memory cells.

The group of arithmetic logic units 32 includes an arithmetic logic unit (ALU) 34 provided for each entry ERY. Arithmetic logic unit 34 is capable of executing addition, logical product, coincidence detection (EXOR), inversion (NOT) and others.

An arithmetic/logic operation is performed by loading and storing data between the entry ERY and the corresponding arithmetic logic unit 34. The entry ERY consists of memory cells MCs arranged aligned in the column direction of memory mat 30, and arithmetic logic unit ALU 34 executes an arithmetic/logic operation in a bit-serial manner (a data word is processed bit by bit). Therefore, in the group of arithmetic logic units 32, arithmetic/logic operation on the data is executed in a bit-serial and entry-parallel manner, in which a plurality of entries are processed in parallel.

As the arithmetic/logic operation is executed in the bit-serial manner in arithmetic logic unit (ALU) 34, even when the data to be subjected to arithmetic/logic operation may have different bit width, simply the number of operation cycles is changed in accordance with the bit width of data word, and the contents of processing are unchanged. Therefore, data having different word configurations can readily be processed.

Further, the data of a plurality of entries ERY can be processed simultaneously by the group of arithmetic logic units 32, and therefore, by increasing the number m of entries, collective arithmetic/logic operations on a large amount of data becomes possible.

Here, by way of example, the number m of entries is 1024, and one entry has a bit width of 512 bits.

Figure 3:
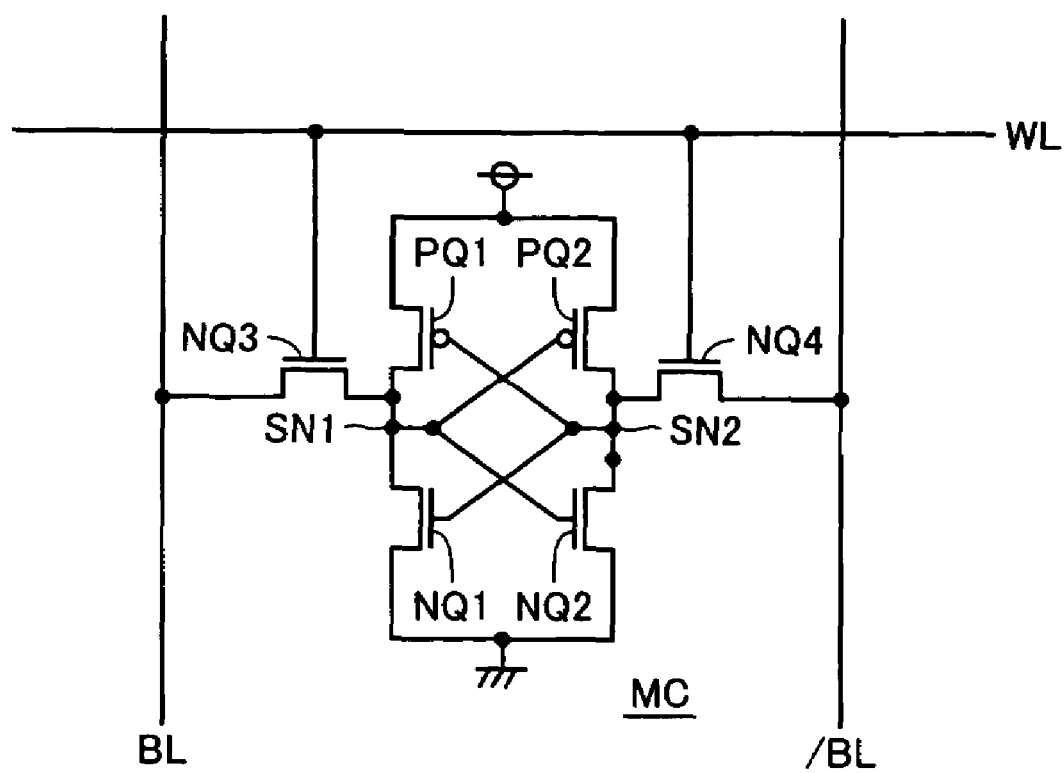
FIG. 3 shows an exemplary structure of a memory cell shown in FIG. 2.

FIG. 3 shows an exemplary structure of a memory cell MC shown in FIG. 2. Referring to FIG. 3, memory cell MC includes a P channel MOS transistor PQ1 connected between a power supply node and a storage node SN1 and having its gate connected to a storage node SN2; a P channel MOS transistor PQ2 connected between the power supply node and storage node SN2 and having its gate connected to storage node SN1; an N channel MOS transistor NQ1 connected between storage node SN1 and a ground node and having its gate connected to storage node SN2; an N channel MOS transistor NQ2 connected between storage node SN2 and the ground node and having its gate connected to storage node SN1; and N channel MOS transistors NQ3 and NQ4 connecting storage nodes SN1 and SN2 to bit lines BL and /BL, respectively, in response to a potential on a word line WL.

The memory cell MC shown in FIG. 3 is a full CMOS (Complementary Metal Oxide Semiconductor) type SRAM (Static Random Access Memory) cell that performs data writing/reading at high speed.

As the memory cell MC, a DRAM cell unit of "twin cell structure" in which two DRAM cells are connected in series between bit lines BL and /BL and set to a selected state by a common word line WL may be used.

When an arithmetic/logic operation is to be performed by main processing circuitry 20, first, data to be processed are stored in each entry ERY. Thereafter, bits of a certain digit of the stored data are read in parallel from all the entries ERY and transferred (loaded) to the corresponding arithmetic logic units 34. For a two term operation, similar transfer operation takes place on bits of different data word in respective entries, and 2-input operation is performed by each arithmetic logic unit 34. The result of arithmetic/logic operation is rewritten (stored) in a prescribed area of the corresponding entry from arithmetic logic unit 34.

Figure 4:
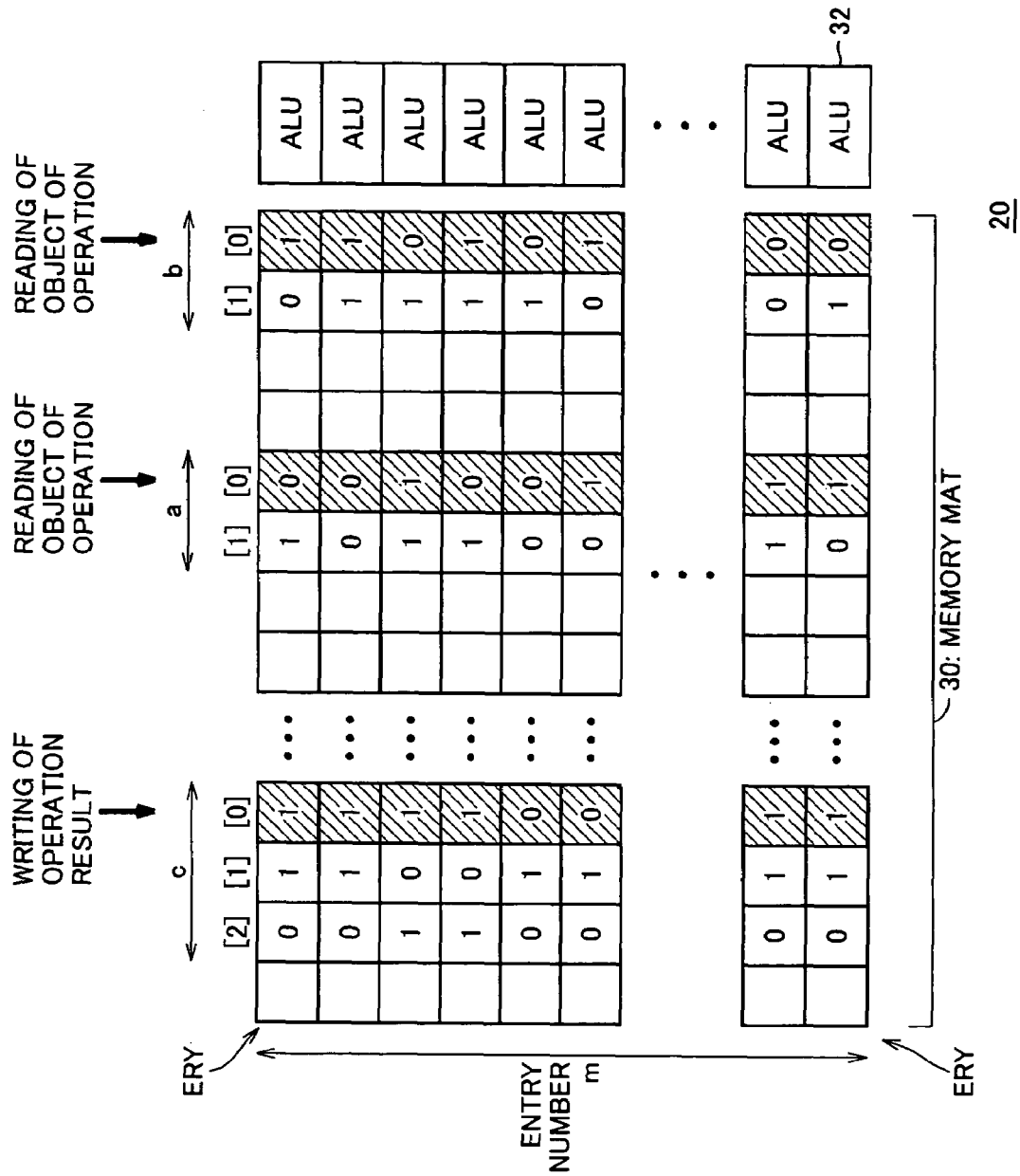
FIG. 4 schematically shows an arithmetic/logic operation sequence of a semiconductor device in accordance with Embodiment 1 of the present invention.

FIG. 4 shows an exemplary arithmetic/logic operation performed by main processing circuitry 20 shown in FIG. 2. Referring to FIG. 4, data words a and b having the bit width of 2 bits are added to generate a data word c. In each entry ERY, data words a and b forming a set as an object of arithmetic/logic operation are both stored.

Referring to FIG. 4, in an arithmetic logic unit corresponding to the entry ERY of the first row, an operation of 10B+01B is performed, whereas in an arithmetic logic unit corresponding to the entry ERY of the second row, an operation of 00B+11B is performed. Here, "B" represents a binary number. In an arithmetic logic unit corresponding to the entry ERY of the third row, an operation of 11B+10B is performed. In the similar manner, data words a and b stored in each entry are added.

The arithmetic/logic operation is performed in the bit-serial manner, starting from the lowest bits. First, in entry ERY, a lower bit a [0] of data word a is transferred to the corresponding arithmetic logic unit (hereinafter referred to as ALU) 34. Thereafter, a lower bit b [0] of data word b is transferred to the corresponding ALU 34. ALU 34 performs an addition, using 2 bits of data thus supplied. The result of addition a [0]+b [0] is written (stored) to a position of lower bit c [0] of data word c. Specifically, in the entry ERY of the first row, "1" is written to the position of c [0].

This addition is performed on higher bits a [1] and b [1], and the result of operation a [1]+b [1] is written to the position of c [1].

An addition may possibly produce a carry, and such carry value is written to a position of c [2]. Thus, addition of data words a and b completes in every entry ERY, and the result is stored in each entry ERY as data c. Assuming that the number of entries m is 1024, addition of 1024 sets of data can be executed in parallel.

Figure 5:
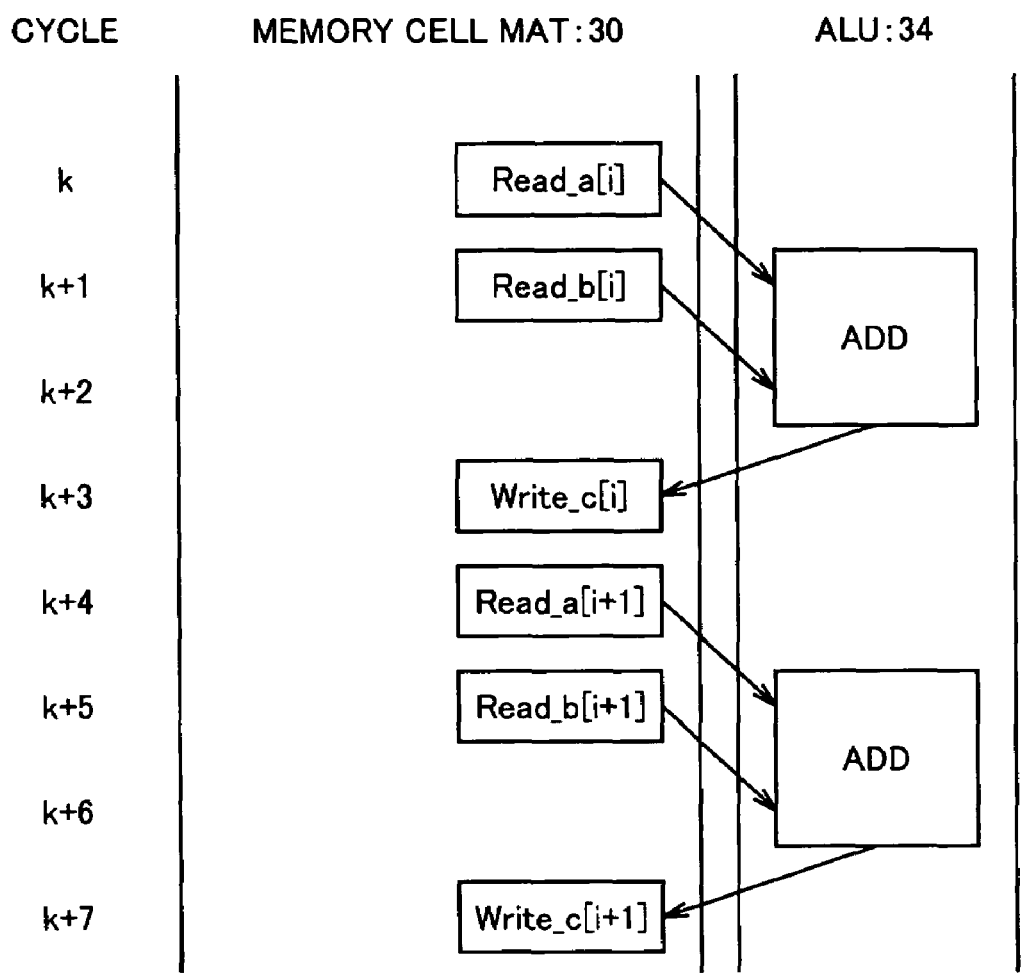
FIG. 5 shows internal timings in an arithmetic/logic operation of the semiconductor device in accordance with Embodiment 1 of the present invention.

FIG. 5 schematically shows internal timings in the addition operation. In the following, internal timings of addition will be described with reference to FIG. 5. In ALU 34, a 2-bit adder (ADD) is used.

In FIG. 5, "Read" represents an operation (load) of reading a data bit to be processed from the memory mat and transferring to the corresponding ALU 34, and "Write" represents an operation (store) or operation instruction of writing the data of the result of operation of ALU 34 to a corresponding bit position of the corresponding entry.

In a machine cycle k, a data bit a[i] is read from memory mat 30, in the next machine cycle (k+1), the data bit b[i] as the next objective of operation is read (Read), and applied to the adder (ADD) of ALU 34.

In machine cycle (k+2), in the adder (ADD) of ALU 34, the applied data bits a[i] and b[i] are added, and in machine cycle (k+3), the result of addition c[i] is written to the corresponding position of the corresponding entry.

In machine cycles (k+4) and (k+5), data bits a[i+1] and b[i+1] are read and transferred to the adder (ADD) of ALU 34, in machine cycle (k+5), ALU 34 performs addition, and in machine cycle (k+6), the result of addition is stored in bit position c[i+1].

Transfer of a data bit between memory mat and ALU 34 requires one cycle, and ALU requires an operation cycle of one machine cycle. Therefore, addition of 2 bits of data and storage of the result of addition require 4 machines cycles. The approach, in which the memory mat is divided into a plurality of entries, sets of data to be processed are stored in respective entries, and arithmetic/logic operation is performed by corresponding ALUs 34 in bit-serial manner, is characterized in that a relatively large number of machine cycles are necessary for the arithmetic/logic operation of each data, whereas high speed data processing can be achieved by increasing degree of parallelism of operations when an extremely large amount of data are to be processed. The arithmetic/logic operation is performed in the bit-serial manner, and the bit width of data to be processed is not fixed. Therefore, this approach can be applied to various applications having various different data configurations.

When the data word as the object of arithmetic/logic operation has the bit width of N, arithmetic/logic operation by each entry requires 4×N machine cycles. The bit width of the data word as the object of arithmetic/logic operation is generally 8 to 64 bits. Therefore, when the number of entries m is set relatively large to 1024 and data of 8 bit data width are to be processed in parallel, 1024 results of arithmetic operations can be obtained after 32 machine cycles. Thus, required processing time can significantly be reduced as compared with sequential processing of 1024 sets of data.

Figure 6:
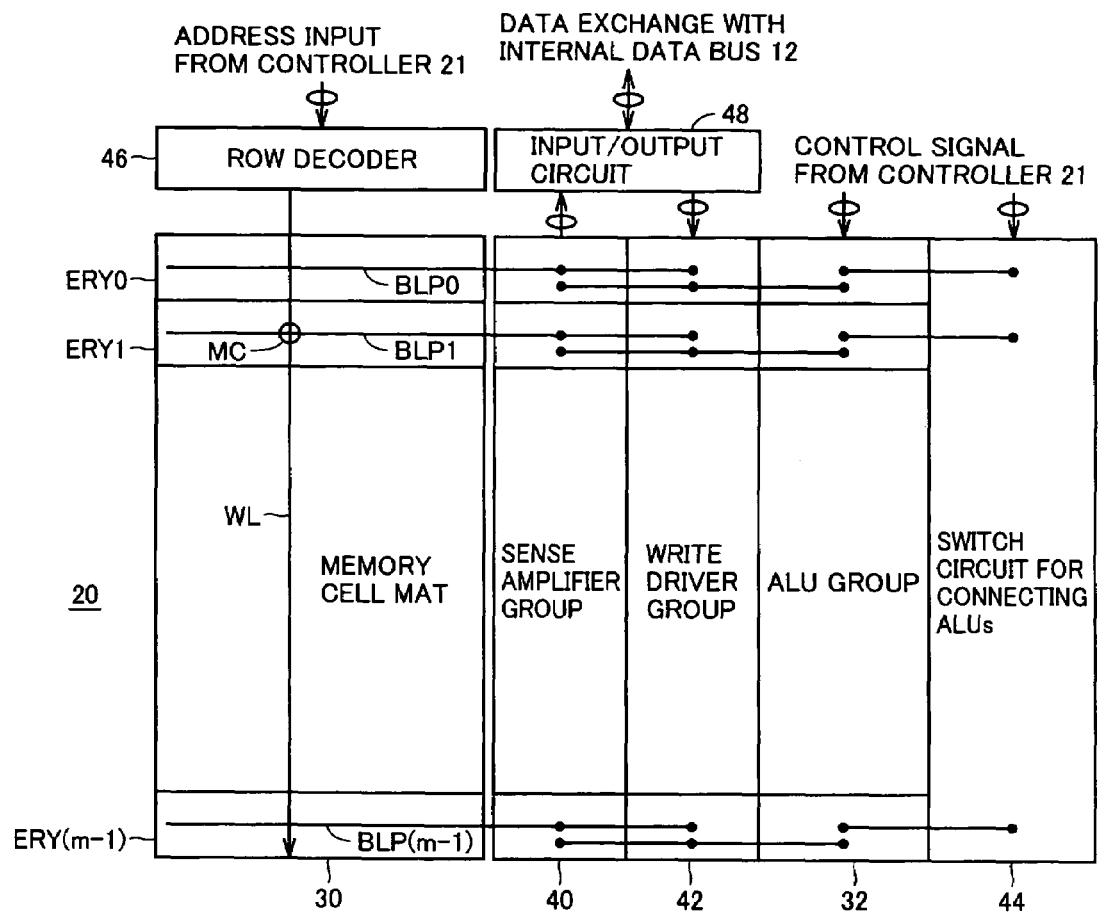
FIG. 6 more specifically shows the configuration of a main portion of the semiconductor device in accordance with Embodiment 1 of the present invention.

FIG. 6 more specifically shows the configuration of main processing circuitry 20. In memory mat 30, memory cells MC are arranged in a matrix of rows and columns, word lines WL are arranged corresponding to respective rows of memory cells, and bit line pairs BLP are arranged corresponding to respective columns of memory cells. Memory cells MC are arranged at intersections of the bit line pairs BLP and word lines WL. To each word line WL, memory cells of a corresponding row are connected, and to each bit line pair BLP, memory cells of a corresponding column are connected.

Each entry is provided corresponding to each bit line pair BLP, and in memory mat 30, entries ERY0 to ERY(m−1) are arranged corresponding to bit line pairs BLP1 to BLP(m−1), respectively. The bit line pair BLP is used as a data transfer line between the corresponding entry ERY and the corresponding ALU 34. As the entry ERY consists of one column of memory cells, arithmetic/logic operation can be done by the corresponding ALU in bit-serial manner even when the bit width of data stored in one entry varies dependent on application or contents of processing, and thus, change in data bit width can readily be accommodated.

For word lines WL of memory mat 30, a row decoder 46 is provided, which drives the word line connected to the data bits to be processed to a selected state in accordance with an address signal from controller 21 (see FIG. 1). Word line WL is connected to memory cells of the same position of respective entries ERY0 to ERY(m−1), and by row decoder 46, data bits of the same position are selected in respective entries ERY.

In the group of arithmetic logic units (ALU group) 32, respective ALUs 34 are arranged corresponding to bit line pairs BLP0 to BLP(m−1), though not specifically shown in FIG. 6. Between the ALU group 32 and memory mat 30, a sense amplifier group 40 and a write driver group 42 are provided for loading/storing (transferring) data.

The sense amplifier group 40 includes sense amplifiers provided corresponding to respective bit line pairs BLP for amplifying data read onto the corresponding bit line pair BLP and transmitting the amplified data to the corresponding ALU 34 of the group of arithmetic logic units 32.

Similarly, the write driver group 42 includes write drivers arranged corresponding to respective bit line pairs BLP for amplifying data from the corresponding ALU 34 of the group of arithmetic logic units 32 and transferring the same to the corresponding bit line pair BLP.

The sense amplifier group 40 and the write driver group 42 form a transfer circuit between the bit lines (data transfer lines) and ALUs 34, enabling bi-directional data transfer between the memory mat and the ALUs.

For the sense amplifier group 40 and the write driver group 42, an input/output circuit 48 is provided, and data is transferred to and from internal data bus 12 shown in FIG. 1. The manner of data input/output of input/output circuit 48 is appropriately determined in consideration of the number of entries and the data bit width.

For the group of arithmetic logic units 32, a switch circuit 44 is further provided. Switch circuit 44 sets interconnection path among ALUs 34 based on a control signal from controller 21 shown in FIG. 1. Therefore, as in a barrel shifter, data transfer becomes possible not only between neighboring ALUs but also between ALUs physically separated by a distance. Switch circuit 44 for interconnecting ALUs may be implemented, for example, by a cross bar switch employing an FPGA (Field Programmable Gate Array).

Alternatively, as switch circuit 44, a structure that performs shifting of a plurality of bits in one machine cycle, such as a barrel shifter, may be used.

FIG. 6 does not explicitly show inter-block data bus 16 of FIG. 1. Inter-block data bus 16 may be connected to switch circuit 44 for interconnecting ALUs, or it may be connected to an internal data transfer bus between input/output circuit 48 and groups 40 and 42 of sense amplifiers and write drivers.

ALU 34 in the group of arithmetic logic units 32 has its timings and contents for arithmetic/logic operation determined in accordance with a control signal from controller 21.

Figure 7:
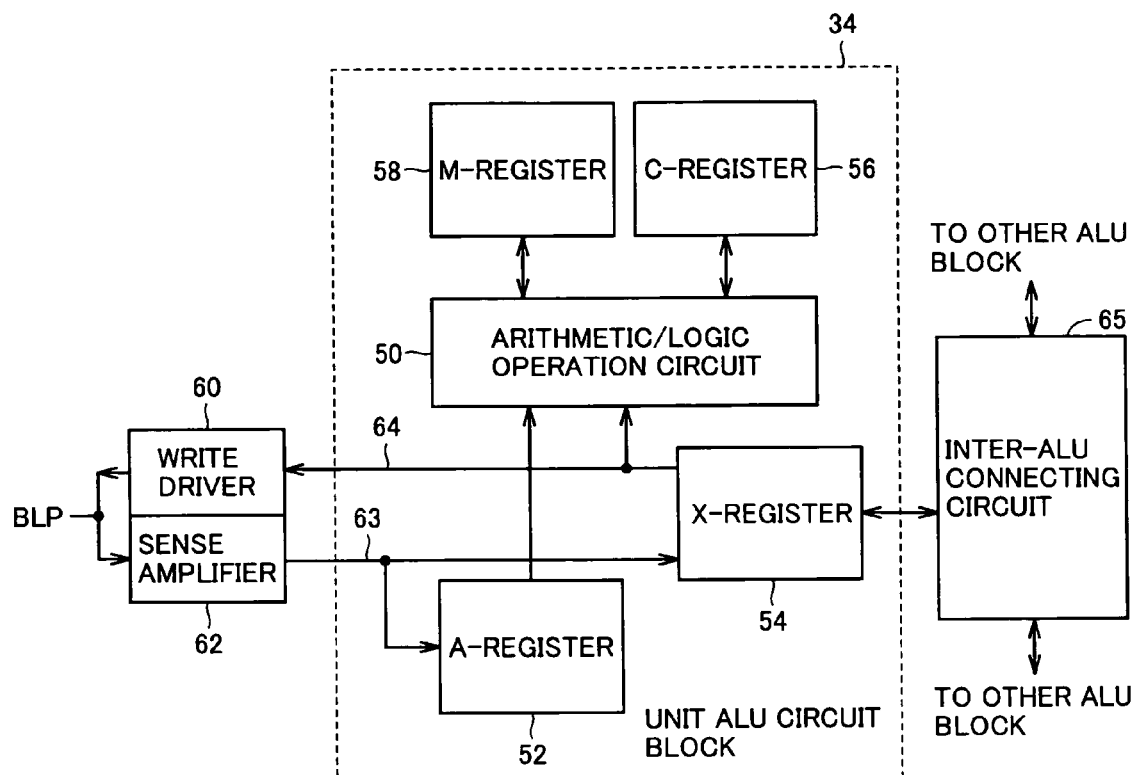
FIG. 7 schematically shows a configuration of an ALU included in the group of ALUs shown in FIG. 6.

FIG. 7 shows an exemplary configuration of one ALU. Referring to FIG. 7, ALU 34 includes: arithmetic/logic operation circuit 50 performing a designated arithmetic/logic operation; an A-register 52 temporarily storing data read from the corresponding entry; an X-register 54 temporarily storing data read from the corresponding entry, data representing result of arithmetic/logic operation by arithmetic/logic operation circuit 50 or data to be transferred to the write driver; a C-register 56 storing a carry or a borrow at the time of addition or subtraction; and an M-register 58 storing mask data designating prohibition of an arithmetic/logic operation by arithmetic/logic operation circuit 50.

The sense amplifier group 40 and the write driver group 42 include, as basic circuits forming a unit component, a sense amplifier 62 and a write driver 60 provided corresponding to the bit line pair BLP. Sense amplifier 62 amplifies the data read from the memory cell of the corresponding entry, and transfers the amplified data to A-register 52 or X-register 54 through internal data transfer line 63. Write driver 60 buffers the data stored in X-register 54 and writes to the memory cell of the corresponding entry through corresponding bit line pair BLP.

Arithmetic/logic operation circuit 50 can execute operations including addition (ADD), logical product (AND), logical sum (OR), exclusive OR (EXOR), inversion (NOT) and the like, and the contents of operation are set by a control signal (not shown in FIG. 7) from the controller. When the mask data stored in M-register 58 is "0", the arithmetic/logic operation of ALU 34 is stopped, and when it is "1", the arithmetic/logic operation of ALU 34 is enabled. By utilizing the operation masking function, it becomes possible to execute arithmetic operations on effective entries only, where not all entries are used. Thus, accurate processing can be done, and as unnecessary operation is stopped, power consumption can be reduced.

X-register 54 is further connected to other ALUs through an inter-ALU connecting circuit 65 included in switch circuit 44 for connecting ALUs with each other. Inter-ALU connecting circuit 65 is formed by a switch circuit such as an FPGA cell, and used for transferring data to any ALU 34 included in the group of arithmetic logic units 32. By the transfer function of inter-ALU connecting circuit 65, arithmetic/logic operation of data stored in various physical positions in the memory mat becomes possible, and the degree of freedom in arithmetic/logic operation is increased.

Inter-ALU connecting circuit 65 may be formed, for example, by a switch matrix, and when the area of occupation poses a problem, the path among ALUs allowing transfer may be limited. By way of example, m entries may be divided into groups of a plurality of blocks, and the transfer path of inter-ALU connecting circuit 65 may be limited to allow data transfer only among the groups.

FIG. 8 shows an operation sequence of ALU 34 shown in FIG. 7. FIG. 8 shows an example in which a two term addition "a+b" is executed using a 1-bit adder.

First, in machine cycle (k−1), a bit "1" is set in M-register 58 to designate execution of arithmetic operation, and C-register 56 is cleared to "0" for initialization.

In machine cycle k, data bit $a[i]$ is read from the memory mat, transferred through sense amplifier 62 to X-register 54 and stored therein. The value stored in X-register 54 is made valid in the next machine cycle (k+1).

In machine cycle (k+1), data bit $b[i]$ is read from memory mat 30, transferred to A-register 52 and stored therein.

In machine cycle (k+2), data bits $a[i]$ and $b[i]$ are in definite states, so that the arithmetic/logic operation is executed by ALU 34. In machine cycle (k+3), the result of arithmetic/logic operation (result of addition) $c[i]$ is written through write driver 60. In ALU 34, the result of addition $a[i]+b[i]$ has been fixed and whether there is a carry $C[i]$ or not has also been fixed in machine cycle (k+2). Therefore in machine cycle (k+3), it is possible to write the result of addition in bit $c[i]$ of the memory mat from X-register 54 of ALU 34 through write driver 60. Carry $C[i]$ is stored in C-register 56, and writing thereof does not take place.

In the next machine cycle (k+4), the next higher data bit $a[i+1]$ is read and transferred to ALU 34, and in the next machine cycle (K+5), the data bit stored in X-register 54 is made valid as bit $a[i+1]$. In this machine cycle (k+5), bit $b[i+1]$ is read in memory mat 30. At this time, bit transfer from the memory mat to A-register 52 of ALU 34 is in progress, while in A-register 52 (FIG. 7), data bit $b[i]$ read in the previous machine cycle (k+1) has been stored (in machine cycle (k+5), A-register 52 is rewritten, and the stored data is made definite in machine cycle (k+6)).

In machine cycle (K+6), the data bits stored in A-register 52 and X-register 54 have been definite, and the arithmetic/logic operation (addition) is executed on these bits. In the next machine cycle (k+7), the result of addition $a[i+1]+b[i+1]$ is written to the position of bit $c[i+1]$. Further, the carry $C[i+1]$ is stored in the C-register. By repeating the series of operations on all bits of data words a and b of the corresponding entry, addition of data words a and b is achieved. After the result of addition of last bits is written, carry C stored in the C-register is written to the most significant bit position in the storage area of data word c.

When a word line WL is selected in memory mat 30, row decoder 46 shown in FIG. 6 stores starting points of storage areas of each bit of data words a, b and c as pointer values of register group. By incrementing the pointer value in every machine cycle, addition and storage of the result of addition starting from a lower bit to a higher bit can be achieved.

Figure 9:
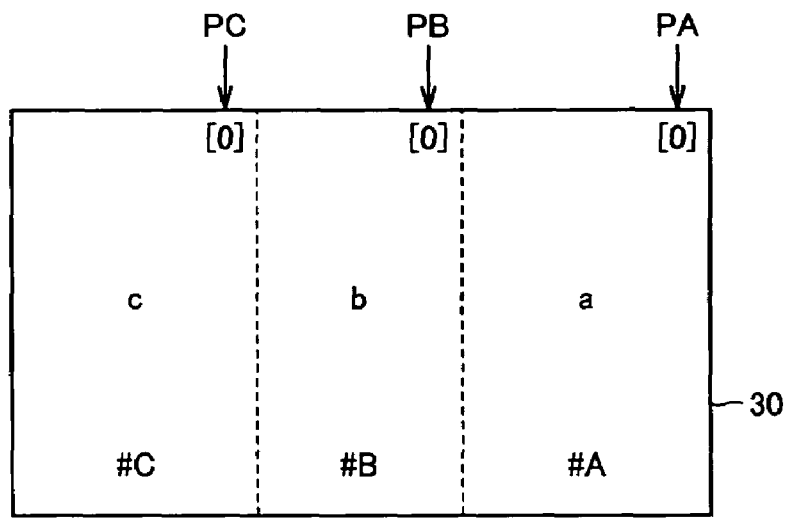
FIG. 9 schematically shows a pointer designating an address area of the semiconductor processing device in accordance with Embodiment 1 of the present invention.

As shown in FIG. 9, in an area #A for string data word a, an area #B for storing data word b and an area #C for string word c of operation result of memory mat 30, the positions of the least significant bit [0] are designated by pointers PA, PB and PC, respectively. In each machine cycle, these pointers are successively activated, and after the arithmetic/logic operation for 1 bit data is completed, the pointer values are incremented. Here, if the bit width of areas #A and #B are determined in advance, addition values corresponding to the bit width of data areas #A and #B may be used as pointers PB and PC, based on pointer PA. These pointers PA to PC are stored in the group of registers 22 shown in FIG. 1, and reapplied to row decoder 46 shown in FIG. 6.

By setting pointers PA to PC in the register group and applying the same to the row decoder in each machine cycle successively, the area for storing a data word in memory mat 30 can be set, in accordance with the bit width of the data word to be processed.

A counter circuit may be used for generating pointers PA to PC, or values stored in the register may be updated by controller 21 (see FIG. 1).

As described above, according to Embodiment 1 of the present invention, the memory mat is divided into a plurality of entries, an arithmetic logic unit is provided for each entry, and the arithmetic logic units perform arithmetic/logic operation in parallel in bit-serial manner, so that a large amount of data can be processed in parallel, and thus, a processor capable of high speed arithmetic/logic operation regardless of data bit width is achieved.

Embodiment 2

Figure 10:
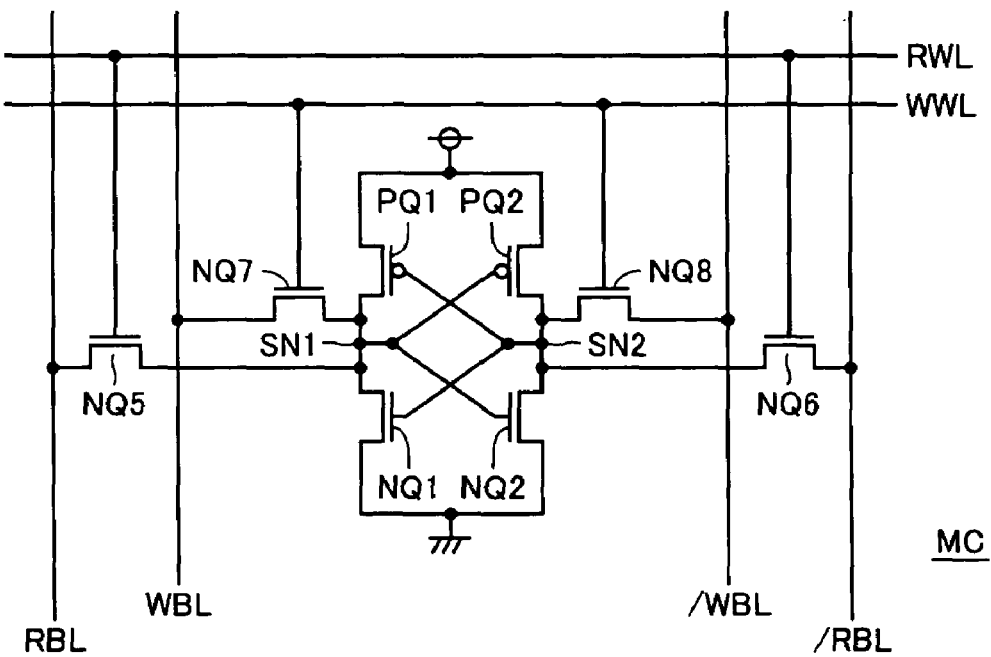
FIG. 10 shows an exemplary structure of a memory cell used in a semiconductor processing device in accordance with Embodiment 2 of the present invention.

FIG. 10 shows a structure of a memory cell MC of the memory mat in accordance with Embodiment 2 of the present invention. Referring to FIG. 10, memory cell MC is a dual port memory cell having a write port and a read port provided separately. For the memory cell MC, a read word line RWL and a write word line WWL, as well as read bit lines RBL and /RBL and write bit lines WBL and /WBL are provided. The read port includes N channel MOS transistors NQ5 and NQ6 connecting storage nodes SN1 and SN2 to read bit lines RBL and /RBL, respectively, in response to a signal potential of read word line RWL. The write port includes N channel MOS transistors NQ7 and NQ8 connecting storage nodes SN1 and SN2 to write bit lines WBL and /WBL, respectively, in response to a signal potential of read word line WWL.

A data storage portion of memory cell MC includes load P channel MOS transistors PQ1 and PQ2 as well as driving N channel MOS transistors NQ1 and NQ2.

By using the dual port memory cell structure as shown in FIG. 10, reading and writing can be done concurrently, when arithmetic/logic operation of data is performed in bit-serial manner. Here, the region to which the result of arithmetic/logic operation is written is provided separately from the region storing the data to be processed. Therefore in these memory cells, there is no conflict between the write data and the read data, and hence, the problem of arbitration experienced in a common multi-port memory does not occur.

Figure 11:
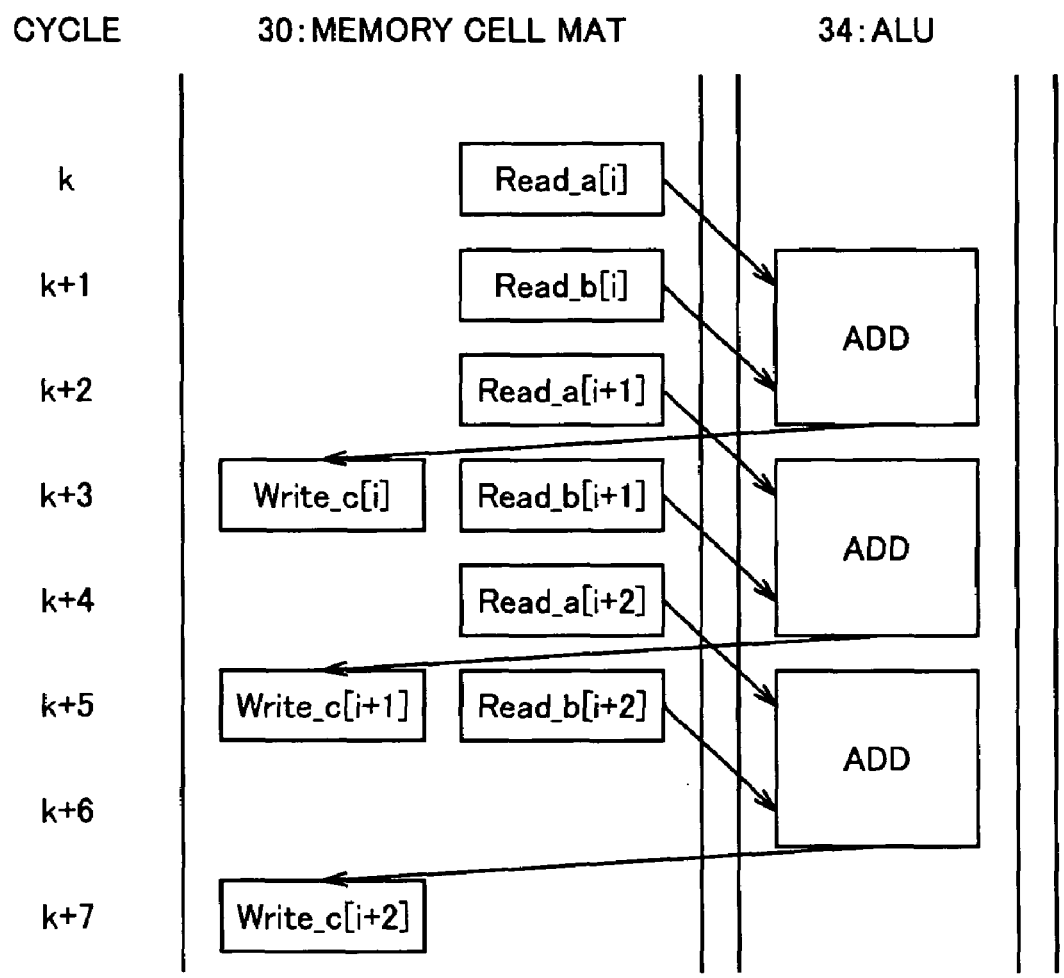
FIG. 11 shows internal timings in an arithmetic/logic operation of the semiconductor processing device in accordance with Embodiment 2 of the present invention.

FIG. 11 shows an example of internal timings in an arithmetic/logic operation in accordance with Embodiment 2 of the present invention. In the following, an arithmetic/logic operation utilizing a 1-bit adder, similar to Embodiment 1 above, will be described with reference to FIG. 11. The configurations of ALUs and memory mat entries are the same as those of Embodiment 1. Therefore, in Embodiment 2 also, the memory mat is divided into entries corresponding to respective columns, and an ALU 34 is provided corresponding to each entry.

In machine cycle k, a data bit a[i] is read (Read). In the reading operation, a read word line RWL corresponding to the data bit a[i] is driven to a selected state, and storage nodes SN1 and SN2 are coupled to read bit lines RBL and /RBL, so that data bit a[i] is read.

In the next machine cycle (k+1), the next data bit b[i] is read, and applied to an adder (ADD) of the corresponding ALU 34. In ALU 34, arithmetic/logic operation is performed in machine cycle (k+2), and the data c[i] of the result of arithmetic/logic operation is stored in a result register, that is, X-register 54.

In machine cycle (k+2), the next data bit a[i+1] is read from the memory mat and transferred to the ALU through read bit lines RBL and /RBL.

In machine cycle (k+3), the result of arithmetic/logic operation (a[i]+b[i]) produced in machine cycle (k+2) is written to the position of bit c[i] of the memory mat (Write). In this writing operation, a write word line WWL corresponding to the bit c[i] is driven to the selected state, MOS transistors NQ7 and NQ8 of the write port are rendered conductive, storage nodes SN1 and SN2 are connected to write bit lines WBL and /WBL, and the data bit from the corresponding write driver is stored.

In this machine cycle (k+3), reading of data bit b[i+1] is performed in parallel, and the read data bit b[i+1] is transferred to ALU 34 through read bit lines RBL and /RBL.

In machine cycle (k+4), addition of bits a[i+1] and b[i+1] is performed by the ALU. In this machine cycle (k+4), concurrently with the addition (arithmetic operation), bit a[i+2] is read from the memory mat and transferred to the ALU.

In machine cycle (k+5), the result of operation a[i+1]+b[i+1] that was made definite in machine cycle (k+4) is transferred from the corresponding write driver to bit c[i+1] through the write bit lines, and written to the corresponding memory cell through the write port.

Further, in machine cycle (k+5), in parallel with the writing, bit b[i+2] as the object of the next arithmetic/logic operation is read and transferred to ALU 34. In machine cycle (k+5), an addition is performed in the ALU, and the result is written to the position of bit c[i+2] of the memory mat in machine cycle (k+6).

As described above, when a dual port memory is used, in the writing and reading operations, data bits are transferred through different paths, that is, read bit lines and write bit lines. Therefore, data transfer of write data and read data can be done in parallel. Data is written once in two cycles, and in each data machine cycle, the bit as the object of arithmetic/logic operation can be read. As the writing and reading are performed in parallel, the number of cycles necessary for 1-bit addition operation can be reduced to two cycles. As for the arithmetic/logic operation (addition) of data words having the data width of N bits, addition can be done in 2×N cycles. Namely, operation performance (speed of processing) twice as high as that of Embodiment 1 requiring 4×N cycles can be attained. Consequently, even when addition is done in the bit-serial manner, high speed processing is possible.

In parallel with the execution of addition, the data bit to be processed next is transferred. Therefore, it is preferable to implement a register for storing the result of arithmetic/logic operation and a register for storing the first transferred data bit (a[i]) to be processed by separate register circuits, so as to prevent conflict of data. By way of example, in the configuration of ALU 34, the first transferred bit a[i]) may be stored in A-register 52, and the result of addition may be stored in X-register 54 and transferred through the write driver, so that conflict of the next data bit a[i+1] and the result of addition a[i]+b[i] can be prevented.

Figure 12:
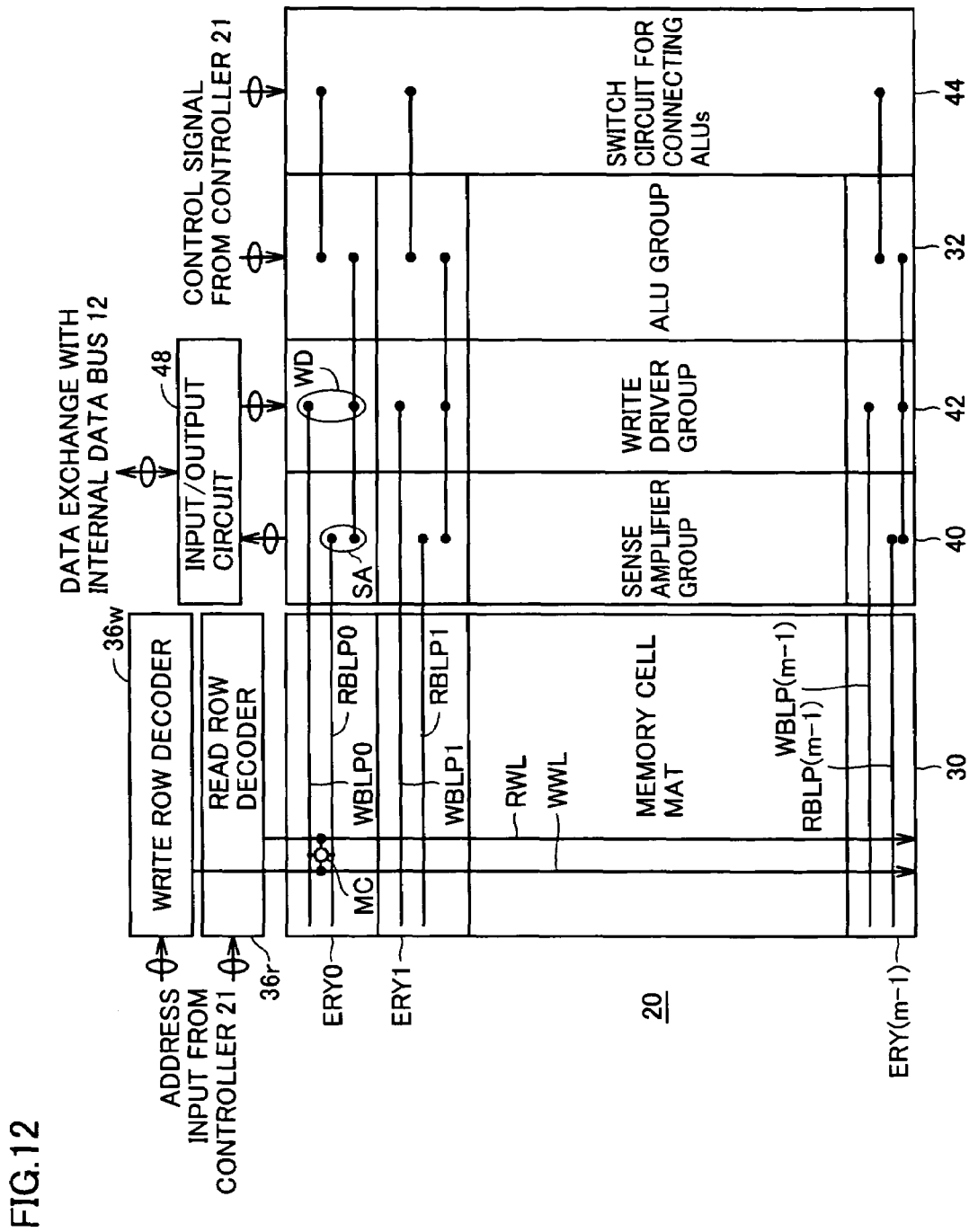
FIG. 12 more specifically shows a configuration of main processing circuitry of the semiconductor processing device in accordance with Embodiment 2 of the present invention.

FIG. 12 schematically shows a configuration of main processing circuitry 20 in accordance with Embodiment 2. In the configuration of main processing circuitry 20 shown in FIG. 12 also, in memory mat 30, memory cells MC, each implemented by a dual port SRAM cell, are arranged in a matrix of rows and columns. Corresponding to each row of memory cells MC, a write word line WWL and a read word line RWL are arranged. Corresponding to each column of memory cells MC, a write bit line pair WBLP and a read bit line pair RBLP are arranged. Each column of memory cells MC is used as an entry ERY. Here, write bit line pair WBLP consists of write bit lines WBL and /WBL, while read bit line pair RBLP consists of read bit lines RBL and /RBL.

The sense amplifier group 40, write driver group 42, group of arithmetic logic units 32, switch circuit 44 for interconnecting ALUs and input/output circuit 48 are the same as those of Embodiment 1.

Sense amplifier group 40 includes sense amplifiers SA provided corresponding to entries ERY0 to ERY(m−1), respectively. Sense amplifier SA is connected to the read bit line pair RBLP of the corresponding entry, and coupled to the corresponding ALU of the group of arithmetic logic units 32.

Write driver group 42 includes write drivers WD arranged corresponding to entries ERY0 to ERY(m−1), respectively. Write driver WD is connected to the write bit line pair WBLP of the corresponding entry. Write driver WD is coupled to the corresponding ALU, and transfers the data of the result of arithmetic/logic operation to the corresponding write bit line pair WBLP.

The read word line RWL and the write word line WWL are provided separately, and therefore, a write row decoder 36w selecting a write word line WWL and a read row decoder 36r selecting a read word line RWL are provided separately as row decoders. Row decoders 36w and 36r are selectively activated in accordance with a control signal or an address signal applied from controller 21 shown in FIG. 1, and drives the designated word lines RWL and WWL to the selected state. Though not explicitly shown in FIG. 12, the addresses to row decoders 36w and 36r are generated utilizing a pointer, as in Embodiment 1.

In the configuration of main processing circuitry 20 in accordance with Embodiment 2 shown in FIG. 12, memory cells MC in memory mat 30 are implemented by dual port memory cells, read bit line pairs and write bit line pairs are provided as internal data transfer lines for writing and reading respectively, and row decoders for selecting word lines for reading and writing are provided separately. Except for these points, the shown configuration is the same as that of Embodiment 1. Write row decoder 36w is activated once in two machine cycles in an addition using a 1-bit adder, while read row decoder 36r is activated in every cycle.

As described above, according to Embodiment 2 of the present invention, memory cells are formed by dual port memory cells, and simultaneous, parallel transfer of write data and read data between the arithmetic logic unit and the memory mat is made possible. Thus, the time for arithmetic/logic operation can be reduced.

Embodiment 3

Figure 13:
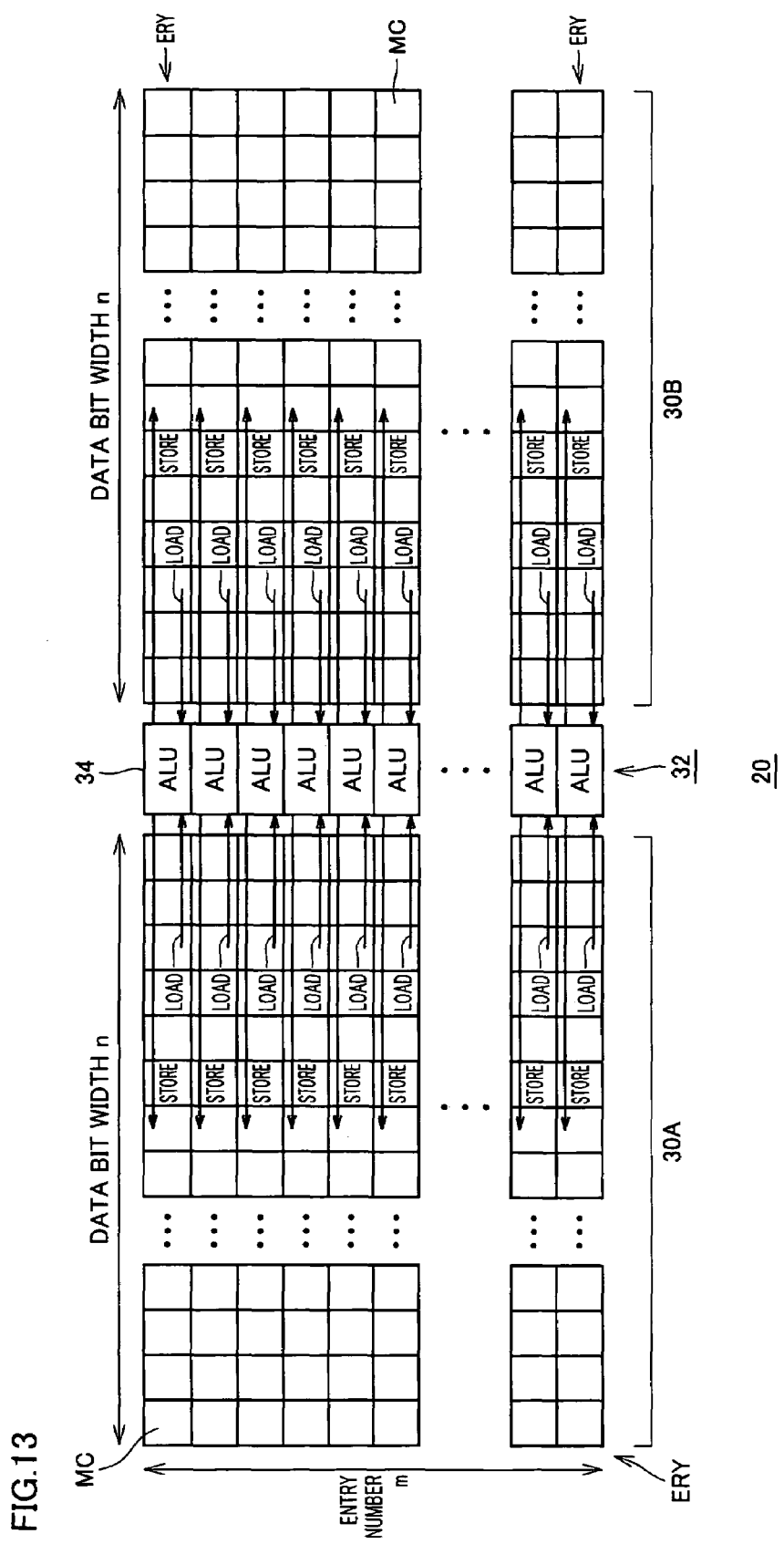
FIG. 13 schematically shows a configuration of a main processing circuitry of a semiconductor processing device in accordance with Embodiment 3 of the present invention.

FIG. 13 schematically shows a configuration of a main portion of main processing circuitry 20 in accordance with Embodiment 3 of the present invention. In main processing circuitry 20 shown in FIG. 13, memory mats 30A and 30B are arranged on both sides of the group of arithmetic logic units 32. Memory mats 30A and 30B are of the same structure, each having m entries ERY of which data width is n bits. Between each entry of memory mats 30A and 30B, ALU 34 of the group of arithmetic logic units 32 is arranged. ALU 34 performs a designated arithmetic/logic operation on the data of the corresponding entries of memory mats 30A and 30B. When each ALU 34 is to perform a two term operation, data to be processed for each term are stored in memory mats 30A and 30B, and the result of operation is stored in one of memory mats 30A and 30B. Therefore, in memory mats 30A and 30B, the amount of data to be stored can be reduced as compared with a configuration utilizing only one memory mat. The total size (bit width) of entries of memory mats 30A and 30B may be made substantially the same as the size (bit width) of entries of memory mat 30 of Embodiment 1 or 2. The memory cell is implemented by a dual port memory cell, as in Embodiment 2.

Figure 14:
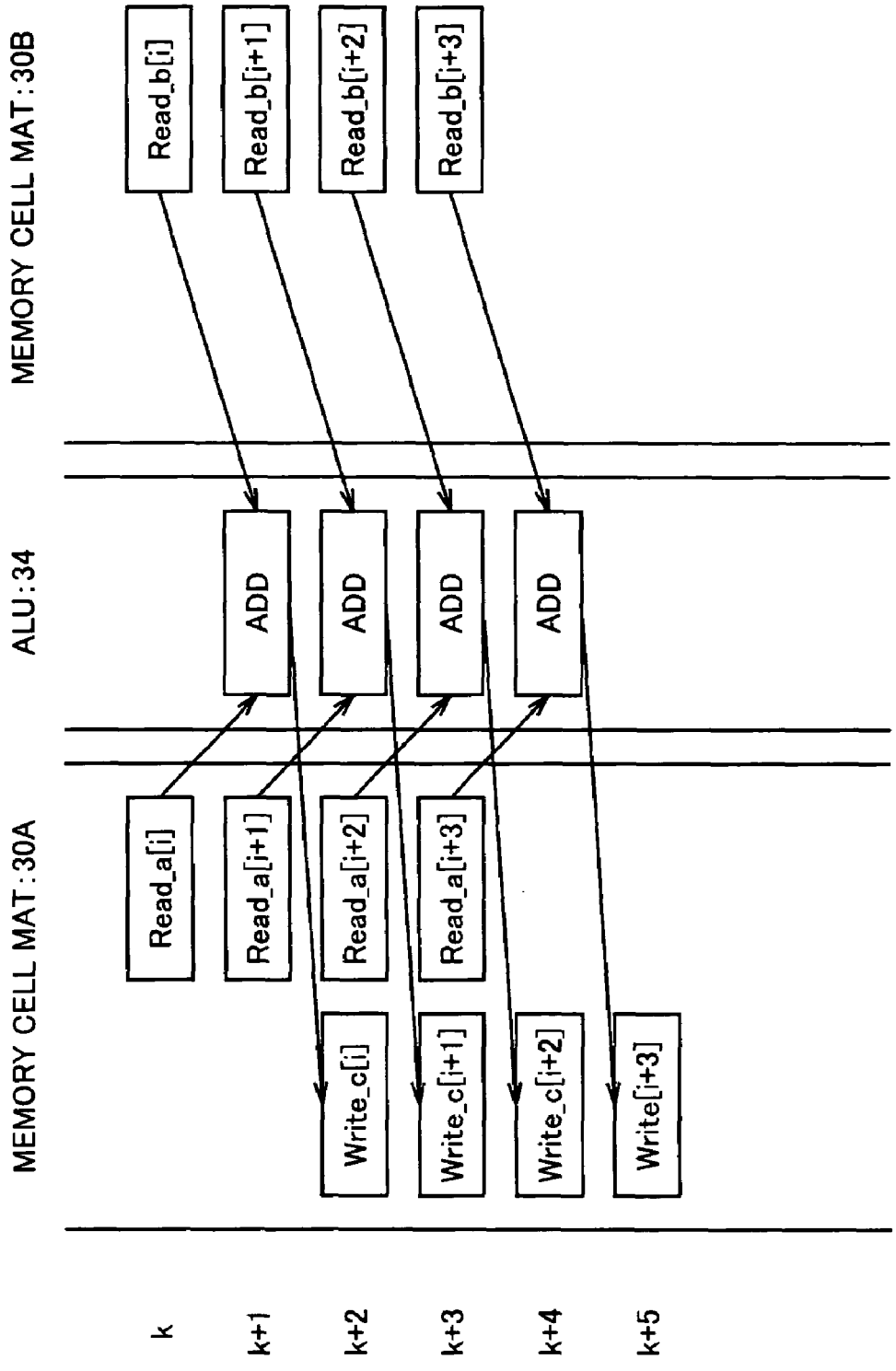
FIG. 14 shows internal timings in an arithmetic/logic operation of a main processing circuitry shown in FIG. 13.

FIG. 14 shows internal timings of an operation sequence of main processing circuitry 20 in accordance with Embodiment 3 of the present invention. In the following, the arithmetic/logic operation performed by main processing circuitry 20 shown in FIG. 13 will be described.

In memory mats 30A and 30B, sets of data words a and b to be processed are stored in corresponding entries, respectively. In machine cycle k, corresponding data bits a[i] and b[i] are read from memory mats 30A and 30B.

In machine cycle (k+1), an ADD operation (addition) on data bits a[i] and b[i] is performed by the ALU. In memory mats 30A and 30B, the memory cell is implemented by a dual port memory cell, and the result of arithmetic/logic operation is stored in machine cycle (k+2) to bit c[i] of memory mat 30A. In machine cycle (k+1), the next data bits a[i+1] and b[i+1] are read and applied to the corresponding ALU, and in machine cycle (k+2), in parallel with transfer of the write data (data of the result of operation) to bit c[i], an addition is performed on the set of data bits to be processed next.

In machine cycle (k+2), data bits a[i+2] and b[i+2] to be processed next are read and transferred to ALU 34.

In machine cycle (k+3), the result of arithmetic/logic operation done by ALU 34 in machine cycle (k+2) is fixed, and hence, the data of the result of operation is written to the corresponding memory bit c[i+1]. In machine cycle (k+3), still further data bits a[i+3] and b[i+3] are read and transferred to ALU 34.

In this manner, data words of each term of two term operation are stored in corresponding entries of memory mats 30A and 30B and the corresponding data bits are read from memory mats 30A and 30B and transferred to the ALU in the same machine cycle, whereby data can be written in each machine cycle. Therefore, when data words having the data width of N bits are to be added, the arithmetic/logic operation can be completed in N machine cycles, and thus, the speed of operation (speed of processing) can further be improved.

Figure 15:
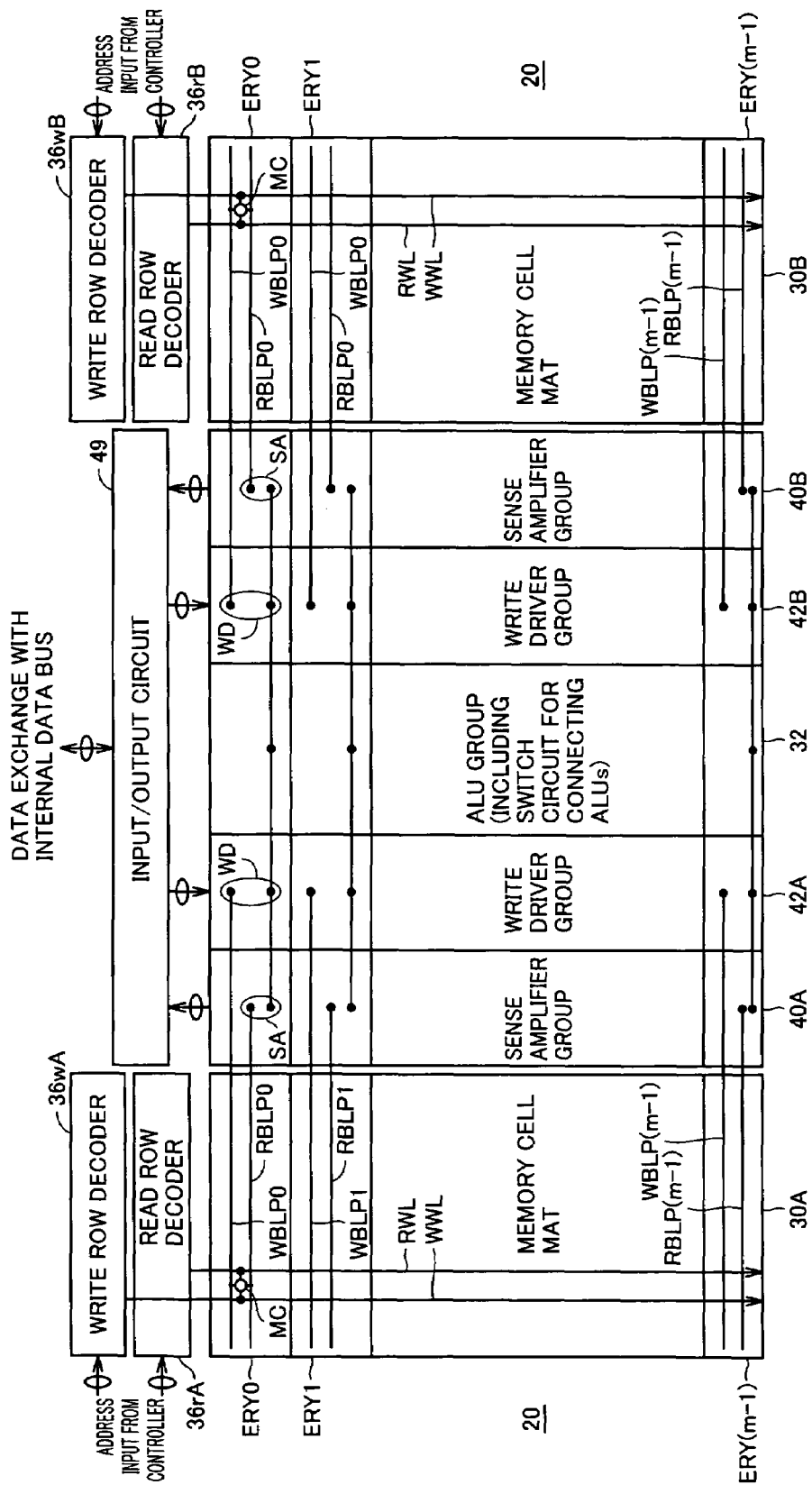
FIG. 15 more specifically shows a configuration of the main processing circuitry in accordance with Embodiment 3 of the present invention.

FIG. 15 more specifically shows the configuration of main processing circuitry 20 according to Embodiment 3. In memory mats 30A and 30B, memory cells MC are implemented by dual port memory cells as in the memory cell structure of Embodiment 2 above, write word lines WWL and read word lines RWL are provided corresponding to memory cells aligned in the row direction and write bit line pairs WBLP and read bit line pairs RBLP are provided corresponding to the memory cells aligned along the column direction. These memory mats 30A and 30B each have m entries ERY0 to ERY(m−1), and these entries are arranged correspondingly between memory mats 30A and 30B.

Though not explicitly shown in FIG. 15, between memory mats 30A and 30B, the group of arithmetic logic units 32 is provided. As in Embodiment 1 above, a switch circuit for interconnecting ALUs is arranged for the group of arithmetic logic units 32, enabling data transfer between ALUs physically distant from each other.

Between the group of arithmetic logic units 32 and memory mat 30A, a sense amplifier group 40A and a write driver group 42A are arranged, and between the group of arithmetic logic units 32 and memory mat 30B, a sense amplifier group 40B and a write driver group 42B are arranged.

Sense amplifier group 40A includes sense amplifiers SA arranged corresponding to read bit line pairs RBL (RBLP0-RBLP(m−1)) of memory mat 30A, respectively, and write driver group 42A includes write drivers WD arranged corresponding to write bit line pairs WELP (WELP0-WELP(m−1)) of memory mat 30A, respectively.

Similarly, sense amplifier group 40B includes sense amplifiers SA arranged corresponding to read bit line pairs RBL (RBLP0-RBLP(m−1)) of memory mat 30B, respectively, and write driver group 42B includes write drivers WD arranged corresponding to write bit line pairs WELP (WELP0-WELP(m−1)) of memory mat 30B, respectively.

For memory mat 30A, a read row decoder 36rA selecting a read word line RWL, and a write row decoder 36wA selecting write word line WWL are provided. For memory mat 30B, a read row decoder 36rB selecting a read word line RWL, and a write row decoder 36wB selecting write word line WWL are provided.

An input/output circuit 49 is provided for sense amplifier group 40A and write driver group 42A, as well as write driver group 42B and sense amplifier group 40B, for data transfer to and from the internal data bus (bus 12 of FIG. 1).

Different from Embodiment 1, input/output circuit 49 receives and transfers in parallel the data transferred to memory mats 30A and 30B. The data stored in memory mats 30A and 30B may have bit positions re-arranged by the unit of memory mat, or, alternatively, each of memory mats 30A and 30B may have a register circuit for serial/parallel conversion and parallel/serial conversion, and data writing and reading word line by word line may be performed between the register circuit and the memory mat to achieve data input/output with the outside. Other configuration may be utilized.

Write row decoders 36wA and 36wB and read row decoders 36rA and 36rB are the same as those of Embodiment 2. Read row decoders 36rA and 36rB drive the read word lines of the same bit position to the selected state in the same machine cycle. When the result of arithmetic/logic operation is to be stored in memory mat 30A, write row decoder 36wA is activated, and the corresponding write word line is driven to the selected state. Here, the write row decoder 36wB in memory mat 30B is kept in an inactive state.

As described above, according to Embodiment 3, two memory mats are arranged, the ALU group is positioned therebetween, and data sets to be processed are stored in respective memory mats, so that arithmetic/logic operation, data writing and data reading can be performed in every machine cycle, realizing high speed arithmetic operation.

Embodiment 4

Figure 16:
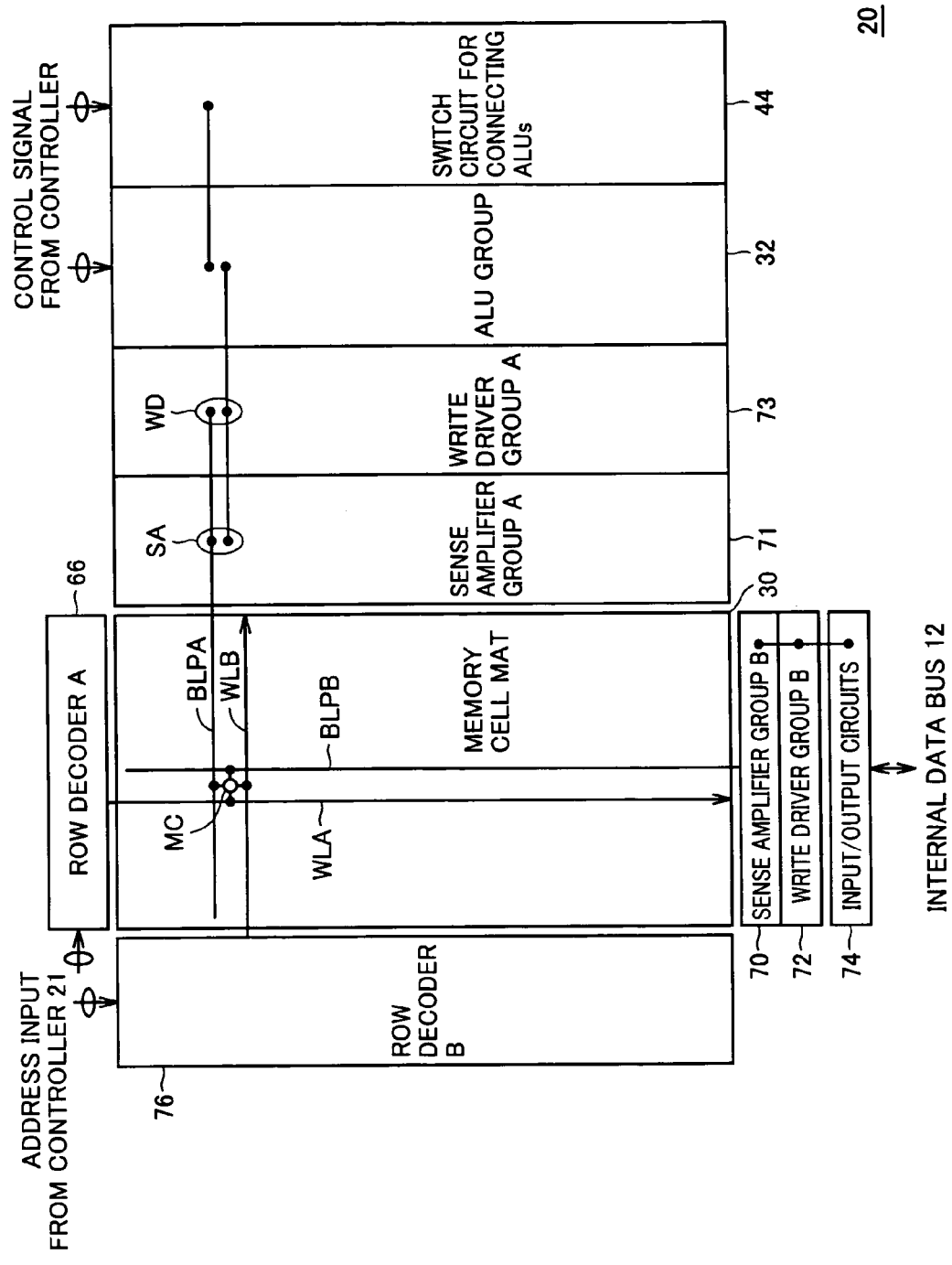
FIG. 16 schematically shows a configuration of the main processing circuitry in accordance with Embodiment 4 of the present invention.

FIG. 16 schematically shows a configuration of main processing circuitry 20 in accordance with Embodiment 4 of the present invention. Referring to FIG. 16, in memory mat 30, dual port memory cells MC are arranged in a matrix of rows and columns. In memory mat 30, word lines WLA and WLB are arranged in orthogonally intersecting directions with each other, and bit line pairs BLPA and BLPB are arranged in orthogonally intersecting directions with each other. Specifically, word line WLA and bit line pair BLPA are arranged parallel to each other, and word line WLB and bit line pair BLPB are arranged parallel to each other. For memory mat 30, a group of arithmetic logic units 32 for performing an arithmetic operation, a sense amplifier group A71 and write driver group A73 for transferring data between memory mat 30 and the group of arithmetic logic units 32, and a switch circuit 44 for interconnecting ALUs, that is, for switching data transfer path among ALUs of the group of arithmetic logic units (ALUs) 32 are provided.

In sense amplifier group A71, senses amplifiers SA are provided corresponding to the bit line pair BLPA, and in write driver group A73, word drivers WD are provided corresponding to the bit line pair BLPA. Therefore, in the group of arithmetic logic units (ALUs) 32, the bit line pair BLPA forms one entry, and one ALU is provided for one bit line pair BLPA.

For the bit line pair BLPB, an input/output circuit 74 is provided for transferring data among sense amplifier group B70, write driver group B72 and internal data bus 12 (see FIG. 1). Sense amplifier group 70, write driver group 72 and input/output circuit 74 are for data transfer through bit line pair BLPB between internal data bus 12 and memory mat 30. Therefore, sense amplifier group 70, write driver group 72 and input/output circuit 74 are adapted to have the same bit width as the bit width of one entry of memory mat (column decoder is not provided).

For word line WLA, a row decoder A66 is provided, and for word line WLB, row decoder B76 is provided. Row decoders A66 and B76 select word lines in accordance with an address applied from controller 21 shown in FIG. 1.

In the configuration of main processing circuitry 20 shown in FIG. 16, selection of a column of memory mat 30 is not required, and therefore, a column decoder is not provided.

Data is transferred entry by entry between internal data bus 12 and memory mat 30 (data is transferred in an entry-serial, bit-parallel manner), and at the time of executing an arithmetic/logic operation, data is transferred in bit-serial and entry parallel manner to the group of arithmetic logic units 32, and the arithmetic/logic operation is performed.

Specifically, in data transfer to and from internal data bus 12, a word line WLB is selected by row decoder B76, one entry is driven to the selected state, and data is transferred to and from internal data bus 12 in entry-serial and bit-parallel manner. At the time of executing an arithmetic/logic operation, to the group of arithmetic logic units 32, data of each entry is transferred in bit-serial manner, and the arithmetic/logic operation is performed in bit-serial and entry-parallel manner.

Therefore, data transfer to and from internal data bus 12 requires time corresponding to cycles same in number as the number of entries. For two term operation, it is unnecessary to store data in an area where the result of operation is stored. Here, "0" is simply stored in the result data writing region.

In input/output circuit 74, when data to be processed are received in word-serial manner from internal data bus 12, at input/output circuit 74, a structure may be used at a data input portion, which converts data word (data to be processed) input in word-serial manner to parallel data and writes the resulting data to corresponding entries through sense amplifier group 70. When transfer of only the data of the result of operation to internal data bus 12 is necessary, input/output circuit 74 may be adapted to output only the data in the operation result data area selectively to internal data bus 12 under the control of a control signal provided by controller 21, among the outputs of write driver group B72. Therefore, it is unnecessary to make bus width of internal data bus 12 equal to the bit width of the entry.

Figure 17:
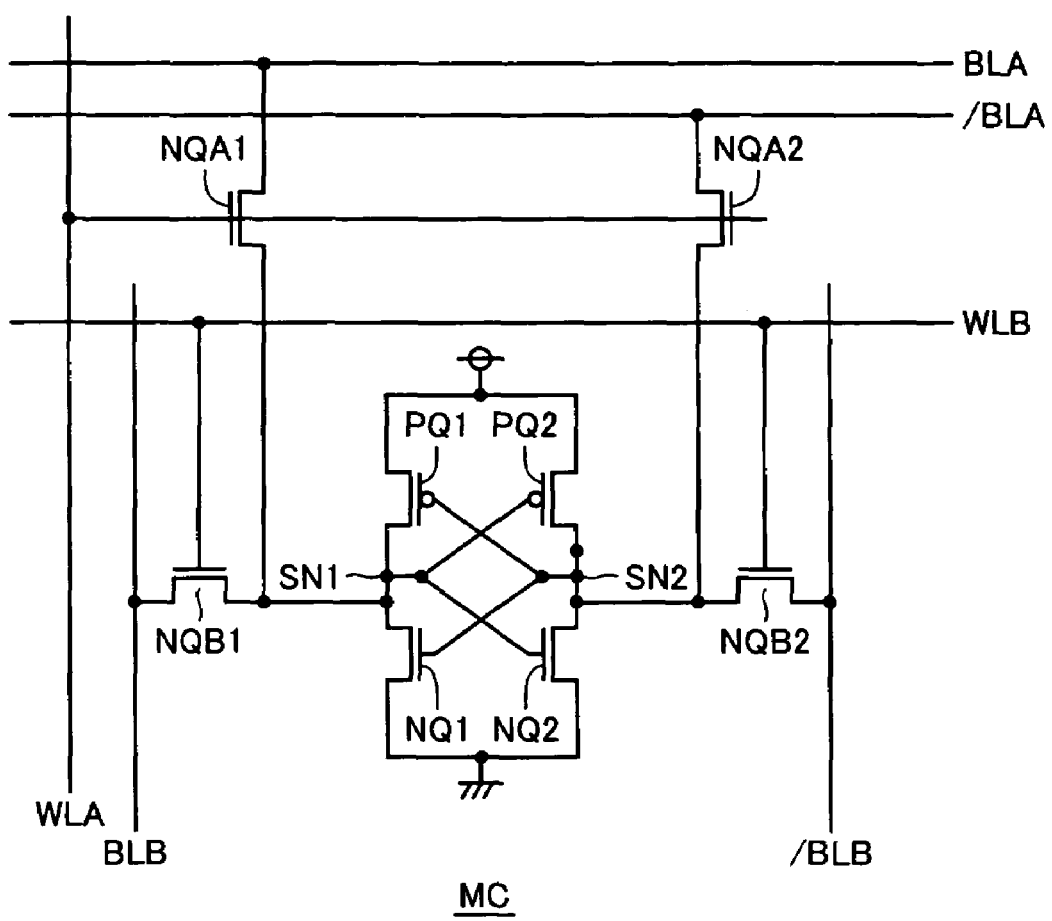
FIG. 17 shows an exemplary configuration of a memory cell shown in FIG. 16.

FIG. 17 shows an exemplary structure of memory cell MC shown in FIG. 16. Referring to FIG. 17, memory cell MC includes cross-coupled load P channel MOS transistors PQ1 and PQ2 and cross-coupled drive N channel MOS transistors NQ1 and NQ2, as a storage portion. Memory cell MC further includes N channel MOS transistors NQA1 and NQA2 connecting storage nodes SN1 and SN2 to bit lines BLA and /BLA in response to a signal on word line SLA, and N channel MOS transistors NQB1 and NQB2 connecting storage nodes SN1 and SN2 to bit lines BLB and /BLB in accordance with a signal potential on word line WLB.

Bit lines BLA and /BLA form a bit line pair BLPA, and bit lines BLB and /BLB form a bit line pair BLPB. Word line WLB is arranged parallel to bit lines BLA and /BLA, while word line WLA is arranged parallel to bit lines BLB and /BLB. Therefore, in memory mat 30, at the time of data writing and arithmetic operation, the direction of the matrix can be rotated by 90° to perform data transfer to the outside and data transfer for the arithmetic operation, and hence, time necessary for data transfer to and from internal data bus 12 can be reduced.

It is noted that bit line pair BLA and /BLA and bit lines BLB and /BLB intersect at right angle to each other, and word lines WLA and WLB intersect at right angle to each other. Here, by forming word lines WLA and WLB in different interconnecting layers, and forming bit lines BLB and /BLB and bit lines BLA and /BLA in different interconnecting layers, such orthogonal intersecting arrangements of bit lines and word lines can be achieved.

As described above, according to Embodiment 4, in memory mat 30, bit lines are arranged in orthogonally intersecting directions and two sets of word lines are arranged also in orthogonally intersecting directions. Thus, when data is to be transferred to internal data bus provided outside, the data can be transferred in entry-serial and bit-parallel manner. Thus, time necessary for data transfer between the internal data bus and the memory mat can be reduced and, as a result, high speed arithmetic/logic operation becomes possible.

Embodiment 5

Figure 18:
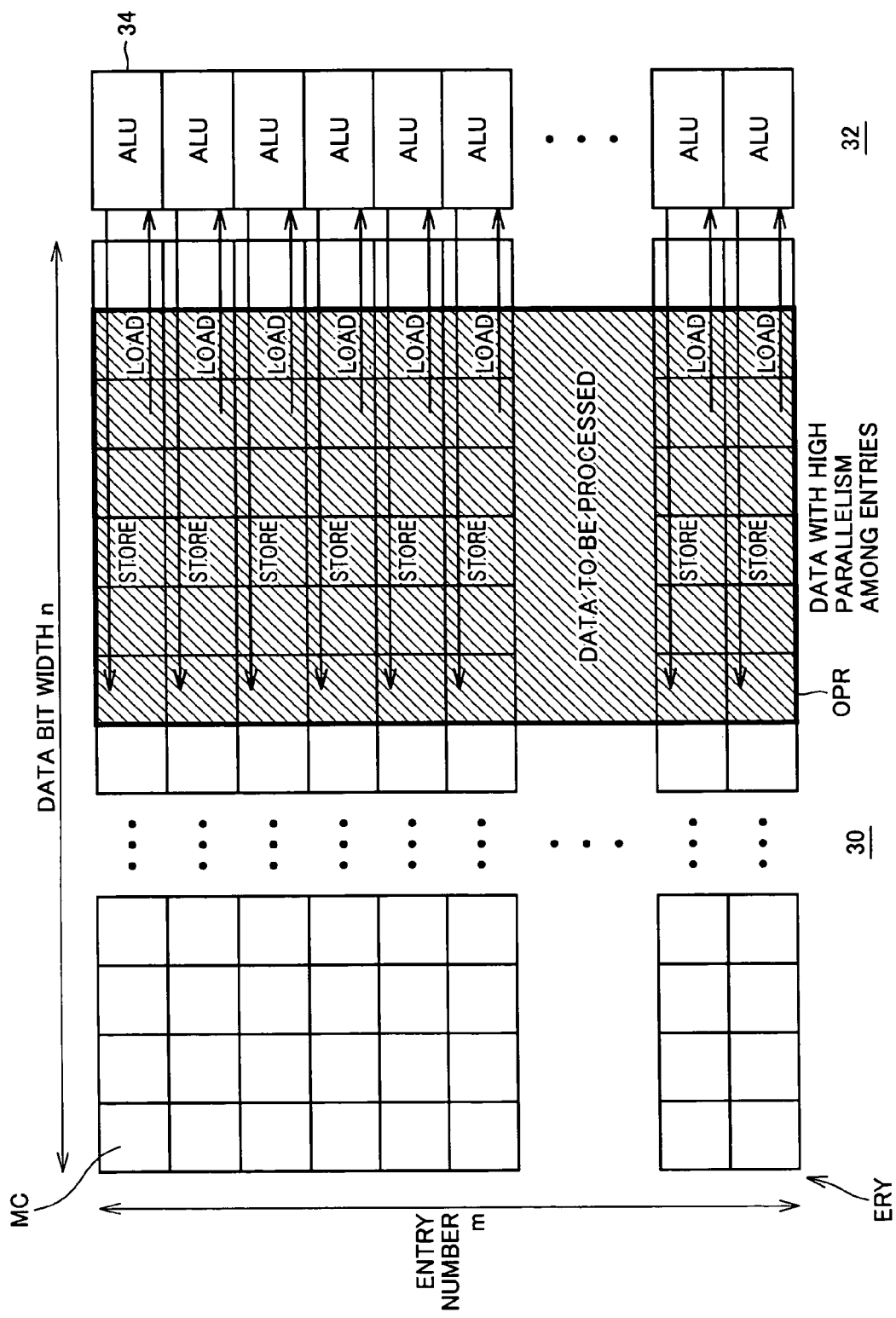
FIG. 18 schematically shows distribution of data as the object of arithmetic/logic operation in a memory mat in accordance with Embodiment 5 of the present invention.

FIG. 18 schematically shows an example of distribution of data to be processed by the processor in accordance with the present invention. Referring to FIG. 18, in memory mat 30, m entries ERY are arranged, with each entry ERY having data bit width of n bits. For each entry ERY, an ALU 34 is provided.

Assume that the data as the object of arithmetic/logic operation stored in object data area OPR are distributed only on a portion in the direction of data bit width of entries but over all entries ERY of memory mat 30. In such a case, high operation performance can be attained by performing the arithmetic/logic operation in the bit-serial and entry-parallel manner.

Figure 19:
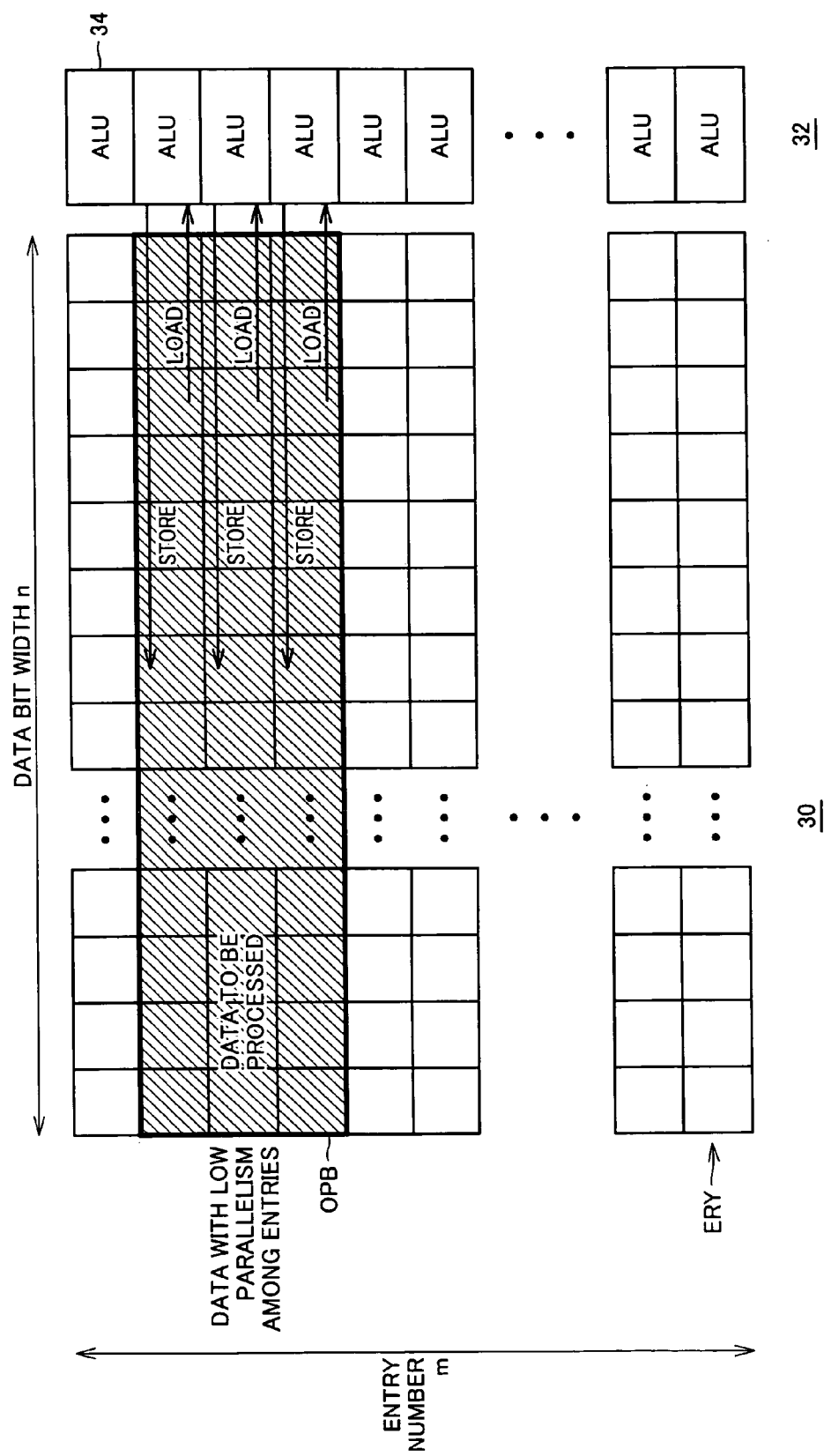
FIG. 19 schematically shows distribution of data as the object of arithmetic/logic operation in a memory mat of a semiconductor processing device in accordance with Embodiment 5 of the present invention.

Dependent on the contents of processing, however, the data to be processed might be distributed only in an area OPB across a small number of entries, as shown in FIG. 19. In FIG. 19, the object data area OPB is distributed over only three entries ERY, and in other entries, there is no data to be processed. In such a case, the bit-serial and entry-parallel operation would rather degrades the arithmetic/logic operation performance, as the data bit width n is larger than the number m of effective entries storing the data to be processed. It is important to implement a highly versatile processor to enable efficient and high-speed arithmetic/logic operation even on the data having low degree of parallelism among entries.

Figure 20:
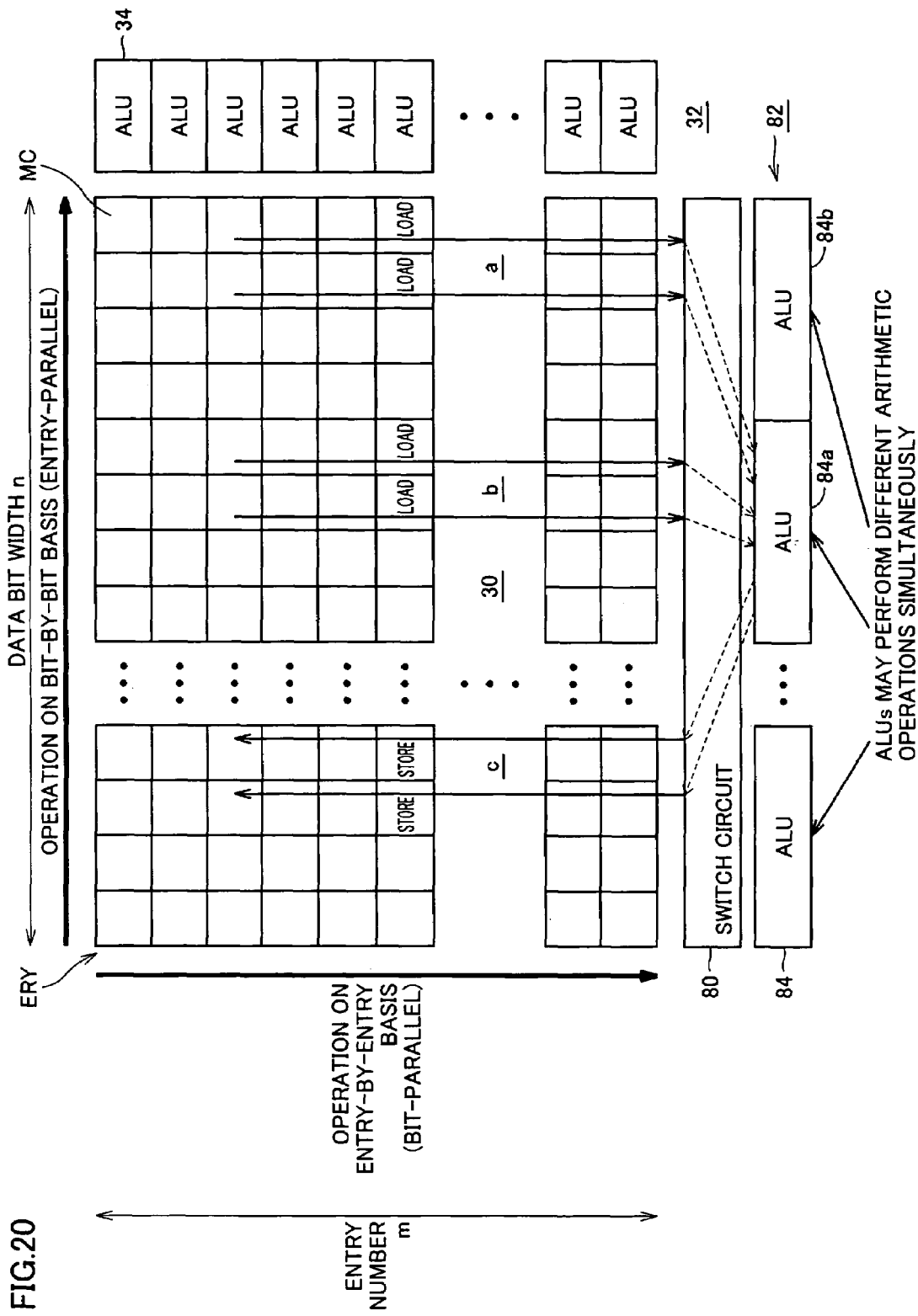
FIG. 20 schematically shows a configuration of a main portion of the main processing circuitry of the semiconductor processing device in accordance with Embodiment 5 of the present invention.

FIG. 20 schematically shows a configuration of the processor in accordance with Embodiment 5 of the present invention. Referring to FIG. 20, in memory mat 30, memory cells MC are arranged in a matrix of rows and columns, as in Embodiments 1 to 4 described above. Memory cells MC arranged in the horizontal direction in FIG. 20 form one entry ERY, and for each entry ERY, an ALU 34 is arranged in the group of arithmetic logic units 32.

For the memory cells in the vertical direction of this figure, a processor group 82 is arranged, with a switch circuit 80 interposed. In processor group 82, a plurality of ALUs 84 are arranged. Contents of arithmetic operations of these ALUs can be set one by one, so that a so-called MIMD Multi Instruction Multi Data Stream) operation can be achieved.

Switch circuit 80 connects a column of memory cells aligned in the column direction of memory mat 30 to ALU 84 in processor group 82, while switching the connection path. Switch circuit 80 is formed, for example, by a cross-bar switch of FPGA. Alternatively, switch 80 may be implemented by a switch matrix. Any structure that can selectively switch and establish connection path between a column of memory cells of memory mat 30 and ALU 84 in processor group 82 may be used as switch circuit 80.

In the configuration shown in FIG. 20, when an arithmetic/logic operation is to be performed on data having high degree of parallelism among entries, ALU 34 in the group of arithmetic logic units 32 arranged on the right side of memory mat 30 is used to perform the arithmetic/logic operation in the bit-serial and entry-parallel manner, to attain high performance of parallel processing.

On the other hand, when the data to be processed have low degree of parallelism and are distributed across a small number of entries, memory mat 30 is connected to ALU 84 executing the arithmetic/logic operation, through switch circuit 80.

Here, the arithmetic/logic operation is performed entry by entry in entry-serial, bit parallel manner. Therefore, when data a and b to be processed exist in entry ERY, the data a and b to be processed are read in parallel, coupled to the corresponding ALU 84 through switch circuit 80, the arithmetic/logic operation is done, and the result of operation is stored in the operation result storing area (c: not shown) of the corresponding entry ERY.

Use of switch circuit 80 allows free setting of the area for storing data to be processed and the area for storing the result of processing in each entry ERY. Further, as the number of entries is small, even when the arithmetic/logic operation is done in entry-serial manner, the time for processing is not much increased. Particularly, where memory mat 30 and processor group 82 are formed on a common chip, internal connection lines therebetween are provided as on-chip lines, and therefore, high speed data transfer is possible. Therefore, data can be transferred and processed at higher speed than in a configuration in which the memory mat and the processor ALU (84) are formed on separate chips.

Further, as the connection between the column of memory mat 30 and ALU 84 of processor group 82 is set by switch circuit 80, change in bit width of the data to be processed can readily be adapted to. By way of example, assuming a configuration in which ALU 84 performs an arithmetic/logic operation of 8 bits, in processor group 82. When 16-bit data are to be processed using this configuration, two neighboring ALUs 84 may be used to provide higher and lower bytes to bit ALUs, and the arithmetic/logic operation can be done. Thus, the configuration can readily handle data having different bit width. It is noted, however, that there is a carry propagation in an addition, and therefore, the carry must be propagated between neighboring ALUs. For this purpose, C-register 56 shown in FIG. 7 may be provided with a shifting function, so that the carry can be propagated in parallel operation of higher and lower bytes and addition can successively be completed.

In actual signal processing, the form of data to be processed much differs from application to application. Even in one specific application, the data form may vary process by process. Therefore, in accordance with the form of data to be processed, whether ALU 34 of arithmetic logic units 32 arranged on the right side of memory mat 30 or ALU 84 of processor group 82 arranged below memory mat 30 is to be used is dynamically switched under the control of controller 21 shown in FIG. 1. Thus, a processor having high arithmetic/logic operation performance regardless of the form of data to be processed is achieved.

It is noted that whether ALU 34 of arithmetic logic units 32 arranged on the right side of memory mat 30 or ALU 84 of processor group 82 arranged at lower side of memory mat 30 is to be used for data processing is switched by a control signal generated real-time in accordance with the contents of operation from controller 21 shown in FIG. 1. Here, switching (activation/inactivation) is merely made between the row decoders, sense amplifiers, write drivers and ALUs either on the right side or lower side of memory mat 30, and there is no overhead in time caused by the switching of the manner of operation. Therefore, the manner of operation can be switched and the arithmetic/logic operation can be executed continuously in time.

Figure 21:
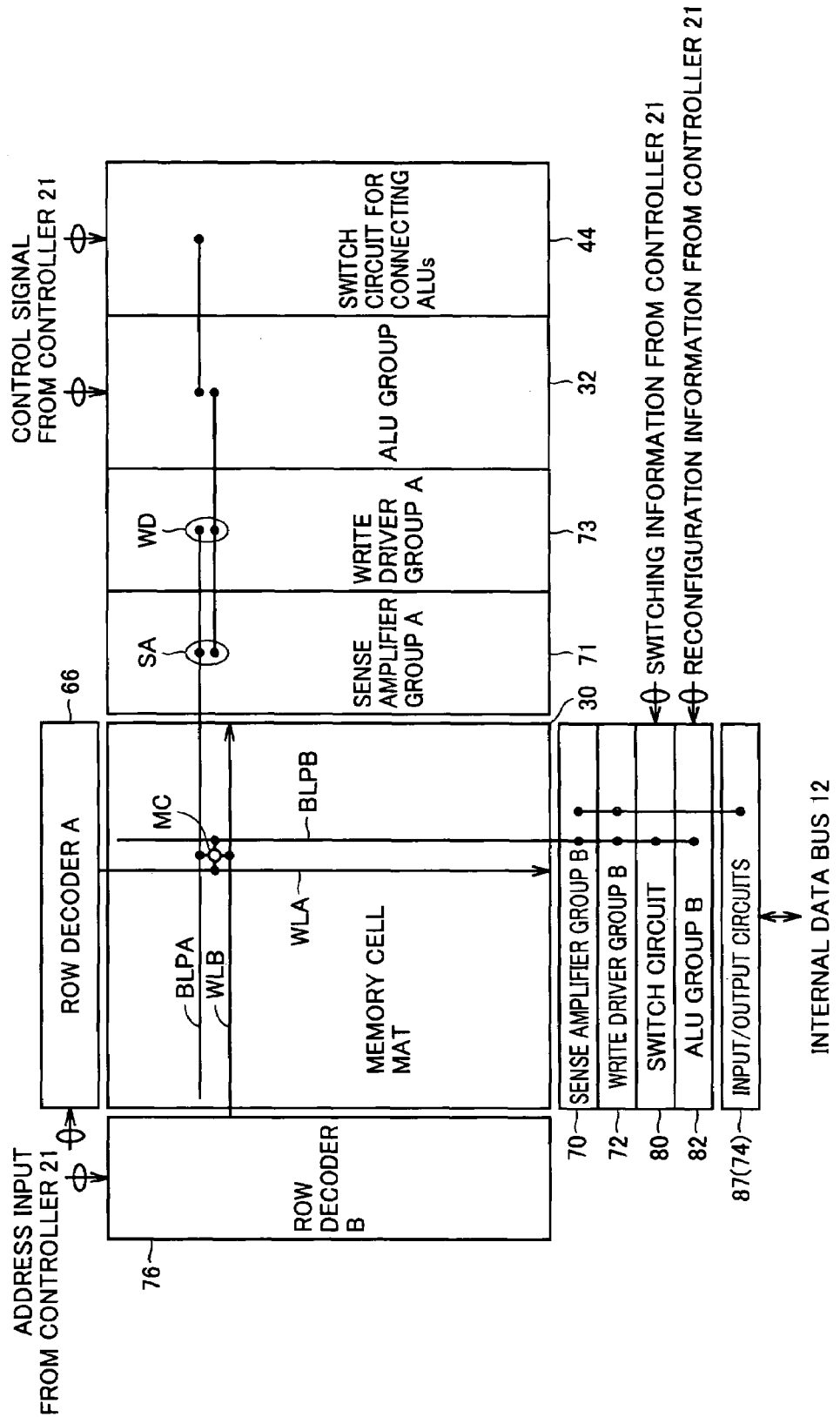
FIG. 21 more specifically shows the configuration of the main processing circuitry in accordance with Embodiment 5 of the present invention.

FIG. 21 more specifically shows the configuration of main processing circuitry 20 in accordance with Embodiment 5. Referring to FIG. 21, on the right side of memory mat 30, the group of arithmetic logic units 32 for performing the arithmetic/logic operation in entry-parallel manner is arranged, and on the lower side of memory mat 30, processor group (ALU group) 82 for performing the arithmetic/logic operation in the entry-serial and bit-parallel manner is arranged. Between the group of arithmetic logic units 32 and memory mat 30, sense amplifier group A71 and write driver group A73 are arranged, and between processor group 82 and memory mat 30, sense amplifier group B70 and write driver group B72 are arranged.

For the group of arithmetic logic units 32, switch 44 for interconnecting ALUs to enable transfer among ALUs is provided. Between processor group 82 and write driver group B72 and sense amplifier group B70, switch circuit 80 is provided. Sense amplifier group B70 and write driver group B72 are coupled to input/output circuit 87, and transfer data to and from internal data bus 12. Therefore, input/output circuit 87 may have the same structure as input/output circuit 74 according to Embodiment 3 shown in FIG. 16.

On the right side and lower side of memory mat 30, in order to transfer data to be processed, in memory mat 30, bit line pair BLPA is arranged along the horizontal direction of the figure and bit line pair BLPB is arranged in a direction orthogonally crossing bit line pair BLPA. Parallel to bit line pair BLPA, word line WLB is arranged, and parallel to bit line pair BLPB, word line WLA is arranged. Bit line pair BLPA is coupled to sense amplifier group A71 and write driver group A73, and the bit line pair BLPA is coupled to respective sense amplifiers SA and write drivers WD.

Bit line pair BLPB is coupled to the sense amplifiers of sense amplifier group B70 and to the write drivers of write driver group B72. Connection path between the sense amplifier group B70, write driver group B72 and the ALUs in processor group 82 is determined by switch circuit 80. The connection path of switch circuit 80 is set in accordance with switching information from controller 21 shown in FIG. 1, and the contents of arithmetic/logic operation executed by the ALUs in processor group 82 are determined, or an ALU to be activated is designated, based on re-configuration information from controller 21.

For word line WLA, a row decoder A66 is provided, and for word line WLB, a row decoder B76 is provided. To row decoders A66 and B76, an address signal from controller 21 or a pointer stored in a register is applied, and one of the row decoders A66 and B76 is selectively activated by controller 21 in accordance with the contents of operation.

As the group of arithmetic logic units 32 on the right side or the processor group 82 on the lower side of memory mat 30 is selectively activated by controller 21, the contents of arithmetic/logic operation can be changed dynamically.

Memory cells MC are arranged at intersections of the word lines WLA and WLB and bit line pairs BLPA and BLPB. As for the structure of memory cell MC, the dual port memory cell structure of memory cell MC described in Embodiment 4 with reference to FIG. 17 may be used. In this manner, efficient data transfer between data bus 12 and memory mat 30 can be achieved, and arithmetic/logic operations and processing programs can be updated.

As described above, in Embodiment 5, ALU groups are arranged on two, orthogonally intersecting sides of the memory mat, and in accordance with the form of data to be processed, arithmetic/logic operation can be achieved in bit-parallel and entry-serial manner or entry-serial and bit-parallel manner. Thus, high speed arithmetic/logic operation is achieved regardless of the form of data to be processed.

Further, as switch circuit 80 switching the connection path between each column of the memory mat and the processor group is provided, a set of data to be processed can reliably be transferred to the corresponding ALU even when the set of data to be processed is arranged in one entry. Further, by the use of this switch circuit, the operation bit width of ALU can also be changed, and by changing the contents of arithmetic/logic operation by the ALU, MIMD operation in which a plurality of instructions are executed in parallel can be achieved.

Embodiment 6

Figure 22:
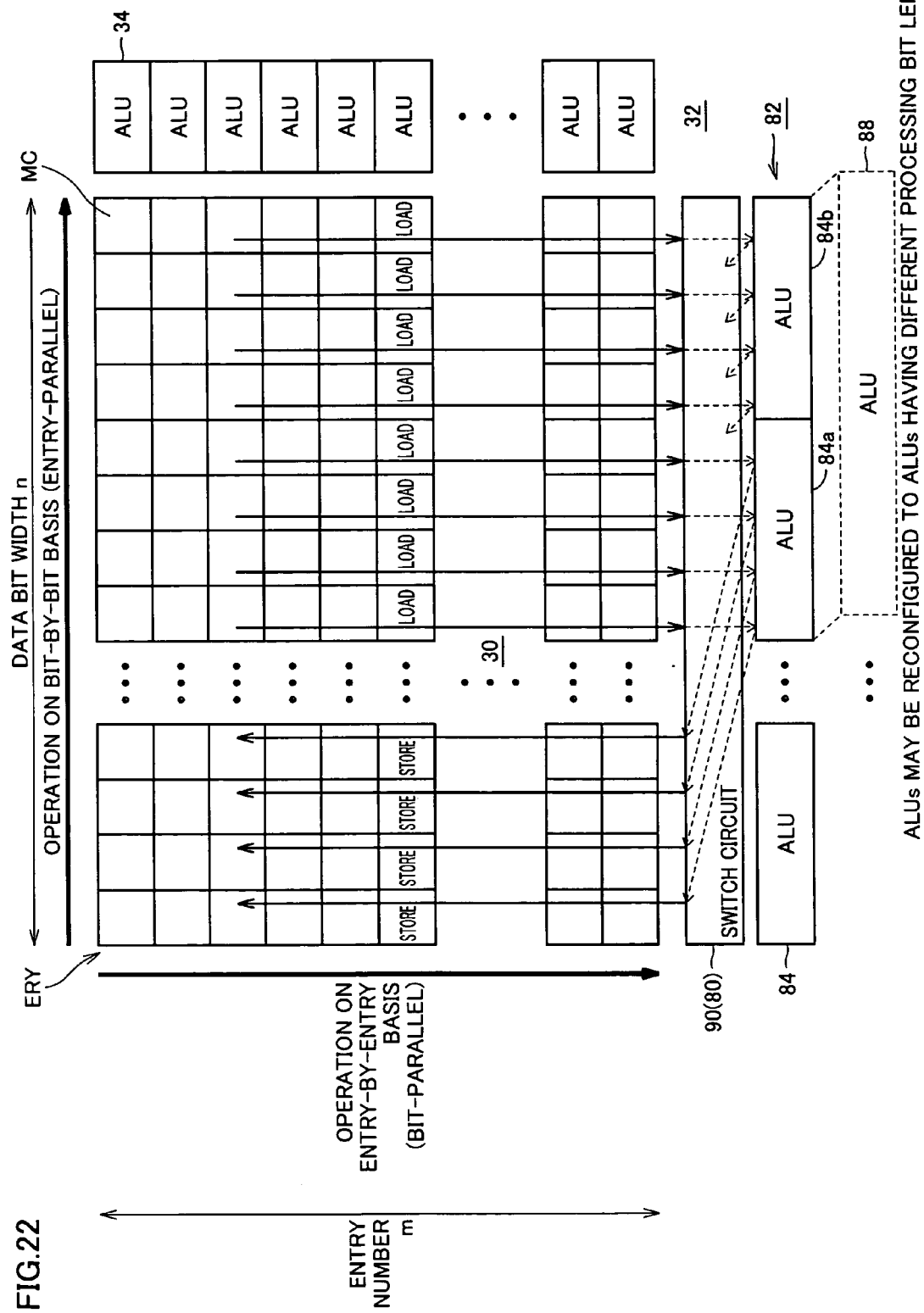
FIG. 22 schematically shows a configuration of a main portion of main processing circuitry in accordance with Embodiment 6 of the present invention.

FIG. 22 schematically shows a configuration of the main processing circuitry in accordance with Embodiment 6 of the present invention. In the configuration of main processing circuitry 20 shown in FIG. 22 also, memory mat 30 is divided into a plurality of (m) entries ERY, and on the right side of memory mat 30 in the figure, ALUs 34 of the group of arithmetic logic units 32 are arranged corresponding to respective entries ERY. On the lower side of memory mat 30, ALUs 84 of processor group 82 are arranged, with a switch circuit 90 interposed. Operation bit width of the ALUs 84 of processor group 82 can be changed in accordance with re-configuration information from controller 21, as shown in FIG. 22. By way of example, when the ALUs are adders and operation is changed from a 8-bit operation to 16-bit operation, a carry propagation path is connected in two ALUs performing 8-bit addition, in order to extend the carry propagation path. A 8-bit adder or a 16-bit adder can alternatively be set simply by selectively rendering conductive a selector or a switch circuit.

When a subtraction is to be performed, by way of example, when 8-bit subtraction to 16-bit subtraction are to be performed using two's complement representation, in place of the addition of "1" at the least significant bit of higher byte, a carry is applied from the most significant bit of the lower byte. This configuration can be readily achieved by using a selector in accordance with the re-configuration information from the controller.

Therefore, when two ALUs 84a and 84b of processor group 82 are used to perform an arithmetic/logic operation, an ALU 88 having the bit width corresponding to the total bit width of ALUs 84a and 84b can be formed equivalently to execute the operation.

As in Embodiment 5 above, connection path of switch 90 is set in accordance with connection path information from the controller. When the data bit is changed, the ALUs 84 in processor group 82 are re-configured based on processor re-configuring information from controller 21. The re-configuring information is given dynamically from controller 21 in accordance with the bit width of data to be processed, and therefore, there is no overhead in time caused by re-configuration of processor group 82. Therefore, arithmetic operations can be executed on data having different data bit width at high speed.

Similar to switch circuit 80 of Embodiment 5 described above, switch circuit 90 may be formed by using a cross-bar switch such as an FPGA, or it may be formed by a switch matrix simply switching the data transfer path.

As described above, according to Embodiment 6 of the present invention, at the time of entry-serial, bit-parallel arithmetic operation, the bit width of arithmetic/logic operation of processors can be variably set, and thus, high speed arithmetic/logic operation can be executed on data of various bit width.

Embodiment 7

Figure 23:
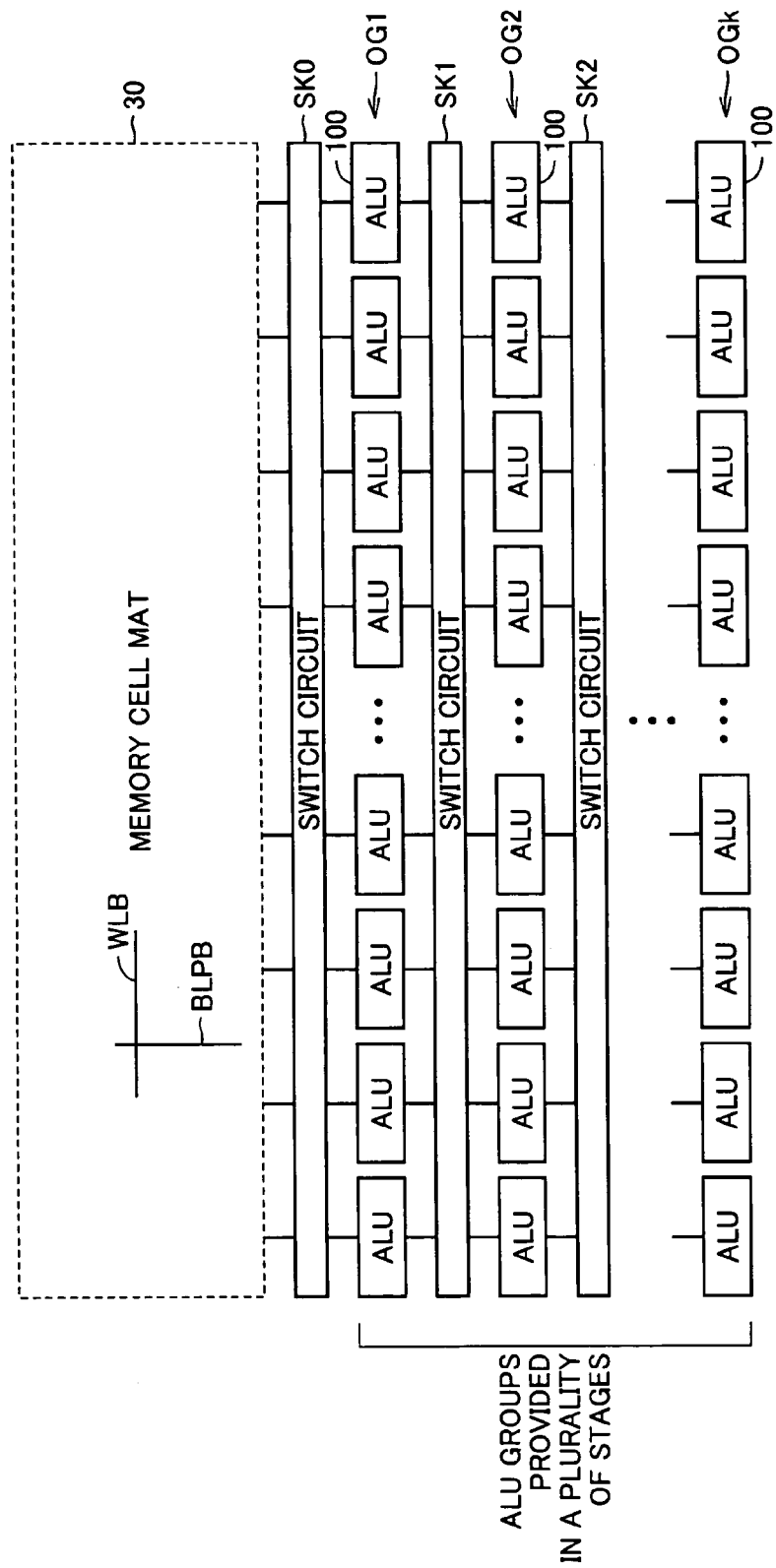
FIG. 23 schematically shows a configuration of a main portion of main processing circuitry in accordance with Embodiment 7 of the present invention.

FIG. 23 schematically shows a configuration of a main portion of the main processing circuitry in accordance with Embodiment 7 of the present invention. FIG. 23 shows the configuration of a portion corresponding to the processor group 82 arranged on the lower side of memory mat 30. In the configuration shown in FIG. 23, processor groups OG1 to OGk are arranged in a plurality of stages, as the processor group. Between memory mat 30 and the processor groups OG1 to OGk, switches SK0, SK1, SK2, . . . are arranged. In each of the processor groups OG1 to OGk, ALUs (processors) 100 are arranged. Internal configuration and bit width of these ALUs 100 may be changed in accordance with re-configuring information from the controller. All ALUs 100 may have the same structure.

Signal processing often involves very complicated computational operations such as repetitive product and sum operations. Therefore, use of only one stage of ALU group may sometimes fail to provide sufficiently high speed of processing. Thus, processor groups OG1 to OGk arranged in a plurality of stages are used as shown in FIG. 23, and the connection path is set by switches SK0, SK1, SK2, . . . provided therebetween. Further, when different arithmetic operations such as multiplication and addition are executed successively by processor groups OG1 to OGk arranged in a plurality of stages, processing in pipe-line manner is achieved, enabling high speed processing. Further, in one multiplication, an adding portion generating an intermediate partial product and a final product circuit adding the intermediate partial products and generating the final product may be achieved by ALUs of respective stages, and a high-speed multiplication device can be achieved.

Further, using switch circuits SK0-SK2, . . . , connection path of ALUs 100 in each group of processors OG1 to OGk is set, and therefore, a new operation can be executed using results of arithmetic operations done by ALUs physically apart from each other, and therefore, a very complicated arithmetic/logic operation can be achieved.

As described above, according to Embodiment 7 of the present invention, processor groups are arranged in a plurality of stages in the processor group for entry-serial operations, and therefore, complicated arithmetic operations can be executed at high speed.

The connection path of switch circuits SK0-SK2, . . . is designated and set in accordance with the path setting information from controller 21 as in Embodiment 6 above. Switch circuits SK0-SK2, . . . may be implemented by cross-bar switch circuits using FPGA or by a switch matrix.

Embodiment 8

Figure 24:
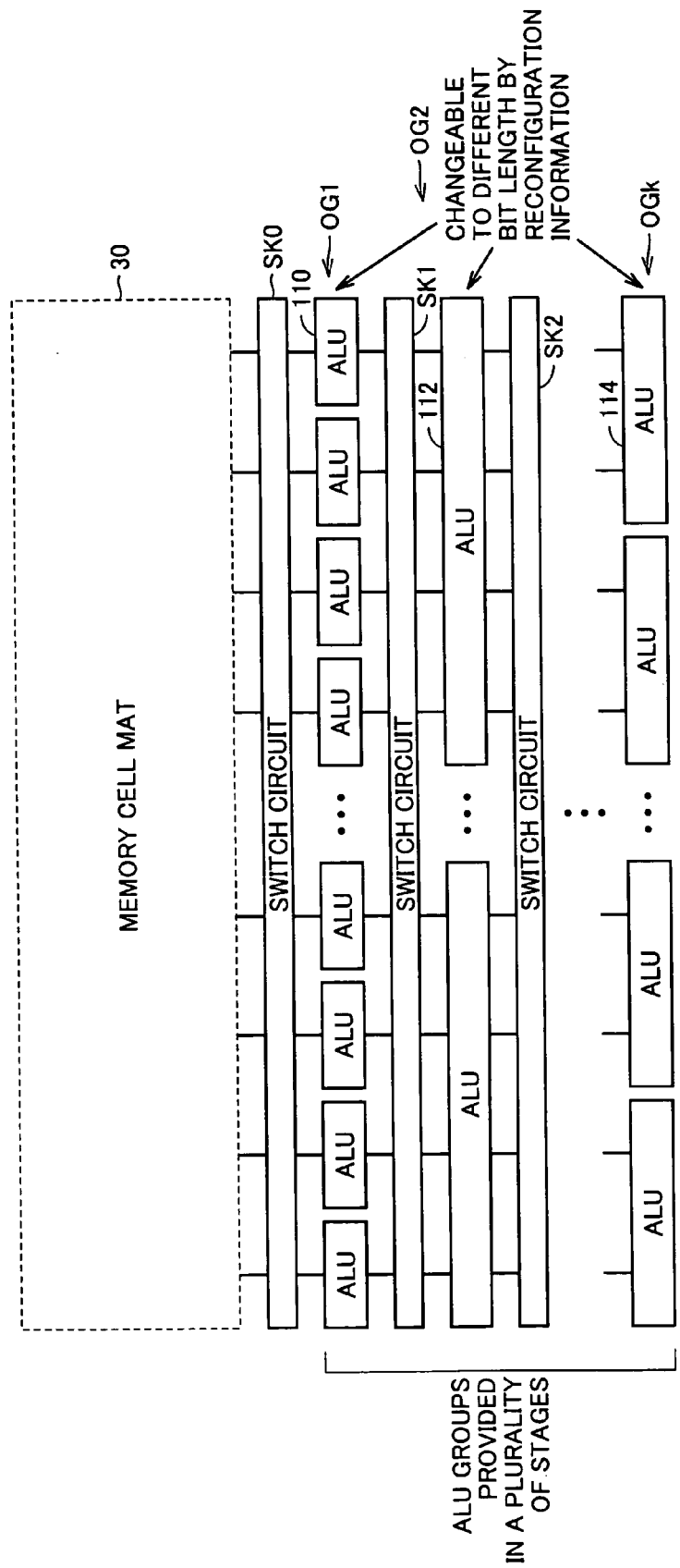
FIG. 24 schematically shows a configuration of a main portion of main processing circuitry in accordance with Embodiment 8 of the present invention.

FIG. 24 schematically shows a configuration of a main portion of main processing circuitry 20 in accordance with Embodiment 8 of the present invention. In the configuration shown in FIG. 24 also, a configuration of a processor group performing arithmetic/logic operation in the entry-serial and bit-parallel manner arranged on the lower side of memory mat 30 is schematically shown. In the configuration shown in FIG. 24, processor groups OG1 to OGk are arranged in a plurality of stages, and between memory mat 30 and the processor groups OG1 to OGk, switches SK0, SK1, SK2, . . . are arranged, so that the data transfer path can be selectively established.

In processor groups OG1 to OGk, the bit width of data to be processed by the arithmetic logic unit is set to allow reconfiguration. Referring to FIG. 24, processor group OG1 includes ALUs 110, processor group OG2 includes ALUs 112 of which bit width is four times that of ALU 110, and processor group OGk includes ALUs 114 of which bit width is twice that of ALU 110.

By variably setting the bit width of processing by ALUs in processor groups OG1 to OGk, it becomes possible to readily cope with any change in effective bit width of data that may possibly occur as a result of executing an arithmetic operation. The bit width of each ALU in processor groups OG1 to OGk is set in accordance with configuration information from controller 21 shown in FIG. 1, and connection path of switches SK0, SK1, SK2, . . . is also set based on connection information from the controller.

Figure 25:
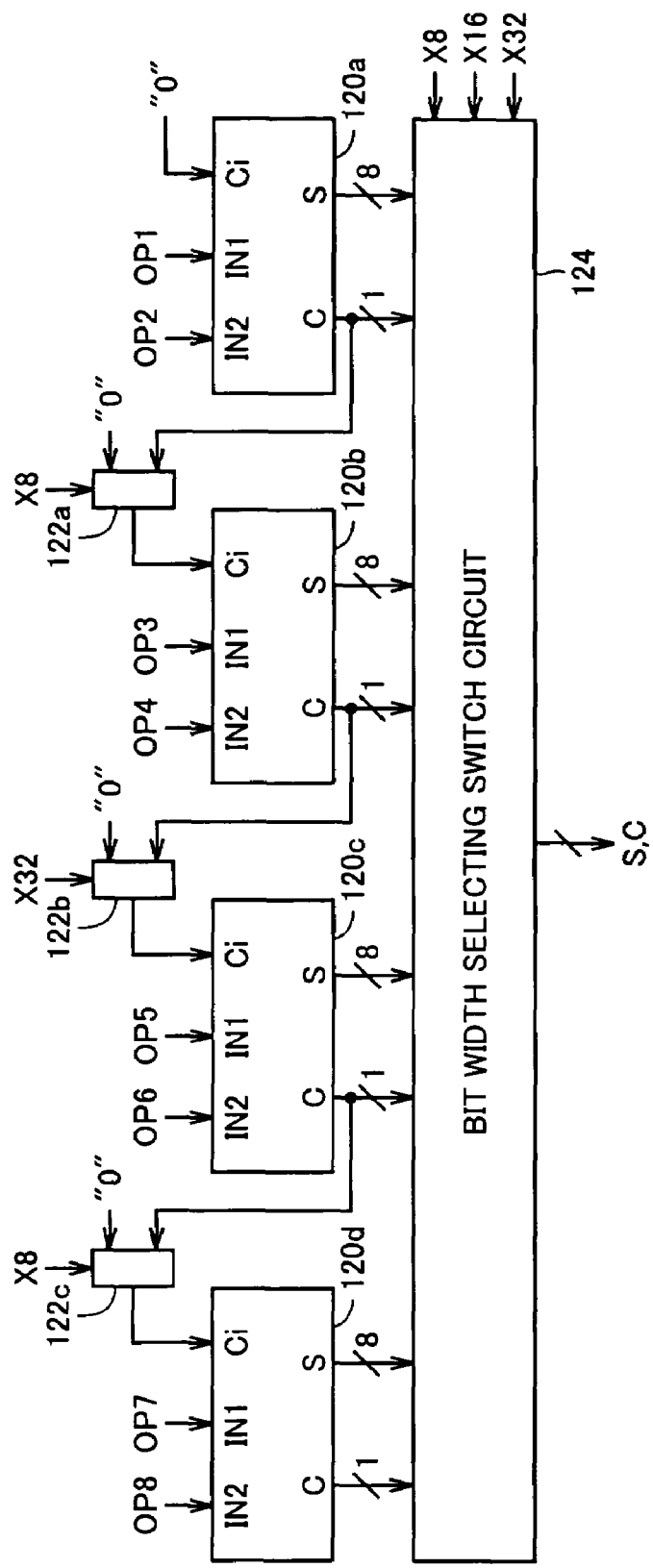
FIG. 25 schematically shows an example of variable configuration of the ALU shown in FIG. 24.

FIG. 25 schematically shows an exemplary configuration of an ALU of which bit width can be re-configured. In the configuration shown in FIG. 25, binary adder circuit performing addition of 8-bit data, 16-bit data, and 32-bit data is shown as an example of the processor.

Referring to FIG. 25, four 8-bit adders 120a to 120d are provided. These 8-bit adders 120a to 120d each include a carry input Ci, binary inputs IN1 and IN2, a sum output S and a carry output C. Bit "0" is applied to carry input Ci and bit operand data OP1 and OP2 are applied to inputs IN1 and IN2 of 8-bit adder 120a. To adder 120b, 8-bit operand data OP3 and OP4 are applied, to adder 120c, 8-bit operand data OP5 and OP6 are applied, and to adder 120d, operand data OP7 and OP8 are applied.

For carry input Ci of adder 120b, a selector 122a is provided for selecting either the carry output C of adder 120a or bit "0", for carry input Ci of adder 120c, a selector 122b is provided for selecting either the carry output C of adder 120b or bit "0", and for carry input Ci of adder 120d, a selector 122c is provided for selecting either the carry output C of adder 120c or bit "0".

Selector 122a selects fixed bit "0" when a×8-bit configuration designating signal X8 is activated, and otherwise selects the carry output C of adder 120a. Selector 122b selects the carry output from adder 120b when a×32 bit designating signal X32 designating a 32-bit word configuration is active, and otherwise selects fixed bit "0". Selector 122c selects fixed bit "0" in accordance with ×8-bit configuration designating signal X8 when 8-bit word configuration is designated, and otherwise selects an output signal from adder 120c.

For adders 120a to 120d, a switch circuit 124 for bit width selection, receiving the signals X8, X16 and X32 as bit width selecting signals, is provided.

When the data processing is performed based on ×8-bit configuration, selectors 122a to 122c select fixed bit "0", and switching circuit 124 for bit width selection selects and outputs in parallel an 8-bit sum output S and 1-bit carry output C outputted from each of the adders 120a to 120d. Therefore, as the fixed bit "0" is applied to the carry input Ci of adders 120a to 120d, these adders execute binary addition based on the corresponding operand data.

For ×16-bit configuration, selector 122a selects the carry output C of adder 120a, and selector 122c selects the carry output C of adder 120c. Selector 122b again selects fixed bit "0" in this state. Therefore, adders 120a and 120b operate as a 16-bit adder, and adders 120c and 120d operate as a 16-bit adder. Here, switch circuit 124 for bit width selection selects carry outputs of adders 120b and 120d in accordance with the signal X16 designating the 16-bit data word configuration, and selects, as the sum output S, sum outputs from respective adders 120a to 120d. Here, switch circuit 124 for bit width selection may be formed in the following manner. The carry outputs of adders 120a and 120c are not used in the ALUs of the processor groups of the subsequent stage, and therefore, an output path of switch circuit 124 is shifted by 1 bit to the lower bit direction, to generate output signals of adders 120b and 120d. Thus, 17 bits of data including the input bit data and 1-bit carry are outputted for adders 120a and 120b, and similarly, 17 bits of data including the 16-bit sum output and 1-bit carry are outputted for adders 120c and 120d.

For ×32-bit configuration, selectors 122a and 122c select the carry outputs of adders 120a and 120c, respectively. Selector 122b selects the carry output of adder 120b. Therefore, these adders 120a to 120d are connected, forming a 32-bit adder circuit. Switch circuit 124 for bit width selection selects 8-bit sum outputs of adders 120a to 120d and the carry output of adder 120d in accordance with the signal X32 designating ×32-bit configuration, and generates a sum output S consisting of 32 bits of data and a 1-bit carry output C.

By the use of switch circuit 124 for bit width selection such as shown in FIG. 25, it becomes possible to execute addition of ×16 bit data and 32 bit data, utilizing adder circuits 120a to 120d performing arithmetic/logic operation on 8-bit data as basic units. For 64-bit data, the configuration shown in FIG. 25 is further cascaded.

In the configuration of adders shown in FIG. 25, the carry output is selectively propagated by selectors 122a to 122c, realizing a ripple carry adder, and therefore, the time of addition may possibly be longer because of carry propagation. To avoid such a problem, the carry-look-ahead or carry-save addition scheme may be used.

As described above, according to Embodiment 8, for entry-serial arithmetic/logic operation, processors are arranged in a plurality of stages, and the bit width of data to be processed by the processors of each stage is reconfigurable. Therefore, necessary arithmetic/logic operation can be achieved at high speed, regardless of data bit width and the contents of arithmetic/logic operation.

Embodiment 9

Figure 26:
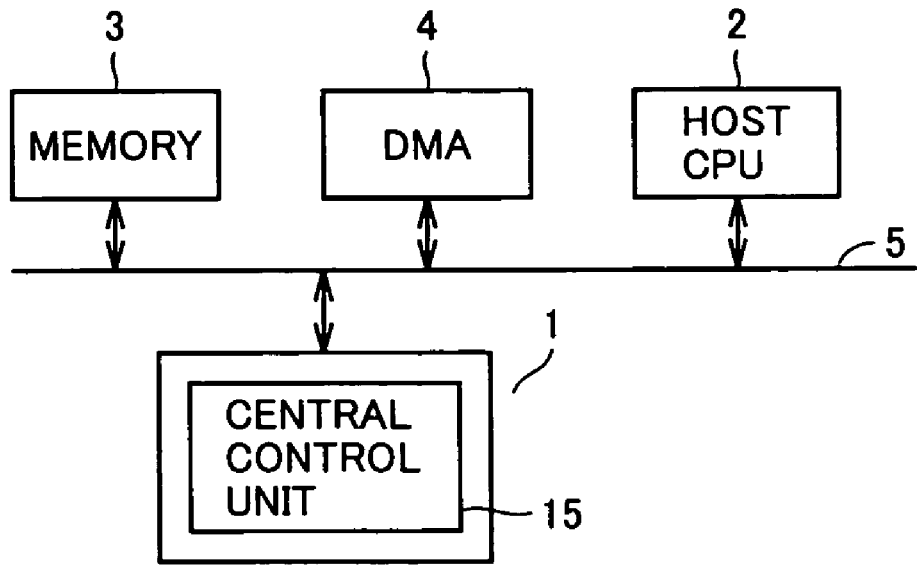
FIG. 26 shows an exemplary configuration of a processing system in accordance with Embodiment 9 of the present invention.

FIG. 26 shows an exemplary configuration of a processing system using the semiconductor device in accordance with the present invention. Similar to the configuration shown in FIG. 1, in FIG. 26, a host CPU (Central Processing Unit) 2, a DMA circuit 4 and a memory 3 are connected to a system bus 5. Further, a semiconductor processing device 1 in accordance with the present invention is connected. A plurality of semiconductor processing devices 1 may be provided parallel to system bus 5. In the configuration of processing system shown in FIG. 26, host CPU 2 executes a necessary process using data stored in memory 3. When processing of a large amount of data is necessary as in the case of image data processing, semiconductor processing device in accordance with the present invention takes charge of data processing. Specifically, the system configuration includes hierarchical CPU structure of host CPU 2 and central control unit 15 in semiconductor processing device 1, and therefore, high speed processing becomes possible.

[First Modification]

Figure 27:
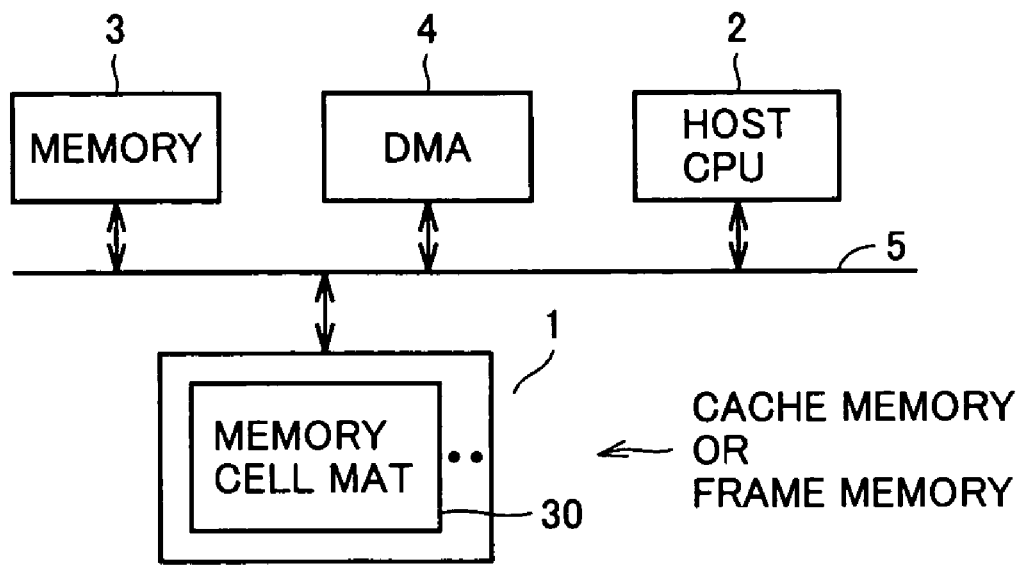
FIG. 27 schematically shows an exemplary configuration of a processing system in accordance with Embodiment 9 of the present invention.

FIG. 27 shows an exemplary system formation in accordance with a first modification of the processing system using semiconductor processing device 1 of the present invention. In the processing system shown in FIG. 27, similar to the processing system shown in FIG. 26, semiconductor processing device 1, host CPU 2, memory 3 and DMA circuit 4 are connected through system bus 5. In semiconductor processing device 1, basic operation blocks (FB1-FBn) are arranged in parallel as shown in FIG. 1, and in the main processing circuitry (20) in each basic operation block, memory mat 30 is arranged. When the memory mats 30 in these basic operation blocks are used as frame memories storing image data, semiconductor processing device 1 can be used as a memory macro. Namely, semiconductor processing device 1 can be used as a working memory for the image data processing, or semiconductor processing device 1 can be used as a frame buffer.

Further, in semiconductor processing device 1, memory mat 30 consists of SRAM cells. Therefore, when a high speed memory is to be achieved, memory mat 30 may be used as a cache memory and memory 3 may be used as a main memory, to build a high speed data processing system.

[Second Modification]

Figure 28:
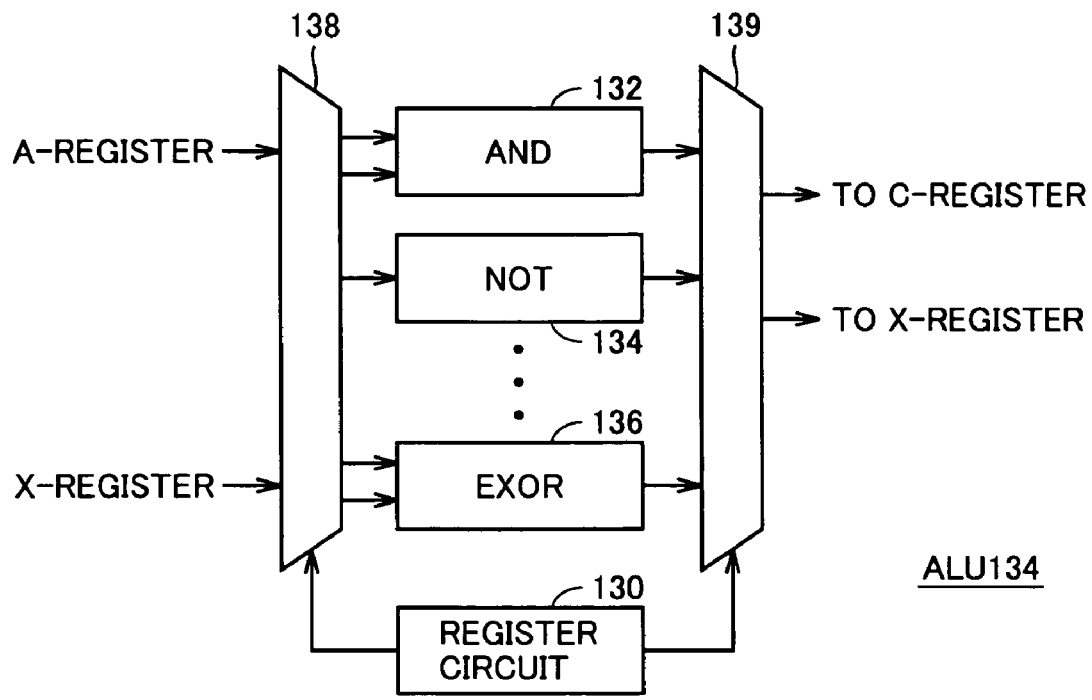
FIG. 28 schematically shows an exemplary configuration of an ALU included in a main processing circuitry in a semiconductor processing device in accordance with Embodiment 9 of the present invention.

FIG. 28 schematically shows an exemplary configuration of a processor (ALU) 34 performing a bit-serial and entry-parallel arithmetic/logic operation, included in main processing circuitry 20. Referring to FIG. 28, ALU 34 includes an AND gate 132, an NOT gate 134, an EXOR gate 136, a register circuit 130 storing data for setting the contents of arithmetic and logical operation, a selecting circuit 138 setting connection paths among the A-register, X-register and gates 132, 134, . . . in accordance with an output signal from register circuit 130, and a selecting circuit 139 selectively coupling the outputs of gate circuits 132 to 136 to C-register and X-register.

When a 1-bit multiplication is to be executed, AND gate 132 is used, and when addition is to be executed, AND gate 132 and EXOR gate 136 are used. For comparison, EXOR gate 136 is used. For subtraction, NOT gate 134 is used and thereafter addition in two's complement representation is performed.

The contents of arithmetic/logic operation by ALU 34 are set by the data stored in register circuit 130. The data stored in register circuit 130 are set by controller 21 in accordance with a program instruction stored in micro-program storing memory 23 shown in FIG. 1. Therefore, each of the contents of arithmetic/logic operation of ALU 34 is programmable. Accordingly, when there are a plurality of basic operation blocks FB1 to FBn as shown in FIG. 1, the semiconductor processing device 1 can be used as a programmable logic circuit realizing various logic circuits. Here, by loading program data at the time of system activation or at the time of operating semiconductor processing device 1, the contents of arithmetic/logic operation can be set.

The configuration in which the contents of arithmetic/logic operation of processor (ALU 34) are changed in accordance with the data stored in register circuit 130 can be similarly applied to ALU 84 and the like that performs arithmetic/logic operation in the entry-serial and bit-parallel manner. In that case, a processing circuit such as an adder circuit, multiplier circuit or comparator circuit is selected.

[Third Modification]

Figure 29:
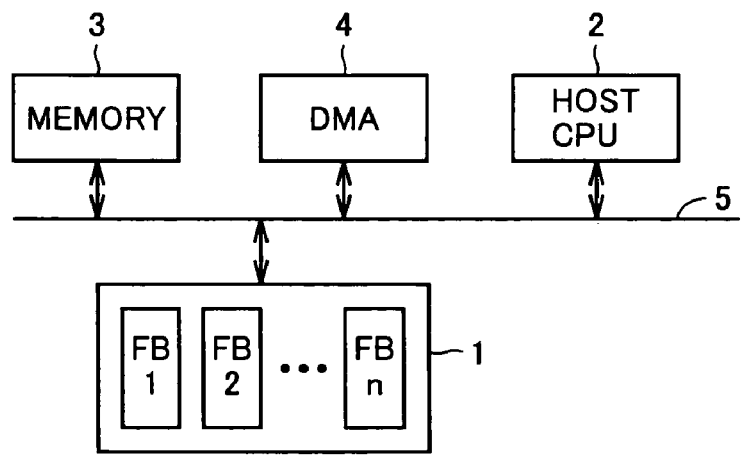
FIG. 29 shows an exemplary configuration of a processing system utilizing the semiconductor processing device in accordance with Embodiment 9 of the present invention.

FIG. 29 schematically shows a configuration of the processing system in accordance with the third modification of Embodiment 9 of the present invention. In the processing system shown in FIG. 29 also, CPU 2, memory 3, DMA circuit 4 and semiconductor processing device 1 are connected to system bus 5. In semiconductor processing device 1, a plurality of basic operation blocks FB1 to FBn are provided in parallel, and in each of basic operation blocks FB1 to FBn, the main processing circuitry having the memory mat and the ALU group is provided. The contents of arithmetic/logic operation of the ALU group are programmable as shown in FIG. 28 described above. Therefore, in these basic operation blocks FB1 to FBn, processes may be executed independent from each other in accordance with a micro-program stored in micro-program storing memory (23) by the controller provided inside, and the contents of processing may be set independent from each other. Therefore, these basic operation blocks FB1 to FBn can be regarded as operation blocks of fully identical function, or some can be used as a memory, some can be used as a programmable logic circuit and some can be used as a high speed processor circuit (high speed processing device performing parallel operations). Thus, parallel processor that executes various arithmetic/logic operation in parallel can be achieved in accordance with the contents of arithmetic/logic operation to be done by the processing system, enabling high speed, high performance processing system.

As described above, according to Embodiment 9 of the present invention, the processing system is built using the semiconductor device of the present invention, and therefore, arithmetic/logic operation can be done while the manner of data processing can be changed dynamically in a very flexible manner without any restriction of bit width of data to be processed, and in addition, various hierarchical CPU systems, a hierarchical memory system and a co-processor system can be built in flexible manner.

Embodiment 10

Generally, in an RAM (Random Access Memory), when a defect is generated in the memory mat during wafer processing, the defective bit is equivalently repaired by replacing the defective bit with a redundant bit prepared in advance, so that the RAM can be used as a non-defective article, and this circuit technique for defect repairing has been generally used. In the present invention, most part of the main processing circuitry consists of memory cells, and therefore, it is possible to improve production yield using the defect repairing technique.

Figure 30:
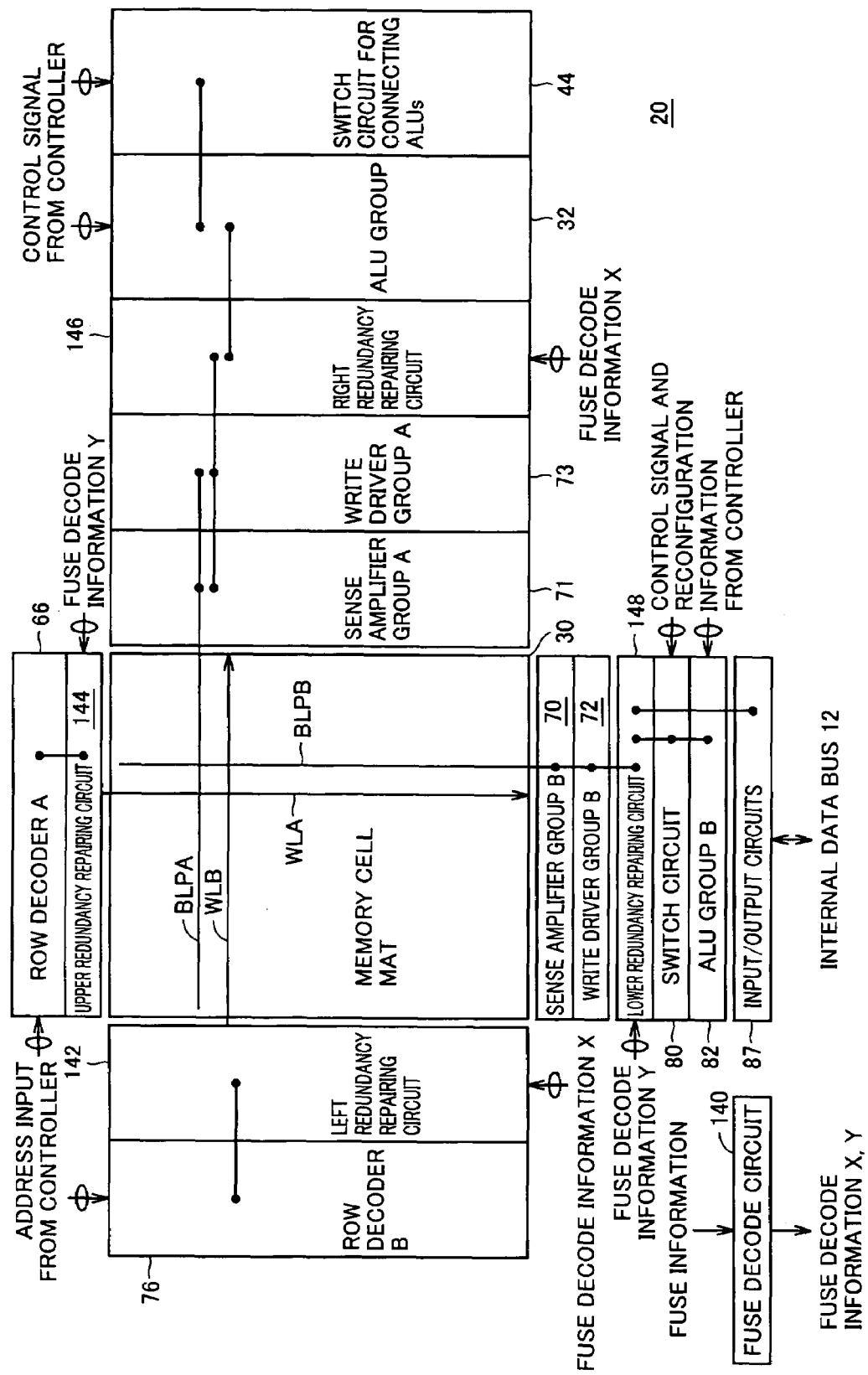
FIG. 30 schematically shows a configuration of a main portion of a main processing circuitry in accordance with Embodiment 10 of the present invention.

FIG. 30 schematically shows a configuration of a main portion of main processing circuitry 20 in accordance with Embodiment 10 of the present invention. Main processing circuitry 20 shown in FIG. 30 has a structure similar to that of main processing circuitry 20 shown in FIG. 21. It is noted, however, that other structures of main processing circuitry in accordance with other embodiments may be similarly adopted for main processing circuitry of Embodiment 10.

The configuration of main processing circuitry 20 shown in FIG. 30 differs from that of main processing circuitry 20 shown in FIG. 21 in the following points. Specifically, between row decoder B76 and the word line WLB of memory mat 30, a left redundancy repairing circuit 142 is provided, and between row decoder A66 and word line WLA, an upper redundancy repairing circuit 144 is provided. Between bit line pair BLPA and the group of arithmetic logic units (ALUs) 32, a right redundancy repairing circuit 146 is provided, and between bit line pair BLPB and processor group (ALU group B) 82, a lower redundancy repairing circuit is provided.

In order to set the manner of repairing by these redundancy repairing circuits 142, 144, 146 and 148, a fuse decode circuit 140 is provided, which decodes fuse information from fuse circuit 24 shown in FIG. 1 and generates pieces of fuse decode information X and Y. To redundancy repairing circuits 142 and 146, the same fuse decode information X is applied, and to redundancy repairing circuits 144 and 148, common fuse decode information Y is applied. The reason for this is that when a defect of word line WLA is to be repaired, defect repairing is also necessary for the bit line pair BLPB to which the memory cells, connected to the word line WLA, are connected. Similarly, when a defect of word line WLB is to be repaired, defect repairing is also necessary for the bit line pair BLPA.

Redundancy repairing circuits 142 and 144 for the word lines operate such that in a test, memory mat 30 is accessed, while avoiding a defective address programmed in advance using various fuse elements. In other words, these redundancy repairing circuits 142 and 144 repair a defect in accordance with the so-called "shift redundancy" method.

Redundancy repairing circuits 146 and 148 are respectively provided for ALU groups 32 and 82 from the following reason. When a word line is to be repaired by row decoder 76 and/or 66, defect repairing is also necessary for the bit line pairs BLPA and BLPB. By arranging redundancy repairing circuits 146 and 148 for the bit line pairs, it becomes possible to properly execute arithmetic/logic operation in the group of arithmetic logic units (ALUs) 32 and in processor group (ALU group B) 82 using the data stored in non-defective memory cell, regardless of whether a defect is replaced in memory mat 30 or not.

Programming of a defective address is performed in the following manner. In wafer test, data reading and writing operations from and to the memory mat are tested, and a fusible metal line as a fuse is cut using an energy beam such as a laser beam. Fuses for programming defective address are arranged as fuse 24 in each of basic operation blocks FB1 to FBn shown in FIG. 1. The fuse information is converted to pieces of fuse decode information X and Y using fuse decode circuit 140 shown in FIG. 30. The pieces of fuse decode information X and Y are transferred to each of the redundancy repairing circuits at the time of chip activation, for example, to achieve repair of any defect.

Figure 31:
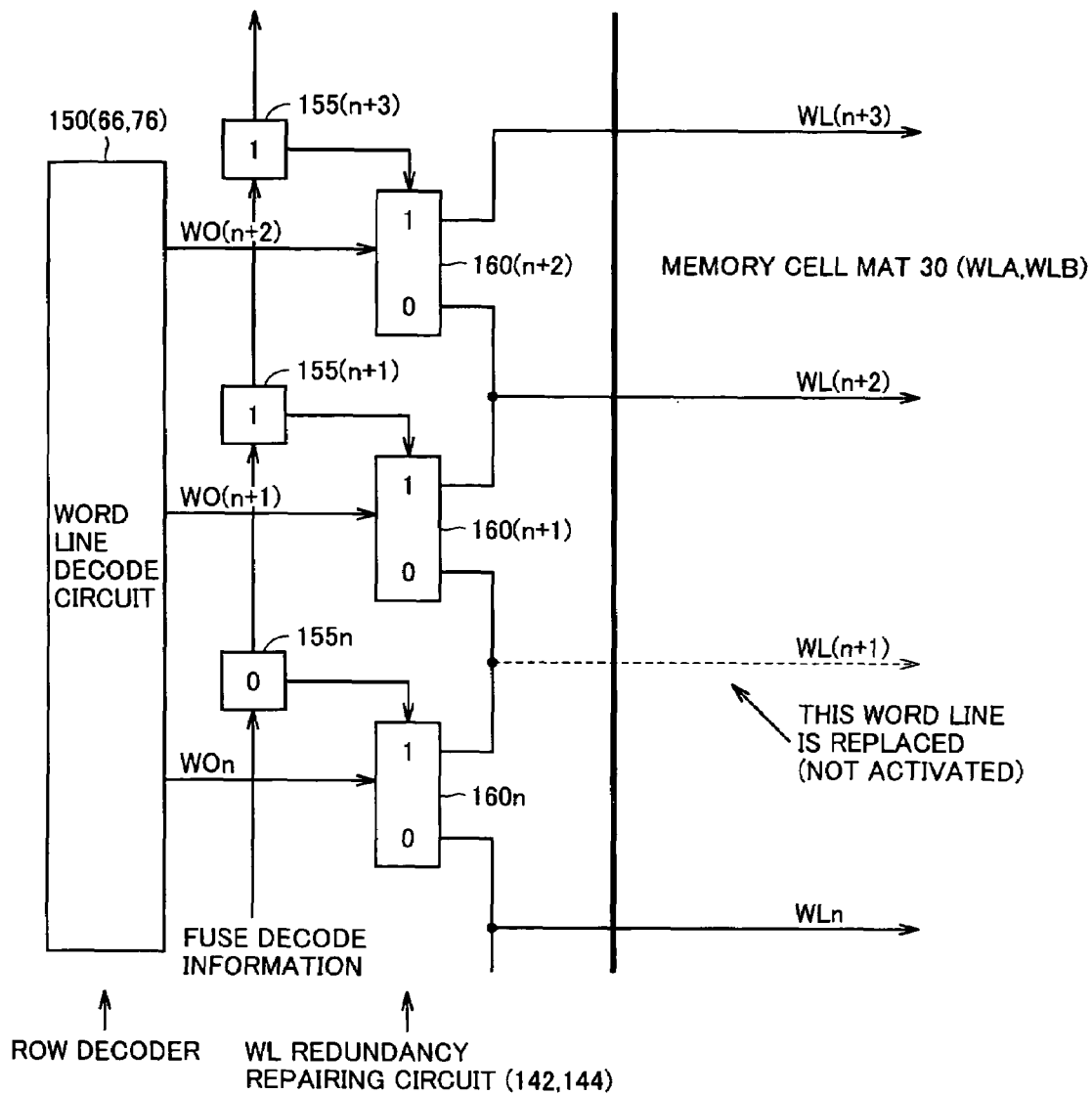
FIG. 31 schematically shows a configuration of a redundancy repairing circuit for a word line shown in FIG. 30.

FIG. 31 shows an exemplary configuration of the redundancy repairing circuit provided for the row decoder. In FIG. 31, word lines WLn to WL (n+3) in memory mat 30 are shown as representative examples. Word line WL of FIG. 31 represents word line WLA or WLB. In order to drive these word lines WLn to WL (n+3) to the selected state in accordance with an address input, a word line decode circuit 150 is provided. Word line decode circuit 150 corresponds to row decoder A66 or row decoder B76 shown in FIG. 30.

Corresponding to outputs WOn to WO (n+2) from word line decode circuit 150, fuse decode information registers 155*n* to 155 (n+2) are provided, respectively. These fuse decode information registers 155*n* to 155 (n+2) form shift register circuits or scan paths, and successively shift the fuse decode information generated by fuse decode circuit 140 (see FIG. 30) and store the fuse decode information of the corresponding word lines.

Further, corresponding to outputs WOn to WO (n+2) from word line decode circuit 150, shift switching multiplexers 160*n* to 160 (n+2) are provided, for switching transfer path of the outputs WOn to WO (n+2) from word line decode circuit 150, in accordance with the data stored in fuse decode information registers 155*n* to 155 (n+2). These shift switching multiplexers 160*n* to 160 (n+2) transmit, when the data stored in the corresponding fuse decode information register is "0", the corresponding output signal of the word line decode circuit to the corresponding word line, and when the data stored in the corresponding fuse decode information register is "1", transmits the corresponding output signal of the word line decode circuit with a shift to the upper side (having a greater word line number).

Now, assume that bit "0" is stored in fuse decode information register 155*n* and bit "1" is stored in fuse decode information registers 155 (n+1) and 155 (n+2). In this case, shift switching multiplexer 160*n* transmits an output signal WOn of word line decode circuit 150 to the corresponding word line WLn in accordance with the bit "0" stored in fuse decode information register 155*n*. Therefore, the word lines smaller number than word line WLn are supplied with output signals of word line decode circuit 140 without shifting.

On the other hand, as bit "1" is selected and stored in fuse decode information registers 155 (n+1) and 155 (n+2), shift switching multiplexers 160 (n+1) and 160 (n+2) transmit output signals WO (n+1) and WO (n+2) of word line decode circuit 150 to word lines WL (n+2) and WL (n+3), respectively. Therefore, word line WL (n+1) is isolated from the output of word line decode circuit 150, and hence, word line WL (n+1) is always kept in an inactive state. Thus, the defective word line WL (n+1) can be always kept at a non-selected state, and the defect is repaired for avoiding the defective address.

It is naturally understood that, in memory mat 30, in order to repair any defect by the shift redundancy method, word lines larger in number than the address space (number of entries) of address mat 30 must be provided.

As described above, word lines up to word line WLn are successively driven to the selected state in accordance with the output signals of word line decode circuit 150. By setting the data stored in the register circuits corresponding to and higher than the defective word line to "1", thereby to shift the transfer paths, word line WL (n+2) is selected in accordance with the output signal WO (n+1) of word line decode circuit 150. Subsequently, the correspondence between the word lines and the outputs WO of word line decode circuit 150 is shifted by one, and normal word lines of memory mat 30 are each driven to the selected state.

Specifically, by storing the bit "1" in the fuse decode information register corresponding to the defective word line and in the following fuse decode information registers, the defective word line can be isolated from word line decode circuit 150, and selection of a defective address can be prevented.

Figure 32:
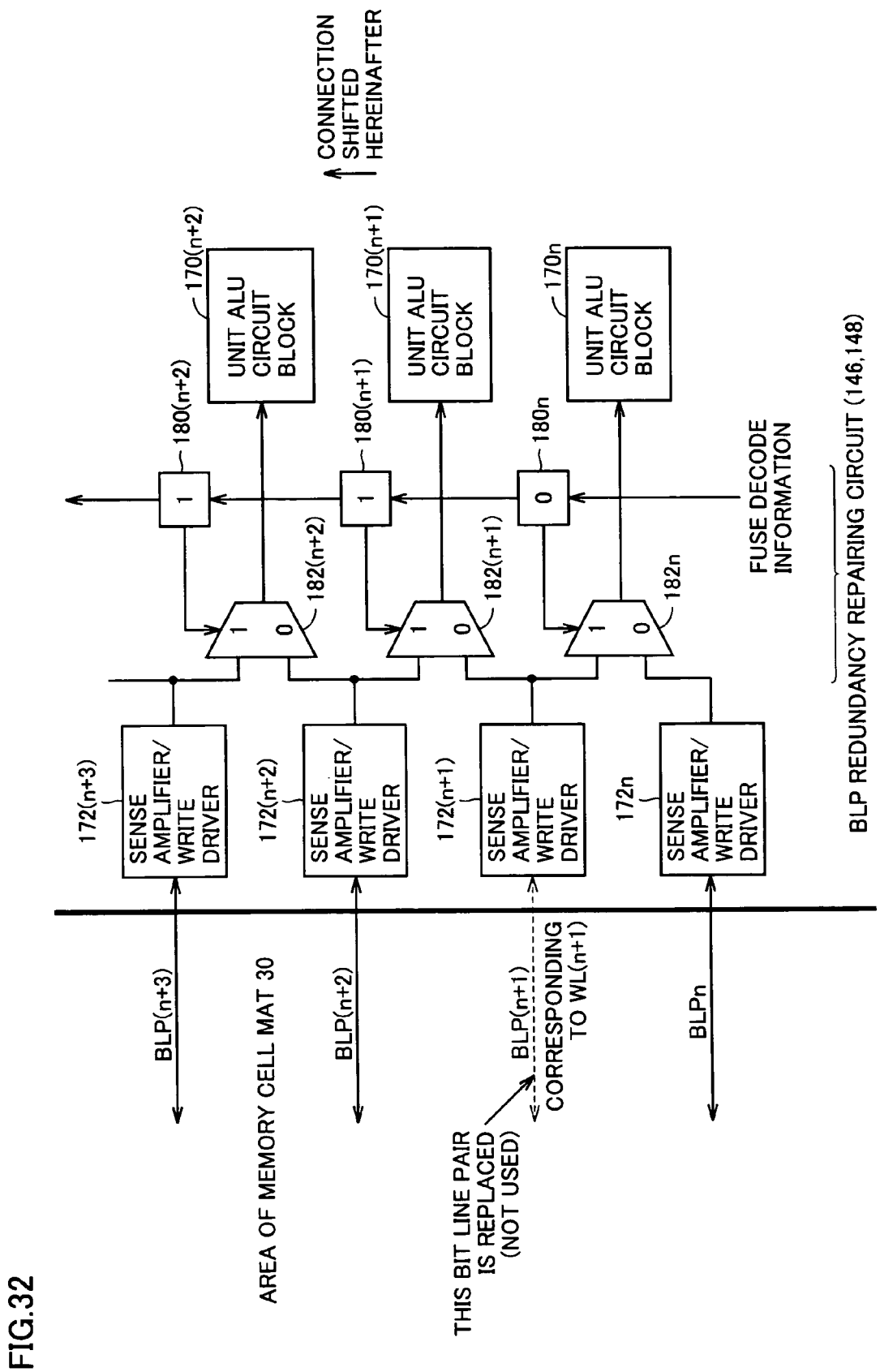
FIG. 32 schematically shows a configuration of a redundancy repairing circuit for a bit line shown in FIG. 30.

FIG. 32 schematically shows a configuration of a redundancy repairing circuit (146, 148) provided corresponding to the sense amplifier group and the write driver group. Referring to FIG. 32, a configuration provided for bit line pairs BLPn to BLP(n+3) of memory mat 30 is shown as a representative example. These bit line pairs BLPn to BLP(n+3) are any of bit line pairs BLPAn to BLPA (n+3) or BLPBn to BLPB (n+3).

Corresponding to bit line pairs BLPn to BLP(n+3), sense amplifiers/write drivers 172n to 172 (n+3) are arranged. Each of the sense amplifiers/write drivers 172n to 172 (n+3) consists of a sense amplifier and a write driver included in the corresponding sense amplifier group and the write driver group.

Corresponding to bit line pairs BLPn to BLP(n+2), unit ALU circuit blocks 170n to 170 (n+2) are provided. Each of the unit ALU circuit blocks 170n to 170 (n+2) corresponds to ALU 34 or to a unit ALU (a circuit performing a 1-bit operation) included in processor group (ALU group B) 82.

In the BLP redundancy repairing circuit (146, 148), corresponding to bit line pairs BLPn to BLP (n+2), fuse decode information registers 180n to 180 (n+2) are provided for storing fuse decode information. These fuse decode information registers 180n to 180 (n+2) are generated from fuse decode circuit 140 shown in FIG. 30. These fuse decode information registers 180n to 180 (n+2) form a shift register circuit that transfers the fuse decode information successively through shifting operation, and stores the fuse decode information of the corresponding bit lie pair.

Corresponding to these fuse decode information registers 180n to 180 (n+2), shift switching multiplexers 182n to 182 (n+2) are provided. These shift switching multiplexers 182n to 182 (n+2) are respectively coupled to sense amplifiers/write drivers 172n to 172 (n+2) arranged for the corresponding bit line pairs and to sense amplifiers/write drivers 172 (n+1) to 172 (n+3) shifted by one column to the upper side.

These shift switching multiplexers 182n to 182 (n+2) each connect the corresponding bit line BLP to the corresponding unit ALU circuit block 170 when the data stored in corresponding fuse decode information registers 180n to 180 (n+2) is bit "0", and connect the corresponding bit line BLP to the unit ALU circuit block 170 shifted by one column to the upper side when the data stored in corresponding fuse decode information registers 180n to 180 (n+2) is bit "1".

It is assumed that fuse decode information register 180n stores bit "0" and fuse decode information registers 180 (n+1) and 180 (n+2) store bit "1", as shown in FIG. 32. In this state, shift switching multiplexer 182n couples sense amplifier/write driver 172n provided for the bit line pair BLPn to the corresponding unit ALU circuit block 170n. Shift switching multiplexer 182(n+1) couples sense amplifier/write driver 172(n+2) provided for the bit line pair BLP (n+2) to unit ALU circuit block 170 (n+1), and similarly, shift switching multiplexer 182(n+2) couples sense amplifier/write driver 172(n+3) provided for the bit line pair BLP (n+32) to unit ALU circuit block 170 (n+2).

Therefore, sense amplifier/write driver 172 (n+1) provided for bit line pair BLP(n+2) is isolated from the corresponding unit ALU circuit block 170 (n+1), and not coupled to any unit ALU circuit block. The bit line pair BLP (n+1) corresponds to the defective word line WL (n+1). Therefore, as the bit line pair is replaced in conjunction with the replacement of the defective word line, an arithmetic/logic operation can reliably be performed by the unit ALU circuit block 170 using only the non-defective memory cells.

As described above, according to Embodiment 10 of the present invention, a defective cell can be repaired by redundancy replacement, and hence, a device performing reliable arithmetic/logic operation is achieved and production yield can be improved.

Further, in the memory mat having word lines arranged in orthogonally intersecting directions and the bit lines also arranged in orthogonally intersecting direction, when a defective word line is replaced by redundancy scheme, the bit line pair corresponding to the defective word line is also replaced by redundancy scheme. Therefore, an arithmetic/logic operation can be done reliably, using the memory cells properly storing data, and thus, device reliability can be ensured.

Embodiment 11

Figure 33:
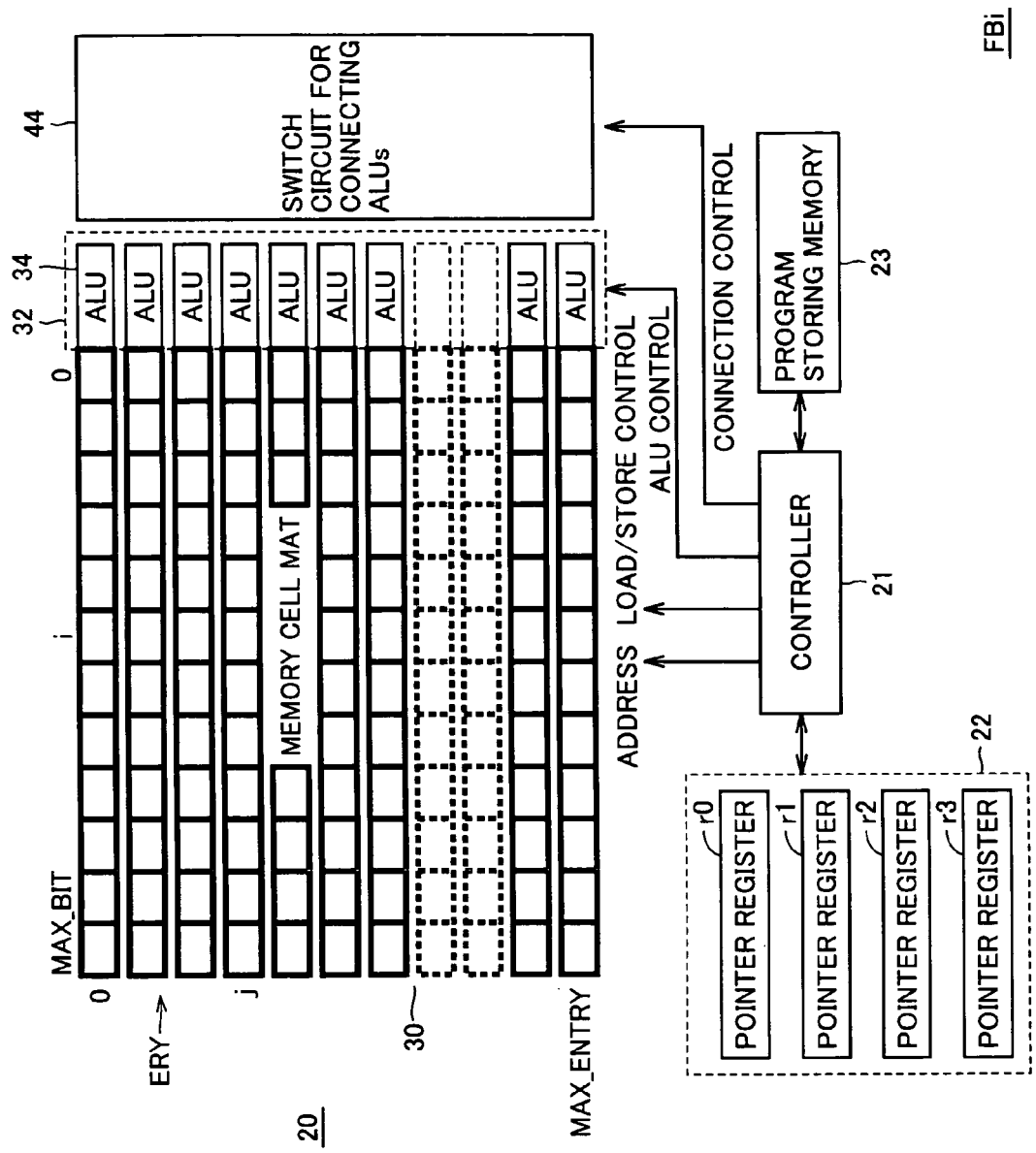
FIG. 33 schematically shows a configuration of a main portion of a basic operation block in accordance with Embodiment 11 of the present invention.

FIG. 33 schematically shows a configuration of a main portion of a basic operation block FBi according to Embodiment 11 of the present invention. Referring to FIG. 33, memory mat 30 includes, as entries, entries with numbers 0 to MAX_ENTRY. Each entry has bit positions 0 to BIT_MAX, and the bit width is BIT_MAX+1.

In the group of arithmetic logic units (ALU group) 32, an arithmetic logic unit (hereinafter also referred to as ALU unit) 34 is arranged corresponding to each entry. For the group 32 of arithmetic logic units 34, switch circuit 44 for interconnecting ALUs is provided.

The operation of main processing circuitry 20 is set by a program (micro program) stored in program storing memory 23. Controller 21 executes processing in accordance with the program stored in program storing memory 23.

In Embodiment 1 above, program storing memory 23 stores micro programs. In Embodiment 11, the program instruction stored in program storing memory 23 may be macro instructions rather than micro instructions. Controller 21 decodes the program instruction and executes a necessary process for the operation designated by the instruction.

In register group 22, pointer registers r0 to r3 are provided, and addresses of memory cell mat 30 of the data to be processed are stored in pointer registers r0 to r3. Controller 21 generates an address designating an entry or a position in an entry of main processing circuitry 20 in accordance with the pointers stored in pointer registers r0 to r3 to control data transfer (load/store) between memory cell mat 30 and the group of arithmetic logic units 32, and sets information designating connection among ALU units 34.

Figures 34, 35:
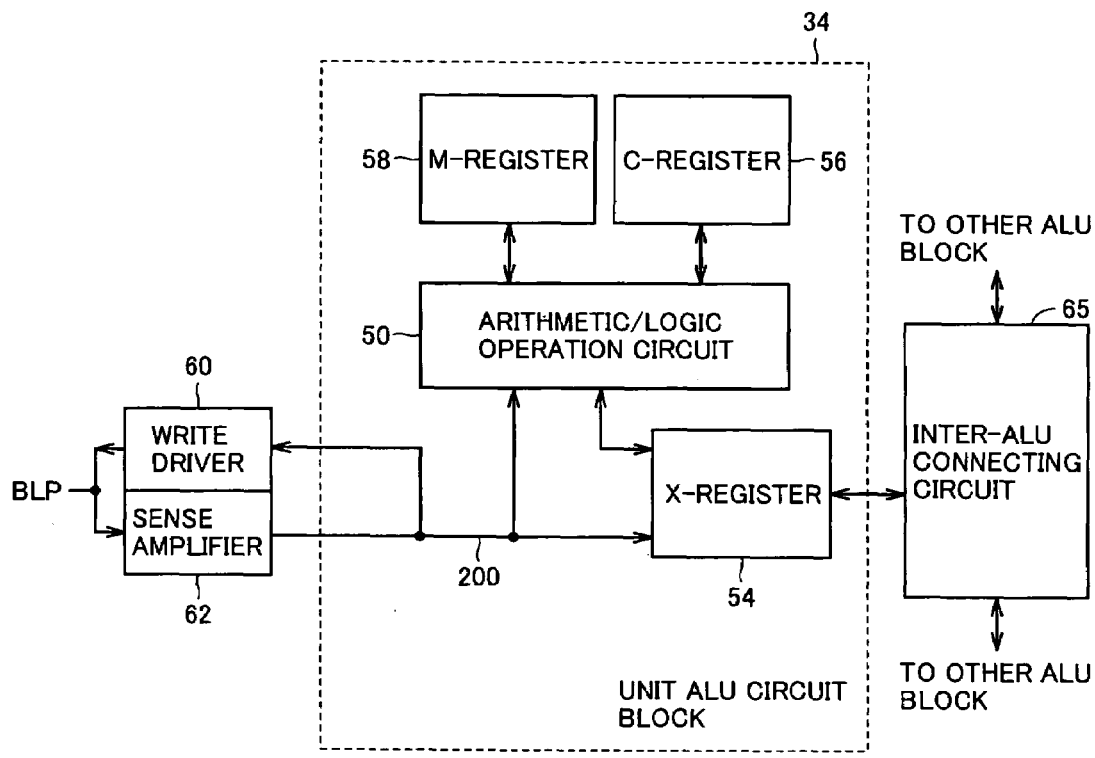
FIG. 34 schematically shows a configuration of a unit ALU circuit block shown in FIG. 33.
FIG. 35 shows, in the form of a list, register instructions in accordance with Embodiment 11 of the present invention.

FIG. 34 schematically shows a configuration of arithmetic logic unit 34 shown in FIG. 33. Referring to FIG. 34, in ALU 34, X-register 54 is coupled to write driver 60 and sense amplifier 62 through an internal data line 200. Internal data line 200 is coupled to arithmetic operation circuit 50.

In the unit ALU circuit block (ALU unit 34) shown in FIG. 34, different from the configuration shown in FIG. 7, A-register is not provided. X-register 54 temporarily stores data loaded from the memory cell of the corresponding entry, and temporarily stores an intermediate result of operation by arithmetic operation circuit 50. In two term operation, when a first operation data is stored in X-register 54, the next (another) operation data is directly applied to arithmetic operation circuit 50, and the arithmetic/logic operation is executed.

X-register 54 is coupled to another unit ALU circuit block (ALU unit) through ALU interconnecting circuit 65, and thus, data can be transferred between different ALUs.

Except for these points, the configuration of ALU unit 34 shown in FIG. 34 is the same as that of unit ALU circuit block 34 shown in FIG. 7. Therefore, corresponding portions are denoted by the same reference characters and detailed description thereof will not be repeated.

FIG. 35 shows, in the form of a list, operation instructions (register instructions) corresponding to pointer registers r0 to r3 shown in FIG. 33. Five instructions are prepared as register instructions.

Instruction "reg. set n, rx" is an instruction for setting a constant n in register rx. The constant n represents a bit position in an entry, and defines any value of bits 0 to MAX_BIT of one entry.

Instruction "reg. cpy rx, ry" is an instruction for copying the contents of pointer register rx to pointer register ry.

Instruction "reg. inc rx" is an instruction for incrementing by one the value stored in pointer register rx.

Instruction "reg. dec rx" is an instruction for decrementing by one the value stored in pointer register rx.

Instruction "reg. sft rx" is an instruction for shifting the value stored in pointer register rx one bit to the left.

By these five register instructions, the values stored in pointer registers r0 to r3 (pointers) are operated and an address of the data to be processed of the memory mat is designated.

FIG. 36 shows, in the form of a list, operation instructions for ALU 34 shown in FIG. 34. Contents of operations defined by the ALU instructions will be described in the following, with reference to FIG. 36.

Instruction "alu. set. #" is an instruction for setting "1" in register # (X, C or M). The ALU set instruction designates setting of a register entry by entry.

Instruction "alu. clr. #" is an instruction for clearing the value stored in register # to "0".

Instruction "alu. cpy. #1#2" is an instruction for copying the value stored in register #1 to register #2.

When this alu copy instruction is executed, inter-register data transfer is executed in the ALU provided in each entry.

FIG. 37 shows load/store instructions among the ALU instructions defining data transfer between the memory cell mat and the ALU.

Instruction "mem. 1d@rs" is an instruction for loading data from the memory cell position represented by pointer register rx to X-register.

Instruction "mem. st@rx" is an instruction for storing, when bit "1" is set in M-register (mask register 58), the data stored in X-register to an address position designated by pointer register rx.

By utilizing the memory load/store instruction, it becomes possible to perform data transfer between the memory cell and the ALU unit, using the value stored in pointer register rx as an address.

FIG. 38 shows, in the form of a list, instructions for moving data (Move) between entries, among the ALU instructions.

Instruction "ecm. mv. n#n" defines the amount of movement of the data moving instruction by a numerical value #n. Therefore, by this instruction, in transferring data of X-register 3, the value stored in the X-register of entry j+n is moved to the X-register of entry j. The amount of entry movement n assumes an integer value from 0 to 128, and the data can be moved (Move) between entries that are apart by at most 128 bits. Here, ENTRY_MAX is not smaller than 128.

Instruction "ecm. mv. r rx" is an instruction for moving data between entries by the value stored in pointer register rx, and when this instruction is executed, the value stored in the X-register of entry j+rx is transferred to the X-register of entry j.

By utilizing instructions shown in the form of lists on FIGS. 35 to 38, it becomes possible to set data of a desired entry in the ALU unit.

FIG. 39 shows instructions for designating arithmetic/ogic operation to be performed by each unit ALU circuit block (ALU unit).

Instruction "alu. op. adc@rx" is an instruction designating addition of data at a memory cell address designated by pointer register rx to the data stored in the X-register, and storing the result of addition in the X-register. In this addition, full addition is performed, and therefore, when a carry is generated, the carry is stored in C-register. In X-register (Xj), a sum Sum is generated by exclusive logical sum operation ("^") of memory cell data Aj[rx] of the address designated by the pointer register rx, bit value Xj stored in the X-register and the carry Cj stored in the C-register, which sum is stored in the X-register.

The carry Cj is provided by a logical sum (+) of AND operations (&) of respective sets of bits among memory cell data Aj[rx], the bit Xj stored in the X-register, and the bit of the value Cj stored in the C-register.

The addition instruction is executed when "1" is set in the mask register (M-register Mj), and when "0" is set in the mask register, the addition instruction is not executed in this entry.

Instruction "alu.op.sbb@rx" is a subtraction instruction, and when this subtraction instruction is executed, from the data Aj[rx] of the memory address designated by pointer register rx, the bit value stored in the X-register is subtracted. The result of subtraction is stored in the X register, and a borrow is stored in the C-register.

At the time of subtraction, an inverted value !Xj of the bit Xj stored in the X-register is used and a process similar to that of addition is performed. Therefore, when this subtraction instruction is applied, the value stored in the X-register is inverted and applied to the adder (the carry of the least significant bit is set to 1).

FIG. 40 shows, in the form of a list, instruction designating logic operations performed in the ALU.

Instruction "alu. op. and@rx" is an AND instruction. When this instruction is executed, a logical product (AND) of data Aj[rx] of the memory address designated by the pointer of pointer register rx and the bit value Xj stored in the X-register is provided, and the resulting logical product is stored in the X-register. It is noted, however, that when the value stored in the mask register Mj (represented by Mj) is "0", this AND instruction is not executed. The same applies to the logic operation instructions described below. Namely, whether the designated operation is executed or prohibited is determined by the value stored in the mask register.

Instruction "alu. op. or@rx" is to perform logical sum (OR operation) between the data Aj[rx] at the memory address of pointer register rx designated by the pointer and the bit Xj stored in the X-register, with the result stored in the X-register.

Instruction "alu. op. eq@rx" is an EXOR instruction to perform an exclusive logical sum operation (EXOR operation) between the data Aj[rx] at the memory address of pointer register rx designated by the pointer and the bit Xj stored in the X-register, with the result stored in the X-register.

Instruction "alu. op. not" is an NOT instruction (inversion instruction), for inverting the value Xj of the X-register, and the result of inversion !Xj is stored in the X-register.

When ALU 34 is formed including mask register (M-register) 58, C-register 56, X-register 54 and arithmetic operation circuit 50 and an arithmetic/logic operation is described by the combination of instructions shown in FIGS. 35 to 40, various arithmetic/logic operations can be executed in a word-parallel and bit-serial manner.

FIG. 41 shows an example of a program executing the addition operation in the +basic operation block in accordance with Embodiment 11 of the present invention. Referring to FIG. 41, by a line number, a line of each operation instruction in the program is designated, an instruction to be executed is designated in the line, and after "//", contents of the operation instruction to be executed are described. The contents following "//" are descriptions of the operation contents, and not an execution instruction. The addition program shown in FIG. 41 defines a binary addition, and the process (a+b)=c is executed. The processing of the addition program shown in FIG. 41 will be described in the following.

In line #0, "1" is set in the mask register (M-register), and the value stored in the carry register (C-register) is cleared to "0".

In line #1, a constant as is stored in pointer register r0, a constant bs is stored in pointer register r1, and a constant cs is stored in pointer register r2. These constants as, bs and cs represent positions of least significant bits of operands a, b, and c of the binary addition operation (a+b)=c in the corresponding entry.

In lines #2 and #3, an addition instruction is designated. Addition is repeatedly executed starting from i=0 to bit width (bit_count)-1, and each time the addition instruction is executed, the value i is incremented (i++). The contents of the function in curly brace following a "for" sentence is repeatedly executed until the condition of "for loop instruction" is satisfied, that is, until the value i attains the number of the bit width to be processed.

In the loop instruction defined by the "for" sentence, the contents of pointer register r0 is transferred (loaded) to the corresponding ALU unit and stored in the X-register, and thereafter, the data of the memory cell indicated by the pointer value stored in pointer register r1 is transferred to the corresponding ALU unit and added to the value stored in the X-register (with the value stored in the C-register). The result of addition is stored at an address position indicated by the pointer of pointer register r2. In the series of instructions; "r0+", "r1+" and "r2+" represent that the pointers of pointer registers r0, r1 and r2 are each incremented by one.

In line #3, the tail of instruction sequence, executed in accordance with the loop instruction, is indicated.

When the loop instruction defined by for { } is completed and the addition on the data bits is finished, in accordance with line #4, the value stored in the C-register is transferred to the X-register, and thereafter, the value stored in the X-register is stored at an address location designated by pointer register r2. By this processing, the carry of the result of addition is stored.

FIG. 42 schematically illustrates the addition operation of FIG. 41. First, the least significant bit locations as, bs and cs in the storage area of the entry ERY of operands a, b and c are designated by the pointers of pointer registers r0, r1 and r2, respectively. Here, it is noted that the bold letters as, bs and cs are used for distinctively indicating the start bit positions "as, bs and cs" as shown in the figure. Such representation also applies to the subsequent embodiments. Thereafter, data ai and bi of the memory cells indicated by the pointers of pointer registers r0, r1 and r2 are read and added, and the result of addition is stored in the memory cell position indicated by pointer register r2. When operands a and b are each 3-bit data, addition and storage are executed with i=0~2, and finally, the value stored in the C-register is stored in the bit position (cs+3) designated by the pointer register r2, through the X-register.

By the instruction "alu. op. adc@r1+", the contents to be executed by the ALU circuit (arithmetic logic operation circuit) in the ALU unit can be set to addition.

FIG. 43 shows an example of a subtraction program for performing a subtraction of operands a and b (a–b) and generating a subtraction result c. A binary subtraction will be described with reference to FIG. 43.

First, by line #0, M- and C-registers are initialized as in the process of addition.

In line #1, as in the process of addition, addresses of the entries of operands are initialized, and lowest bit positions of operands a, b and c to be processed are set in pointer registers r0, r1 and r2.

In lines #2 and #3, a loop operation instruction is designated as in the addition executing program. By the instruction "alu. op. sbb@r1+", a process for subtracting operand b from operand a is executed. The load instruction "mem. 1d" and store instruction "mem. st" are the same as in addition, and the arithmetic/logic operation data is transferred to the ALU unit and the result of subtraction is stored in c[i] of the memory mat.

Line #3 designates the tail of contents of the loop operation instruction.

In accordance with line #4, after the end of loop instruction designated by lines #2 and #3 (after the end of subtraction of all bits of operands a and b), the contents of the C-register are transferred to the X-register, thereafter, the contents of X-register are stored in the memory position designated by pointer register r2, and the borrow is stored.

As for the flow of each bit in the subtracting operation, "subtraction" is performed in place of "addition" of addition operation shown in FIG. 42, and the bit flow is the same.

Figures 44, 45:
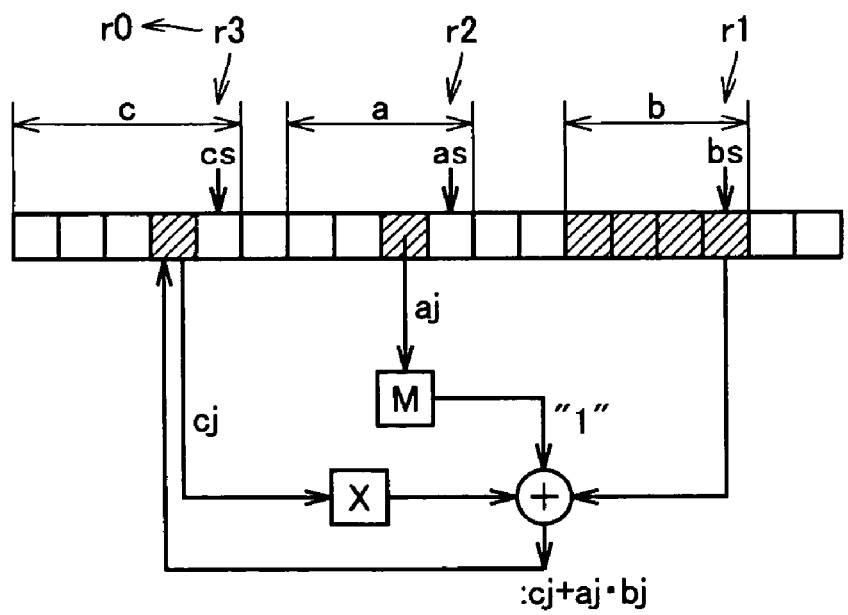
FIG. 44 shows a multiplication program in accordance with Embodiment 11 of the present invention.
FIG. 45 schematically shows a data flow of the multiplication program shown in FIG. 44.

FIG. 44 shows an example of a multiplication program for performing a multiplication a×b=c. Referring to FIG. 44, binary multiplication operation will be described in the following.

First, by line #0, constants as and cs are set in pointer registers r2 and r3. At the time of initialization defined by line #0, regions for the multiplicand a and the result of multiplication c are initialized, and the region for the multiplier b is not yet set.

In line #1, by the "for" sentence, it is designated that multiplication is repeated by the number corresponding to the bit width of the storage area (region) of multiplicand a. Here, "a_bit_count" represents bit width of multiplicand a.

By the function sentence of line #2, a multiplicand bit a[j] designated by pointer register r2 is transferred to and stored in the X-register. Thereafter, the multiplicand bit a[j] stored in the X-register is stored in the mask register (M register) (to stop multiplication, as multiplication is unnecessary when the multiplicand bit a[j] is "0").

By the instruction of line #3, the pointer of pointer register r3 is copied to pointer register r0, and thereafter, constant bs is set in pointer register r1 and the initial address of multiplier b is set.

By line #4, the C-register is cleared.

By the "for" sentence of line #5, repeated processing on multiplier b is designated. Here, "b_bit_count" represents the bit width of multiplier b.

By the function sentence of line #6, memory cell data designated by the pointer of pointer register r0, that is, the result of multiplication, is transferred (loaded) to the X-register. Then, the multiplier bit b[i] designated by pointer register r1 is transferred to the ALU unit, and when the value stored in the M-register is 1, the result of multiplication c in the X-register and the corresponding bit b[i] of multiplier b are added. The addition instruction is not executed when the value stored in the M-register (mask register) is "0". By this processing, multiplication a[j]×b[i] is performed, and the result of multiplication is added to partial products up to this point.

The result of addition is transferred to and stored in the position indicated by pointer register r0, and the counter of pointer register r0 is incremented by one. The instruction defined by the function sentence of line #6 is repeatedly executed until the condition of "for" sentence of line #5 is satisfied, that is, on all the bits of multiplier b. By the addition operation, generation of partial product of one bit a[j] and addition of partial products generated so far are executed.

When processing on all the bits of one multiplier b is completed, in accordance with line #8, the value stored in the C-register is stored in the X-register, and the carry that has been transferred to the X-register is stored at an address position designated by pointer register r0. Thus, the process of adding partial products is completed.

By line #9, the pointer of pointer register r3 is incremented by one, and the multiplier of the next digit is designated. The operation defined by lines #2 to #9 is repeatedly executed on each bit of multiplicand a. By the series of operations, bit-serial multiplication can be done.

FIG. 45 schematically shows bit flow when the multiplication program of FIG. 44 is executed. Referring to FIG. 45, a bit aj of multiplicand a is stored in the mask register (M). Thereafter, multiplication result bit cj is read and stored in the X-register, and multiplier bit bi is read and addition is done selectively. At the time of this addition, when the multiplicand bit aj stored in the mask register (M-register) is "1", the multiplication result bit cj is added to the multiplier bit bi. When the multiplicand bit aj is "0", addition is not performed, and the multiplication result bit cj is held in the X-register. Therefore, the result of addition represents cj+aj×bi, and the result of addition is stored in the original bit position cj. This process is repeatedly executed on all the bits of multiplier b. Thus, partial product of multiplier b and multiplicand bit aj is calculated and the result of partial product is added to the partial product bit of the corresponding digit. Therefore, the operation of generating a partial product of each bit of multiplicand a and adding the result to the partial products generated up to that time point is repeated.

FIG. 46 schematically illustrates address allocation of an entry when a division a/b=c . . . d is performed. A start address as of dividend a is designated by pointer register r0, and a start address ds of an area for storing a reminder d is stored in pointer register r1. Divisor b and quotient s have start addresses bs and cs.

FIG. 47 shows an example of a program for performing the division. Contents of operation of the division program will be described with reference to FIG. 47.

Referring to FIG. 47, by the instruction of line #0, the mask register (M-register) of the unit ALU circuit is set, and the corresponding ALU circuit is set to an operable state. Further, start addresses as and bs of operands a and b are set in pointer registers r0 and r1.

By line #1, a repeat sentence ("for" sentence) is described and designated, and the remainder is initialized. Specifically, in accordance with pointer register r0, the dividend a is transferred to and stored in the reminder storing area designated by pointer register r1, through the X-register. This operation is repeated on all bits of dividend a, and in the initial state, dividend a is set as reminder d. The remainder storing area is extended in bit width at a higher bit area of dividend a, so that it has sufficiently large bit width, and in this area of extended bit width, the dividend having its bit width adjusted is stored.

By the instruction of line #2, a sum of the start address cs of quotient c and a value smaller by 1 than the bit width of quotient c (bit_count-1) is set in pointer register r2. Accordingly, the most significant address of the area for storing quotient c is set in pointer register r3. By the instruction of line #2, similarly, a sum of the start address ds of remainder d and a value smaller by 1 than the bit width of remainder d (bit_count-1) is set in pointer register r2. Consequently, in pointer register r2, the least significant address of the area storing the first bit to be subjected to division is set.

In line #3, a repeat sentence ("for" sentence) is described. Following the repeat sentence of line #3, instructions of lines #4 to #7 are defined as an iteration function.

First, by line #4, the mask register (M-register) is set, and the X-register is cleared. The clear value of the X-register is stored in the address area defined by pointer register r3, that is, the most significant bit position of quotient c. Thus, the quotient is initialized (cleared).

By the instruction of line #5, the contents of pointer register r2 are stored in pointer register r0. Thereafter, in pointer register r1, the start address bs of the divisor is set, and the C-register is cleared.

In line #6, a repeat sentence is again described, and as an iteration function, the instruction of line #7 is defined. Specifically, the data of the memory cell at an address designated by pointer register r0 is stored in the X-register, and the pointer of pointer register is incremented by one. Thereafter, the data of the memory cell at the address designated by pointer register r1 is subtracted from the data stored in the X-register. This process is executed repeatedly.

After the subtraction is completed, the contents of C-register are transferred to the X-register, in accordance with the instruction of line #9. Thereafter, the value stored in the X-register is inverted, and the inverted value is stored in the M-register. By this operation, the magnitude relation between the divisor b and the first dividend is determined.

By line #10, the contents of pointer register r2 are again copied to pointer register r0, the start address bs of the divisor b is again initialized in pointer register r1, and the C-register is cleared, to be ready for the next processing.

By line #11, a repeat sentence is again designated, and from the data of the memory cell at an address designated by pointer register r0, the data of memory cell specified by pointer register r1 is subtracted. At this time, the pointer of pointer register r1 is incremented by one. The result of operation is stored in the X-register, the result of subtraction is stored at the position of memory cell address defined by pointer register r0, that is, the original reading position, and the pointer of pointer register r0 is incremented by one. This operation is repeatedly executed.

By line #14, the value of pointer register r2 is decremented by one, and by the instruction of line #15, 1 is stored in the X-register, the value stored in the X-register is stored in a memory cell position designated by pointer register r3, and the value of pointer register r3 is decremented by one.

Line #16 defines completion of the function described by the repeat sentence designated by line #1, and therefore, the process indicated by lines #2 to #15 is repeatedly executed.

Therefore, in the division program shown in FIG. 47, the divisor is subtracted from the dividend successively in a bit-serial manner, and the subtraction is executed selectively in accordance with the magnitude of the divisor and the dividend, whereby the divisor bit can be generated. Further, in the area of remainder d, the dividend is stored, the position for starting operation in the remainder area is successively decremented and shifted to the lower bit side, whereby digit of dividend of the division is shifted down, and the divisor is subtracted successively from the dividend to determine whether 1 holds as the quotient. By repeating this operation, the remainder can be obtained reliably at the end of division.

FIGS. 48A to 48F show a data flow when the division program shown in FIG. 47 is executed. In the following, the division operation will be specifically described.

Figure 48A:
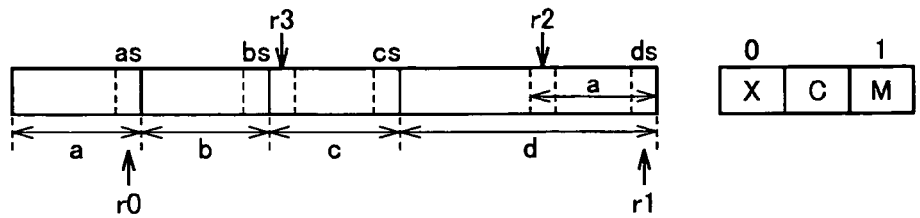
FIGS. 48A to 48F schematically show a data flow of the division program shown in FIG. 47.

As shown in FIG. 48A, by the instruction of line #0, "1" is set in the mask register (M-register), and pointer register r0 designates the least significant bit address as of dividend a. Further, pointer register r1 designates the least significant bit address position ds of the area for storing remainder d.

By the instruction of line #1, pointer registers r0 and r1 are successively incremented to execute load/store operation, whereby the dividend a is copied in the remainder storing area. The bit width of the remainder storing area is larger than the bit width of dividend a (bit width wider than the sum of bit width of dividend a and divisor b is prepared).

By copying the dividend a to the lower bit area of remainder area, the higher bit of dividend a is extended, to be ready for calculating the quotient by successively subtracting the divisor from the bit-width-adjusted dividend.

Thereafter, by the group of instructions of line #2, the position address of the most significant bit of the quotient storing area is set in pointer register r3, and pointer register r2 is set to designate the most significant bit position of dividend a in the remainder storing area.

Figure 48B:
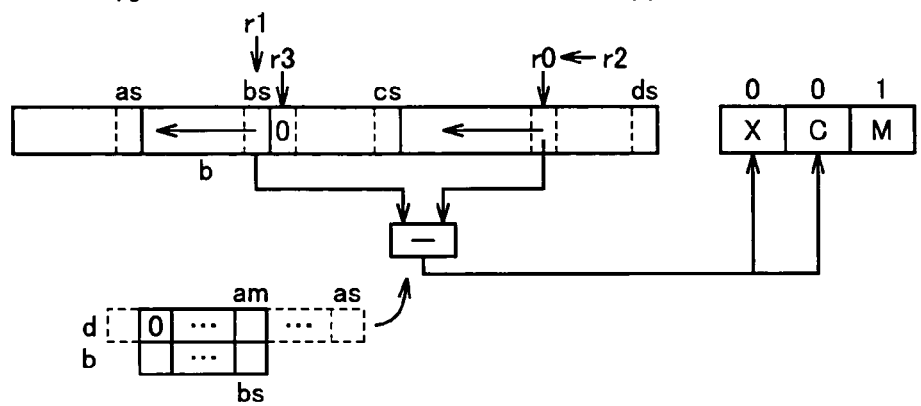

Next, as shown in FIG. 48B, by the group of instructions of line #4, the mask register (M-register) is again set to "1", the X-register is cleared to a state of holding "0", the value stored in the X-register is stored at the most significant bit position of the quotient storing area, and the quotient of the previous operation cycle is cleared.

Thereafter, pointers of pointer registers r0 and r2 are transferred, and the most significant bit position of dividend a in the remainder storing area is designated. In this state, the pointers of pointer registers r0 and r1 are successively incremented to execute the subtracting operation, and the result of subtraction is stored in the X-register and C-register. This operation corresponds to an operation of subtracting the divisor b from a value formed by the bits higher by the bit width of divisor b from the most significant bit am of the dividend a. Specifically, an operation of subtracting divisor b from the higher bits of the digit-adjusted dividend is executed.

Figure 48C:
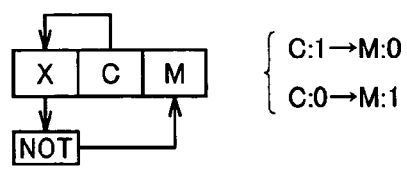

Thereafter, as shown in FIG. 48C, a comparison loop of the first bit of quotient c is executed, and by the group of instructions of line #9, the contents of C-register are transferred to the X-register, the value stored in the X-register is inverted (NOT), and the inverted value is transferred to the M-register. When the value stored in the C-register is "1", there is a borrow, indicating a state that the divisor b is larger and 1 cannot hold at the most significant bit of quotient c. When the value stored in the C-register is "0", the difference value is positive, and in that case, 1 is stored in the M-register (mask register). When the mask register (M-register) stores "0", the designated instruction is not executed. When the value stored in the mask register (M-register) is "1", an operation in accordance with the designated instruction is executed. Specifically, which of 0 and 1 is set as the quotient is determined by the value stored in the mask register (M-register).

Figure 48D:
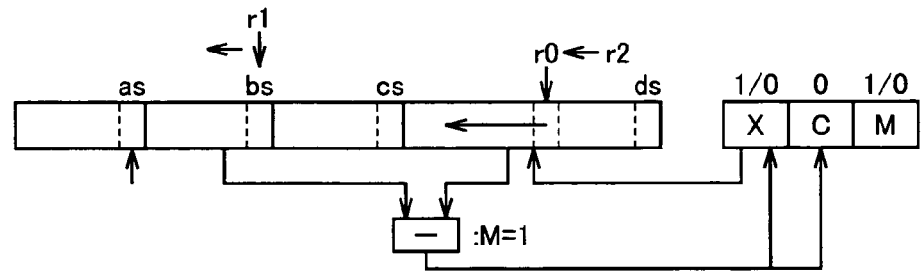

Next, as shown in FIG. 48D, by the group of instructions of lines #10 and #11, again, subtraction of divisor b from the value having the most significant bit am of dividend a as the least significant bit is performed. The result of subtraction is stored in the X-register and stored in the original area of the higher area. The subtraction is performed by successively incrementing pointers r1 and r0 (to which the pointer value of pointer r2 has been transferred). The subtracting operation is performed when the value stored in the mask register (M-register) is "1", and not performed when the value stored in the mask register (M-register) is "0". When 0 holds for the quotient, the subtraction is unnecessary, and it is required to store 0 in the corresponding bit of quotient c. Even for this unnecessary operation, the instruction is virtually executed without branching, as there is a possibility that 1 might hold in the division of other entries, and it is necessary to execute the division in all the entries in parallel (a common control signal is generated to every entry from the controller).

Figure 48E:
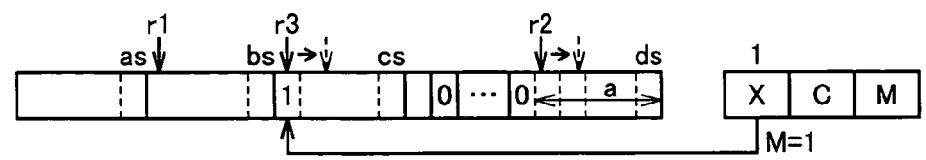
Figure 48F:
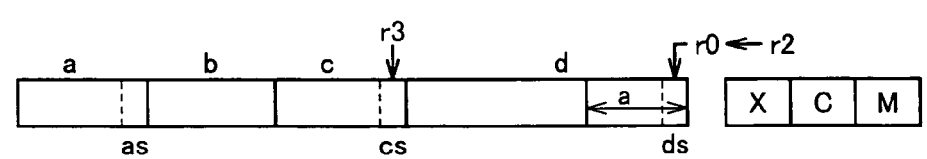

Then, as shown in FIG. 48E, when the subtraction is completed, the pointer of pointer register r2 is decremented by one in accordance with the instruction of line #14, 1 is set in the X-register, and at a position indicated by the pointer of pointer register r3, "1" is stored. This process is executed when the value stored in the M-register (mask register) is 1. When the value stored in the M-register is "0", the value is not stored and "0" is maintained at the position indicated by the pointer register r3 of the storage area for quotient c.

Thus, the pointer of pointer register r3 is decremented by one, and the next bit position of the quotient is designated.

Thereafter, by repeating the process described above, finally, pointer register r3 designates cs to be stored as the least significant bit of quotient c, or point register r0 is set to a state for designating the least significant bit ds in the remainder storing area. Thus, by repeatedly executing the subtracting operations, the result of subtraction of the least significant bit of quotient c can be obtained. In the remainder storing area, the decrement value based on the result of subtraction between dividend a and divisor b is stored (when the value stored in the M-register is 1).

When the dividend a in the remainder area is smaller than the divisor b, the value stored in the M-register assumes "0", and therefore, eventually, the result of operation having quotient c=0 and remainder d=a is obtained.

When a plurality of registers are provided in the ALU unit, the division operation can be achieved in the bit-serial manner using the registers. Thus, division of a plurality of data can be executed in parallel, and no matter whether the contents of division in respective entries may have quotient 1 or 0, the number of cycles of the operation is the same. Therefore, parallel division processing is achieved.

As described above, according to Embodiment 11 of the present invention, each unit ALU circuit block (arithmetic logic unit) in the group of arithmetic logic units includes a mask register, a carry register and an X-register, and the arithmetic/logic operation by the processing circuit is set by the controller in accordance with a program instruction. Therefore, parallel processing can be done on a large number of words in the bit-serial manner.

The controller may have a configuration that enables the following. Namely, the program instruction is decoded, the control signal to select a memory cell of the memory mat (main processing circuitry) and to effect writing/reading is generated in accordance with the result of decoding, and the contents of logic operation of the logic operation processing circuit of the ALU unit are generated by the register control signal and the processor selecting signal, to achieve the designated state of operation. Address calculation may be executed by using a general purpose register and a pointer register.

Embodiment 12

Figures 49, 50:
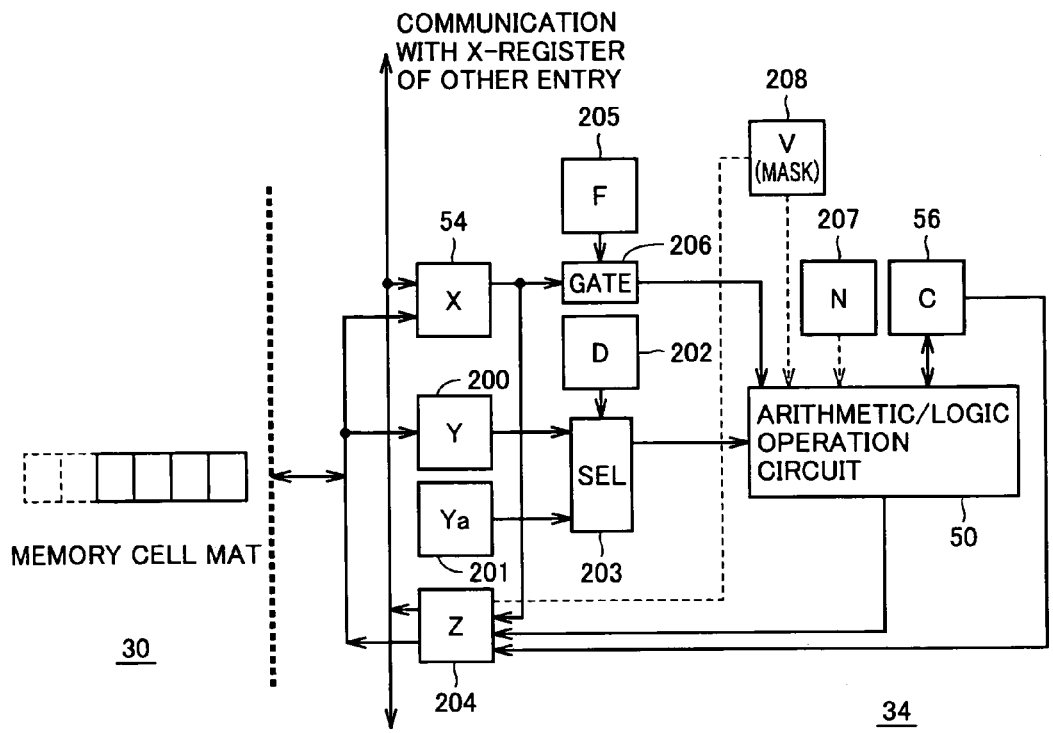
FIG. 49 schematically shows a configuration of a unit ALU circuit block in accordance with Embodiment 12 of the present invention.
FIG. 50 shows, in the form of a list, procedures for generating a partial product in accordance with second order Booth's algorithm.

FIG. 49 schematically shows a configuration of the unit ALU circuit block (ALU unit) 34 in accordance with Embodiment 12. Referring to FIG. 49, ALU unit 34 includes, in addition to arithmetic/logic operation circuit (ALU) 50, X-register 54 and C-register 56, a Y-register 200, a Ya-register 201, a D-register 202, a selector (SEL) 203 selecting one of the values stored in Y-register 200 and Ya-register 201 in accordance with the value stored in D-register 202 and transferring the selected value to arithmetic/logic operation circuit 50, and a Z-register 204.

The Z-register 204 receives data from the arithmetic/logic operation circuit (ALU), X-register 54 and C-register 56, and transfers the data to the X-register of another entry or to the corresponding entry of memory mat 30. The X-register is capable of transferring data to/from the register of other entries.

ALU unit 34 further includes an F-register 205, a gate circuit 206 selectively transferring the value stored in the X-register 54 to arithmetic/logic operation circuit 50 in accordance with the value stored in F-register 205, an N-register 207 storing a constant value, and a V-register 208 storing a mask bit controlling activation/inactivation of arithmetic/logic operation circuit 50 and Z-register 204. V-register 208 provides a function similar to that of mask register (M-register) according to Embodiment 11.

In the configuration of ALU unit 34 shown in FIG. 49, the number of register circuits is increased as compared to that of Embodiment 11. By effectively utilizing the increased number of register circuits, multiplication is executed in accordance with second order Booth's algorithm. Second order Booth's algorithm reduces by half the number of partial products generated. When we represent the multiplicand by X, multiplier by Y and product by Z, the product Z can be given as:

$$Z = X \cdot \sum_{j=0}^{(n-1)/2} (y_{2j-1} + y_{2j} - 2 \cdot y_{2j+1}) \cdot 2^{2j} \quad (1)$$

$$Y = (y_n, \ldots, y_0)$$

From Equation (1), it can be seen that by looking at neighboring three bits of multiplier Y at one time, the number of partial products generated by multiplication by multiplicand X can be reduced to one half times. Further, the value in the parenthesis of Equation (1) varies among 0, ±1 and ±2. Therefore, the partial product to be added is given as $\pm 2 \times X \times 2^j$, $\pm X \times 2^j$ or 0. Multiplication by 2 can be implemented by 1-bit left shift operation. A negative operation can be implemented by adding two's complement value.

FIG. 50 represents a procedure for generating a partial product in accordance with second order Booth's algorithm. From equation (1), the value X2j is 0 when corresponding three bits y(2j+1), y(2j) and y(2j−1) are all 0 or 1, and therefore shift up is unnecessary and 0 is stored (operation is not performed). Here, suffixes of multiplier bits as shown in Equation (1) are given by the numerals in the parenthesis.

When the multiplier bit y(2j+1) is 0 and one of multiplier bits y(2j) and y(2j−1) is 1, the multiplicand bit X×2j is multiplied by one, and stored in the original bit position (2j bit shift up).

When the multiplier bit y(2j+1) is 0 and multiplier bits y(2j) and y(2j−1) are both 1, the multiplicand bit $X \times 2^j$ is multiplied by 2, and shifted up by further 1 bit. Thus, the bit position is shifted up by (2j+1) bits.

When the multiplier bit y(2j+1) is 1 and multiplier bits y(2j) and y(2j−1) are both 0, multiplication by −2 takes place, and therefore, shift up of (2j+1) bits is performed and the two's complement value thereof is calculated, or alternatively, the two's complement value is calculated first and shift up of (2j+1) bits is performed.

When the multiplier bit y(2j+1) is 1 and one of multiplier bits y(2j) and y(2j−1) is 1, the multiplicand bit $X \times 2^j$ is multiplied by −1, and therefore the result of multiplication is shifted up by 2j bits, and two's complement value thereof is calculated (or the two's complement value of multiplication result is shifted up by 2j bits).

Figure 51:
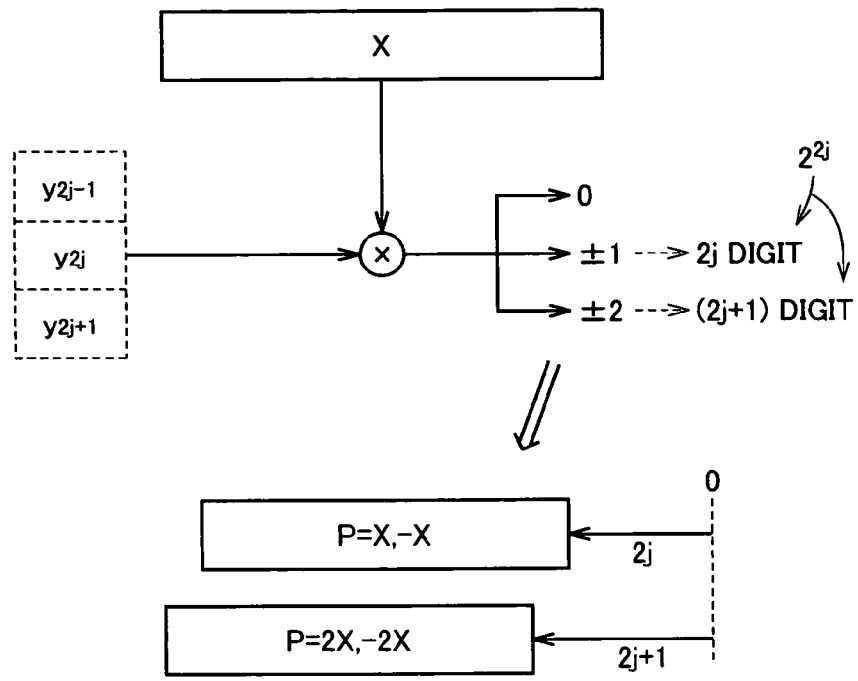
FIG. 51 schematically shows the process for generating a partial product in accordance with second order Booth's algorithm.

FIG. 51 schematically shows the procedure of generating the partial product shown in FIG. 50. The multiplicand X is multiplied by the result of decoding multiplier bits y(2j−1), y(2j) and y(2j+1), to generate partial products. Here, in accordance with the value of 3-bit multiplier, the coefficient for the multiplicand X is any of 0, ±1 and ±2.

In order to generate a partial product corresponding to the digits of multiplier bit y(2j), multiplicand X is shifted by 2j digits when the coefficient is ±1, and further shifted by one digit to the higher side when the coefficient is ±2. By shifting the multiplicand X in accordance with second order Booth's algorithm, the partial product P can be generated.

Figure 52:
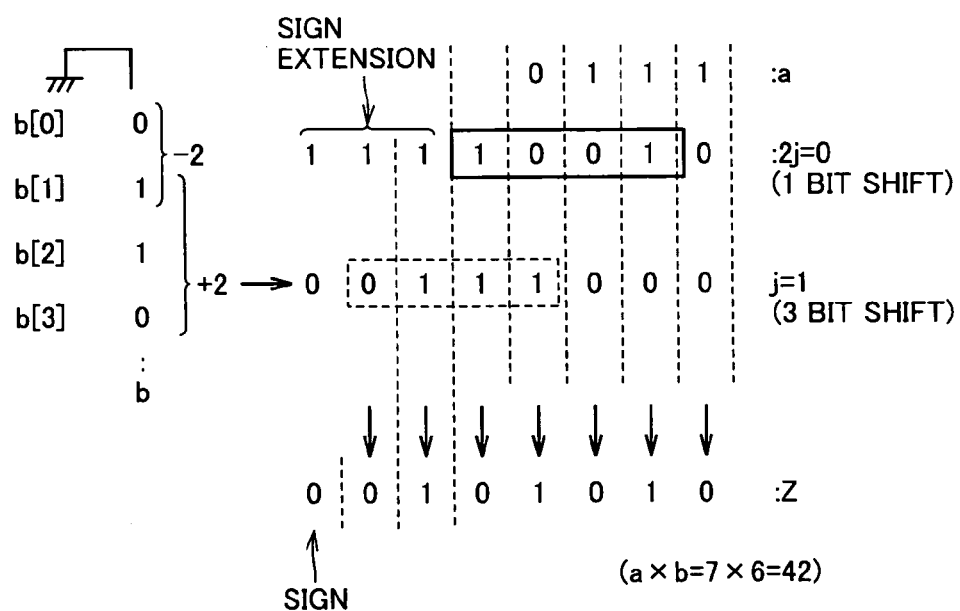
FIG. 52 shows an example of multiplication in accordance with second order Booth's algorithm.

FIG. 52 shows a specific example of generating a partial product in accordance with second order Booth's algorithm. Referring to FIG. 52, the multiplicand a is (0111), and the multiplier b is (0110). In accordance with second order Booth's algorithm, in the set of multiplier bits, the even-numbered bit (y(2j)) is used as the central bit. Therefore, the 0-th bit b[0] of the multiplier b is assumed to be y(2j). Here, multiplier bit y(2j−1) is set to 0. In this example, from the list of FIG. 50, an arithmetic operation of multiplication by −2 is performed, and therefore, the multiplicand a is shifted by 1 bit and two's complement thereof is obtained. Consequently, (10010) is calculated as a partial product. For bit position adjustment of the result of multiplication, sign extension is performed always in the bit direction, and "1" is set in the higher bits.

In generating the next partial product, the multiplier bit b[2] is used as the multiplier bit y(2j). Therefore, here, by multiplying the multiplier a by 2, the partial product is obtained, and as j=1, the partial product can be obtained by a left shift of 3 bits. By adding these partial products, the result of multiplication Z=(00101010) is obtained. In this manner, a×b=7×6=42 is obtained.

According to second order Booth's algorithm, a 4-bit multiplication requires two times of partial product calculation. Therefore, as compared with calculation of partial product of each bit, the number of times of calculating partial products can significantly be reduced. The multiplication according to second order Booth's algorithm is achieved by ALU unit 34 shown in FIG. 49. In the following, operation instructions for executing second order Booth's algorithm will be described.

FIG. 53 shows, in the form of a list, register instructions representing operation on the registers in accordance with Embodiment 12 of the present invention. Referring to FIG. 53, in addition to register instructions of Embodiment 11, an instruction "reg. inc2 rx" representing an operation of incrementing by 2 by one instruction is prepared. The instruction "reg. inc2 rx" is an instruction to increment the pointer of pointer register rx by 2. Other register instructions are the same as those described with reference to FIG. 35 of Embodiment 11.

FIG. 54 shows, in the form of a list, operation instructions on X-register, V-register, N-register, C-register and F-register included in the ALU unit.

The instruction "alu. set. #R" is for setting 1 in a register #R (X-register, V-register and N-register).

The instruction "alu. clr. #RR" is for clearing the register #RR (X-register, C-register and F-register).

These set/clear instructions are the same as the set/clear instructions among the ALU instructions of Embodiment 11 described above. In Embodiment 12, however, X-register, V-register and N-register can be set, and X-register, C-register and F-register can be cleared.

FIG. 55 shows, in the form of a list, inter-register transfer instruction for the registers included in the ALU unit.

The instruction "alu. cpy. #R#U" instructs an operation of copying the contents of register #R to register #U. The copy instruction shown in FIG. 55 differs from the inter-register transfer instruction of Embodiment 11 simply in the names of registers used, and the contents of operation are the same.

FIG. 56 shows, in the form of a list, load/store instructions among the ALU instructions of Embodiment 12.

The instruction "mem. 1d. #R@rx" is for storing memory cell data Aj[rx] designated by the pointer register rx to register #R (X-register, Y-register).

The instruction "mem. st@rx" is for storing the value stored in the X-register to a memory cell address Aj[rx] designated by the pointer register rx. This store instruction is executed when the value stored in the V-register is "1" and the corresponding ALU unit is set to the enabled state. When the mask register (V-register) is in the cleared state, the store instruction is not executed.

FIG. 57 shows, in the form of a list, instructions for moving data between entries.

By the instruction "ecm. mov. n#n", the value stored in the Z-register of an entry j+n apart by a constant n is moved to the X-register of entry j. When data is transferred between entries, the destination of data transfer is determined in a cyclic manner (when the maximum entry number is exceeded, operation returns to the entry of the minimum entry number).

By the instruction "ecm. mov. r rn", the value stored in the Z-register of an entry j+rn apart by the value rn stored in the register rx is moved to the X-register of entry j. For this movement also, the destination of transfer is determined in the cyclic manner.

When data is transferred between entries in accordance with rn set in a register, the pointer register used is any of four pointer registers r0 to r3 and is determined by the storage contents of these pointer registers.

At the time of this data transfer between entries, data is transferred from the Z-register to the X-register.

FIG. 58 shows, in the form of a list, instructions defining arithmetic operations performed by the arithmetic logic unit (ALU unit).

The instruction "alu. op. adc" is for storing the data of a memory address designated by the pointer register rx to the Y-register, and performing full addition of the value stored in the Y-register and the value stored in the X-register. The result of addition (Sum) is stored in the Z-register, and the carry is stored in the C-register. The addition is executed when the N-register and the V-register are both set.

The instruction "alu. op. sbb" is for storing the data of a memory address designated by the pointer register rx to the Y-register, and performing a subtraction of the value stored in the Y-register and the value stored in the X-register (Y-X). The result of subtraction is stored in the Z-register, and the borrow is stored in the C-register. The subtraction instruction is also executed when N-register 207 and V-register 208 are both set.

FIG. 59 shows, in the form of a list, arithmetic/logic operation instructions related to the execution of second order Booth's algorithm in the ALU instructions.

The instruction "alu. op. booth" is for determining values of conditional branching registers, that is, N-register and V-register necessary for executing second order Booth's algorithm, using the stored values of $(y(2j+1), y(2j), y(2j-1))$ =(Y, X, F) that are necessary for conditional branching in second order Booth's algorithm. Before the execution of Booth's instruction "alu. op. booth", a 2-bit multiplier is set in each of X-register 54 and Y-register 200, using a load instruction. These operations are executed when mask register (V-register) 208 is set.

In the N-register, information as to whether a shift-up is to be caused by multiplication or not is set. In D-register 202, information as to whether $(2j+1)$ bit shift is to be done or not is stored. The value of Y-register is stored in F-register 205. Specifically, in the N-register, when the value $y(2j+1)$ of the Y-register is "1" and at least one of the values $y(2j)$ and $y(2j-1)$ stored in the X-register and F-register is "0", "1" is set, and when the bit $y(2j+1)$ stored in Y-register 200 is "0" and one of the bit values $y(2j)$ and $y(2j-1)$ stored in the X-register and F-register is "1", "1" is set in the N-register, designating a shift up.

When the value $y(2j+1)$ of the Y-register is "0" and the values $y(2j)$ and $y(2j-1)$ stored in the X-register and F-register are both "0", or when the value stored in the Y-register is "1" and the values stored in the X-register and F-register are both "0", the D-register is set to "1". The value stored in the D-register designates a shift up of $(2j+1)$ bits. By transferring the contents of Y-register to the F-register, the multiplier bit $y(2j+1)$ can be used as the multiplier bit $y(2j-1)$ for the next operation with j being incremented by one.

The instruction "alu. op. exe" is for executing second order Booth's algorithm, and conditional branching is taken in accordance with the values stored in the D-register and F-register.

When the value stored in the D-register is 1, the value of Ya-register is selected by selector 203. When the value stored in the D-register is 0, the value stored in the Y-register is selected. This execution instruction (EXE instruction) is an addition instruction when the value stored in the F-register is 0, and it is a subtraction instruction when the value stored in the F-register is 1.

When the execution instruction "alu. op. exe" is valid, in accordance with the value stored in F-register 205, gate circuit 206 shown in FIG. 49 performs inversion or non-inversion of the value stored in X-register 54. When the Booth instruction is executed, gate circuit 206 generates complementary values X, !X and F, !F of the values stored in X-register 54 and F-register 205.

The contents of operation of gate circuit 206 is determined by a control signal (ALU control) from an instruction decoder included in the controller.

FIG. 60 is a table showing values stored in respective registers, that is, Y-register 200, X-register 54, F-register 205, D-register 202 and N-register 207, and corresponding contents of control (partial product generating procedure), when the Booth instruction shown in FIG. 58 is executed.

As described above, in Y-register 200, X-register 54 and F-register 20, multiplier bits $y(2j+1)$, $y(2j)$ and $y(2j-1)$ are set, respectively. By executing the Booth instruction "alu. op. booth" in accordance with the values stored in the Y-register, X-register and F-register, 0 or 1 is set in D-register 202 or N-register 207. The Booth instruction completes the preparation for calculating the partial products of multiplicand X.

The value of the F-register is used for determining whether the multiplier is to be provided as a complement or not for generating the partial product, in combination with the values stored in the D-register and N-register. By switching addition and subtraction, the complement of partial product can selectively be generated (subtraction is the same as addition of a complement).

Further, the instruction "alu. op. exe" can be applied to operations other than multiplication according to Booth's algorithm, and in accordance with the value stored in D-register 202, addition or subtraction can selectively be executed. The execution instruction "alu. op. exe" involves an addition instruction and a subtraction instruction.

By the use of Ya-register 201, a multiplier shifting operation is implemented. In Ya-register 201, when the Booth instruction is executed, the value stored in Y-register 200 loaded last time is copied (Ya=Yj in the EXE instruction). Therefore, when the initial value of Ya-register 201 starts from 0, by three bits stored in the Y-register, Z register and Ya-register, the state can be prepared in which a multiplier of 2 bits is loaded and 1-bit multiplier is shifted. Specifically, by storing the bit y1 from (y1, y0, 0) in the Ya-register, a set of three bits (y3, y2, y1) can be generated at the time of loading when the next Booth instruction is executed.

FIG. 61 shows, in the form of a list, instructions for performing logic operations, in the ALU instructions.

The instruction "alu. op. and" designates an operation of storing the memory cell data of the address designated by the pointer of pointer register rx to the Y-register, performing a logical product operation on the value stored in the Y-register and the X-register, and storing the result of logical product operation in the Z-register. When the V-register (mask register) is not set, this logical product operation (AND operation) is not executed.

The instruction "alu. op. or" is for storing the memory cell data of the address designated by the pointer of pointer register rx to the Y-register, performing a logical sum operation on the value stored in the Y-register and the value stored in the X-register and storing the result of logical sum operation in the Z-register. The logical sum instruction is executed when the mask register (V-register) is set.

The instruction "alu. op. exor" designates an operation of storing the memory cell data of the address designated by the pointer of pointer register rx to the Y-register, performing an exclusive logical sum operation on the value stored in the Y-register and the X-register, and storing the result of operation in the Z-register. The exclusive logical sum operation (EXOR operation) is also executed when the mask register (V-register) is set, and it is not executed when the V-register is cleared.

The instruction "alu. op. not" designates an operation of inverting the value stored in the X-register and storing the result of inversion in the Z-register. This inversion instruction is not executed when the V-register is cleared, either.

The instruction "alu. op. LT" is for setting the N-register to 1 or clearing to 0 in accordance with the value stored in the C-register. When the value stored in the C-register is 1, the N-register is cleared to 0.

FIG. 62 shows a program describing, using these instructions, an operation of multiplication in accordance with second order Booth's algorithm. In the following, the multiplication in accordance with second order Booth's algorithm will be described with reference to FIG. 62.

First, by the instruction of line #0, the mask register (V-register) is set, and execution of an operation is designated.

Thereafter, by the instruction of line #1, a start address of multiplier b and a start address cs of an area for storing the result of multiplication c are set in pointer registers r2 and r3, respectively. Further, the F-register is cleared and "0" is stored.

In line #2, a repeat sentence is described, bit width of multiplicand a is determined, and when the repeat sentence is executed, j is multiplied by 2.

According to line #3, the data bit set in pointer register r2 is stored in the X-register, and the data of the memory cell designated by pointer register r2 is stored in the Y-register. Here, the pointer register r2 is incremented by one when the instruction is executed, and therefore, by the instruction of line #3, 2 bits of multiplier, $y(2j+1)$ and $y(2j)$ are stored in the Y-register and X-register, respectively.

In accordance with line #4, Booth instruction is executed, and as can be seen from the contents of operation shown in FIG. 59, values stored in the N-register and D-register are set, and the value stored in the Y-register is copied to the F-register. Thus, the partial product generating procedure is set.

By the instruction of line #5, the address indicating the first bit position of the multiplication result c stored in register r3 is copied to pointer register r0, and the initial address (least significant bit address) as of the multiplicand a is set in pointer register r1.

In line #6, a repeat sentence is described, and a repetitive operation on multiplier b is executed until the condition of "for" sentence with respect to i is satisfied. For the multiplier b, the constant i representing the number of times of repetition is incremented one by one.

By the instruction of line #7, the data (value of multiplication result) stored in pointer register r0 is stored in the X-register, and thereafter, the data designated by the pointer of pointer register r1, that is, the corresponding bit of multiplicand a is stored in the Y-register. In this state, the Booth algorithm executing instruction (EXE instruction) is executed, addition or subtraction of multiplicand bit aj and the multiplication result bit is executed, partial products are added, and the result of addition is stored in the Z-register. Thereafter, at the memory cell position designated by pointer register r0, the result of addition or subtraction stored in the Z-register is stored.

Line #8 indicates the end of the repeat sentence defined by line #6. Therefore, in this function sentence, the set of 3 bits of multiplier b is decided, and generation of partial product of multiplicand a and addition to the partial products provided up to that time point are executed.

Line #9 again defines a repeat sentence for the bit width of multiplier b. The process for aligning digits is performed by extending the sign of the partial product.

By the instruction of line #10, the data at the address position designated by the pointer register r0 is stored in the X-register, and the partial product generated in accordance with the instruction of line #7 is read. Thereafter, operation is done again in accordance with second order Booth's algorithm, a partial product is generated, and again, the result of partial product generated is stored in the memory cell position designated by the pointer register r0. The pointer register r0 designates the position of storing the result of multiplication c, and by incrementing the pointer of pointer register r0, the sign bit is described at a higher bit position than that of the partial product generated by the previous processing. The bit width of the generated partial product is matched with the bit width of the final result of multiplication c.

When the sign extension process of multiplication result c is completed, by line #12, the pointer of pointer register r3 is incremented by two.

By the description at the end of function sentence on line #13, the series of operations on one bit aj of multiplicand a is completed, and the process is executed on the data higher by 1 bit of the multiplicand a.

Figure 63:
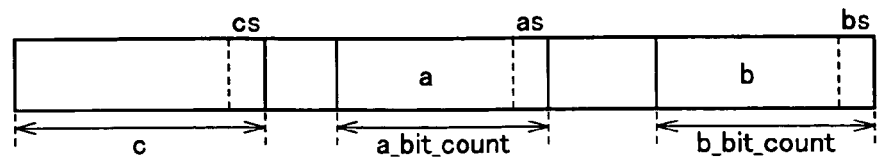
FIG. 63 shows an entry address pointer at the time of multiplication in accordance with Embodiment 12 of the present invention.

FIG. 63 shows addresses of one entry of the initial value, in connection with the signed Booth algorithm multiplication program shown in FIG. 62. The start position (least significant bit position) of the area storing the multiplication result c is set by the address cs. The multiplicand a has a bit width a_bit_count, and the least significant bit position thereof is designated by an address as. The multiplier b has the bit width b_bit_count, and the least significant bit position thereof is designated by an address bs.

Figure 64:
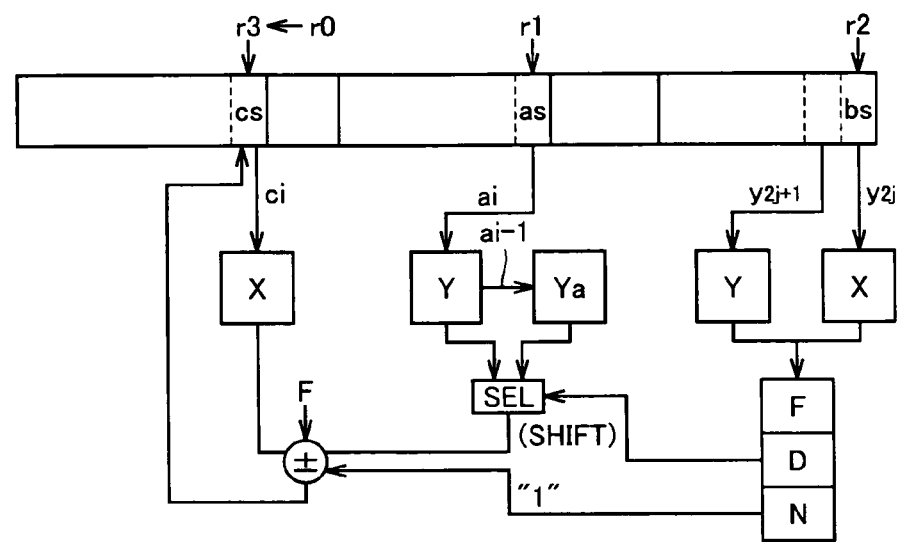
FIG. 64 schematically shows a flow of data bits at the time of multiplication in accordance with Embodiment 12 of the present invention.
Figure 65:
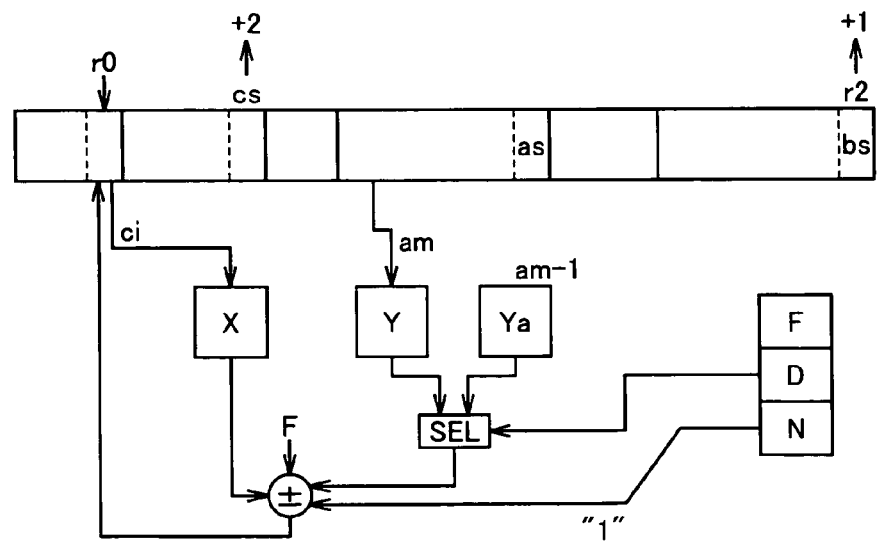
FIG. 65 schematically shows a multiplication process in accordance with Embodiment 12 of the present invention.

As shown in FIG. 64, first, by the instruction of line #1 of FIG. 62, the address cs is set in pointer register r3, and the address bs is set in pointer register r2.

By the instruction of line #3, the multiplication bits y(2j) and y(2j+1) designated by pointer register r2 are stored in the X-register and Y-register, respectively. Consequently, the initial values of the F-register, D-register and N-register are set by the Booth instruction of line #4. Thus, the result of decoding is designated for the partial product, and which of 0, ±1 and ±2 operations is to be performed is set.

Thereafter, by the instruction of line #5, the contents of pointer register r3 are transferred to pointer register r0, and the address of the area for storing the result of multiplication is designated by pointer register r0. Further, the least significant bit address as of multiplicand a is set in pointer register r1. In accordance with the instruction of line #7, by the pointer of pointer register r0, the multiplication result bit ci of the previous cycle is stored in the X-register, an by the pointer of pointer register r1, the bit ai of multiplicand a is stored in the Y-register. In accordance with the contents stored in the D-register, one of Y-register and Ya-register is selected, and when the N-register is "1", addition or subtraction is performed in accordance with the value stored in the F-register. The result of operation is stored in the bit position from which the result bit ci is read.

By the selection of the Ya-register and Y-register, a $2^j$ bit shit or $2^j+1$ bit shift operation is implemented.

Thereafter, the pointers of pointer registers r0 and r1 are incremented, contents of the F-register, D-register and N-register are made definite, and similar arithmetic operation is executed. Consequently, addition/subtraction of a new multiplicand is performed in bit-serial manner, on the partial product provided up to that time point.

When these operations of generating the partial products are completed, in accordance with the instruction of line #9, at a higher bit position of the area for storing the multiplication result, similar Booth execution instruction is executed on the position designated by pointer register r0. At this time, in the Y-register, the most significant bit am of multiplicand a is stored, and in the Ya-register, the second most significant bit a(m−1) is stored. Therefore, the same operation as the generation of most significant bit of partial product described above is performed, and the result of operation is again written to the position designated by pointer register r0. Thus, sign extension process is performed, and 0 or 1 is successively written to the higher bit positions.

After completion of these processes, the pointer of pointer register r3 is incremented by two and the value of pointer register r2 is incremented, to be ready for the next second order Booth's decoding operation. By executing the above-described series of processes on the sets of an even-numbered bit and a neighboring odd-numbered bit of multiplier b, it becomes possible to obtain the final product by successively generating partial products and adding to the previous partial product, in bit-serial manner.

As can be seen from the repeat sentence of line #2 shown in FIG. 62, the addition of partial products is completed in the operation cycles ½ times the bit width of multiplier b, and thus, high speed multiplication is possible.

The group of instructions described above can be applied not only to multiplication according to second order Booth's algorithm but also to normal addition/subtraction and division. Each of these operations will be described in the following.

FIGS. 66A and 66B show an addition program using the operation instructions in accordance with Embodiment 12. Referring to FIG. 66A, a binary addition (a+b)=c is performed. Least significant bit addresses of operands a, b and c are set to as, bs and cs, respectively.

FIG. 66B shows a program for performing the binary addition. In the addition program, the same arithmetic operation as in Embodiment 11 is performed, except that registers used have different names.

FIGS. 67A and 67B represent a program for performing a binary subtraction in accordance with Embodiment 12 of the present invention. As shown in FIG. 67B, an operation of (a−b)=c is performed. The least significant bit addresses of operands a, b and c are as, bs and cs.

FIG. 67B shows the subtraction program. In the subtraction program shown in FIG. 67B, the same arithmetic operation as in Embodiment 11 is performed, except that operation instructions have different names, and similar subtraction operation can be executed in accordance with a subtraction instruction "alu. op. sbb".

FIG. 68 shows a program of an unsigned binary multiplication using operation instructions in accordance with Embodiment 12 of the present invention. In the program shown in FIG. 68, a binary multiplication of a×b=c is performed. The least significant bit addresses of operands a, b and c are as, bs and cs.

In the multiplication program shown in FIG. 68, though the instructions used have different names, similar processes as in Embodiment 11 are performed, and by successively adding the bits of the same digits of partial products, the final product can be obtained.

FIG. 69 shows an exemplary division program using operation instructions in accordance with Embodiment 12 of the present invention. In the division program shown in FIG. 69, an operation of a/b=c . . . d is performed. The least significant bit addresses of dividend a, divisor b, quotient c and remainder d are set to as, bs, cs and ds, respectively.

In the division program of FIG. 69 also, similar processes as in Embodiment 11 are performed using registers of different names. By successively performing subtraction of divisor b from dividend a, the quotient and remainder can be calculated.

As described above, according to Embodiment 12, a plurality of registers and gate circuits are provided in the unit ALU circuit block (arithmetic logic unit), and Booth instruction "alu. op. booth" and Booth algorithm execution instruction "alu. op. exe" are prepared as operation instructions. Thus, multiplication can be done in accordance with second order Booth's algorithm, realizing high speed multiplication.

Embodiment 13

Figure 70:
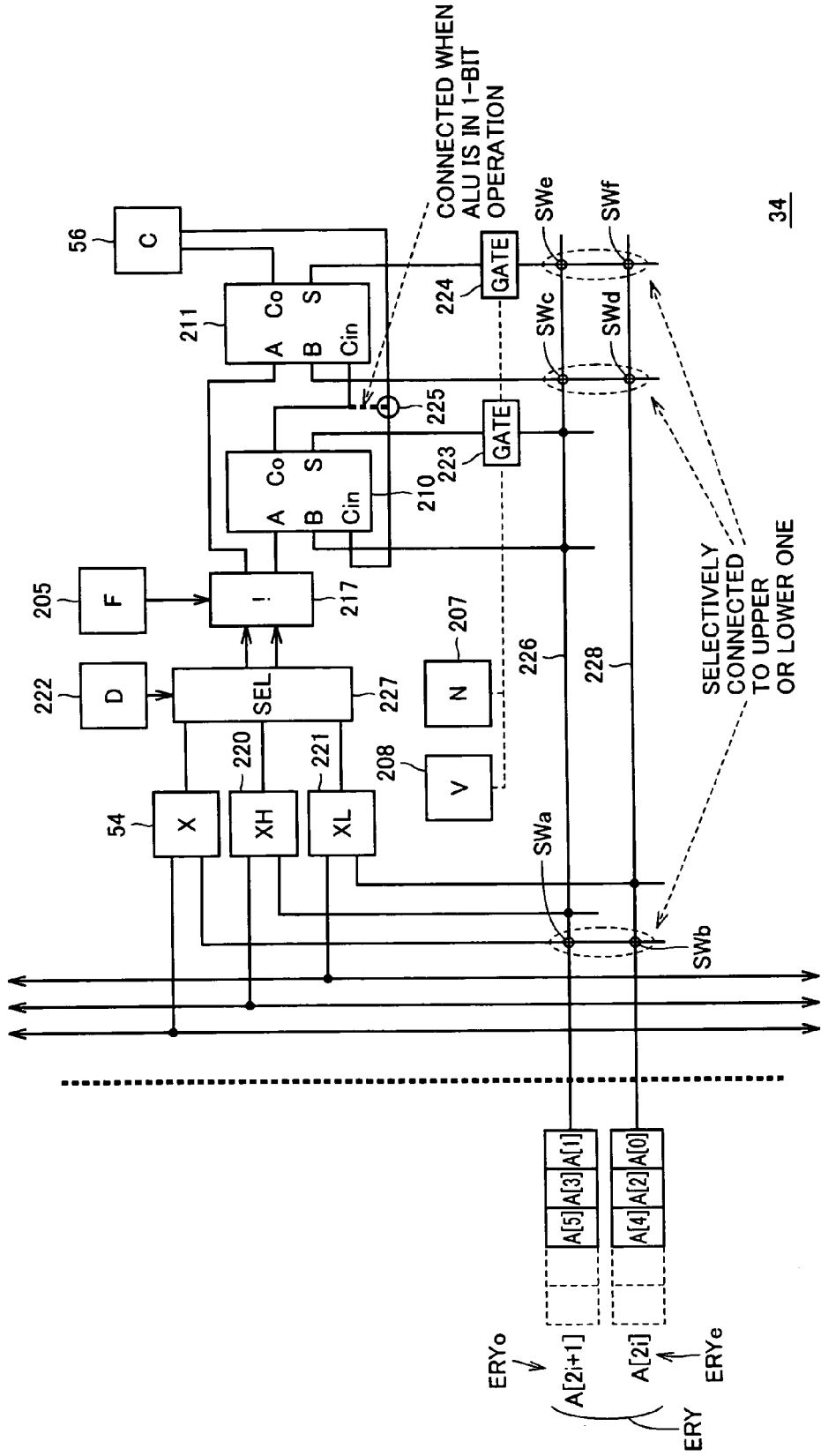
FIG. 70 schematically shows a configuration of a unit ALU circuit in accordance with Embodiment 13 of the present invention.

FIG. 70 schematically shows a configuration of unit ALU circuit block (arithmetic logic unit; ALU unit) 34 in accordance with Embodiment 13. According to Embodiment 13, in the memory mat, one entry ERY is divided into an even-numbered entry ERYe storing data bits A[2i] of even-numbered addresses and an odd-numbered entry ERYo storing data bits A[2i+1] of odd-numbered addresses. By performing operations in parallel on the data bits of the same address of even-numbered entry ERYe and odd-numbered entry ERYo, speed of processing can be improved.

In ALU unit 34, cascade-connected full adders 210 and 211 for arithmetic/logic operation are provided as arithmetic/logic operation devices. The process data of ALU unit 34 and the registers for setting the contents of operations, that is, X-register 54, C-register 56, F-register 205, V-register 208 and N-register 207 achieve the same functions as those of Embodiment 12.

In Embodiment 13, ALU unit 34 further includes: an XH-register 220 and an XL-register 221 storing in parallel 2 bits of data; a selector (SEL) 227 selecting, in accordance with the value stored in D-register 222, 2 bits of one of the set of data from registers 54, 220 and 221; a selective inverting circuit 217 performing inversion/non-inversion on 2 bits selected by selector 227, in accordance with a bit stored in F-register 205; and gates 223 and 224 selectively outputting 3-outputs S of full adders 210 and 211 in accordance with data stored in registers 207 and 208.

The outputs of two bits from selective inversion circuit 217 are applied to A-inputs of full adders 210 and 211, respectively. XH-register 220 and XL-register 221 transfer odd-numbered address bit of odd-numbered entry ERY0 and even numbered address bit of even-numbered entry ERYe, through internal data lines 226 and 228, respectively. X-register 54 is selectively connected to one of internal data lines 226 and 228 by switch circuits Swa and SWb.

Full adder 210 has its B-input coupled to internal data line 226, and an output of gate 223 receiving an S-output of full adder 210 is also connected to internal data line 226. Full adder 211 has its B-input selectively connected to one of internal data lines 226 and 228 by switch circuits SWc and SWd. An output of gate 224 receiving the S-output of full adder 211 is also selectively connected to one of internal data lines 226 and 228, in accordance with switch circuits Swe and SWf By these switch circuits SWa to SWf, bit-by-bit serial processing of 2-bit parallel division is executed.

Gates 223 and 224 execute the designated arithmetic/logic operation when the values stored in V-register 208 and N-register 207 are both "1", and otherwise, output a high impedance (set to an output high-impedance state).

Further, the value stored in C-register 56 is connected to a carry input Cin of full adder 211. The carry output Co of full adder 210 is connected to carry input Cin of full adder 211, and to carry input Cm of full adder 210 through a switch 225. The switch 225 separates the carry output Co of full adder 210 and connects carry input Cin of full adder 211 to C-register 56 when an arithmetic/logic operation is to be done bit by bit.

In ALU unit 34 shown in FIG. 70, any Z-register is not used, and X-register 54, XH-register 220 and XL-register 221 are capable of data transfer to and from corresponding registers of other entries.

In Embodiment 13, as pointer registers for designating addresses of the memory mat, pointer registers p0 to p3 are used. Besides, pointer registers r0 to r3 in general purpose registers are also used.

FIG. 71 shows, in the form of a list, pointer register instructions related to operations of pointer registers p0 to p3.

The instruction "ptr. set n, px" is for setting an arbitrary value n in a pointer register px. The arbitrary value n may assume any value within the range of the bit width (O-BIT-_MAX) of one entry.

The instruction "ptr. cpy px, py" is a copy instruction for transferring and copying the contents of pointer register px to pointer register py.

The instruction "ptr. inc px" is for incrementing by one the pointer of pointer register px.

The instruction "ptr. inc2 px" is for incrementing by two the pointer of pointer register px.

The instruction "ptr. dec px" is for decrementing by one the pointer of pointer register px.

The instruction "ptr. dec2 px" is for decrementing by two the pointer of pointer register px.

The instruction "ptr. sft px" is for left-shifting by one bit the pointer of pointer register px.

By utilizing instructions "ptr. inc2 px" and "ptr. dec2 px", 2-bit parallel processing becomes possible (odd and even addresses are simultaneously updated).

FIG. 72 shows, in the form of a list, load/store instructions of 1-bit operation.

Referring to FIG. 72, the instruction "mem. 1d. #R@px" is for storing (loading) the data at a position Aj[px] designated by the pointer register px to register #R.

The instruction "mem. st. #R@px" is for writing (storing) the value stored in register #R to the memory cell position Aj[px] designated by the pointer register px. The store instruction is not executed when the mask register (V-register 208) is cleared.

The instruction "mem. swp. X@px" is for swapping the value stored in the X-register and the data at the memory cell position Aj[px] designated by the pointer register px. The swap instruction is executed when "1" is set both in the mask register (V-register) 208 and in N-register 207. As the X-register is cleared/set by the data stored in the memory cell, circuit configuration can be simplified.

FIG. 73 shows, in the form of a list, load/store instructions for the ALU unit in 2-bit operation.

Referring to FIG. 73, the instruction "mem2. 1d. X@px" is for storing the data of memory cell positions Aj[px] and Aj[px+1] designated by the pointer register px to XL register 221 and XH-register 220. Specifically a lower bit of data at continuous address positions is stored in the XL-register and a higher bit is stored in the XH-register.

The instruction "mem2. str. X@px" is for storing values stored in the XL-register and the XH-register, respectively, to the memory cells of continuous addresses Aj[px] and Aj[px+1] designated by the pointer register px. This operation is not executed when the mask register (V-register) is cleared.

The instruction "mem2. swp. X@px" is for swapping the data at the address Aj [px] designated by the pointer register px and a higher address Aj [px+1] with the values stored in the XL-register and XH-register, respectively. The swap instruction is not executed when the V-register and the N-register are both cleared.

In the 2-bit operation, successive addresses Aj[px] and Aj[px+1] are accessed simultaneously using the pointer of pointer register px, whereby parallel processing of 2 bits is implemented.

FIG. 74 shows, in the form of a list, instructions for moving data (move) between entries, of 1-bit operation. When data is moved between entries, the pointer register rn is used. Candidates of the pointer register rn for moving data between entries include four pointer registers r0 to r3.

The instruction "ecm. mv. n #n" is for transferring the value stored in the X-register of an entry j+n apart by a constant n to the X-register of entry j.

The instruction "ecm. mv. r rn" represents an operation in which the value of X-register of entry j+m apart by a value stored in the register rn is transferred to the X-register of entry j.

The instruction "ecm. swp" instructs an operation of swapping the values stored in the X-registers of neighboring entries j+1 and j.

FIG. 75 shows, in the form of a list, operations of moving (move) data between entries in the ALU for 2-bit operation. In the 2-bit operation, instruction descriptor "ecm2" is used in place of instruction descriptor "ecm". By the designation of instruction descriptor "ecm2", arithmetic/logic operation 2-bits by 2-bits is defined, parallel data transfer between XH- and XL-registers is performed, and for the designation of contents to be transferred between the registers, the same instruction descriptors as the 1-bit operation, that is, "mv. n#n", "mv. r rn" and "swp" are used.

FIG. 76 shows, in the form of a list, arithmetic operation instructions of the ALU unit for 1-bit operation.

The instruction "alu. adc@px" is an addition instruction. The data at the memory address Aj[px] indicated by the pointer of pointer register px is added to the value Xj stored in the X-register, and the result z is stored in the original memory cell. Specifically, in the memory cell at address Aj[px], Sum (sum) of the addition is stored, and a carry is stored in the C-register.

The instruction "alu. sbc@px" is a subtraction instruction. From the data at the memory address Aj[px] indicated by the pointer of pointer register px, the value Xj stored in the X-register is subtracted, and the result of subtraction is stored in the original memory position Aj[px]. After the subtraction, the value of a result of subtraction is stored in the original memory cell, and the borrow is stored in the C-register.

The instruction "alu. inv@px" is an inversion instruction. The data at the memory address Aj[px] indicated by the pointer of pointer register px is inverted and stored in the original memory position.

These addition, subtraction and inversion instructions are executed when the N-register and the V-register are both set, and not executed when either one of the N-register and the V-register is cleared.

The instruction "alu. let f" is a register setting instruction. A value designated by a function value f (4 bits) are stored in corresponding one of the F-register, D-register, N-register and C-register (f=F×8+D×4+N×2+C).

FIG. 77 shows, in the form of a table, arithmetic operation instructions of the ALU unit for 2-bit operation. FIG. 77 shows instructions for performing a multiplication in 2-bit by 2-bit manner, in accordance with second order Booth's algorithm.

The instruction "alu2. booth" is a Booth instruction. When the Booth instruction is executed, from the values stored in the XH-register, XL-register and the F-register, the values to be stored in the N-register, D-register and F-register are obtained for preparation for the next operation. The Booth instruction is executed when the V-register is set. The contents executed by the Booth instruction are set based on the result of Booth decoding at the time of executing the Booth instruction, as will be described in the following.

The instruction "alu2. exe@px" is a Booth instruction executing instruction (EXE instruction), by which a shift operation and a non-inversion/inversion operation are performed in accordance with values stored in the D-register and the F-register.

The contents of multiplication operation in accordance with Booth's algorithm will be described specifically in the following.

FIG. 78 shows, in the form of a list, values stored in the D-register and N-register when the Booth instruction shown in FIG. 77 is executed.

When the Booth instruction is executed, multiplier bits y(2j+1), y(2j) and y(2j−1) are stored in the XH-register, XL-register and F-register. Therefore, the bit values of the D-register and N-register are the same as in Embodiment 12, and when the bit "1" is stored in the N-register, a shift operation is designated, and when the bit "1" is stored in the D-register, a shift-up by (2j+1) bits is designated. When the bit "1" is stored in the XH-register, a complement is generated at the time of a shift-up.

When the Booth instruction is executed, the value stored in the XH-register is transferred to the F-register and to the C-register. Thus, for the next operation, the multiplier bit y(2j−1) is stored in the F-register.

In the X-register, the initial value "0" is stored. By using the initial stored value of the X-register, a value corresponding to the multiplier bit shifted by 1 bit can be obtained.

When the Booth executing instruction (EXE instruction) is executed, first, the memory cell data Aj[px] designated by the pointer register px is added to the value stored in the XH-register or XL-register or to the inverted value thereof, and the result of addition is stored in the original memory cell position Aj[px]. The carry is used as a carry for the operation of the next memory address Aj[px+1]. Here, using the carry cc, the memory cell data at the address Aj[px+1] is added to the value stored in the XH-register or XL-register or to the inverted value thereof, and the result of addition is stored in the original memory cell position Aj[px+1]. Further, the value of X-register is changed to the value stored in the XL-register, when the value stored in the D-register is 1. Thus, at the time of (2j+1) bit shift, yi (=2j) can be stored as the multiplier bit in the X-register.

FIG. 79 shows a program describing a Booth algorithm multiplication process in accordance with Embodiment 13 of the present invention. Least significant bits of multiplicand a, multiplier b and the result of multiplication c are as, bs and cs, respectively. Here, for simplicity of description, it is assumed that the multiplier b and the multiplicand a have the same bit width bit_count.

First, by the group of instructions on line #0, the least significant bit address bs of multiplier b is set in the pointer register p2, and the least significant bit address cs of the result of multiplication is set in the pointer register p3.

In line #1, the "for" sentence designates the range of the set of multiplier bits of the Booth algorithm (i is incremented by 2i).

By the instruction of line #2, first, the data of addresses Aj[p2] and Aj[p2+1] designated by the pointer register p2 are stored in the XH-register and XL-register, respectively. Then, the Booth instruction is executed, and the values of N-register, D-register and F-register are set.

By the instruction of line #3, the pointer value cs of pointer register p3 is copied to the pointer register p, and the least significant bit address as of the multiplicand a is set in the pointer register p1.

By line #4, 2-bit by 2-bit process is executed, and therefore, the range of change and the amount of increment of the address j of the multiplicand are set.

By the instruction on line #5, the multiplicand bit designated by pointer register p1 are stored in the XH-register and the XL-register, respectively. Then, using the data of the memory cells designated by the pointer register p0, that is, the partial product of the previous cycle and the multiplicand bit designated by the pointer register p1, the Booth execution instruction is performed. When the instruction of line #5 is executed, pointer values of pointers p0 and p1 are incremented by two (incremented by two addresses), as 2-bit processing is performed.

This process is repeatedly executed by the number designated by j. Therefore, for all the bits of multiplicand a, generation of partial product and addition to the partial product generated in the previous cycle are performed in accordance with second order Booth's algorithm 2-bits by 2-bits, and the result of addition is stored in the partial product storing area.

By line #6, the end of function defined by the "for" sentence of line #4 is designated. When a set of one multiplier bit is completed, again the "for" sentence is described on line #7, designating sign extending process of 2-bit basis. Specifically, in accordance with the execution instruction of line #8, the sign extending process is performed in the area designated by the pointer register r0, that is, the higher bit area of partial product storing area, and the sign extension is performed up to the most significant bit position.

Line #9 designates completion of the function defined by the "for" sentence of line #7. When the sign extension process ends, the pointer of pointer register p3 is incremented by two, in accordance with the instruction of line #10.

Line #12 designates the tail of the "for" sentence of line #1, and thus, using the next set of multiplier bits of multiplier b, generation of partial product and addition to the partial product of the previous cycle are again executed 2-bits by 2-bits.

In the program of FIG. 79, pointer registers p1, p2 and p3 are incremented by two. In the memory cell mat of the main processing circuitry, however, bits of the even and odd addresses are stored at the same bit positions of the even-numbered and odd-numbered entries as described above, and in address control of the memory cell mat, bit position in the entry is updated bit by bit.

Figure 80:
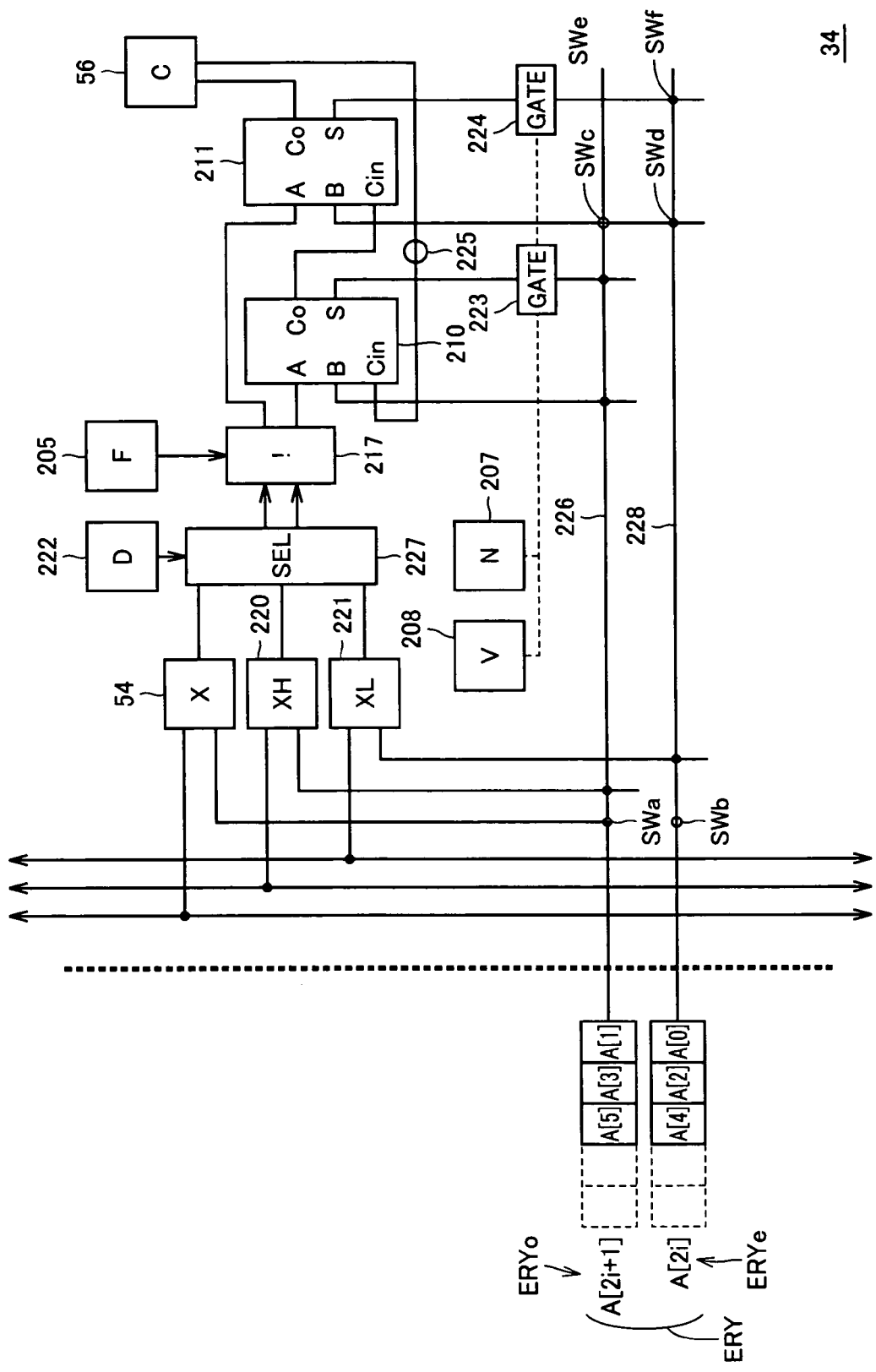
FIG. 80 schematically shows connection of a unit ALU circuit in accordance with Embodiment 13 of the present invention.

FIG. 80 schematically shows connection of unit ALU circuit block 34 for the 2-bit operation. When 2-bit operation is to be performed, particularly when multiplication is to be performed in accordance with Booth's algorithm, X-register 54 is coupled to internal data line 226 through a switch circuit SWa. Switch circuit SWb is set to disconnect X-register 54 from internal data line 228.

Switch circuit SWd couples the B-input of full adder 211 to internal data line 228, and switch circuit SWc separates the B-input of full adder 211 from internal data line 226. Switch circuit 225 disconnects the carry output Co of full adder 210 from the carry input C in of full adder 210. C-register 56 is coupled to the carry input Cin of full adder 210, with switch circuit 225 interposed. The output of gate circuit 224 is coupled to internal data line 228 by switch circuit SWf.

In the 2-bit operation, full adders 210 and 211 operate in parallel, and when the execution instruction (EXE instruction) of FIG. 77 is executed, they output the result zz of addition for bits Aj[px] and Aj[px+1] in parallel.

In the memory cell mat, in the even-numbered entry ERYe and odd-numbered entry ERYo, data bits of even address A[2i] and odd address A[2i+1] are stored, respectively. By the pointer register px, the memory cells of the same bit position of the even-numbered entry ERYe and odd-numbered entry ERYo are designated. Therefore, when the program is executed, as the px counter value of the pointer register is incremented by 2, the bit positions of the even-numbered entry ERYe and odd-numbered entry ERYo are shifted to the higher bit side by 1 bit. This operation of incrementing the pointer of pointer register rx can be implemented simply by word line switching, when the address for selecting the word line of the memory cell mat is generated based on the pointer of pointer register px.

Figure 81:
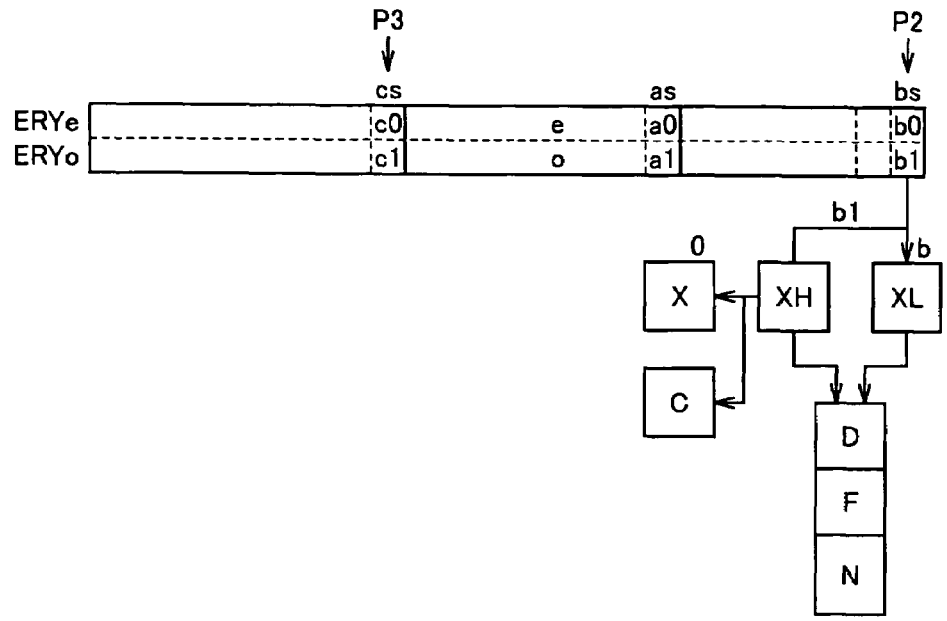
FIG. 81 schematically shows a data flow when the multiplication program is executed in accordance with Embodiment 13 of the present invention.

FIG. 81 schematically shows a data flow when a multiplication is done in accordance with second order Booth's algorithm. FIG. 81 first shows the data flow when the Booth instruction is executed. The entry is divided into the even-numbered entry ERYe and odd-numbered entry ERYo. The least significant bit address bs of multiplier b is set in the pointer register p2, and the least significant bit address cs of the result of multiplication c is set in the pointer register p3. By executing the group of instructions of line #2 shown in FIG. 79, 2 bits of multiplier b designated by the pointer register p2 (bits b1 and b0 of FIG. 81) are stored in the XH-register and XL-register. In the initial state, the X-register and F-register are initialized to "0".

In this state, in accordance with the contents of operation shown in FIG. 77, the values to be stored in the D-register and N-register are determined, and after the values of D-register and N-register are set, the bit (b1) stored in the XH-register is stored in the F-register. Thus, the state is prepared in which the multiplier bit y(2j+1) is set as the y(2j−1) bit when the next partial product is to be generated.

Figure 82:
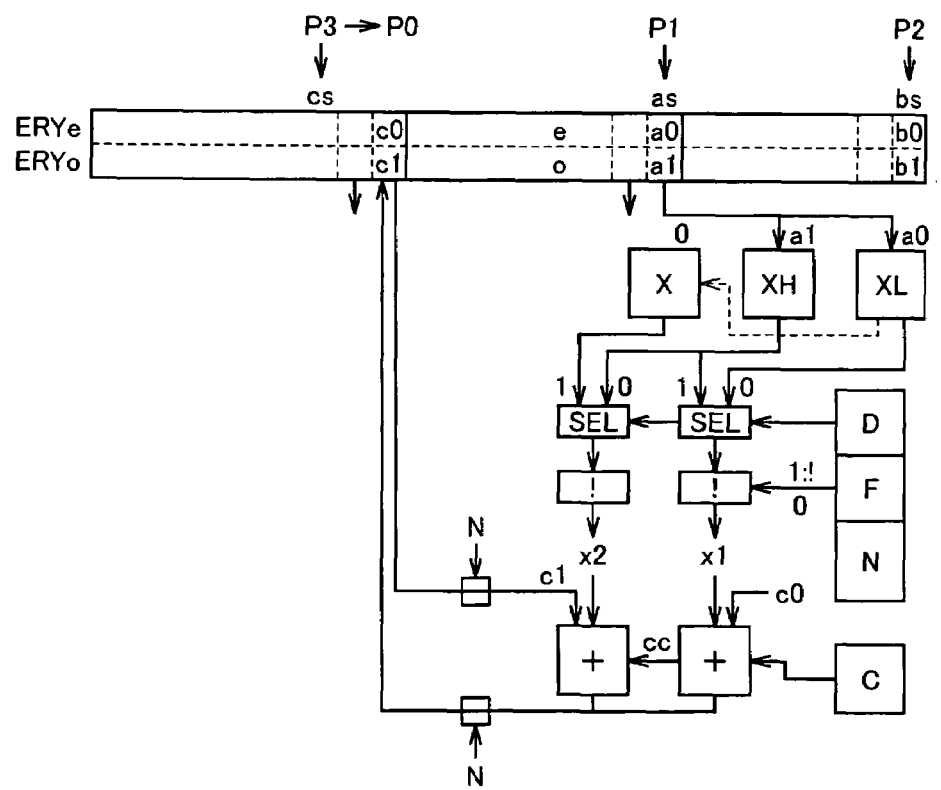
FIG. 82 schematically shows a data flow when multiplication is done in accordance with Embodiment 13 of the present invention.

FIG. 82 schematically shows the data bit flow when the Booth execution instruction (EXE instruction) is executed. The value stored in the pointer register p3 is transferred to the pointer register p0, and the least significant bit address as of multiplicand a is set in the pointer register p1. Then, 2 bits (a1 and a0) of multiplicand a are stored in the XH-register and XL-register, respectively. The selector (SEL; 227) selects one of the XH-register and XL-register and one of the X-register and XH-register.

A selective inverter (217) selectively inverts the output bit of the selector (SEL) in accordance with the value stored in the F-register, to generate bits x1 and x2 to be added. These are added (2-bit addition) to 2 bits (c0, c1) of the partial product read in accordance with the pointer value of pointer register p0, by full adders 210 and 225. The result of addition is selectively stored in the original position, in accordance with the bit stored in the N-register.

By the selecting operation by the selector (SEL), at the time of 2j bit shift, ±1 multiplication is performed in accordance with values stored in the XH-register and XL-register, to be added to the corresponding partial product, and the result of addition is stored in the original partial product bit position. At the time of 2j+1 bit addition shift, the multiplicand bit read in the previous cycle is added to the corresponding partial product without using the values stored in the XH-register and XL-register, and as a result, a 2j+1 bit shift is implemented. Here, values of the D-register, F-register and N-register are fixed when an entire partial product is generated, and thus, the contents of selection by the selector (SEL) and the selective inverter are fixed. Thus, generation of partial products by 2j bit shift and 2j+1 bit shift and addition to previous partial product can be performed accurately.

The pointers of pointer registers p1 an dp0 are incremented two by two, the positions of entries ERYe and ERYo are shifted 1-bit by 1-bit equivalently, and thus, generation of partial product and addition to the previous partial product are executed 2 bits by 2 bits.

After this operation, in accordance with the instructions on lines #8 and #9, sign extension of the generated partial product is performed, and the sign bits are successively stored in higher bit positions.

As shown in FIG. 70, as two full adders 210 and 211 are provided in ALU unit 34 and 2-bit addition is performed, generation of partial product and addition to the previous partial product can be done 2-bits by 2-bits.

Further, as shown in FIG. 77, the Booth execution instruction (EXE instruction) causes either addition or subtraction in accordance with the value stored in the F-register, and therefore, this execution instruction involves addition or subtraction.

Addition and subtraction can also be executed 2-bits by 2-bits, or 1-bit by 1-bit. Division, however, is done 1-bit by 1-bit, as it is necessary to perform subtraction with the bit positions of the dividend right-shifted one by one. In order to implement such 1-bit operation, switch circuit 225 of FIG. 80 is provided.

Figure 83:
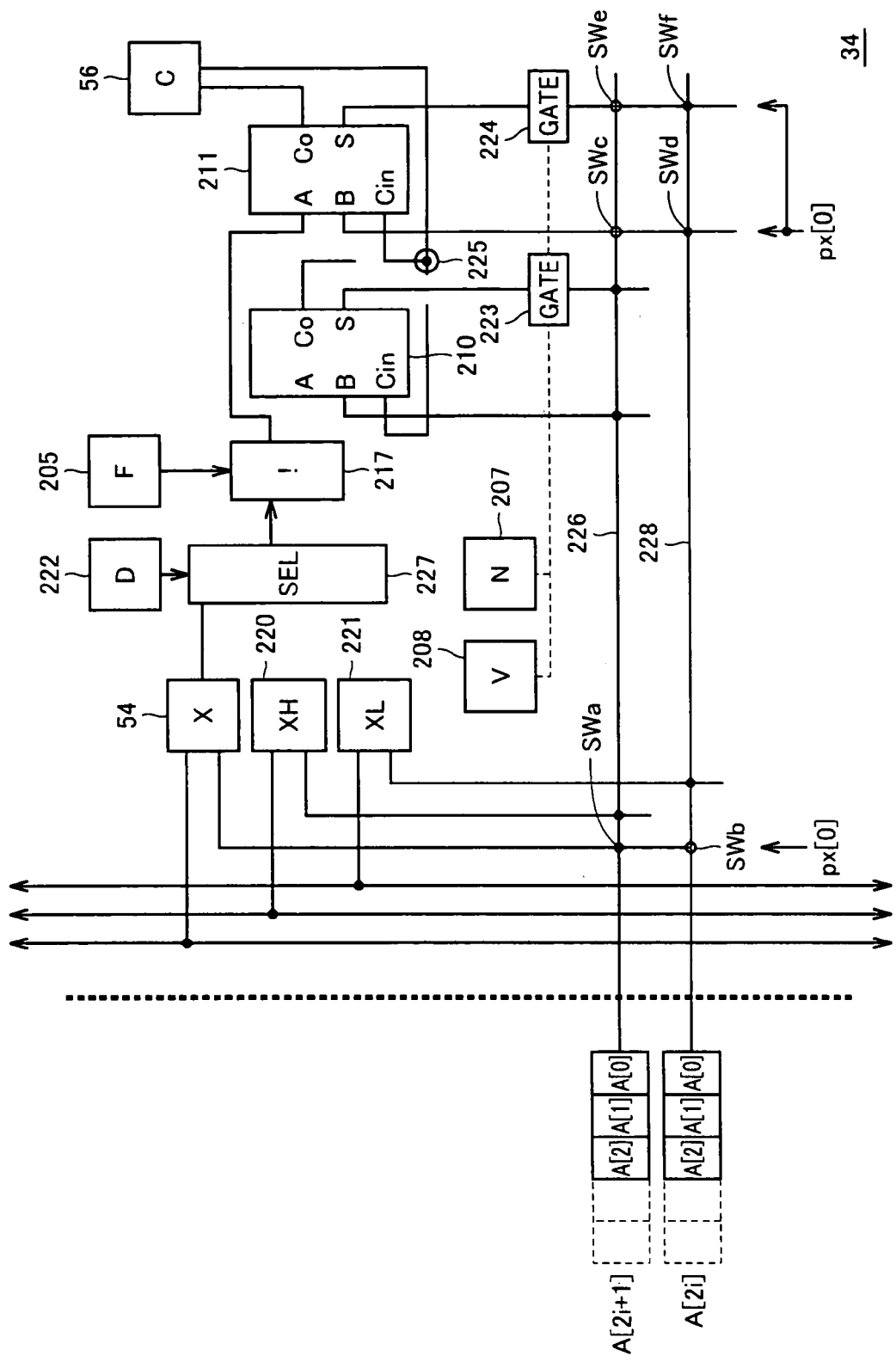
FIG. 83 schematically shows a connection of a unit ALU circuit for 1-bit arithmetic/logic operation in accordance with Embodiment 13 of the present invention.

FIG. 83 schematically shows an exemplary connection of ALU unit 34 for 1-bit addition/subtraction. In the connection for 1-bit operation, X-register 54 is connected to internal data lines 226 and 228 through switch circuits SWa and SWb, respectively, and the output of X-register 54 is selected by selector 227. Connection of switches SWa and SWb is determined by pointer px.

In accordance with the bit stored in F-register 205, addition/subtraction is performed by selective inverter 217. The output of selective inverter 217 is applied to the A-input of full adder 211. The B-input of full adder 210 is connected to internal data line 226. The carry output Co of full adder 210 is separated from the carry input Cin of full adder 210 by switch circuit 225, and the sum output S of full adder 210 is coupled to internal data line 226 through gate 223. Full adder 210 is not used for addition. The carry input Cin of full adder 211 is coupled to C-register 56 through switch circuit 225. The B-input of the full adder is selectively coupled to internal data line 226 or 228, through switch circuits SWc and SWd, in accordance with the pointer px. Further, the sum output S of full adder 211 is selectively connected to internal data lines 226 and 228, through gate 224 and switches SWe and SWf When the subtraction is to be achieved by addition of two's complement, "1" is stored as the initial value in C-register 56, and the bit value from X-register 54 is inverted by selective inverter 217. For addition, C-register 56 is cleared to "0", as the initial state.

In the entry, data bits of successive addresses A(2i) and A(2i+1) are stored in the areas connected to internal data lines 226 and 228, and the data are transferred to the X-register 54 through internal data lines 226 and 228.

FIG. 84 shows an example of a program for performing a two term addition, using ALU 34 of 1-bit configuration. In the binary addition program shown in FIG. 84, the instruction "mem. 1d. C 0" is for storing the data bit "0" stored in a specific area of the memory mat to the C-register. If the C-register were provided with a set/reset function, circuit structure would be complicated. Therefore, a clear bit for resetting is stored in a specific area, and using the clear bit, the C-register is set to the cleared state.

In the two term addition operation, a+b=c is performed. By the F-register 205, selective inverter 217 is set to the non-inverting state, and a bit of addend b designated by the pointer register p1 is added to the corresponding bit of the augend a designated by the pointer register p0. By the addition instruction, as shown in FIG. 76, the sum is stored in the original bit position of augend a, and the addition (a+b)=c is achieved. By changing the connection of X-register 54 and the full adder in accordance with the pointer of pointer register px, addition can successively be done on the data bits of even-numbered and odd-numbered entries.

FIG. 85 shows an example of a binary subtraction. In the binary subtraction, a=(a−b) is performed. In the program shown in FIG. 85, the instruction "men. 1d. C 1" is for setting 1 in the C-register, and by generating two's complement of subtrahend b, addition of the complement and the minuend a is executed.

Selective inverter 217 is set as an inverter in accordance with the value stored in the F-register. The result of addition is stored in the original position of minuend a. Switching of switches SWa to SWf is done in accordance with the pointer of pointer register px, as in the addition operation FIG. 86 shows an example of a multiplication program for unsigned multiplication 1-bit by 1-bit. The least significant bits of multiplicand a, multiplier b and the result of multiplication c are as, bs and cs, respectively.

The least significant bit addresses bs and cs are set in the pointer registers p2 and p3, respectively. Thereafter, the corresponding bit of the multiplier b designated by pointer register p2 is stored in N-register 207, and the process of gate 224 receiving the sum output Sum of full adder 211 is set. The position for storing the multiplication result of pointer register p3 is copied to pointer register p0. The C-register is cleared and the initial state is set. The start address of multiplicand a is set in the pointer register p1, and the bit of multiplicand a is loaded to X-register 54. Using full adder 211, the corresponding bit of the result of multiplication is added to the bit of multiplicand a.

The result of addition is stored in the address location designated by the pointer register p0 only when the value stored in N-register 207 is 1. Thus, multiplication of bits bi and ai as well as addition to the partial product can be done. After generation of the partial product, the carry stored in the C-register is stored at the most significant bit position of the partial product.

At the time of this multiplication, the bit bi of multiplier b is fixed, and a whole of partial product is generated. After the whole partial product is generated, the pointer p3 designating the least significant bit position of the partial product is incremented by one, so as to designate a new partial product. Thereafter, the bit position of multiplier b is incremented and then the next multiplication is performed. In this manner, multiplication can be done bit by bit successively. For this multiplication also, connection of switch circuits SWa to SWf is controlled by even-number/odd-number of each of the pointers.

Figures 87, 88:
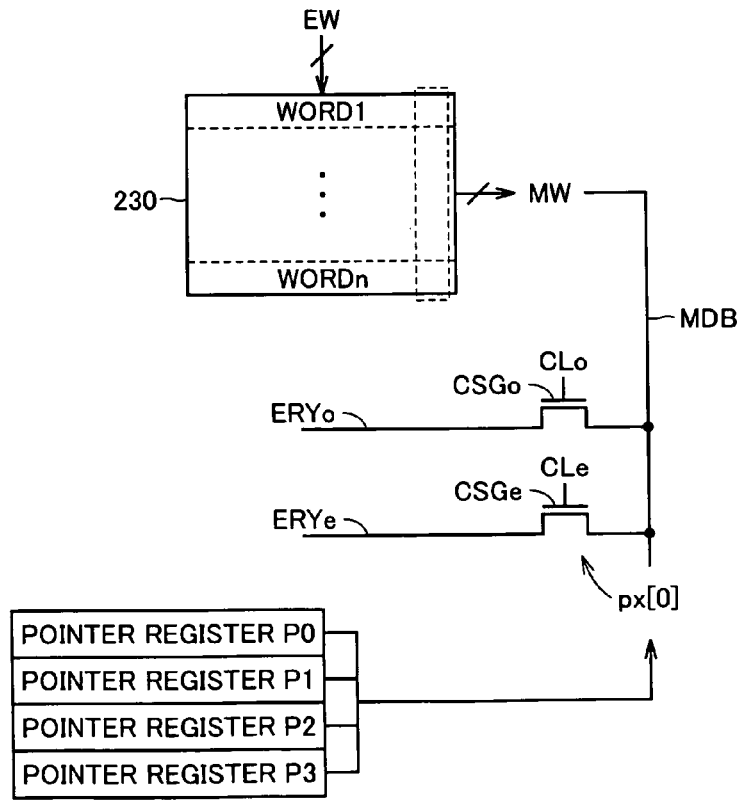
FIG. 87 shows a division program in accordance with Embodiment 13 of the present invention.
FIG. 88 schematically shows a path for writing data to an entry in accordance with Embodiment 13 of the present invention.

FIG. 87 shows a program for performing a division. In the division, a/b=c . . . d is executed. In the division program shown in FIG. 87, by an operation instruction "alu. let (0b0011)" of a function sentence defined by the "for" sentence, the F-register, D-register, N-register and C-register are initialized ((0,0,1,1) are set in these registers).

The instruction "mem. st. C tp" designates an operation of storing the value tp stored in the C-register in a specific area of the memory.

The operation instruction "alu. inv. tp" designates an operation of inverting the specific bit tp for rewriting to the original memory position.

The instruction "mem. 1d. N tp" designates an operation of storing the inverted specific bit value tp to the N-register.

By executing the series of instructions, the selector SEL is set to a state of selecting the output of X-register, selective inverter 217 to a state for performing inversion, and subtracting operation "alu. sbc@p0" is achieved.

In the division operation, 2-bits of data are stored in the XH-register and XL-register, and stored in the remainder storing area of the entry. In the operation of copying the dividend, it is copied 2-bits by 2-bits, and thus, the speed of processing for generating a remainder is improved. Circuit connection of the ALU is set to the state in which one full adder 211 is used, as in the addition/subtraction and multiplication operations.

Thereafter, the divisor b is stored bit by bit in the X-register, which is subtracted from the dividend a with the digits aligned in the remainder storing area, and the result of subtraction is stored selectively in the original remainder storing area, in accordance with the value stored in the N-register.

Thus, the magnitude relation between divisor b and dividend a is determined (the value of carry tp in the C-register is determined), and based on the magnitude relation, the value to be stored in the N-register is set. The next subtracting operation is done selectively, using the addition operation, in accordance with the value stored in the N-register. By the addition, the original value of the remainder area is selectively recovered (when the quotient bit is 0, it is necessary to perform the subtracting operation with the bit position shifted). As a quotient bit, the inverted value of the value stored in the N-register is set. Thereafter, bit positions of the quotient and the remainder area are right-shifted by 1 bit, and the similar operation is repeated.

When subtraction is to be done in bit-serial manner, the B-input of full adder 211 is selectively connected to internal data lines 226 and 228 by using switch circuits SWc and SWd, and X-register 54 is connected alternately to internal data line 226 and 228 using switch circuits SWa and SWb.

Therefore, as in the addition/subtraction and multiplication operations described above, division can be performed in bit-serial manner on the data of the storage areas in the even-numbered and odd-numbered entries.

It is noted that addition and subtraction can be performed 2-bits by 2-bits, using both full adders 210 and 211.

FIG. 88 schematically shows an exemplary construction of a path for writing data in a distributed manner to even-numbered entry ERYe and odd-numbered entry ERYo of one entry ERY. Referring to FIG. 88, a transposing memory 230 transforms external data EW applied from the outside in a word-serial and bit-parallel manner to bit-serial and word-parallel data MW and transfers the same to a memory data bus MDB. To memory data bus MDB, bit line pairs forming the odd-numbered entry ERYo and the even-numbered entry ERYe are connected, through column selection gates CSGo and CSGe. Column selecting gates CSGo and CSGe are selectively rendered conductive in response to column selecting signals CLo and CLe.

The column selecting signals CLo and CLe are driven to the selected state dependent on whether the least significant bit px[0] of the pointer register px (x=0-3) is an even/odd number. Thus, the even-numbered bit and the odd-numbered bit of the word-parallel and bit-serial memory data MW read from the transposing memory 230 can be distributed to the even-numbered entry ERYe and the odd-numbered entry ERYo, respectively.

In the configuration shown in FIG. 88, when the even-numbered entry ERYe and the odd-numbered entry ERYo are to be used as separate entries, the least significant bit px[0] of the pointer register rx is fixed to 0 or 1 until data is written to all the entries, and after writing to all the entries, the least significant bit px[0] of the pointer register px is changed. Thus, it becomes possible to write a data word in the even-numbered entry area and thereafter to write another data word to the odd-numbered entry area, and the data can be stored entry by entry.

As described above, in accordance with Embodiment 13, even-numbered entry and odd-numbered entry are provided, and full adders operating parallel to each other are provided in the arithmetic logic unit, so that ALU processing can be performed 2-bits by 2-bits. Consequently, high speed processing becomes possible.

Embodiment 14

Figure 89:
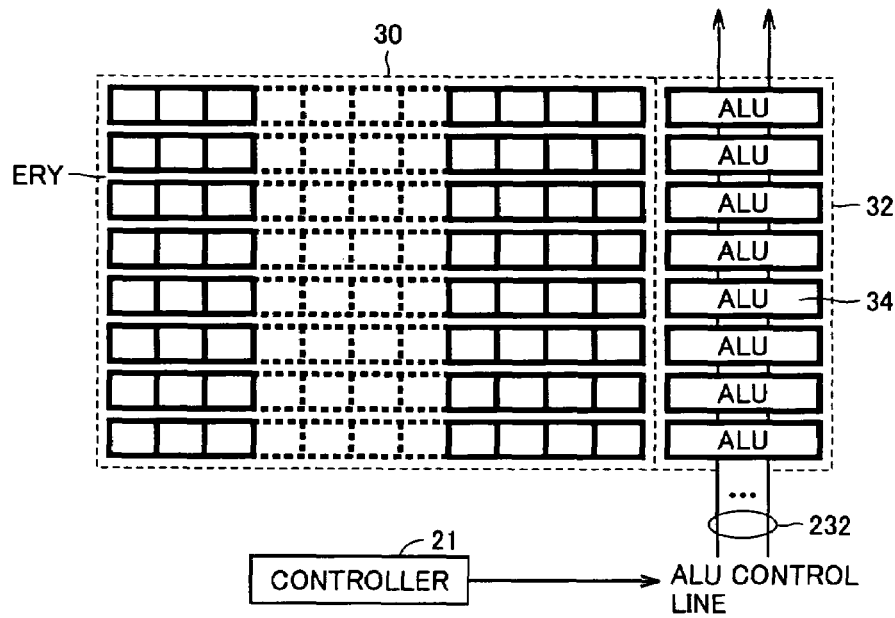
FIG. 89 schematically shows a configuration of ALU control in accordance with Embodiment 14 of the present invention.

FIG. 89 schematically shows a configuration of a main portion of the semiconductor signal processing device in accordance with Embodiment 14 of the present invention. In the configuration shown in FIG. 89, to ALU units 34 included in the group of arithmetic logic units 32, an ALU control signal from controller 21 is commonly applied trough an ALU control line. The ALU units 34 (arithmetic logic units) are arranged corresponding to the entries ERY of memory cell mat 30, respectively.

In the configuration shown in FIG. 89, it is possible to execute a common arithmetic/logic operation in the entries ERY included in memory mat 30. Thus, a single instruction, multi data (SIMD) scheme can readily be implemented.

The ALU control signal from controller 21 is generated from the result of decoding a program stored in the micro instruction memory shown, for example, in FIG. 1.

As described above, in accordance with Embodiment 14 of the present invention, an ALU control line is provided commonly to unit ALUs of the group of arithmetic logic units to transmit a common control signal. Thus, a common ALU operation can be executed readily in each of the entries.

Embodiment 15

Figure 90:
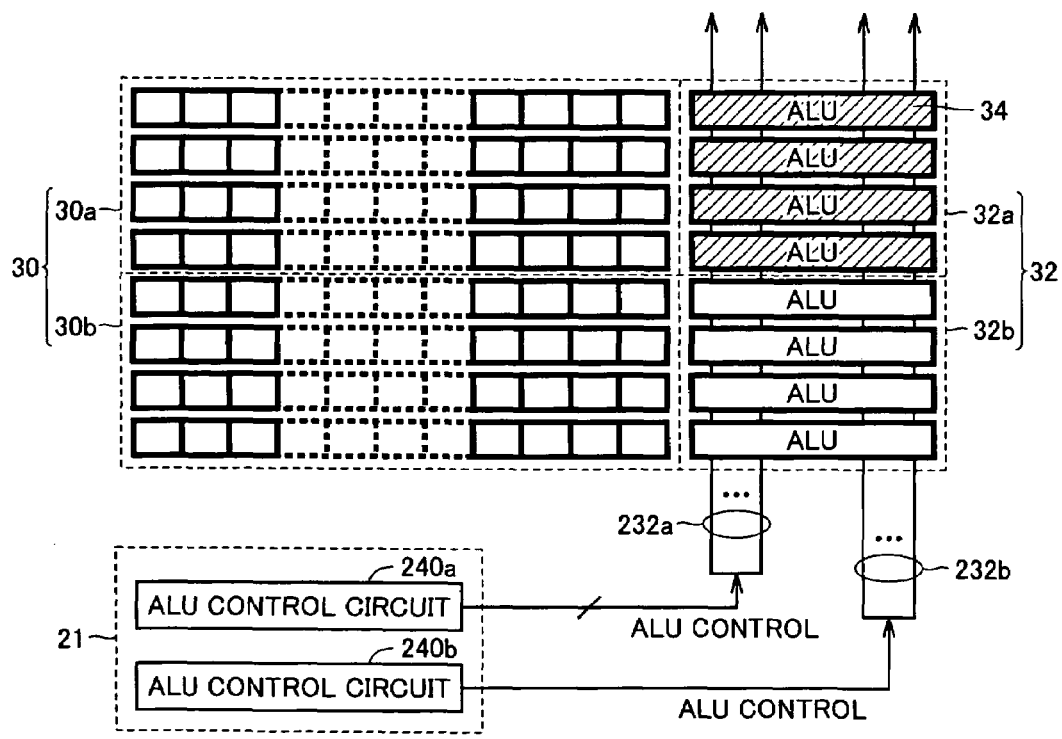
FIG. 90 schematically shows a configuration of ALU control in accordance with Embodiment 15 of the present invention.

FIG. 90 schematically shows a configuration of a main portion of the main processing circuitry in accordance with Embodiment 15 of the present invention. In the configuration shown in FIG. 90, memory cell mat 30 is divided into two sub-mats 30a and 30b. The group of arithmetic logic units 32 is also divided into ALU groups 32a and 32b, corresponding to memory sub-mats 30a and 30b. To ALU group 32a, an ALU control signal from an ALU control circuit 240a included in controller 21 is applied through an ALU control line 232a. To ALU units 34 of ALU group 32b, an ALU control signal from an ALU control circuit 240b included in controller 21 is applied through an ALU control line 232b.

ALU control circuits 240a and 240b are selectively activated in accordance with an output signal of an instruction decoder decoding an instruction in controller 21, and separately and individually generate the control signals.

In the configuration shown in FIG. 90, in the group 32 of arithmetic logic units 34, the contents of operation by ALU groups 32a and 32b can be set independently, and hence more complicated arithmetic/logic operation becomes possible.

Here, in memory cell mat 30, it is not particularly required that data bits of the same address are operated in ALU groups 32a and 32b. By way of example, data transfer and arithmetic/logic operation between memory cell mat 30a and ALU group 32a, and data transfer and arithmetic/logic operation between memory cell mat 30b and ALU group 32b are performed alternately. For example, when data is transferred with ALU group 32a, arithmetic/logic operation is executed in ALU group 32b, and when arithmetic/logic operation is executed in ALU group 32a, data is transferred with ALU group 32b. When access contention occurs because of some problem related to an arithmetic/logic operation cycle number or others, an access arbitration circuit is provided in controller 21, by which data access by one sub-memory cell mat is completed first and data access to the other memory cell mat is made in the next cycle. In this manner, it becomes possible to execute arithmetic operations in ALU groups 32a and 32b using data bits of different addresses.

Alternatively, one of sub-memory mats 30a and 30b may have priority of access, and at the time of programming, whether there is an access or not to the sub-memory mat having the priory may be monitored using a flag. By describing a process of accessing to the other sub-memory mat in accordance with the result of monitoring, the problem of data access contention to the same address position between different memory sub mats can be avoided.

As described above, in accordance with Embodiment 15 of the present invention, the ALU circuit is divided into a plurality of groups, and for each ALU group, the ALU control signal line is provided. Thus, it becomes possible to execute different arithmetic/logic operations in different ALU groups, and hence, it becomes possible to execute a complicated arithmetic/logic operation at high speed.

Embodiment 16

Figure 91:
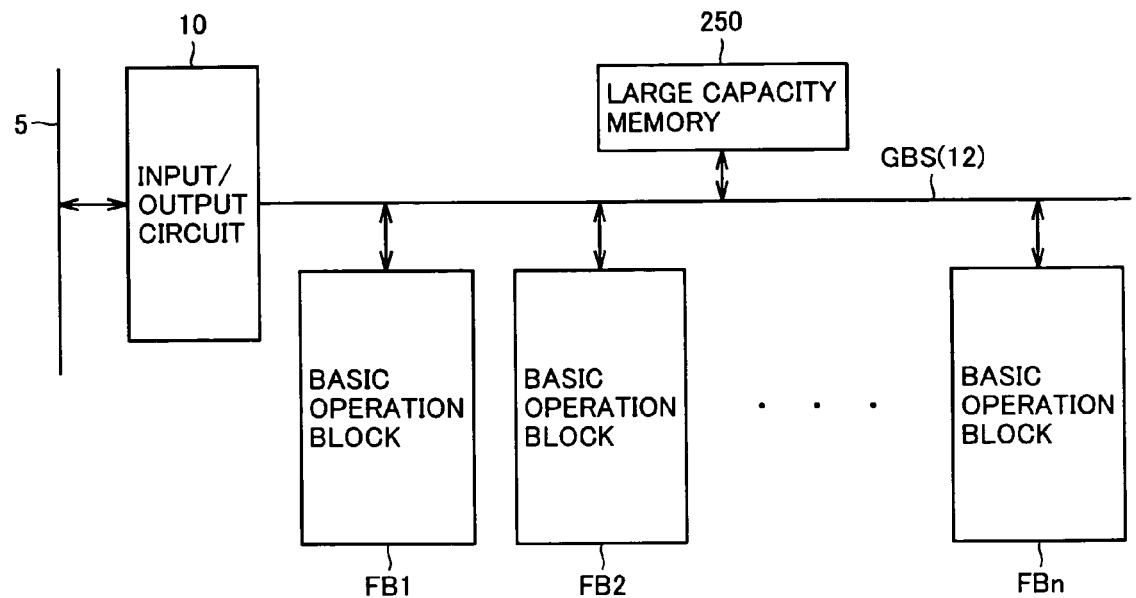
FIG. 91 schematically shows a configuration of a semiconductor processing device in accordance with Embodiment 16 of the present invention.

FIG. 91 schematically shows a configuration of the main portion of a semiconductor device in accordance with Embodiment 16 of the present invention. Referring to FIG. 91, basic operation blocks FB1 to FBn are coupled, in parallel, to internal data bus 12 (global data bus GBS). To the global data bus GBS, a large capacity memory 250 is connected. The global data bus GBS is coupled to an external system bus 5 through an input/output circuit 10.

Large capacity memory 250 is, by way of example, a random access memory (RAM) having storage capacity sufficient to store data of one image, or storage capacity of several to several tens M bits.

To large capacity memory 250, arithmetic/logic operation data is stored from an externally provided host CPU through input/output circuit 10. The manner of storing data in large capacity memory 250 will be described in detail later. Basic operation blocks FB1 to FBn transfer data to and from large capacity memory 250 through global data bus GBS. The data line of global data bus GBS is implemented as interconnection lines over the chip, and therefore, it may have a large bit width. Therefore, band width of data transfer between large capacity memory 250 and any of basic operation blocks FB1 to FBn can be made large, whereby the time necessary for the data transfer does not pose any bottle neck to the arithmetic/logic operation.

Figure 92:
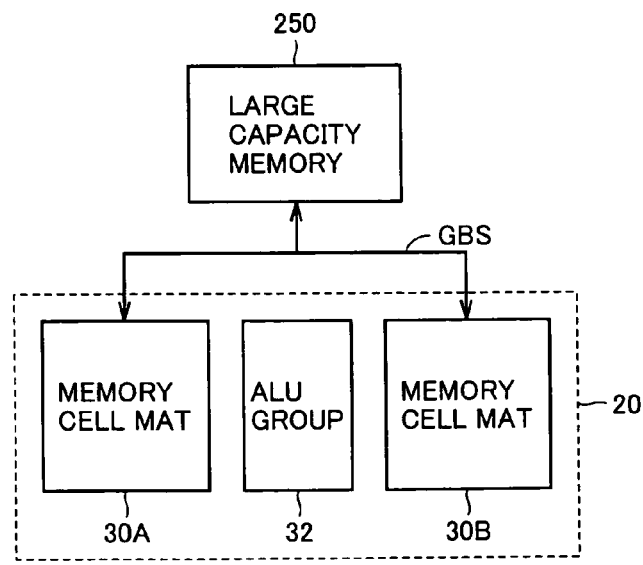
FIG. 92 schematically shows a data transfer path among memories in accordance with Embodiment 16 of the present invention.

FIG. 92 schematically shows a data transfer path between large capacity memory 250 and one basic operation block FBi. In main processing circuitry 20, between memory cell mats 30A and 30B, a group 32 of arithmetic logic units (ALU units) is provided. These memory cell mats 30A and 30B can transfer data to and from large capacity memory 250, through global data bus GBS. In main processing circuitry 20, an input/output circuit serving as an interface between memory cell mats 30A, 30B and the large capacity memory 250 is provided, though not shown in FIG. 92.

When the bus width of global data bus GBS is the same as the number of entries of memory cell mats 30A and 30B, data bits of one row of memory cell mats 30A and 30B can be transferred to and from large capacity memory 250. In this case, the input/output data bits of large capacity memory 250 may be the same as the bit width of one entry of memory cell mats 30A and 30B. Then, contents of one entry can be transferred in one data transfer cycle (in this case, dual port memory cells are used in the memory cell mats).

Figure 93:
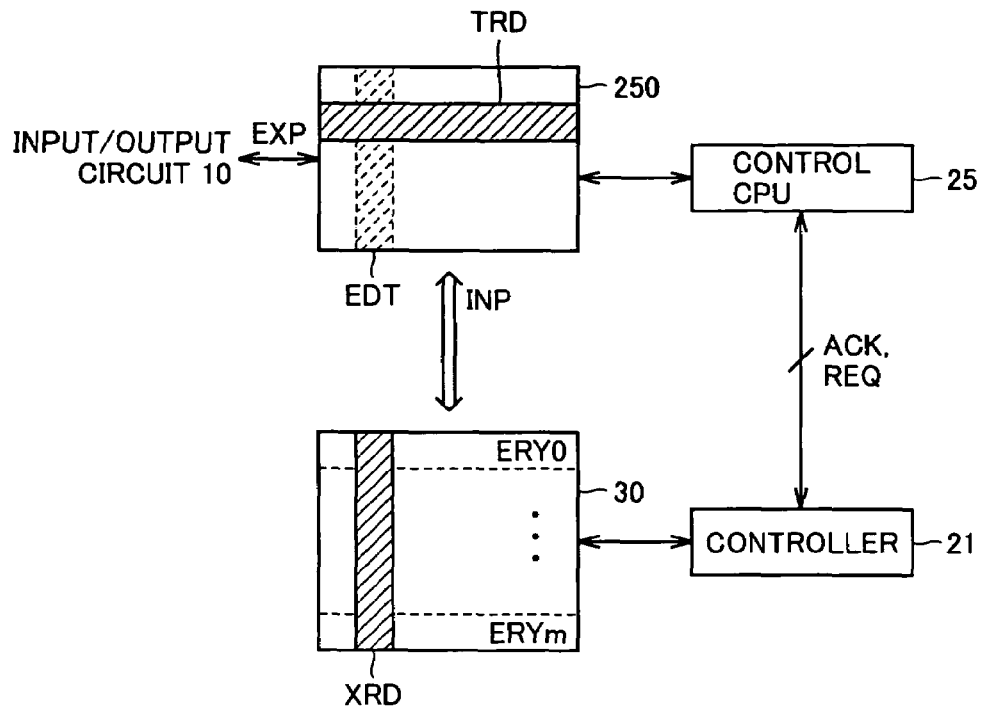
FIG. 93 schematically shows a configuration for controlling data transfer in accordance with Embodiment 16 of the present invention.

FIG. 93 shows an exemplary configuration of a portion performing data transfer between large capacity memory 250 and one memory cell mat 30. Data access of large capacity memory 250 is controlled by a control CPU 25 in the central control unit of FIG. 1. Data input/output of data of memory cell mat 30 is performed by controller included in the corresponding basic operation block. Between control CPU 25 and controller 21, data transfer request REQ and data transfer acknowledgement ACK are transferred, to effect data transfer.

By way of example, large capacity memory 250 has a 2-port configuration, data transfer is performed through input/output circuit 10 and a port EXP, and further, large capacity memory 250 performs data transfer to and from memory cell mat 30 through internal port INP. Therefore, data EDT is stored through input/output circuit 10 and external port EXP, and data block TRD aligned in the direction orthogonal thereto is transferred to memory cell mat 30 through the port INP. Memory cell mat 30 has entries ERY0 to ERYm, and data blocks XRD of the same bit positions of entries ERY0 to ERYm are transferred to and from large capacity memory 250.

Therefore, when data is transferred between large capacity memory 250 and memory mat 30, if the data blocks TRD and XRD are each memory cell data connected to one word line, it is possible to transfer the data block TRD or XRD simply by selecting a word line once.

Data may be stored word by word to large capacity memory 250 from the outside through the port EXP. Data block EDT corresponds to the word line direction of the port EXP. Therefore, large capacity memory 250 has data transposing function. When the input/output circuit as the interface of the external bus has the transposing function, large capacity memory 250 need not have the data transposing function. In a dual port configuration where the data transfer bus between input/output circuit 10 and large capacity memory 250 is separate from the data transfer bus between the large capacity memory and the basic operation block, data transfer between the large capacity memory and the outside can be performed parallel to the data transfer between the large capacity memory and the functional block. In the dual port configuration, the bit width of the port INP corresponds to the entry number (m+1) of memory mat 30 or the bit width of the global data bus.

Large capacity memory 250, however, may be a single port memory. In that case, after data transfer from the outside to large capacity memory 250 is finished, data transfer between large capacity memory 250 and the basic operation block is performed. Further, in data transfer between large capacity memory 250 and basic operation blocks FB1 to FBn, while an arithmetic/logic operation is executed in one basic operation block, data transfer may be performed between the large capacity memory and another basic operation block, so that data transfer and arithmetic/logic operation may be executed in an interleaved manner or pipeline manner.

Figure 94:
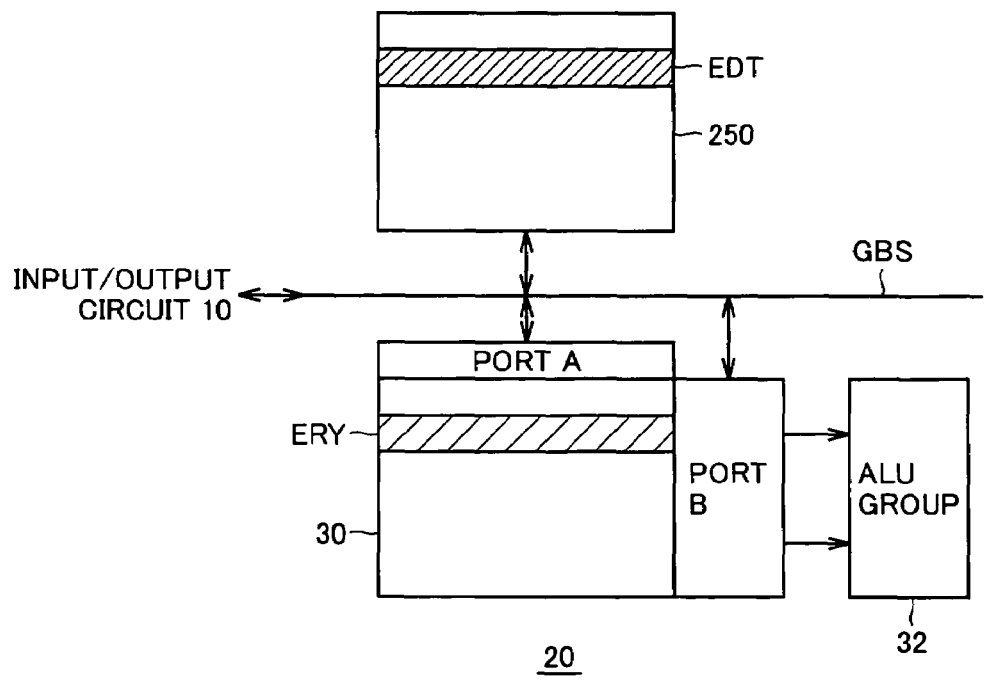
FIG. 94 schematically shows a data transfer path between a large capacity memory and main processing circuitry in accordance with Embodiment 16 of the present invention.

FIG. 94 schematically shows another manner of data transfer between large capacity memory 250 and memory cell mat 30. Referring to FIG. 94, large capacity memory 250 is a single port memory, and it is coupled to global data bus GBS. Memory cell mat 30 of main processing circuitry 20 is a dual port memory, coupled to global data bus GBS through a port A, and coupled to global data bus GBS through a port B. Data transfer to and from large capacity memory 250 is performed in units of entries ER through port A. Port B is for data transfer to and from an external host CPU through input/output circuit 10, using a specific bus of global data bus GBS.

In the configuration shown in FIG. 94, when external data EDT are to be stored in a word-line by word-line basis in large capacity memory 250, the data EDT consisting of a plurality of words on the word line can be transferred through global data bus GBS to memory cell mat 30 through port A, whereby the data of entry ERY can be collectively transferred to memory mat 30.

The port B is used for direct data transfer to and from input/output circuit 10. In this case, input/output circuit 10 is not required to be the same in bit width as global data bus GBS. Port B adjusts the input/output bit width of input/output circuit 10 and the memory cell mat. When data is to be transferred using the port B, input/output circuit 10 is required to have a transposing circuit for transposing the data positions.

In the configuration shown in FIG. 94, the memory cell mat of the main processing circuitry has a 2-port configuration. However, when the port A is used for data transfer between large capacity memory 250 and input/output circuit 10 and port B of the memory is used only for data transfer to and from the ALU group 32, it is unnecessary to provide any arrangement for transposing data outside the main processing circuitry 20. The data for the external CPU can be stored through port A.

Further, data transfer between large capacity memory 250 and memory cell mat 30 in the configuration of FIG. 94 is performed, referring to an internal address pointer (pointer register), using control CPU 25 and controller 21, as in the configuration shown in FIG. 93.

As described above, according to Embodiment 16 of the present invention, a large capacity memory is provided common to a plurality of basic operation blocks, and through an internal data bus having a large bit width, data is transferred between a selected basic operation block and the large capacity memory. Thus, the time required for data transfer can be reduced, and high speed arithmetic/logic operation can be achieved.

Embodiment 17

Figure 95:
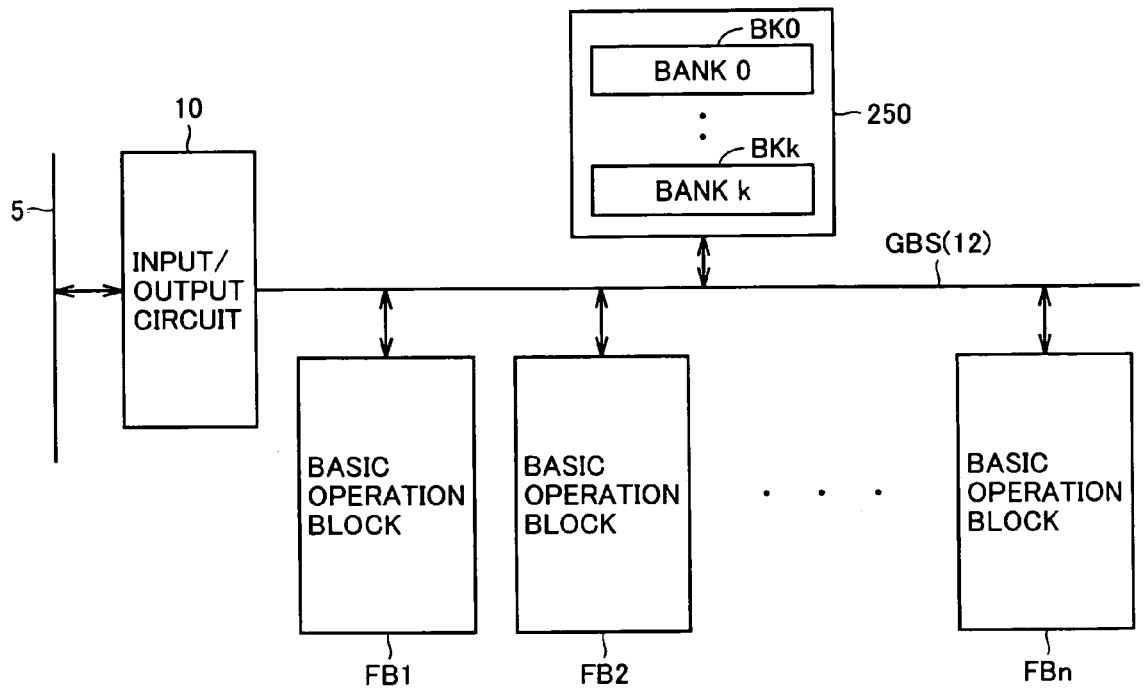
FIG. 95 schematically shows a configuration of a semiconductor processing device in accordance with Embodiment 17 of the present invention.

FIG. 95 schematically shows a configuration of a main portion of a semiconductor processing device in accordance with Embodiment 17 of the present invention. In the semiconductor processing device shown in FIG. 95, large capacity memory 250 coupled to the internal data bus (global data bus) GBS is divided into a plurality of banks BK0 to BKk. Each of the banks BK0 to BKk has a storage capacity comparable to the memory cell mat included in the basic operation blocks FB1 to FBn. Therefore, the storage capacity of large capacity memory 250 is (number of banks)×(capacity of memory mat).

Figure 96:
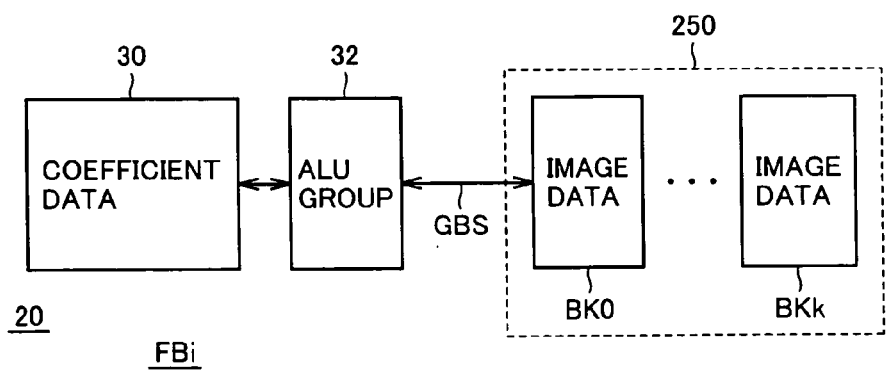
FIG. 96 schematically shows a memory configuration in accordance with Embodiment 17 of the present invention.

FIG. 96 schematically represents connecting relation between large capacity memory 250 and main processing circuitry 20 of one basic operation block FBi. In main processing circuitry 20, coefficient data is stored in memory cell mat 30. In large capacity memory 250, image data is stored in each of banks BK0 to BKk, and data transfer to and from ALU unit 32 is performed through global data bus GBS. In this case, the bit width of global data bus GBS is the same as the number of entries in the memory cell mat.

In image processing, multiplication between a coefficient and arithmetic/logic operation data is executed for filtering or the like. Here, the number of data of the object to be processed is far larger than the number of coefficient data necessary for the arithmetic/logic operation. Accordingly, coefficient data are stored in memory cell mat 30 having a relatively small capacity, and the image data as the object of processing are stored dispersed in banks BK0 to BKk of large capacity memory 250.

At the time of arithmetic/logic operation, any of banks BK0 to BKk is selected in accordance with a bank select signal (not shown), and the data of the selected bank are transmitted to the ALUs of the group of arithmetic logic units 32. The processed image data are transferred to the outside, and the new data are again stored in the corresponding bank. At the time of this data transfer to the outside, another bank is selected and parallel arithmetic/logic operation is executed in basic operation block FBi.

Figure 97:
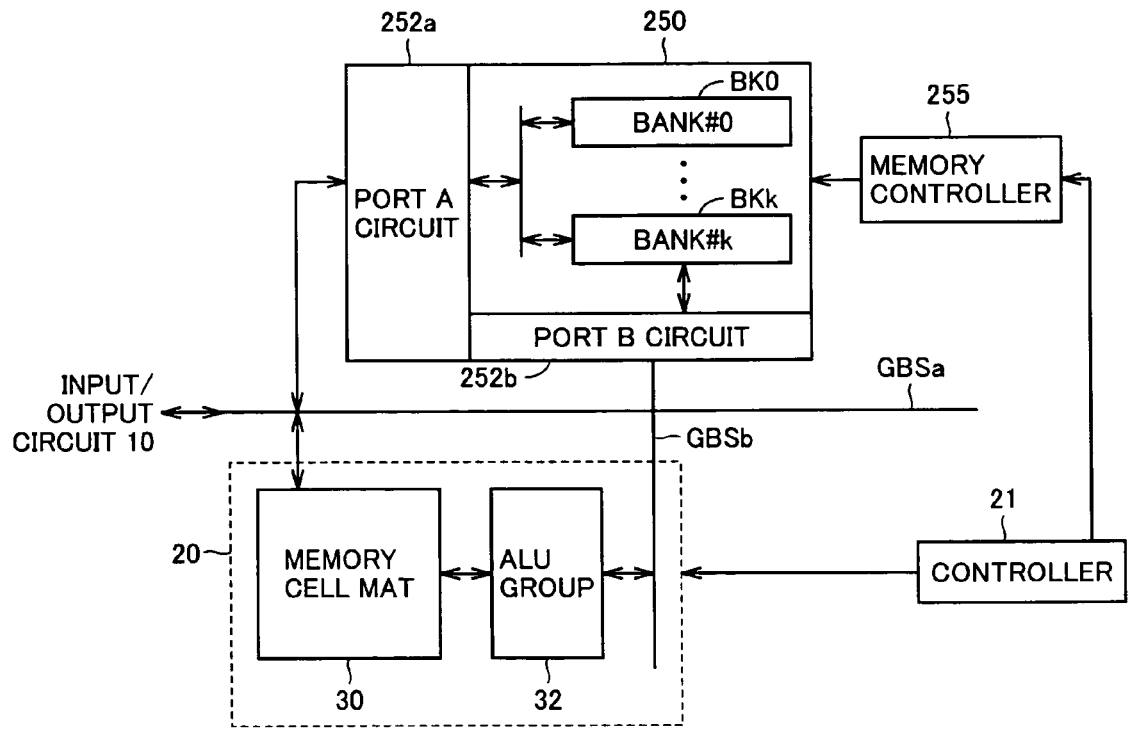
FIG. 97 schematically shows a configuration of a large capacity memory in accordance with Embodiment 17 of the present invention.

FIG. 97 schematically shows a configuration of a semiconductor processing device according to Embodiment 17 of the present invention. In the configuration shown in FIG. 97, large capacity memory 250 includes a port A circuit 252a, a port B circuit 252b, and a plurality of banks BK0 to BKk. Internal data bus (global data bus) includes an internal data bus GBSa coupled to input/output circuit 10, and a global data bus GBSb coupled to port B circuit 252b of large capacity memory 250 and to the group of arithmetic logic units 32 of main processing circuitry 20. Global data bus GBSb has such a bit width that enables parallel transfer of data bits to respective ALU units in the group 32 of arithmetic logic units. The input/output circuit (not shown) of the main processing circuitry is coupled to internal data bus GBSa. Internal data bus GBSa transfers program data to the micro instruction memory of the basic operation block and control information or the like to another controller 21.

Access control of large capacity memory 250 is performed by a memory controller 255. Operation control of main processing circuitry 20 is made by controller 21 in the basic operation block. Controller 21 transfers load/store instruction to memory controller 255. Memory controller 255 and controller 21 individually and separately generate address pointers.

Figure 98:
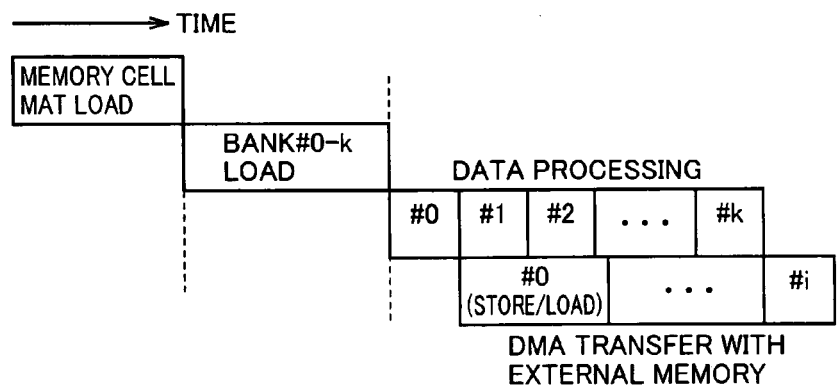
FIG. 98 shows a data transfer operation in the memory configuration shown in FIG. 97.

FIG. 98 is a timing chart representing an operation of the memory arrangement shown in FIG. 97. As can be seen from FIG. 98, first, an instruction is given from the external host CPU, and under the control of controller 21, data are stored in memory mat 30. Thereafter, by the instruction from external host CPU, memory controller 255 is activated, and under the control of host CPU, data to be processed are loaded from an external memory to banks BK0 to BKk through input/output circuit 10. Data load to large capacity memory 250 may be executed in the DMA mode under the control of DMA4 shown in FIG. 1.

When data load to memory mat 30 and banks BK0 to BKk is finished, controller 21 initiates an arithmetic/logic operation. The arithmetic/logic operation is performed on the data of memory cell mat 30 and bank #0 (BK0), and the result of operation is stored in bank BK0. When processing of one bank is completed, the bank is switched to the next one, and the data processing of banks #1, #2, . . . . is executed. The processed data of bank #0 (BK0) is transferred to the external memory in DMA mode by DMA circuit 4 activated by controller 255 through port A circuit 252a, and new image data is stored in bank #0 (BK0).

Therefore, even if the process of storing data in one bank through port A circuit 252a takes a relatively long time, what is required is that the data loading to bank #0 is completed before the time the process on this bank is started after the end of arithmetic/logic operation on other bank. Thought the bit width of port A circuit 252a is limited as compared with the bit width of internal data bus GBSa, data transfer between the external memory and large capacity memory 250 does not exert any undesirable influence on the arithmetic/logic operation on data in the main processing circuitry, as internal data buses GBSa and GBSb are provided separately.

Further, each of the banks BK0 to BKk of large capacity memory 250 transfers data to and from the group of arithmetic logic units 32 through global data bus GBSb, and necessary data can be transferred in each operation cycle. Thus, high speed processing becomes possible.

As described above, according to Embodiment 17, the large capacity memory is adapted to have a multi-bank configuration, and one bank is regarded as a memory cell mat of the main processing circuitry to execute the arithmetic/logic operation. Thus, processed image data and new image data can be transferred in a pipeline manner and high speed processing becomes possible.

In main processing circuitry 250, memory cell mat 30 may have a dual port configuration or a single port configuration (in single port configuration, however, write data to memory mat 30 is required to be subject to bit position changing process).

Embodiment 18

Figure 99:
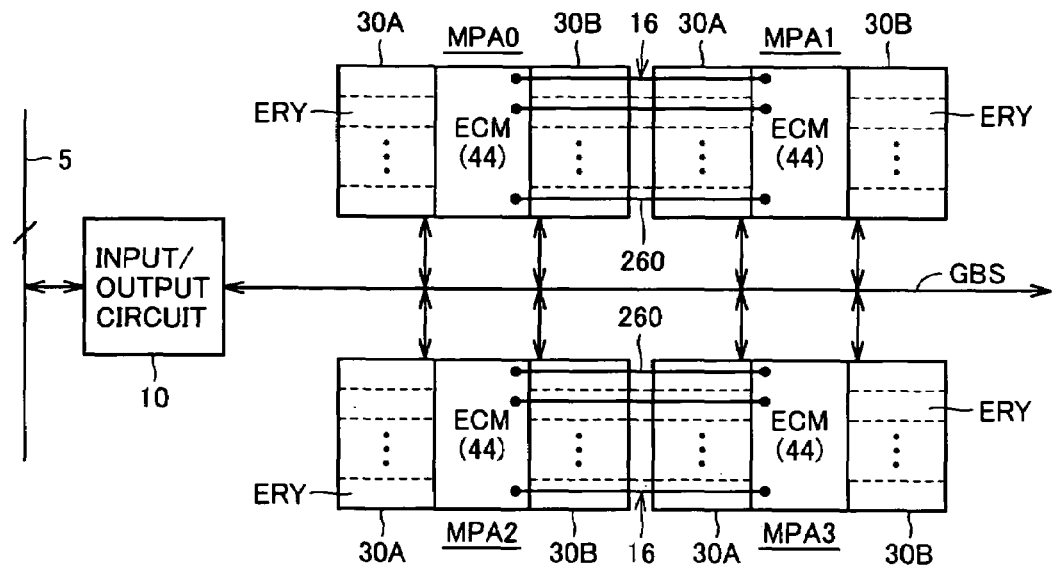
FIG. 99 schematically shows connection among ALUs in accordance with Embodiment 18 of the present invention.

FIG. 99 schematically shows a configuration of a main portion of the semiconductor processing device in accordance with Embodiment 18 of the present invention. Referring to FIG. 99, a plurality of basic operation blocks are connected in parallel, to internal data bus (global data bus) GBS. FIG. 99 shows main processing circuitry (20) MPA0 to MPA3 included in the basic operation blocks as representative examples. Each of the main processing circuitries (20) MPA0 to MPA3 includes memory mats 30A and 30B as well as an ALU group arranged between these memory mats 30A and 30B. The ALU group is not shown in FIG. 99. For the ALU group, switch circuits (44) ECM for interconnecting ALUs are provided.

In the following description, the switches (44) for interconnecting ALUs will be denoted by "ECM".

Memory cell mats 30A and 30B are each divided into a plurality of entries ERY, and for each entry ERY, an inter-ALU connecting circuit (65) is provided.

As shown in FIG. 1, between basic operation units, inter-block data bus 16 is provided for connecting neighboring blocks. Inter-block data bus 16 includes a neighboring block entry interconnecting line 260 for interconnecting inter-ALU connecting circuits (65 in FIG. 7) of neighboring basic operation blocks. Interconnecting line 260 interconnects entries at the same position of main processing circuitries MPA of neighboring operation blocks.

Global data bus GBS is coupled to an external system bus 5 through input/output circuit 10.

Figure 100:
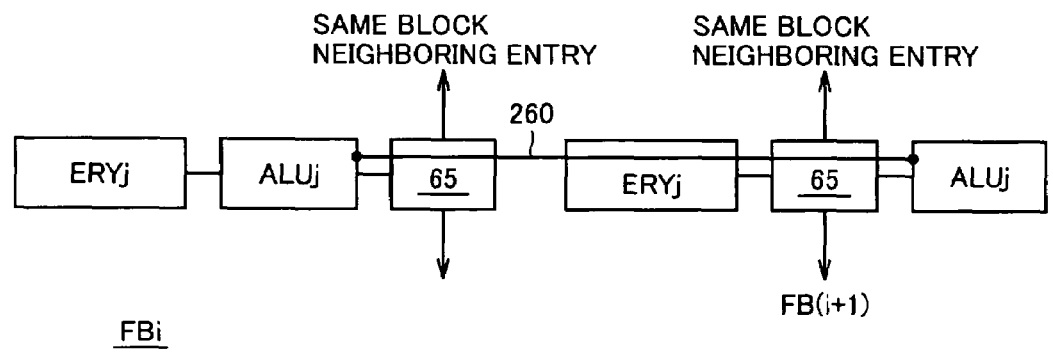
FIG. 100 schematically shows a configuration of a portion related to one bus line of buses connecting neighboring blocks shown in FIG. 99.

FIG. 100 shows a specific manner of connection of neighboring block entry interconnecting line 260. Referring to FIG. 100, in basic operation blocks FBi and FB(i+1), the neighboring block entry interconnecting line 260 is arranged extending along the bit line direction (direction of entry extension), interconnecting ALU units ALUj provided for the entries ERYj of the same column. The neighboring block entry interconnecting line 260 is arranged extending over the memory cell mats in the direction of extension of the entries, that is, the same direction as the bit lines, and interconnects the unit ALU circuit blocks (ALU unit) ALUj of the same column of entries in the neighboring basic operation blocks FBi and FB(i+1).

The global data bus shown in FIG. 99 is coupled to the corresponding sense amplifier group and the write driver group through input/output circuit (see FIG. 15) of each basic operation block. In each of main processing circuitries MPA0 to MPA3, interconnection lines (internal lines in the memory) connecting the sense amplifier group and the write driver group to the input/output circuit are provided by interconnection lines at an upper layer over the sense amplifier group or the write driver group, or by lines at an upper interconnection layer over the memory cell mat, enabling parallel transfer of a plurality of bits of data.

In the example shown in FIG. 100, neighboring block entry interconnecting line 260 connects ALUs to each other. The neighboring block entry interconnecting line 260, however, is coupled to the inter-ALU connecting circuit 65 through the corresponding ALU unit ALUj. Therefore, neighboring block entry interconnecting line 260 may be directly connected to inter-ALU connecting circuit 65. Inter-ALU connecting circuit 65 is coupled to the X-register or Z-register in the ALU unit.

[First Modification]

Figure 101:
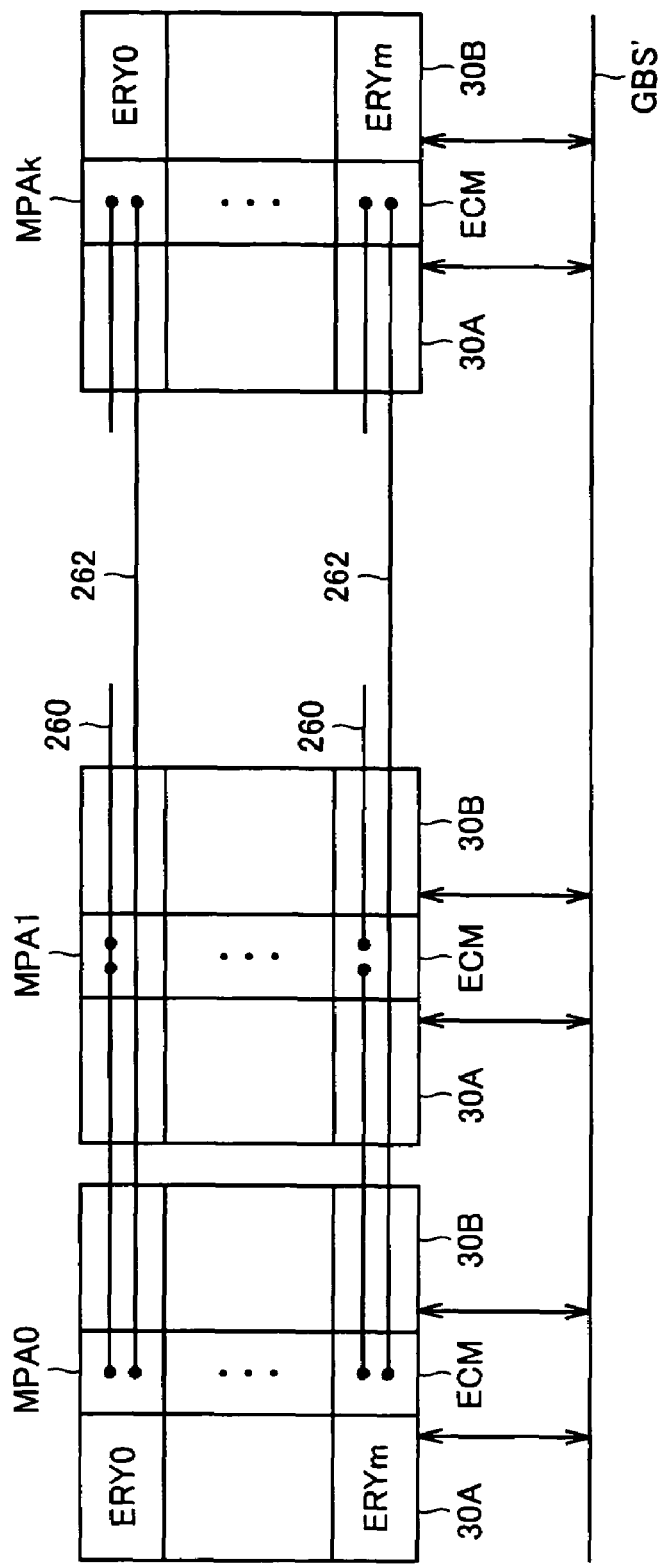
FIG. 101 schematically shows a configuration of a first modification of Embodiment 18 of the present invention.

FIG. 101 schematically shows an arrangement of inter-block data bus according to a first modification of Embodiment 18. Referring to FIG. 101, parallel to global data bus GBS, main processing circuitries MPA0 to MPAk included in the basic operation blocks are coupled. In each of these main processing circuitries MPA0 to MPAk, inter-ALU connecting switch circuit ECM is arranged between memory mats 30A and 30B. By neighboring block entry interconnecting line 260, inter-ALU connecting circuits (65) of the entries at the same position of neighboring main processing circuitries in the inter-ALU connecting switch circuit ECMs are connected.

In the arrangement shown in FIG. 101, the ALU units and the inter-ALU connecting circuits provided for the entries of the same position of the main processing circuitries MPA0 and MPAk in furthest basic operation blocks are interconnected by a feedback line 262. Thus, the ALU units of the entries at the same position in main processing circuitries MPA0 to MPAk are connected to each other in the form of a ring.

As the ALU units and the inter-ALU connecting circuits of the entries at the same position in the basic operation blocks are interconnected in a ring form, it becomes possible to transfer data to and from main processing circuitries at any positions.

In FIG. 101, feedback line 262 is shown linearly extending over the memory cell mats of main processing circuitries MP0 to MPAk. The feedback line 262, however, may be arranged to form a feed back loop extending outside and around the main processing circuitries (memory mats).

Figure 102:
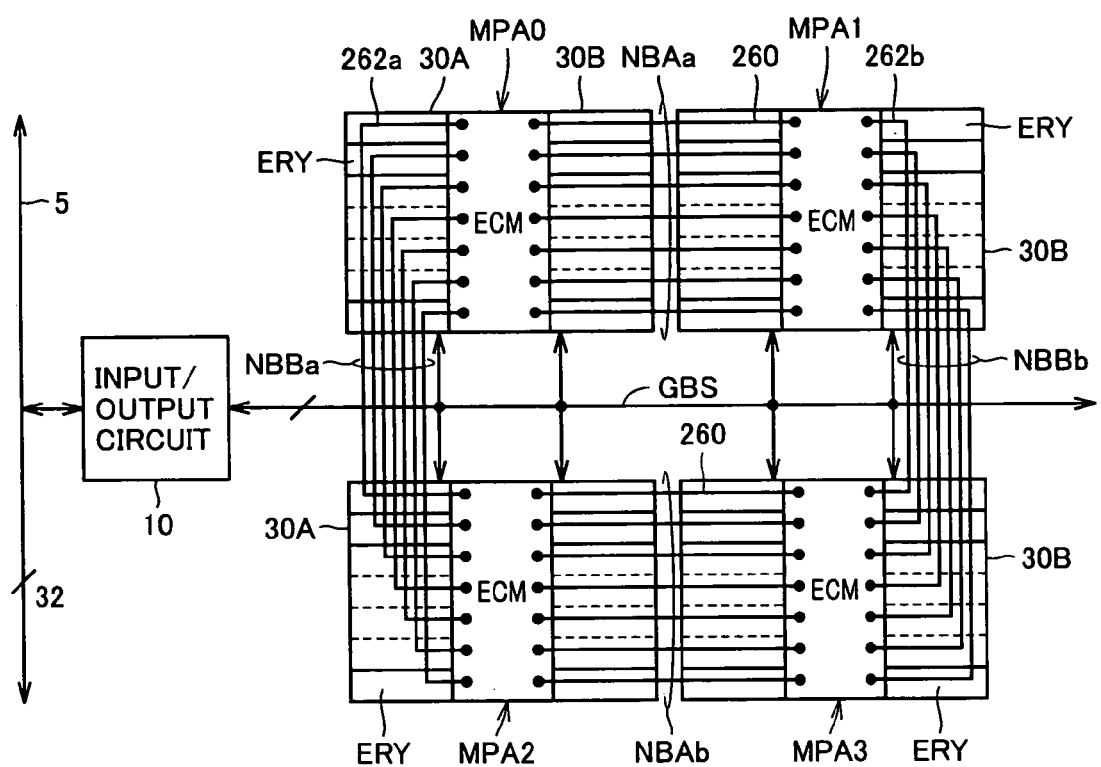
FIG. 102 schematically shows a configuration of a second modification of Embodiment 18 of the present invention.

FIG. 102 schematically shows another exemplary arrangement of the ring-shaped data bus connecting neighboring blocks. Referring to FIG. 102, on one side relative to global data bus GBS, main processing circuitries MPA0 and MPA1 are arranged, and on the opposing side relative to global data bus GBS, main processing circuitries MPA2 and MPA 3 are arranged. Main processing circuitries MPA0 and MPA1 placed adjacently on the same side of global data bus GBS have their ALU units interconnected by a neighboring block entry interconnecting bus NBAa. The neighboring block entry interconnecting bus NBAa includes neighboring block entry interconnecting line 260 interconnecting the ALU units and inter-ALU connecting circuits (65) provided for the entries ERY of the same position of neighboring main processing circuitries MPA0 and MPA1.

In neighboring main processing circuitries MPA2 and MPA3 placed adjacently on the opposing side of global data bus GBS, a neighboring block entry interconnecting bus NBAb is provided in the similar manner. The neighboring block entry interconnecting bus NBAb includes neighboring block entry interconnecting line 260 interconnecting the ALU units and inter-ALU connecting circuits (65) provided for the entries ERY of the same position of neighboring main processing circuitries MPA2 and MPA3.

The interconnecting buses for neighboring blocks (inter-block data bus 16) are further interconnected, by neighboring block entry interconnecting bus NBBa interconnecting the ALU units and inter-ALU connecting circuits provided for the corresponding entries ERY of main processing circuitries MPA0 and MPA2 at opposing positions with respect to global data bus GBS. The neighboring block entry interconnecting bus NBBa includes a line 262a interconnecting the ALU units and inter-ALU connecting circuits provided for the entries ERY of the corresponding positions of main processing circuitries MPA0 and MPA2.

Similarly, the ALU units and inter-ALU connecting circuits provided for the entries ERY of the corresponding positions of main processing circuitries MPA1 and MPA3 are interconnected by neighboring block entry interconnecting bus NBBb. The neighboring block entry interconnecting bus NBBb includes a line 262b arranged for each ALU unit and inter-ALU connecting circuit.

Therefore, as shown in FIG. 102, even when the basic operation blocks (main processing circuitries MPA0 to MPA3) are arranged in a matrix of rows and columns, the ALU units and the inter-ALU connecting circuits at opposing ends on one side relative to the global data bus are interconnected to the ALU units and the inter-ALU connecting circuits of basic operation blocks (main processing circuitries) at opposing ends on the other side relative to the global data bus, and therefore, the ALU units of these main processing circuitries MPA0 to MPA3 can be interconnected in a ring, enabling data transfer to and from any of the main processing circuitries.

Particularly, in neighboring block entry interconnecting buses NBBa and NBBb, lines 262a and 262b interconnect the ALU units and inter-ALU connecting circuits provided for the entries ERY of the same positions of main processing circuitries arranged opposing to each other. Therefore, inter-connecting lines 262a and 262b come to have the same length in respective buses NBBa and NBBb, so that signal propagation delays are made the same, signal skew can be suppressed, and high speed transfer becomes possible.

Neighboring block entry interconnecting buses NBBa and NBBb may be formed to have first interconnecting portions extending over memory cell mats 30A and 30B, respectively, and second interconnecting portions extending in a direction orthogonal to the first interconnecting portions over the memory cell mats of the opposing main processing circuitries with respect to the global data bus GBS. By interconnecting the first and second interconnecting portions on the memory mats, the interconnecting lines of memory mats opposing to each other with respect to the global data bus can be arranged in a compact manner, and increase in memory array area resulting from increased interconnection area can be suppressed.

As described above, according to Embodiment 18 of the present invention, corresponding entries of the main processing circuitries of neighboring basic operation blocks are interconnected by internal lines, and particularly, interconnected in a ring. Therefore, data can be transferred at high speed between the main processing circuitries without using the global data bus GBS.

FIG. 102 does not specifically show an internal structure of inter-ALU connecting switch circuit ECM. Inter-ALU connecting switch circuit ECM includes an ALU unit and an inter-ALU connecting circuit, and the ALU units and inter-ALU connecting circuits are connected to each other by corresponding interconnection line 260 or 262a, 262b.

Embodiment 19

Figure 103:
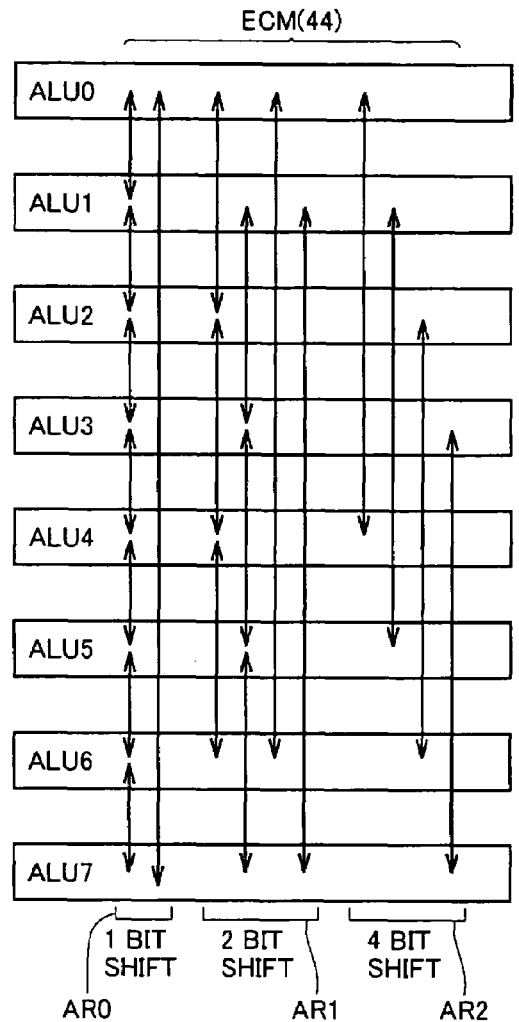
FIG. 103 schematically shows a configuration of a switch circuit for interconnection among ALUs in accordance with Embodiment 19 of the present invention.

FIG. 103 schematically shows the manner of connection of inter-ALU connecting switch circuit (44) ECM according to Embodiment 19 of the present invention. In the example of FIG. 103, eight unit ALU circuit blocks (34) ALU0 to ALU7 are provided in one main processing circuitry. The unit ALU circuit block includes a processing circuit and various register circuits, and internal structure is determined appropriately in accordance with the contents of operation to be achieved. The unit ALU circuit block corresponds to the ALU unit (arithmetic logic unit) of the embodiments above. In the following, for simplicity of description, the arithmetic logic unit (ALU unit) will be denoted simply by "ALU".

For these eight ALUs, inter-ALU connecting switch circuit ECM includes a 1-bit shift area AR0 on which a switch circuit and lines for performing 1-bit shift (move) between ALUs are arranged, a 2-bit shift area AR1 on which a switch circuit and lines for performing 2-bit shift are arranged, and a 4-bit shift area AR2 on which a switch circuit and lines for performing 4-bit shift are arranged. In these shift areas AR0, AR1 and AR2 in one basic operation block, the data are transferred between ALUs at positions corresponding to 1-bit, 2-bit or 4-bit shift along the longitudinal direction of the figure. As the data transfer (shift) by the number of bits corresponding to the power of 2 is implemented, it becomes possible to perform data transfer between any ALUs in 2 cycles.

It is necessary, however, to provide interconnection areas for the respective data shifts. When data shift between ALUs up to $2^n$ bits is to be done, interconnection area of (n+1) in total are necessary, from 1-bit shift area to $2^n$-bit shift area.

Figure 104:
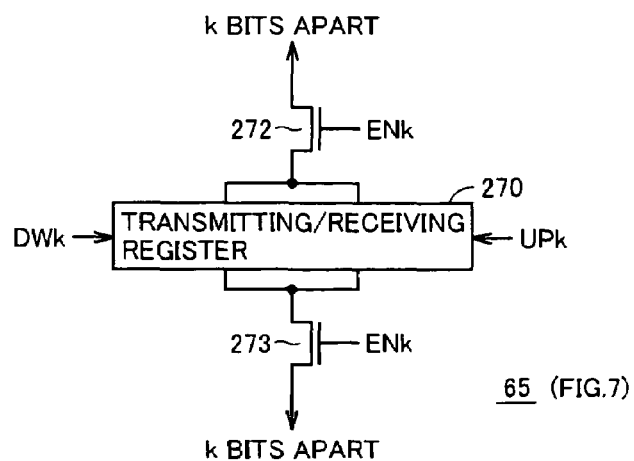
FIG. 104 schematically shows a structure of the switch circuit for interconnecting ALUs shown in FIG. 103.

FIG. 104 shows an exemplary structure of an inter-ALU connecting circuit provided in shift areas AR0 to AR2. The inter-ALU connecting circuit shown in FIG. 104 is provided for each ALU. The inter-ALU connecting circuit shown in FIG. 104 corresponds to the inter-ALU connecting circuit 65 shown in FIG. 7.

Referring to FIG. 104, inter-ALU connecting circuit (65) includes a transmitting/receiving register 270 selectively activated in accordance with an up-shift designating signal UP and a down-shift designating signal DW, and transfer gates 272 and 273 selectively rendered conductive in accordance with a k-bit shift designating signal Enk, for connecting transmitting/receiving register 270 to the inter-ALU connecting circuit apart by k-bits. By the activation of k-bit transfer designating signal Enk, data shift of $2^k$ bits is achieved (k=0, 1, ... ).

Direction of data transmission and reception of transmitting/receiving register 270 is determined by the shift designating signals UP and DW (connection of transmission register and reception register is determined). Transmission/reception register 270 is arranged common to all k-bit shift switches (transfer gates) 272 and 273 of the corresponding inter-ALU connecting circuit.

As shown in FIG. 104, by the provision of transmitting/receiving register 270, it becomes possible to transfer data bits between ALUs bi-directionally. Transmitting/receiving register 270 is connected to the X-register of the corresponding ALU (in the arrangement of FIG. 7). When the X-register and Z-register exist in the ALU and the X-register is used as the receiving register and the Z register is used as the transmitting register (see FIG. 49), transmitting/receiving register 270 may not be provided.

In the arrangement shown in FIG. 103, in 1-bit shift area AR0, ALU0 to ALU7 are connected to each other (by means of switch circuits). Consequently, it becomes possible to transfer data bits bi-directionally in a ring form, in the same main processing circuitry block.

[First Modification]

Figure 105:
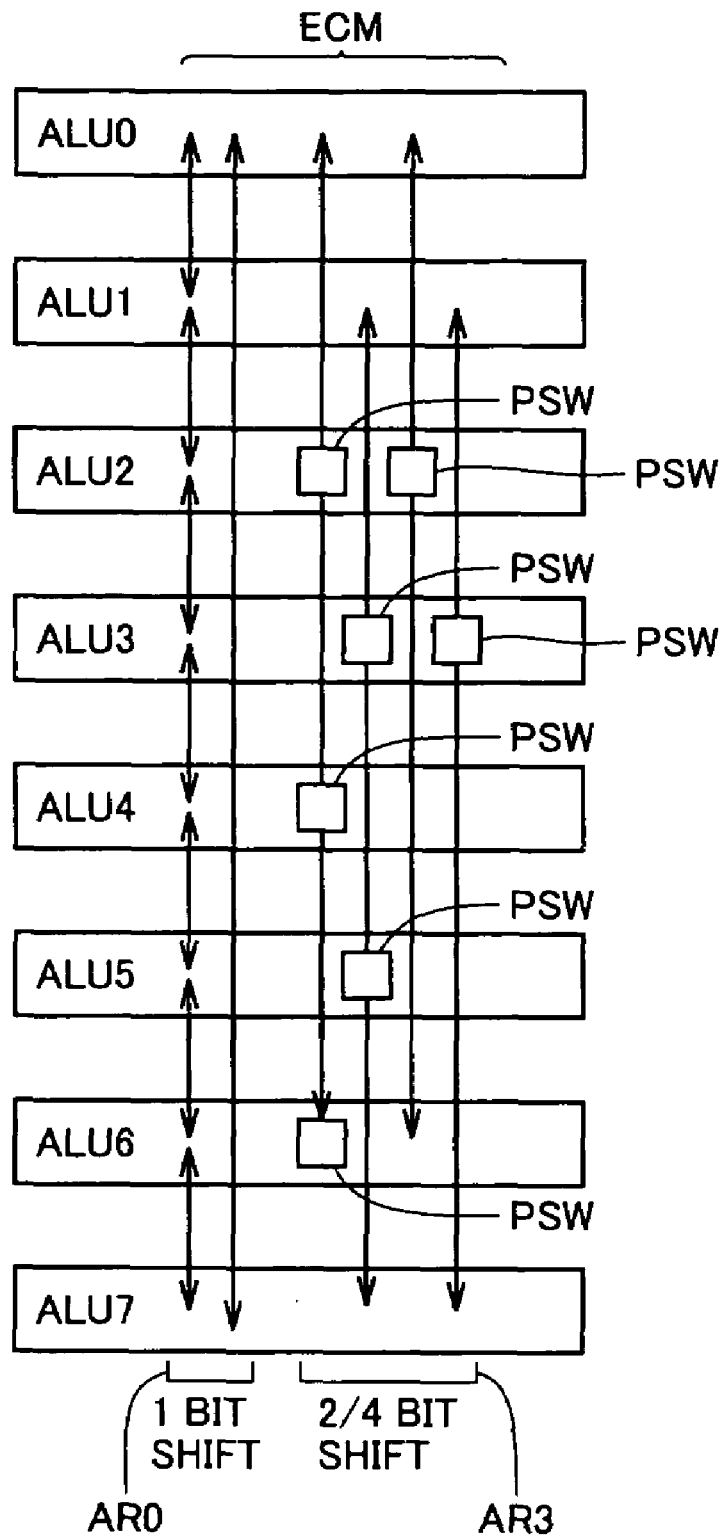
FIG. 105 schematically shows a configuration of a first modification of Embodiment 19 of the present invention.

FIG. 105 schematically shows an arrangement of a first modification of Embodiment 19 of the present invention. Referring to FIG. 105, inter-ALU connecting switch circuit ECM includes a 1-bit shift area AR0 for 1-bit shift between ALUs, and a 2/4-bit shift area AR3 on which lines/switch circuits for performing 2-bit/4-bit shift are arranged. In 1-bit shift area AR0, data transfer between neighboring ALUs is possible, similar to the arrangement of FIG. 103.

In 2/4-bit shift area AR3, a programmable switch circuit PSW alternatively provides a 2-bit shift operation or a 4-bit shift operation. In the arrangement shown in FIG. 105, in order to switch between the 2-bit shift and 4-bit shift, a programmable switch PSW is required. However, the number of bus lines for transfer (move) can be reduced, and the area occupied by the buses can be reduced.

The programmable switch circuit PSW shown in FIG. 105 is arranged between each of the lines in 2-bit shift area AR1 of FIG. 103.

Figure 106:
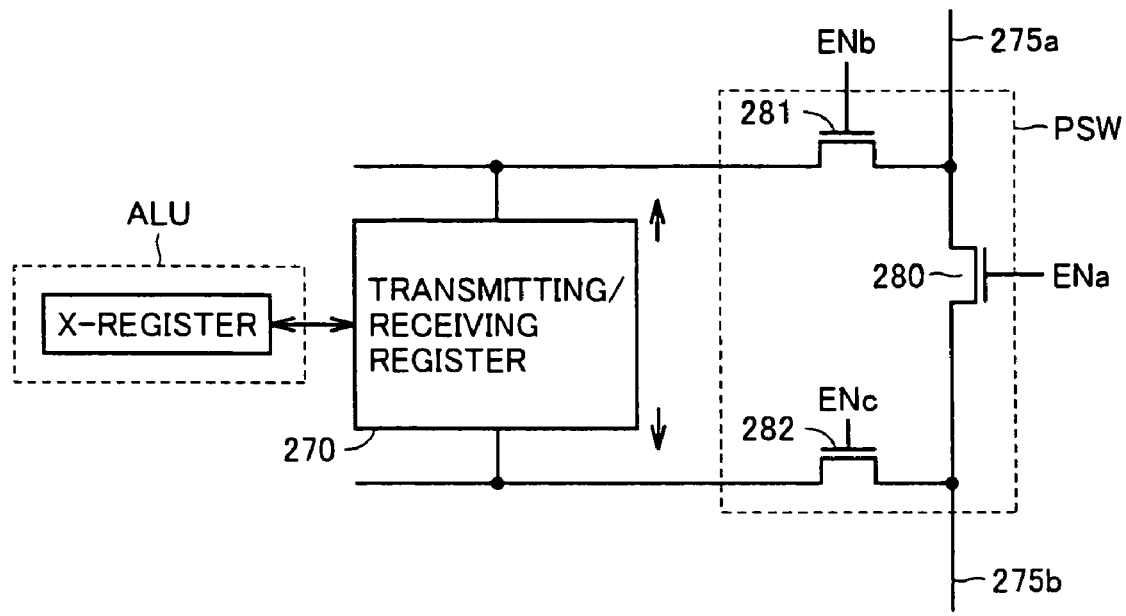
FIG. 106 schematically shows an exemplary structure of a programmable switch circuit shown in FIG. 105.

FIG. 106 schematically shows an exemplary structure of programmable switch PSW. Referring to FIG. 106, programmable switch PSW includes a transfer gate 280 selectively disconnecting lines 275a and 275b in accordance with an enable signal Ena, a transfer gate 281 selectively connecting line 275a to one node of transmitting/receiving register 270 in accordance with an enable signal ENb, and a transfer gate 282 connecting line 275b to the other node of transmitting/receiving register 270 in accordance with an enable signal ENc. The transmitting/receiving register 270 and the programmable switch PSW form the inter-ALU connecting circuit (65).

Transmitting/receiving register 270 includes a transmitting register and a receiving register, and performs upward shift along an upward arrow and performs downward data transfer along a downward arrow. Transmitting/receiving register 270 is coupled, for example, to the X-register included in the corresponding ALU.

By selectively setting the transfer gates 280 to 282 to the conductive/non-conductive state in the programmable switch circuit PSW shown in FIG. 106, 2-bit shift or 4-bit shift can be achieved selectively, and data can be transferred bi-directionally, that is, upward and downward.

Switch control signals ENa to ENc are included in the ALU control signals generated, based on the result of decoding of the program, from controller 21.

Figure 107:
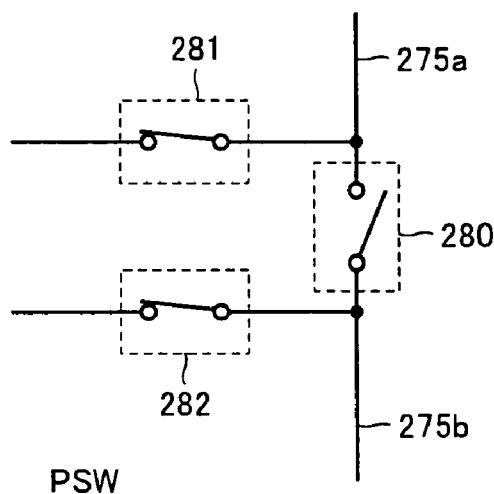
FIG. 107 shows a first state of connection of the programmable switch circuit shown in FIG. 106.

FIG. 107 schematically shows an interrupted state, which is one of the connection states of programmable switch circuit PSW. Referring to FIG. 107, in the interrupted state of programmable switch PSW, transfer gates 281 and 282 are rendered conductive, and transfer gate 280 is rendered non-conductive. Here, connection lines 275a and 275b are disconnected by transfer gate 280, and data is transferred through the corresponding inter-ALU connecting circuit (65). The direction of data transfer is determined by the state of connection of the transmitting and receiving registers.

Figure 108:
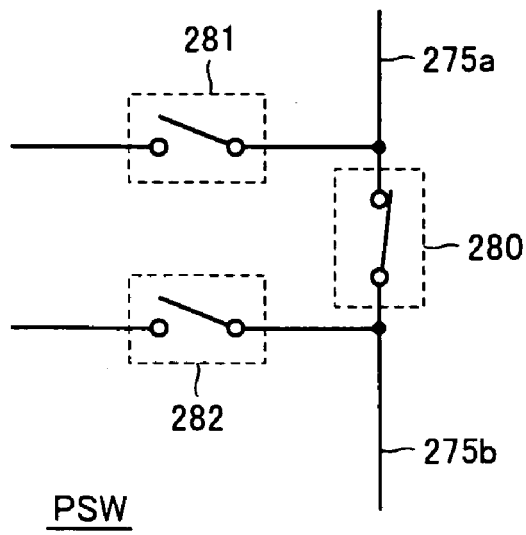
FIG. 108 shows a second state of connection of the programmable switch circuit shown in FIG. 106.

FIG. 108 schematically shows a through connection state, which is another one of the connection states of programmable switch circuit PSW. In the through state THR, transfer gate 270 is set to the conductive state, and transfer gates 281 and 282 are set non-conductive. Therefore, lines 275a and 275b are interconnected, and disconnected from the corresponding ALU unit. Thus, in the through state THR, the data bits on connection lines 275a and 275b are transferred through the corresponding ALU to another ALU. By this through arrangement, data can be transferred through the ALU unit apart by 2 bits to the ALU unit apart by 4 bits, in 4-bit transfer mode.

Figure 109:
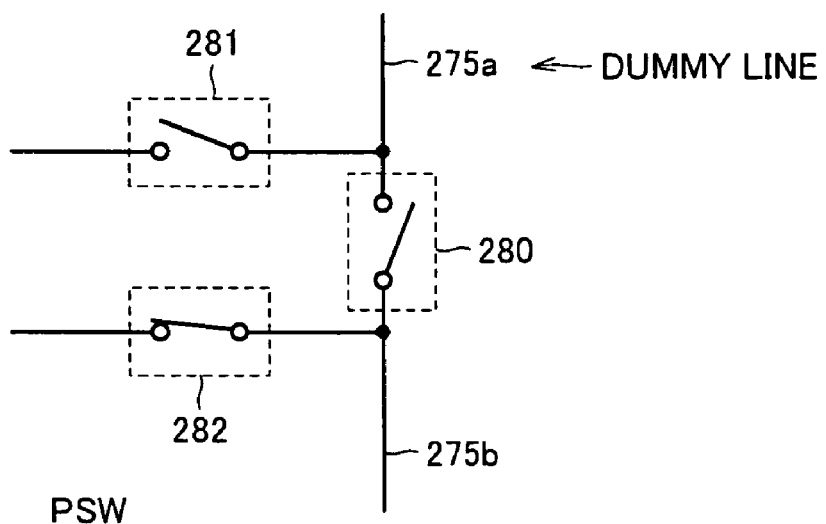
FIG. 109 shows a third state of connection of the programmable switch circuit shown in FIG. 106.

FIG. 109 schematically shows a disconnection/dummy state IRD, which is other one of the connection states of programmable switch circuit PSW. In the interruption/dummy state IRD, transfer gates 280 and 282 are set to the non-conductive state, and transfer gate 282 is set to the conductive state. Therefore, connection line 275b is connected to the corresponding ALU, while connection line 275a is isolated from the corresponding ALU. Connection line 275b transfers data bits to/from the corresponding ALU, while connection line 275a does not contribute to data transfer and arranged as a dummy line.

Figure 110:
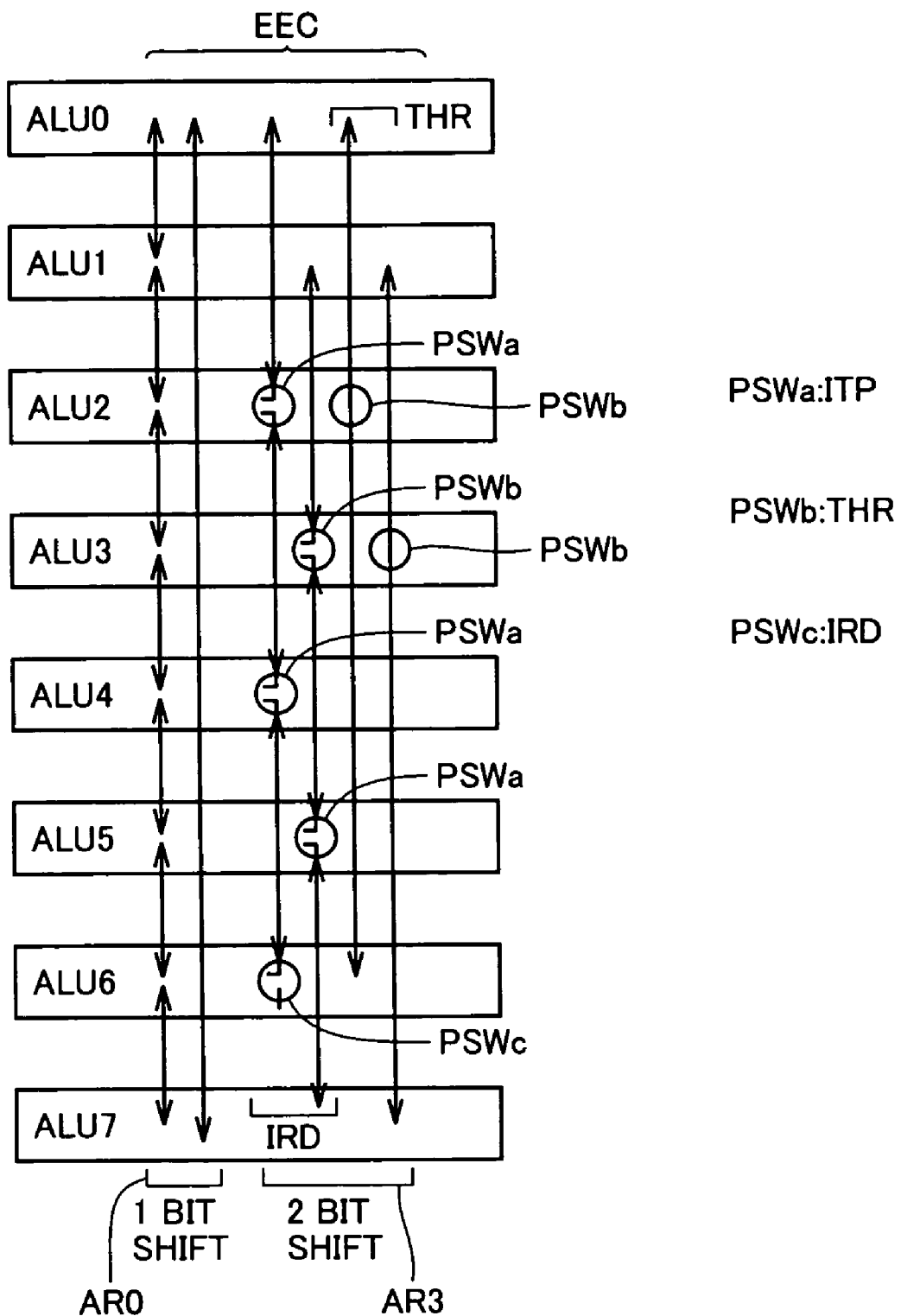
FIG. 110 shows an exemplary connection of a switch circuit for connecting ALUs in accordance with a first modification of Embodiment 19 of the present invention.

FIG. 110 shows an example of connection of programmable switch PSW in 2-bit/4-bit shift area AR3. Referring to FIG. 110, a switch circuit PSWa is set to the interrupted state ITP, and a switch circuit PSWb is set to the through state THR. Therefore, data transfer is performed between ALU (ALU unit) 0, ALU2, ALU4 and ALU 6 by programmable switch circuits PSWa and PSWc, and data transfer is performed between ALU1, ALU3, ALU5 and ALU7 by programmable switch circuit PSWa in the interrupting state. Similarly, by the programmable switch circuit PSWb in the through state, data transfer is performed between ALU 6 and ALU0 and between ALU1 and ALU 7. By such connection of switches, 2-bit shift operation is achieved among ALU0 to ALU7.

In ALU6, switch circuit PSWc is set to the interrupting/dummy state. ALU6 is connected to ALU 0 through programmable switch PSWb. Therefore, programmable switch PSWc provided for ALU6 is not required to transfer data further downward, and has the connection line on one side thereof set always in the dummy connection state. Therefore, programmable switch PSWc provided for ALU6 may have transfer gates 280 and 282 shown in FIG. 108 always set to the non-conductive state. Alternatively, switch circuit PSWc for ALU6 may be formed simply by transfer gate 281 shown in FIG. 109.

Figure 111:
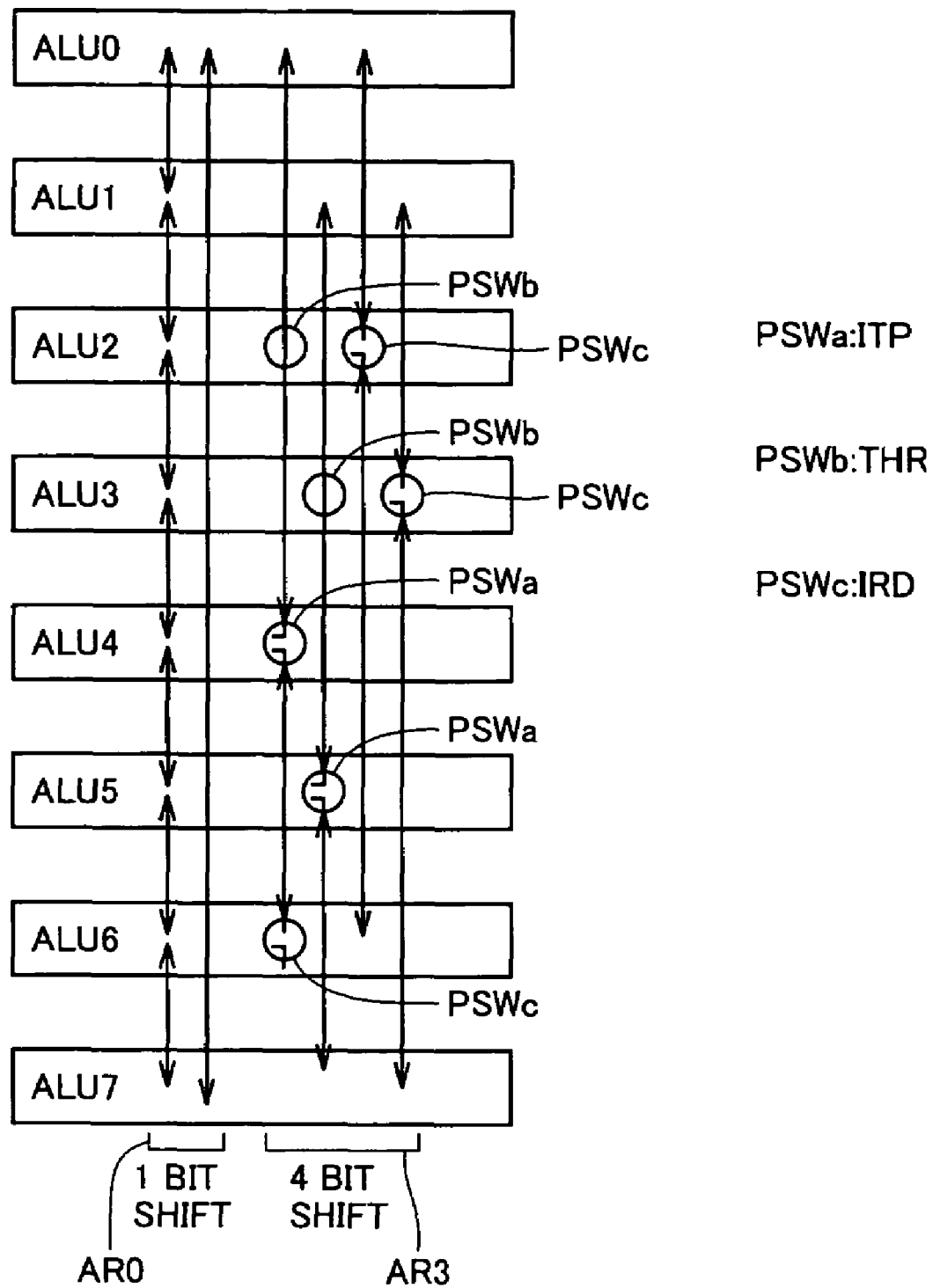
FIG. 111 shows another exemplary connection of a programmable switch in accordance with the first modification of Embodiment 19 of the present invention.

FIG. 111 shows an example of a connection of the programmable switch circuits in the 4-bit shift (move) operation. Referring to FIG. 111, programmable switch circuit PSWa is set to the interrupted state ITP, programmable switch circuit PSWb is set to the through state, and programmable switch circuit PSWc is set to the interrupting/dummy state IRD.

In the state of connection shown in FIG. 111, ALU0 is coupled to ALU4, and ALU4 is separated from ALU6 and connected to ALU2 by programmable switch PSWc in the through state THR. ALU2 is disconnected from ALU0 by programmable switch circuit PSWc in the interrupting/dummy state.

ALU6 is coupled to ALU1 through switch circuit PSWc in the interrupting/dummy state, and ALU7 is coupled to ALU3. ALU3 is separated from ALU1 by programmable switch circuit PSWc.

Therefore, by setting the programmable switch circuits PSW to any of the states ITP, THR and IRD in shift area AR3, 2-bit shift operation and 4-bit shift operation can be achieved. Therefore, it becomes unnecessary to separately provide the interconnection lines for 2-bit shift and 4-bit shift, and the area occupied by connection lines can be reduced.

[Second Modification]

Figure 112:
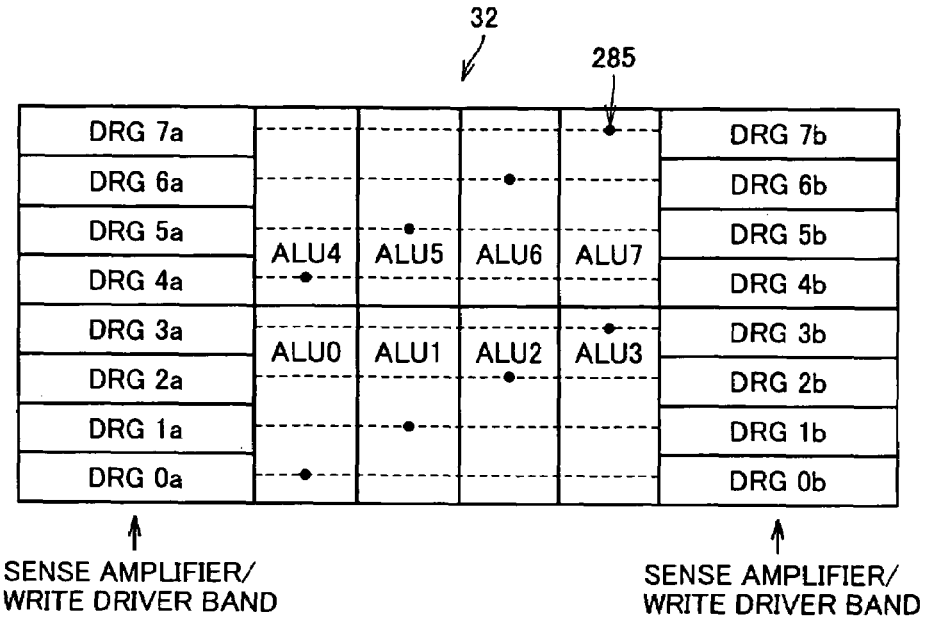
FIG. 112 schematically shows an arrangement of ALUs in accordance with a second modification of Embodiment 19 of the present invention.

In order to mitigate the pitch condition of lines in shift areas AR0 to AR2 or AR3 (restriction on arrangement of switch circuits PSW), the arrangement of ALUs is made as shown in FIG. 112.

In FIG. 112, four unit ALU circuit blocks (ALUs) are arranged aligned in the entry extending direction. Sense amplifiers/write drivers (data registers) DRG0a to DRG7a on memory cell mats on one side and sense amplifiers/write drivers (data registers) DRG0b to DRG7b on memory cell mats on the other side are arranged corresponding to the respective entries (not shown).

As shown in FIG. 112, the ALU pitch of the unit ALU circuit block (hereinafter simply referred to as ALU) is determined so as to correspond to the pitch for arranging four entries (sense amplifiers/write drivers DRGs) per one memory cell mat. Thus, the pitch of the signal lines for shifting among ALUs can be mitigated among ALUs, and therefore, a large number of shifting interconnection lines can be arranged with sufficient margin for the respective ALUs.

Figure 113:
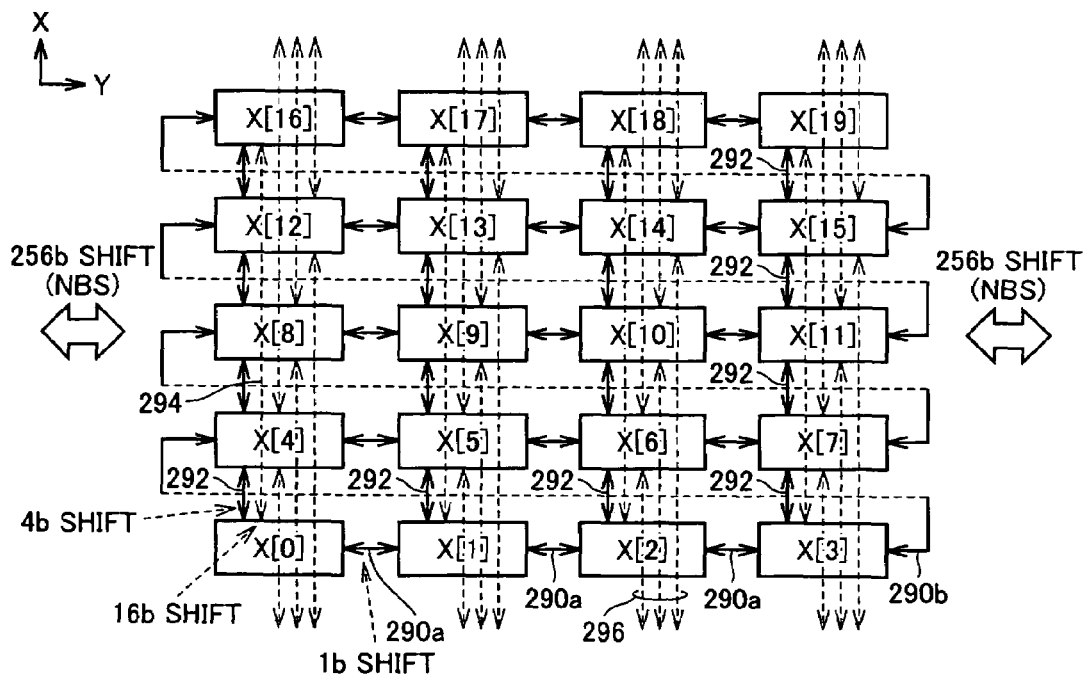
FIG. 113 schematically shows interconnections of a switch circuit for connecting ALUs in the ALU arrangement of FIG. 112.

FIG. 113 schematically shows a line layout of inter-ALU connecting switch circuits corresponding to the ALU arrangement shown in FIG. 112. In FIG. 113, ALUs arranged in four rows and five columns will be denoted by "X[0] to X[19]". Typically, when data bits are transferred between ALUs, data bits are transferred using the X-registers. Therefore, an example of inter-ALU connection in which X-registers included in respective ALUs are connected will be described.

Connection of ALUs neighboring to each other in the Y direction (entry extending direction) in the figure is achieved by connection line 290a connecting X[i] and X[i+1]. The rightmost ALU among the ALUs aligned in the Y direction, that is, X[i+3] is connected to the ALU unit on the left side of the next, neighboring column, that is, X[4i+1]. By connection lines 290a and 290b, ALU units arranged in four rows and five columns are successively connected, to implement the 1-bit shift operation.

ALUs neighboring in the X direction are connected to each other by line 292 (switch circuit is not shown). By the line 292, ALU(X[i]) is coupled to ALU([Xi+4]) apart by 4 bits, and thus, the 4-bit shift operation can be implemented by line 292.

Line 296 supports a shifting between further apart ALUs, and by the line 296, 32-bit or 64-bit shift, for example, can be supported.

When one main processing circuitry has 256 entries, ALUs are connected to the corresponding ALUs of the neighboring main processing circuitry through inter-block data bus NBS (bus 16 of FIG. 1), so that a 256 bit shift is implemented.

Figure 114:
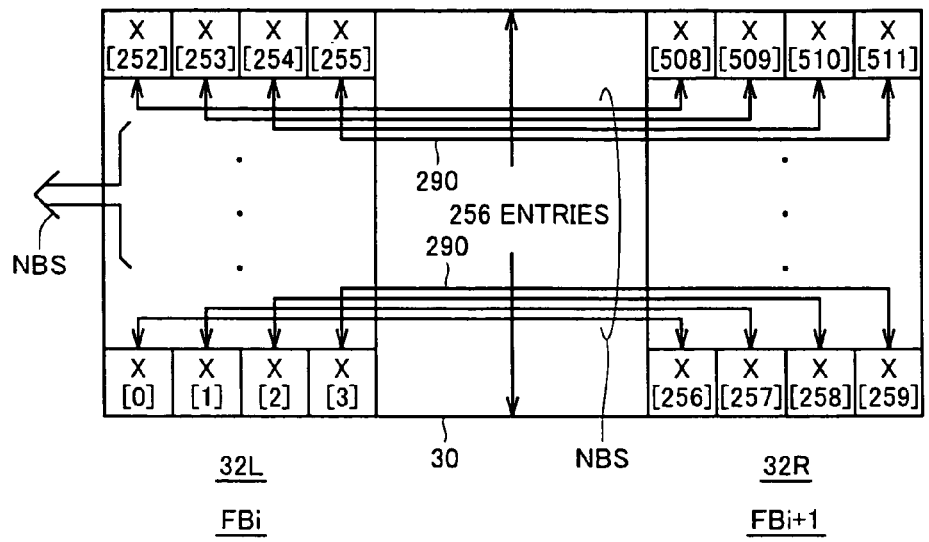
FIG. 114 schematically shows an example of data bus connection between neighboring blocks shown in FIG. 113.

FIG. 114 schematically shows an exemplary arrangement of inter-block data bus NBS (bus 16 of FIG. 1). By way of example, in memory cell mat 30, 256 entries are provided. In the group 32L of ALU units in basic operation block FBi, four ALUs are arranged aligned in each row. Therefore, in the group 32L of ALU units, ALU0 to ALU255 (X[0]-X[255]) are arranged.

In basic operation block FB(i+1), similarly, ALUs are arranged corresponding to 256 entries with four ALUs placed in alignment in the row direction. Basic operation blocks FBi and FBi+1 have successive address areas (address areas of external CPU), and 256 ALUs in ALU unit group 32R are allotted with serially successive numbers. Thus, ALUs (X[256]-X[511]) are arranged.

ALUs arranged at the same position of ALU unit groups 32L and 32R are connected to each other by neighboring inter-block data line 290 of inter-block data bus NBS By way of example, ALU(X[3]) is connected to ALU(X[259]) of ALU unit group 32R. Similarly, ALU(X[255]) of ALU unit group 32L is connected to ALU(X[511]) of ALU unit group 32R. Thus, by transferring data bits through the inter-block data bus NBS, a 256-bit shift operation can be achieved.

Each ALU in ALU unit group 32L of basic operation block FBi is further connected to the ALU in the main processing circuitry of another, neighboring basic operation block, through inter-block data bus NBS.

By arranging the ALUs hierarchically using eight ALUs as a unit in the arrangement of ALUs shown in FIG. 113, and using switch circuits or programmable switch circuits (see FIG. 105) for connection of lines, it becomes possible to achieve 1-bit to $2^n$ bit shift operations.

[Third Modification]

Figure 115:
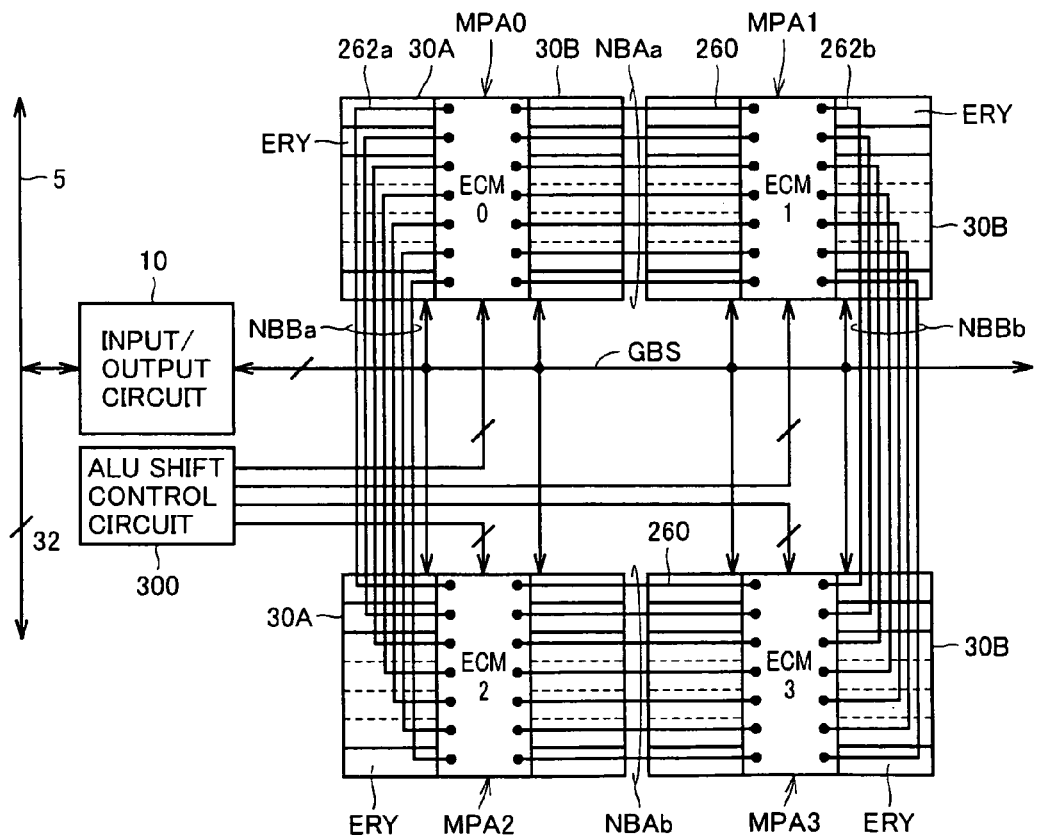
FIG. 115 schematically shows an arrangement of a third modification of Embodiment 19 of the present invention.

FIG. 115 schematically shows an arrangement according to the third modification of Embodiment 19 of the present invention. In the arrangement shown in FIG. 115, for controlling the connection of inter-ALU connecting switch circuit ECM, an ALU shift control circuit 300 is provided. ALU shift control circuit 300 individually controls connection of inter-ALU connecting switch circuits ECMO to ECM3 included in main processing circuitries MPA0 to MPA3. Therefore, arithmetic/logic operation can be done with the amount of shift between ALUs in main processing circuitries MPA0 to MPA3 made different from each other.

The shift control by ALU shift control circuit 300 may be executed under the control of controller 21 included in basic operation block FB shown in FIG. 1. Further, ALU shift control circuit 300 may be arranged distributed in the controller of each basic operation block, to control the connection of the inter-ALU connecting switch circuit of the corresponding ALU. Alternatively, ALU shift control circuit 300 may be configured to set the amount of shift in each of the inter-ALU connecting switch circuits ECMO to ECM3 under the control of an external host CPU through system bus 5.

[Fourth Modification]

Figure 116:
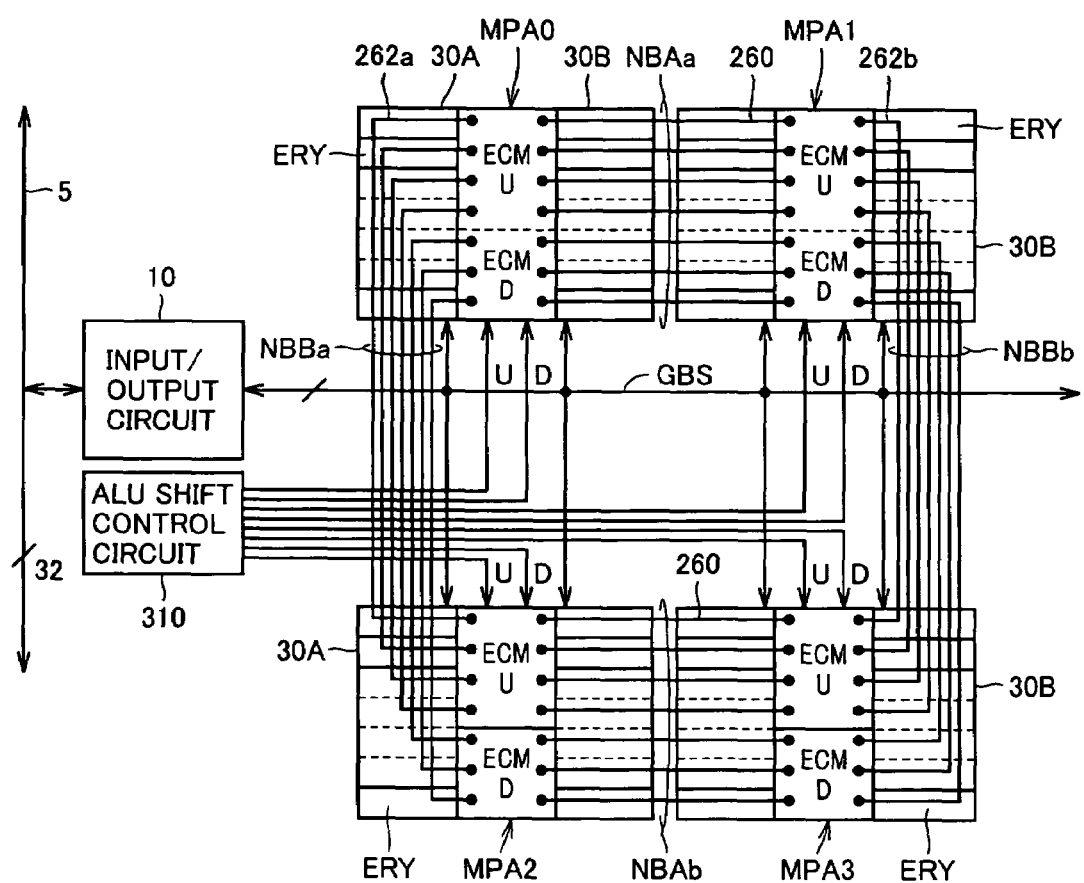
FIG. 116 schematically shows an arrangement of a fourth modification of Embodiment 19 of the present invention.

FIG. 116 schematically shows an arrangement of a fourth modification of Embodiment 19 of the present invention. In the arrangement shown in FIG. 116, in each of main processing circuitries MPA0 to MPA3, inter-ALU connecting switch circuit ECM is divided into an upper switch circuit ECMU and a lower switch circuit ECMD. In order to individually control the upper switch circuit ECMU and lower switch circuit ECMD by main processing circuitries MPA0 to MPA3, ALU shift control circuit 300 applies control signals (denoted by U and D) individually to the upper switch circuit and lower switch circuit of main processing circuitries MPA0 to MPA3. The control signal denoted by character U controls connection of the upper switch circuit ECMU, and the control signal denoted by character D controls connection of the lower switch circuit ECMD.

Except for this point, the arrangement shown in FIG. 116 is the same as that of FIG. 115. Therefore, corresponding portions are denoted by the same reference characters and description thereof will not be repeated.

In the arrangement shown in FIG. 116, in each of main processing circuitries MPA0 to MPA3, the amount of bits to be shifted between ALUs can be set individually by the upper switch circuit ECMU and lower switch circuit ECMD. Therefore, by way of example, an 8-bit shift operation is executed in the ALU corresponding to the upper switch circuit ECMU and a 2-bit shift operation is executed in the ALU corresponding to the lower switch circuit ECMD, and thus, different arithmetic operations can be performed in parallel.

As in the third modification, the ALU shift control operation of ALU shift control circuit 310 may be effected by the controller (21) included in main processing circuitries MPA0 to MPA3. Alternatively, ALU shift control circuit 310 may be provided dedicatedly only for controlling the inter-ALU shift operation.

In the arrangement shown in FIG. 116, the inter-ALU connecting switch circuit is divided into two switch circuits in each of main processing circuitries MPA0 to MPA3. The number of division of the inter-ALU connecting switch circuits is not limited to two, and these switch circuits may be divided into a greater number of blocks. By ALU shift control circuit 310, the amount of shift is controlled in each block.

In the arrangement shown in FIG. 116, in each of the main processing circuitries, the amount of shift among a plurality of ALUs can be set individually, and therefore, each of the main processing circuitries can execute different arithmetic operation. Consequently, more complicated arithmetic/logic operation can be supported.

[Fifth Modification]

FIG. 117 shows a modification of the inter-ALU connecting circuit. Referring to FIG. 117, as lines 275a and 275b shown in FIG. 7, +1 bit shift line 320au, +4 bit shift line 320bu, +16 bit shift line 320cu and N bus shift line 320du, −1 bit shift line 320ad, −4 bit shift line 320bd, −16 bit shift line 320cd and −N bus shift line 320dd are provided. N bus shift lines 320du and 320dd are the lines of inter-block data bus NBS.

The inter-ALU connecting circuit further includes a multiplexer (MUX) 315u selecting one of signal lines 320au-320du in accordance with a shift command signal, a multiplexer (MUX) 315d similarly selecting one of signal lines 320ad-320dd in accordance with the shift command signal, and a transmitting/receiving data register 317 transmitting and receiving data bi-directionally between the signal lines selected by multiplexers 315u and 315d and the corresponding ALU unit 319.

To transmitting/receiving data register 317, a transfer direction designating signal U/D designating a +shift/−shift is applied.

The shift command signals including the transfer direction designating signal may be generated as ALU control signals from the controller of the corresponding basic operation block FB, or may be generated from shift control circuit 300 or 310 according to the third or fourth modification above.

Transmitting/receiving data register 317 corresponds to transmitting/receiving data register 270 shown in FIGS. 104 and 106.

Multiplexers 315u and 315d may be used as the programmable switch circuits PSWs shown in FIG. 105. By controlling connection of multiplexers 315u and 315d, the through state, interrupting state and the dummy state of the programmable switch circuits PSWs shown in FIGS. 105 to 111 may be implemented.

FIG. 118 shows an exemplary structure of transmitting/receiving data register 317 shown in FIG. 117. In the corresponding ALU unit 319, an X-register 320 is shown as a representative register circuit performing the data transfer between ALUs. Other register, such as the XH-register, XL-register or Z-register, may be used for data transfer between ALUs.

Transmitting/receiving data register 317 includes a transmitting register 325 receiving a data bit from an output OUT of X-register 320, a receiving register 326 taking in the received data for transmission to the input IN of X-register 320, and a path setting circuit 330 connecting transmitting register 325 and receiving register 326 selectively to a plus (+) direction shift line 320u and a minus (−) direction shift line 320d.

Plus direction shift line 320u includes shift lines 320au-320du shown in FIG. 117, and minus direction shift line 320d includes shift lines 320ad-320dd shown in FIG. 117. In the arrangement shown in FIG. 118, multiplexers 315u and 315d of FIG. 117 are not shown.

In the arrangement shown in FIG. 118, when a data bit is to be transferred in the plus (+) direction, path setting circuit 330 couples transmitting register 325 to plus direction shift line 320u, and couples receiving register 326 to minus direction shift line 320d. The data of transmitting register 325 is transferred to the ALU in the upward direction, and stored in the receiving register of the corresponding destination. Receiving register 326 stores data transferred from the transmitting register of the lower ALU.

When data transfer in minus direction is to be performed, path setting circuit 330 connects transmitting register 325 to minus direction shift line 320d, and connects receiving register 326 to plus direction shift line 320u. Transmitting register 325 transfers data to the receiving register of the lower side, destination ALU, and receiving register 326 receives data transmitted from the upper side, source ALU.

In this manner, no matter whether the data bit shift (transfer) is performed in the minus direction or plus direction, data transmission/reception is possible. Transmitting register 325 and receiving register 326 are used as transmitting/receiving register 270 in the arrangement of inter-ALU connecting circuit shown in FIG. 104.

Further, path setting circuit 330 may be formed by a switch matrix for switching the connections using switch circuits. Alternatively, in path setting circuit 330, two sets of transmitting tri-state buffer and a receiving tri-state buffer may be provided for different directions of data transfer, and the data transfer direction may be set by selectively activating the set of tri-state buffers.

[Sixth Modification]

FIG. 119 schematically shows an arrangement of the sixth modification of Embodiment 19 of the present invention. In the arrangement shown in FIG. 119, inter-ALU connecting lines include lines 340 extending in the Y direction (entry extension direction) over memory cell mat 30, and lines 342 extending in the X direction over memory cell mat 30 and interconnecting lines 340 apart by a prescribed number of bits from each other.

In ALU unit group 32, when four ALUs are arranged aligned in one column as shown in FIG. 112 above (when ALU pitch is four times the bit line pitch), interconnection of lines 340 apart from each other by 4 bits makes a 64-bit transfer path. In place of the arrangement having lines extending over a long distance in ALU unit group 32, the lines for long distance data transfer are arranged over memory cell mat 30, and therefore, interconnection layout is facilitated.

Lines 340 and 342 arranged extending over memory cell mat 30 may be the lines interconnecting ALUs apart by 128 bits.

In the arrangement of inter-ALU connecting switch circuit, bit shift amount of $2^n$ (n=0 . . . 8) has been described as examples. However, a shift line connection may be used to achieve appropriate amount of shift, dependent on the contents of arithmetic/logic operation to be executed, the amount of bits to be shifted and the number of clock cycles necessary for the shift, or the number of entries included in memory cell mat 30.

As described above, according to Embodiment 19 of the present invention, connection path among ALUs in the main processing circuitry is set individually in each main processing circuitry, and the connection path can be set in a programmable manner. Therefore, inter-ALU connection can be made efficiently without increasing the area occupied by the lines for interconnecting ALUs, and the parallel operation performance can be improved without increasing the interconnection layout area.

Embodiment 20

FIG. 120 schematically shows a structure of input/output circuit 10 in accordance with Embodiment 20 of the present invention. Input/output circuit 10 is coupled to the host CPU through system bus 5, as shown in FIG. 1. Internal data bus 16 (global data bus GBS) is coupled commonly to a plurality of internal basic operation blocks.

Input/output circuit 10 includes: an orthogonal transformation circuit 400 for performing data transfer between j-bit host system bus (bus lines HBS[j−1):0]) and internal k-bit first internal transfer bus CBS[(k−1):0] and performing orthogonal transformation of data bit arrangement, a cross bar switch 402 selectively setting a data transfer path between k-bit first internal transfer bus CBS[(k−1):0] and an m-bit second internal transfer bus SBS [(m−1):0] for performing data bit transfer, and a selector 404 transferring data between the second internal transfer bus SBS [(m−1):0] and an n-bit internal data bus (global data bus GBS [(n−1):0]).

Host system bus 5 is formed by a single-end bus line, while the first and second transfer buses CBS and SBS as well as global data bus GBS (internal data bus 16) are formed by double-end bus lines, for transmitting complemental signals. In the following, except the case when each bit on these lines is particularly referred to, the buses will be referred to by characters CBS, SBS, GBS and HBS.

In input/output circuit 10, transformation of data arrangement and transformation of data bit width for transfer are performed between the data transferred in a j-bit word-serial and bit parallel manner and a word-parallel and bit serial data transmitted on n-bit global data bus GBS.

FIG. 121 schematically shows a construction of an output portion for transferring data from the first transfer bus CBS of orthogonal transformation circuit 400 shown in FIG. 120 to host system bus HBS (bus 5). In FIG. 121, a data output portion of orthogonal transformation circuit 400 includes transformation elements TXF00 to TXF(k−1)(j−1) arranged ink rows and j columns. As transformation elements TXF00 to TXF(k−1)(j−1) are of the same configuration, FIG. 121 shows the configuration of transformation element TXF00 as a representative example. Transformation element TXF00 includes a flip-flop FFa taking in and latching signals on complementary internal data bus lines CBS[0] and /CBS[0] in accordance with a control signal SDoi[0] applied to a clock input, and a tri-state buffer BF transmitting an output signal of flip-flop FFa to the single end system bus line HBS[0] in accordance with an output control signal SToo[0].

First internal transfer bus lines CBS[u] and /CBS[u] are provided corresponding to each row of transfer elements TXFs (generally representing the transfer elements), and a host system bus line HBS[v] is provided corresponding to each column of the transformation elements. Here, u=0 to (k−1) and v=0 to (j−1).

To the output buffer BF of transformation elements TXFs aligned in the row direction, an output control signal SToo[u] is commonly applied. To the clock inputs of flip-flops FFa of transformation elements aligned in the column direction, an input control signal SDoi[v] is commonly applied.

The control signals SDo[(j−1):0] and SToo[(k−1):0] may be generated by control CPU (25) shown in FIG. 1 under the control of host CPU, or similarly generated by CPU 25 in accordance with a DMA transfer request from the controller provided in each basic operation block. These signals may be directly generated by host CPU, and for DMA mode transfer, the signals may be generated under the control of the external DMA controller.

FIG. 122 schematically shows an operation of the output portion of orthogonal transformation circuit 400 shown in FIG. 121. Data are transferred in bit-serial and word parallel manner from the first internal transfer bus CBS. It is now assumed that data bits A[a], B[a], . . . G[a] are applied in parallel. Here, in accordance with an input control signal Doi(a), the transformation elements TXFs of the a-th column take in and latch the applied data bits. Therefore, when orthogonal transformation circuit 400 is fully filled with data from the first internal transfer bus CBS, data of the same bit position of words A, B, . . . G are arranged along the column direction and the bits of each word are arranged aligned in the row direction.

At the time of data output, transformation elements TXFs aligned in the row direction are simultaneously set to an output state in accordance with the output control signal SD00[b]. Therefore, to the host system bus HBS, the bits [0] to [j-1] of one data word are output in parallel. Consequently, when bits of the same position of the entries are reached from the first internal transfer bus CBS, it follows that each data word is output serially to the host system bus HBS.

FIG. 123 shows an exemplary configuration of transformation element TXF. Referring to FIG. 123, flip-flop FFa includes: transfer gates 421a and 421b transmitting signals on transfer bus lines CBS[s] and /CBS[s] in accordance with the input control signal SDoi[u]; a cross-coupled differential amplifying circuit 422 for differentially amplifying, when activated, data transferred from transfer gates 421a and 421b; a P-channel MOS transistor 423p supplying power supply voltage to a P-channel MOS transistors of cross-coupled type differential amplifying circuit 422 in accordance with the input control signal SDoi[u]; and an N-channel MOS transistor 423n coupling an N-channel MOS transistors of cross-coupled type differential amplifying circuit 422 to a ground node in accordance with an inverted signal ZSDoi[u] of the input control signal SDoi[u].

Flip-flop FFa transmits, when the input control signal SDoi [u] is at the H level, the signals on the corresponding transfer bus lines CBS[s] and /CBS[s] to cross-coupled type differential amplifying circuit 422. When the input control signal SDoi[u] is inactivated to attain L level, cross-coupled type differential amplifying circuit 422 is activated by MOS transistors 423p and 423n, to differentially amplify and latch the data transferred by transfer gates 421a and 421b.

Tri-state buffer BF includes: a P-channel MOS transistor PX1 coupled to a power supply node and receiving at its gate an output Q of flip-flop FFa through an inverter; an N-channel MOS transistor NX1 coupled to a ground node and receiving at its gate an output /Q of flip-flop FFa; an N-channel MOS transistor NX2 coupling MOS transistor NX1 to the corresponding host system bus line HBS[t] in accordance with the output control signal SDoo[v]; and a p-channel MOS transistor PX2 coupling MOS transistor PX1 to the corresponding host system bus line HBS[t] in response to the output control signal SDoo[v] passed through an inverter.

Tri-state buffer BF shown in FIG. 123 is in the output high-impedance state when the output control signal SDoo[v] is at the L level, as MOS transistors PX2 and NX2 are both off.

When the output control signal SDoo[v] attains to the "H" level, MOS transistors PX2 and NX2 are turned on, MOS transistors PX1 and NX1 are coupled to the corresponding host system bus line HBS[t], and in accordance with the output signals Q and /Q of flip-flop FF, the host system bus line HBS[t] is driven.

The configuration of transformation circuit RXF shown in FIG. 123 is a mere example, and different configuration may be employed. Any circuit configuration may be used provided that complementary signals are taken in and latched in accordance with the input control signal SDoi[u] and when the output control signal SDoo[v] is activated, a single end system bus line is driven in accordance with the taken complementary signals.

FIG. 124 schematically shows a construction of a data input portion of orthogonal transformation circuit 400 of FIG. 120. FIG. 124 shows a construction of an input portion receiving 1 word of data transmitted through the host system bus HBS. The construction of the input portion shown in FIG. 124 is expanded in accordance with the bit width (j bits) of the host system bus, and the construction shown in FIG. 124 is arranged repeatedly in accordance with the bit width (k bits) of the first internal transfer bus CBS.

Referring to FIG. 124, the input portion of orthogonal transformation circuit 400 includes input transformation elements TXFI0 to TXFI7 provided for bus lines HBS[0] to BBS[7] of host system bus HBS, and a word mask control circuit 430 masking outputs of these input transformation elements TXFI0 to TXFI7 in accordance with a mask signal line HBSm[0] instructing masking of data word by word.

Each of the input transformation elements TXFI0 to TXFI7 includes: a flip-flop FFb taking in a signal on the corresponding one of host system bus lines HBS[0] to HBS[7] in accordance with an input control signal SDii[x]; a tri-state buffer 432 transmitting, when activated, complementary signals to transfer bus lines CBS[x] and /CBS[x] in accordance with the signal latched by the corresponding flip-flop FFb; and an AND circuit 431 receiving the mask control signal from word mask control circuit 430 and the corresponding output control signal SDio[a] and activating the corresponding tri-state buffer 432. Here, in output control signal SDio[a], the indicator, a, assumes any of 0-7.

Word mask control circuit 430 includes: a flip-flop FFc reset in response to a reset signal SDir[x] for masking outputs of input transformation elements TXFI0 to TXFI7 of corresponding one word (8 bits); and an NOR gate 433 receiving the output signal of flip-flop FFc and a signal on mask signal line HBSm[0]. Flip-flop FFc takes in and latches the output signal of NOR gate 433 in accordance with the input control signal SDii[x]. The operation of the input portion of orthogonal transformation circuit 400 shown in FIG. 124 will be described in the following.

When data is transferred from the host system bus HBS, first, the reset signal SDir[x] is activated, and flip-flop FFc of word mask control circuit 430 is reset. Consequently, in each of input transformation elements TXFI0 to TXFI7, AND gate 431 is disabled, and the input transformation elements are set to the output high-impedance state.

In accordance with the input control signal SDii[x] and the mask signal line HBSm of the host system bus, data bits on host system bus lines HBS[0] to HBS[7] are selectively taken into respective flip-flops FFB of input transformation elements TXFI0 to TXFI7. When the signal on mask signal line HBSm[0] is at the H level, the output signal of NOR gate 433 of word mask control circuit 430 attains to the "H" level, and flip-flop FFc takes and latches the H-level signal in accordance with the input control signal SDii[x]. In accordance with the H-level output of flip-flop FFc, AND gate 431 of each of input transformation elements TXFI0 to TXFI7 is enabled. In this state, in accordance with the input control signal SDii[x], flip-flops FFb in input transformation elements TXFI0 to TXFI7 take in and latch the signals on host system bus lines HBS[0] to HBS[7].

When the mask signal HBSm[0] is at the L level, the output signal of flip-flop FFc of word mask control signal is at the L level, and in each of input transformation elements TXFI0 to TXFI7, AND gate 431 is maintained in the disabled state. In this state also, taking of data signals on the corresponding host system bus lines is executed by the flip-flops FFb. At the time of outputting the latched data bits, output control signals SDio[0] to SDio[7] are activated successively. When the output signal of word mask control circuit 430 is at the L level, the output signals of these AND gates 431 are at the L level, and therefore, even when the corresponding output control signals SDio[0] to SDio[7] are activated to the H level, tri-state buffer 432 is in the output high-impedance state. Therefore, in this case, data bits are not transferred from input transformation elements TXFI0 to TXFI7, and the word from the CPU is masked.

When the output signal of word mask control circuit 430 is at the H level, AND gates 431 are activated in accordance with output control signals SDio[0] to SDio[7], respectively, and tri-state buffer 432 drives complementary transfer buses /CBS[x] and CBS[x] in accordance with the signals latched in the corresponding flip-flops FFb.

FIG. 125 schematically represents a data transfer operation at the input portion of orthogonal transformation circuit 400 of FIG. 124. In orthogonal transformation circuit 400, when data is input, the data on host system bus HBS is taken in and latched in accordance with the input control signal SDii[x]. The data on host system bus HBS are selectively masked for each word in accordance with mask data m[0] to m[(j–8)/8]. When the input control signal SDii[j–1] is activated eventually, the storage area of the input portion of orthogonal transformation circuit 400 is full.

At the time of data output, in accordance with output control signal SDio[v], data aligned in one column along the longitudinal direction represented by the hatched area in the figure are transferred, in parallel, to the first internal transfer bus CBS. When there are mask data MSDT of which masking has been instructed by the mask signal HSBM, the data are not transferred to the corresponding transfer bus CBS[k–1], and the mask data MSDT are masked.

By this configuration of the input portion, it becomes possible to mask, in a word unit, the data from the host CPU for storage in the memory cell mat in the main processing circuitry of the internal basic operation block.

The control signal SDii[x], reset signal SDir[x] and output control signal SDio[v] may be generated by an external host CPU or by central control unit 15 shown in FIG. 1 at the time of data input, or these control signals may be successively activated by a dedicated counter circuit (shift register).

When two sets of the output portion shown in FIG. 121 and the input portion shown in FIG. 124 are provided and the input/output portions are operated in the interleaved manner, it becomes possible to absorb difference in data transfer rate between the external host CPU and the internal data bus and thereby to perform continuous (gapless) data transfer.

In orthogonal transformation circuit 400, a flip-flop and a tri-state buffer are used for forming the transformation element. As described in the embodiments previously, however, the orthogonal transformation circuit may be configured using a dual port memory, of which one port is coupled to the host system bus and the other port of which is coupled to the first internal transfer bus. When such a dual port memory is used, area efficiency can be improved, and chip area can be made smaller.

FIG. 126 schematically shows a construction of a cross-bar switch shown in FIG. 120. FIG. 126 shows a construction of the cross-bar switch for 1-bit transfer bus lines SBS[y] and /SBS[y] among the second internal transfer bus SBS[(m−1): 0]. The construction of FIG. 126 is provided for each bus line of the second internal transfer bus SBS.

Referring to FIG. 126, cross-bar switch 402 includes decoders DDD-0 to DDD(m−1) provided corresponding to the first internal transfer bus lines CBS[0], /CBS[0] to CBS[m−1], /CBS[m−1] and selective switch circuits DSW0 to DSW(m−1) connecting the first internal transfer bus lines CBS[0], /CBS[0] to CBS[m−1], /CBS[m−1] to the second internal transfer bus lines SBS[y], /SBS[y] in accordance with the output signals from decoders DDD0 to DDD(m−1).

Decoders DDD0 to DDD(m−1) each include a decode circuit 440 decoding connection control signals DEC[0] to DEC[4], and an AND circuit 441 outputting a switch control signal to corresponding one of switch circuits DSW0 to DSW(m−1) in accordance with a predecode signal output by decode circuit 440.

Connection control signals DEC[0] to DEC[4] represent a connection control signal of 5-bits, assuming that the first internal transfer bus CBS has 32 bits. The bit width of connection control signal DEC is determined in accordance with the bus width of the first internal transfer bus CBS. One output signal from decoders DDD0 to DDD(m−1) is set to the selected state, the corresponding selective switch circuit DSW (any of DSW0 to DSW(m−1)) is rendered conductive, and the selected first internal transfer bus lines CBS[z], /CBS[z] are connected to the second internal transfer bus lines SBS[y], /SBS[y].

Connection of each of the bus lines of the second internal transfer bus SBS is set based on the decoding operation, and therefore, selective connection can be established, with the bus width of the first internal transfer bus matched to that of the second internal transfer bus.

FIG. 127 schematically shows a configuration of the portion generating the connection control signals DEC[0] to DEC[4] shown in FIG. 126. Referring to FIG. 127, the connection control signal generating circuit includes: register circuits XG00 to XG34 arranged in a matrix of rows and columns; a sense amplifier circuit SAC amplifying the signals on the second internal transfer bus lines SBS[y] and /SBS[y] to generate a single end signal; selection gates SSG0 to SSG4 provided corresponding to those of the register circuits XG00 to XG34 which are aligned in the Y direction respectively, selectively rendered conductive in accordance with selection signals SCb[0] to SCb[4] and transmitting, when rendered conductive, the output signal of sense amplifier circuit SAC; and drivers DRV0 to DRV4 provided corresponding to respective columns of register circuits XG00 to XG34, amplifying output signals of the corresponding registers and generating connection control signals DEC[0] to DEC[4], respectively.

Among register circuits XG00 to XG34, to those register circuits aligned in the X direction, input control signals SCi[0] to SCi[3] and output control signals SCc[0] and SCc[3] are commonly applied, respectively.

Each of the register circuits XG00 to XG34 includes: a transfer gate 452 transferring data from corresponding selection gate SSG (any of SSG0 to SSG4) in accordance with the corresponding input control signal SCi[z]; a latch circuit 453 latching the data applied through transfer gate 452; and a transfer gate 454 transferring the data latched in the corresponding latch circuit 453 to the corresponding driver DRV (DRV0 to DRV4) in accordance with output control signal SCc[z]. Latch circuit 453 includes a latch formed by inverters and latches the received signal.

Sense amplifier circuit SAC is activated in accordance with a sense amplifier activating signal SCs, and amplifies the data bits transferred from the basic operation block to the second internal transfer bus lines SBS[y] and /SBS[y].

In the configuration of the connection control signal generating portion shown in FIG. 127, 1-bit context information generated by sense amplifier circuit SAS is transferred to and latched by the register circuits selected by selection gates SSG0 to SSG4. and input control signal SCi[0] to SCi[3]. In register circuits XGa0 to XGa4 aligned in the X direction, one-bit context information determining the manner of connection of the cross bar switch is stored. Therefore, by transferring information of 5 bits serially from the basic operation block to internal transfer bus lines SBS[y] and /SBS[y], and by setting selection signals SCb[0] to SCb[4] in synchronization with the data transfer, the context information bits are transferred through selection gates SSG0 to SSG4. In this operation, by maintaining one input control signal SCi at the selected state, the context information bit transferred to the register circuits aligned in the X direction is latched sequentially. Thus, by the register circuits aligned in the X-direction, context information determining the manner of connection of one cross bar switch is stored.

Therefore, each of the input control signals SCi[0] to SCi[3] can select the context information, and hence, 4 ways of context information (4 planes of context information) can be stored. The context information for determining a required manner of connection is read by setting any of the output control signals SCc[0] to SCc[3] to the active state and transmitted through drivers DRV0 to DRV4. Consequently, by the decoders DDD0-DDD(a−1) shown in FIG. 126, one of 32 pairs of internal transfer bus lines CBS[0], /CBS[0] to CBS[m−1], /CBS[m−1] is selected.

By storing four pieces of information to determine the manner of connection of the cross bar switch, it becomes possible to switch the manner of connection of the cross bar switch on real time basis, and the order of data arrangement can readily be changed at the time of transfer to perform arithmetic operation. By way of example, when the internal transfer bus CBS is of 8 bits and the second internal transfer bus SBS is of 32 bits, data can be transferred with the bus width adjusted, by successively switching transfer paths for transferring 8 bits of data in the cross bar switch, using the 4 planes of context information.

FIG. 128 schematically shows the overall configuration of cross bar switch 402. Referring to FIG. 128, cross bar switch 402 includes: a switch matrix 464 including rows of switches 460a arranged corresponding to the second internal transfer bus lines SBS[0] to SBS[k-1], respectively; a route determining circuit 462 including decoder groups 462a arranged corresponding to the rows of switches 464a, respectively, for setting the connection path of switch matrix 464; and a route information storing circuit 460 including context information storing portions 460a arranged corresponding to the decoder groups 462a, respectively, and storing information for determining the connection route of route determining circuit 462.

The switch row 464a includes selection switch circuits DSW0 to DSW(m−1) shown in FIG. 126, and connects any of the first internal transfer bus lines CBS[0] to CBS[m−1] to the corresponding one of second internal transfer bus lines SB S [0] to SBS[k-1].

Decoder group 462a includes decoders DDD0 to DDD(j−1) shown in FIG. 126, and sets conduction/non-conduction of the selection switches in the corresponding switch row 464a.

Context information storing circuit 460a has such a structure as shown in FIG. 127, stores four kinds of context information for the corresponding decoder group 462a, and outputs any of the stored context information to the corresponding decoder group 462a in accordance with the output control signal SCc.

To route information storing circuit 460, k bits of path designating information is applied from sense amplifier circuit group 466. Sense amplifier circuit group 466 includes sense amplifier circuits shown in FIG. 127 in correspondence to the second internal transfer bus lines SBS[0] to SBS[k−1], respectively, and when activated, amplifies k-bits of data applied from the basic operation block and transfers to the corresponding context information storing circuit 460a.

To the second internal transfer bus lines SBS[0] to SBS[k-1], information of the route information storing memory 460 of the basic operation block FBi is read and transferred, under the control of internal controller 21. Controller 21 operates under the control of control CPU 25 included in central control unit 15, and successively outputs connection information stored in the memory 460. Control CPU 25 further outputs control signals SCb, SCc and SCi for path information storing circuit 460. When selection control signal SCb is toggled five times, the signals SCb[4:0] are each selected once, and thus, storage of one piece of context information is finished.

As route information storing memory 460, a specific area of the memory cell mat in the main processing circuitry may be used, or a dedicated memory may be provided separately from the memory cell mat.

Control CPU 25 further generates a sense activating signal (SCs) for the sense amplifier circuits (SAC) included in sense amplifier circuit group 466 (of which path is not shown).

FIG. 129 schematically shows correspondence between the decoder/switch circuit (hereinafter referred to as a unit connection circuit) of decoder group 462a shown in FIG. 128 and the decode signals. Referring to FIG. 129, unit connection circuit UCBW0 connects the first transfer bus line CBS[i] to the second transfer bus line SBS[i], when the connection control signal DEC is 0 (in decimal notation). The unit connection circuit UCBWx connects the first internal transfer bus line CBS[(i+x)mod.m] to the second internal transfer bus line SBS[i], when the connection control signal DEC is (O+x) (in decimal notation).

The first internal transfer bus CBS has the bit width of m bits, and when the connection control signal DEC is "0", the first internal transfer bus line CBS[i] is always connected to the second internal transfer bus line SBS[i]. Therefore, even when the connection path is to be switched in cyclic manner, by the result value of operation "modulo m" of connection control signal DEC, the connection of the first internal transfer bus can easily be determined, and when the decode signal DEC is "0" in each decoder group 462a, transfer bus lines CBS[j] and SBS[j] of the same number can be connected, and hence, programming related to connection information is facilitated.

FIG. 130 schematically shows the construction of selector 404 shown in FIG. 120. FIG. 130 shows a construction of the selector for second internal transfer bus lines SBS[z] and /SBS[z]. In the construction shown in FIG. 130, global data bus GBS has the bit width four times that of the second internal transfer bus.

Selector 404 includes: a connection gate TGW0 connecting global data bus lines GBS[4z] and /GBS[4z] to transfer bus lines SBS[z] and /SBS[z] in accordance with a selection signal SS[0]; a connection gate TGW1 connecting global data bus lines GBS[4z+1] and /GBS[4z+1] to transfer bus lines SBS[z] and /SBS[z] in accordance with a selection signal SS[1]; a connection gate TGW2 connecting global data bus lines GBS[4z+2] and /GBS[4z+2] to transfer bus lines SBS[z] and /SBS[z] in accordance with a selection signal SS[2]; and a connection gate TGW3 connecting global data bus lines GBS[4z+3] and /GBS[4z+3] to transfer bus lines SBS[z] and /SBS[z] in accordance with a selection signal SS[3].

The global data bus lines GBS[4z], /GBS[4z] to GBS[4z+3], /GBS[4z+3] may not be the successively adjacent data bus lines, but may be bus lines apart by m bits.

Selection signals SS[0] to SS[3] are generated by control CPU 25 included in central control unit 15, and activated successively in data transfer.

FIG. 131 schematically depicts the selecting operation by selector 404 shown in FIG. 130. On the second internal transfer bus SBS, m-bit data D0 to D3 are successively transferred. Selector 404 performs a ¼ selection, and in the present embodiment, m-bit bus lines of global data bus GBS are successively selected in accordance with the selection signals SS[3:0]. Consequently, m-bit data D0, D1, D2 and D3 from selector 404 are distributed to data bus lines of global data bus GBS.

In the global data bus GBS, according to the method of selection shown in FIG. 131, data D0 to D3 consist of bits of mutually different data words, and data D0 to D3 are stored in entries different from each other.

When data D0 to D3 each consist of different data bits of the same set of words from others, or these data include different bits of a set of data words AA to DD, respectively, and it is necessary to write the data D0 to D3 as such to the common entry of the memory cell mat in the main processing circuitry successively, the connection path of selector 404 is fixed, and, by way of example, the data D0 to D3 are successively output to specific m-bit data lines of global data bus GBS. This is shown in FIG. 132.

Referring to FIG. 132, data D0 to D3 are to be successively transferred to global data bus GBS[4z]. Here, 4z covers 0 to (m−1), and the global data bus GBS[4z] is formed by neighboring data bus lines. In this manner, data bits of the same word can be transferred through the same global data bus lines successively, and hence, can be successively stored in the common entry of the memory cell mat in the main processing circuitry. Selector 404 is a bi-directional switch circuit, and when data are transferred from global data bus GBS to the second internal transfer bus SBS, data are transferred in accordance with the data transfer sequence of FIG. 131 or FIG. 132.

In data distribution shown in FIG. 132 also, data D0 to D3 are arranged in neighboring bus lines GBS[(j−1):0] of m bits of the global data bus GBS. The data, however, may be arranged dispersed on bus lines apart from each other by m bits, that is, GBS[4z|z=0~(m−1)], namely, GBS[0], GBS[4] . . . . , not on the neighboring bus lines.

According to the data bus connection control described above, as long as the condition that each bit of a word is stored in the same entry of the memory cell mat of main processing circuitry is satisfied and the condition that data arrangement is transformed by the input/output circuit is satisfied, the data distribution path can arbitrarily be determined.

As described above, according to Embodiment 20 of the present invention, between the system bus connected to an external CPU and a global data bus to which internal basic operation blocks are connected, an input/output circuit that performs data re-arrangement and bit width adjustment is provided. Therefore, words can be transferred in bit-serial manner reliably to the entries of the main processing circuitry of each basic operation block, regardless of the bit width of data words processed by the host CPU.

Embodiment 21

FIG. 133 is a circuit block diagram showing a construction of a semiconductor integrated circuit device according to Embodiment 21 of the present invention. Referring to FIG. 133, the semiconductor integrated circuit device includes a plurality of (four in this example) functional blocks FBA1 to FBA4, four functional blocks FBB1 to FBB4, and a cross bar switch. These functional blocks FBA1 to FBA4 and FBB1 to FBB4 may correspond to the main control circuitries as described hitherto in the preceding Embodiments, or may be assigned predetermined processing operations. In the present embodiment and subsequent embodiments, the functional blocks are each merely required to be configured to perform a logic or arithmetic operation.

Functional blocks FBA1 to FBA4 are arranged along the X direction in the figure, functional blocks FBB1 to FBB4 are arranged along the X direction in the figure, and functional blocks FBB1 to FBB4 are arranged opposite to functional blocks FBA1 to FBA4, respectively.

The cross bar switch is arranged between functional blocks FBA1 to FBA4 and functional blocks FBB1 to FBB4, and connects functional blocks FBA1 to FBA4 and functional blocks FBB1 to FBB4 in one-to-one relationship but in arbitrary combination. There are 4! possible combinations of connection.

Specifically, the cross bar switch includes select signal line pairs LLP1 to LLP8, data signal lines LL1 to LL8, decode circuits 501 to 516, and wired OR switches 521 to 536. Each of the data signal lines LL5 to LL8 extend in the X direction of the figure, along functional blocks FBB1 to FBB4. Each of the data signal lines LL1 to LL4 extend in the Y direction of the figure orthogonal to the X direction. Data signal lines LL1 to LL4 are connected at first ends to data signal terminals of functional blocks FBA1 to FBA4, respectively, and connected at second ends to data signal lines LL5 to LL8 through via holes.

Wired OR switches 521 to 524; 525 to 528; 529 to 532; 533 to 536 are arranged corresponding to the data signal lines LL5 to LL8, respectively. Wired OR switches 521 to 524 are connected to the corresponding data signal line LL5 and data signal terminals of functional blocks FBB1 to FBB4, respectively, and controlled by output signals of decode circuits 501 to 504, respectively. Wired OR switches 525 to 528 are connected to the corresponding data signal line LL6 and data signal terminals of functional blocks FBB1 to FBB4, respectively, and controlled by output signals of decode circuits 505 to 508, respectively.

Wired OR switches 529 to 532 are connected to the corresponding data signal line LL7 and data signal terminals of functional blocks FBB1 to FBB4, respectively, and controlled by output signals of decode circuits 509 to 512, respectively. Wired OR switches 533 to 536 are connected to the corresponding data signal line LL8 and data signal terminals of functional blocks FBB1 to FBB4, respectively, and controlled by output signals of decode circuits 513 to 516, respectively.

Each of the select signal line pairs LLP1 to LLP4 extends in the Y direction of the figure. Select signal line pairs LLP1 to LLP4 are connected at first ends to select signal terminal pairs of functional blocks FBA1 to FBA4, and connected at second ends to decode circuits 501, 506, 511 and 516, respectively.

Each of the select signal line pairs LLP5 to LLP8 extend in the X direction of the figure, along functional blocks FBB1 to FBB4. Select signal pair LLP5 is connected to select signal pair LLP1 through a via hole, and transmits the select signal from functional block FBA1 to each of decode circuits 502, 503, and 504. Select signal pair LLP6 is connected to select signal pair LLP2 through a via hole, and transmits the select signal from functional block FBA2 to each of decode circuits 505, 507, and 508. Select signal pair LLP7 is connected to select signal pair LLP3 through a via hole, and transmits the select signal from functional block FBA3 to each of decode circuits 509, 510, and 512. Select signal pair LLP8 is connected to select signal pair LLP4 through a via hole, and transmits the select signal from functional block FBA4 to each of decode circuits 513, 514, and 515.

When a select signal is output from each of functional blocks FBA1 to FBA4, one of the output signals from decode circuits 501 to 504, one of the output signals from decode circuits 505 to 508, one of the output signals from decode circuits 509 to 512, and one of the output signals from decode circuits 513 to 516 are set to the active "H" level.

Consequently, one of wired OR switches 521 to 524, (by way of example, switch 522), one of wired OR switches 525 to 528, (by way of example, switch 528), one of wired OR switches 529 to 532, (by way of example, switch 529), and one of wired OR switches 533 to 536, (by way of example, switch 535) are rendered conductive. In this manner, functional blocks FBA1 to FBA4 are connected in one-to-one correspondence and in an optional combination to functional blocks FBB1 to FBB4.

FIG. 134 is a circuit block diagram more specifically showing the construction of the cross bar switch. Referring to FIG. 134, wired OR switches 521 to 524 include N-channel MOS transistors (switching elements) 521a to 524a, respectively. N-channel MOS transistors 521a to 524a have the first electrodes (source or drain) connected together to corresponding data signal line LL5, and the second electrodes (drain or source) connected to data signal terminals of functional blocks FBB1 to FBB4, respectively, and receive, at their gates, output signals from decode circuits 501 to 504, respectively. N-channel MOS transistors 521a to 524a are rendered conductive when the output signals of decode circuits 501 to 504 are set to the "H" level, respectively. Other wired OR switches 525 to 528, 529 to 532 and 533 to 536 are similar in construction to wired OR switches 521 to 524.

Each of the select signal line pairs LLP1 to LLP8 includes two signal lines. The select signal is comprised of a data signal of 2 bits. To each of the decode circuits 501 to 504, unique select signal is allotted beforehand. By way of example, select signals (00), (01), (10) and (11) are allotted to decode circuits 501 to 504, respectively. Decode circuit 501 produces an output of "H" level when the select signal is "00", that is, when the signals of 2 bits included in the select signal are both at the "L" level, and otherwise produces an output of "L" level.

Decode circuit 502 produces an output of "H" level when the select signal is "01", that is, when 2-bit signals included in the select signal attain the "L" level and "H" level, and otherwise produces an output of "L" level. Decode circuit 503 produces an output of "H" level when the select signal is "10", that is, when 2-bit signals included in the select signal attain the "H" level and "L" level, and otherwise produces an output of "L" level. Decode circuit 504 produces an output of "H" level when the select signal is "11", that is, when 2-bit signals included in the select signal are both at the "H" level, and otherwise produces an output of "L" level. Other decode circuits 505 to 508; 509 to 512; and 513 to 516 operate in the same manner as decode circuits 501 to 504.

When the select signal is output from functional block FBA1, one of decode circuits 501 to 504 (for example, decode circuit 501) outputs the "H" level signal, and N-channel MOS transistor 521*a* corresponding to the selected decode circuit 501 is rendered conductive, so that the data signal terminal of functional block FBA1 is connected to the data signal terminal of functional block FBB1.

Now, the effect of Embodiment 21 will be described. In the cross bar switch, the lines in the Y direction are data signal lines LL1 to LL4 and select signal line pairs LLP1 to LLP4, and accordingly includes 12 lines in total, while the lines in the X direction are data signal lines LL5 to LL8 and select signal line pairs LLP5 to LLP8, and accordingly includes 12 lines in total. There are 16 switches 521 to 536, and 16 decode circuits 501 to 516.

Assume that a cross bar switch, of the same scheme as the cross bar switch of FIG. 133, is formed to connect N functional blocks FBA1 to FBAN to N functional blocks FBB1 to FBBN, with N=2^m. Here, the symbol "^" indicates the power and 2^m indicates that 2 is multiplied m times. In that case, in the Y direction, there will be (m+1)×N lines, and in the X direction, there will be (m+1)×N lines, there will be N×N switches and N×N m-input decode circuits.

By way of example, when N=128 (m=7) and a switch is to be provided at every intersection of signal lines as in a conventional simple switch matrix in which 128×128 lines from 128 functional blocks at first side and 128×128 lines from 128 functional blocks at the opposing side are coupled to 128 lines extending in X direction through switch circuits, there are 3×128×128=49152 lines in the Y direction including the lines for switch control, 128 lines in the X direction, and 32768 (=2×128×128) switches for connection to the first side functional blocks and the switches for connection to the opposing side functional blocks. In the present invention, there are 8×128=1024 lines in. the Y direction, 8×128=1024 lines in the X direction, 16384 (=128×128) switches and 16384 decoders. Therefore, the number of lines is even smaller in the present invention. Further, in the conventional simple matrix structure as described above, the interconnection in the Y direction is in a dense layout and switches between the lines in the Y direction and the functional blocks are in a dense arrangement. In contrast, according to the present invention, the lines and switches are uniformly dispersed along the X and Y directions. Thus, the layout area can be made even smaller in the present invention.

Further, according to the present invention, when bi-directional data transfer is to be performed between functional blocks FBA1 to FBA4 and FBB1 to FBB4, basically, the same structure as shown in FIG. 133 can be used. Specifically, what is necessary is simply to issue select signals including connection destination information from functional blocks FBB1 to FBB4. Therefore, when bi-directional data transfer is desired, the difference in layout area between the present invention and the conventional simple switch matrix becomes more significant.

Next, the application of the present invention will be described. Each of the functional blocks FBA1 to FBA4 and FBB1 to FBB4 shown in FIG. 133 is formed by a unit cell of ALU (Arithmetic and Logic Unit). The ALU unit cells include various operation unit cells. By coupling a plurality of basic operation unit cells (Add, Mul, Div, Sub, Shift and others) in an organic manner, a functional element can be formed. As shown in FIG. 133, by arranging a plurality of ALU unit cells at upper and lower portions and programming the operation (connection routes) of the cross bar switch, the functional element can be formed. In this case, when such coupling is made bi-directional, a larger functional element can be implemented. Further, by programming the cross bar switch, that is, by re-configuring P & R (Place and router), a reconfigurable logic can be achieved.

Embodiment 22

FIG. 135 is a circuit block diagram showing a main portion of a semiconductor integrated circuit device according to Embodiment 22 of the present invention, comparable to FIG. 134. Referring to FIG. 135, the semiconductor integrated circuit device differs from the device of Embodiment 21 in that latch circuits 537 are added to output nodes of decode circuits 501 to 516, respectively. For example, latch circuit 537 corresponding to decode circuit 501 latches the output signal of corresponding decode circuit 501 in response to a latch signal ϕL, and applies the latched signal to the gate of N-channel MOS transistor 521*a* included in the corresponding wired OR switch 521.

In Embodiment 22, after the output signals of decode circuits 501 to 516 are latched by latch circuit group 537, select signal line pairs LLP1 to LLP8 may be released for other use.

Embodiment 23

FIG. 136 is a block diagram showing a construction of a semiconductor integrated circuit device according to Embodiment 23 of the present invention. Referring to FIG. 136, the shown semiconductor integrated circuit device differs from the device of FIG. 133 in that decode circuits 501 to 516 are replaced by a decode circuit portion DD and that redundant functional block FRBA, redundant decode circuit portion RDD, redundant wired OR switch portion RSS and redundant functional block FRBB are added. Wired OR switch portion SS includes wired OR switches 521 to 536 shown in FIG. 133.

Decode circuit portion DD includes, in addition to decode circuits 501 to 516 shown in FIG. 133, a program circuit for storing a select signal designating a defective functional block among functional blocks FBB1 to FBB4. When functional block FBB4 is defective, for example, a select signal designating functional block FBB4 is stored in the program circuit of decode circuit portion DD.

When a select signal designating a normal functional block FBB2 is applied from functional flock FBA1, decode circuit portion DD and wired OR switch portion SS operate in the similar manner as decode circuits 501 to 516 and wired OR switches 521 to 536 shown in FIG. 133, to connect functional block FBA1 to functional block FBB2.

When a select signal designating a defective functional block FBB4 is applied from functional block FBA1, the portions of decode circuit portion DD and wired OR switch portion SS corresponding to the defective functional block FBB4 are inactivated, and redundant decode circuit portion RDD and redundant wired OR switch portion RSS are activated. Redundant decode circuit portion RDD and redundant wired OR switch portion RSS connect functional block RBA1 to redundant functional block FRBB. In this manner, the defective functional block FBB1 is replaced by redundant functional block FRBB. When bi-directional data transfer is to be performed, a defective functional block among functional blocks FBA1 to FBA4 is replaced by redundant functional block FRBA in the similar manner.

In Embodiment 23, redundancy function is provided for the functional blocks and the cross bar switch. Therefore, a random logic, which usually cannot have any redundancy function, is provided with redundancy function, and production yield can be improved.

Embodiment 24

FIG. 137 is a block diagram showing a construction of a semiconductor integrated circuit device according to Embodiment 24 of the present invention. Referring to FIG. 137, the semiconductor integrated circuit device includes a number of functional blocks FBA1 to FBAn (n is an integer not smaller than 2), a number of functional blocks FBB1 to FBBn and a cross bar switch. The cross bar switch includes a global decode circuit portion GDD, a local decode circuit portion LDD and a wired OR switch portion SS.

Wired OR switch portion SS includes, as described with reference to FIG. 133, n wired OR switches corresponding to the respective functional blocks FBA1 to FBAn. The n wired OR switches arranged correspond to functional blocks FBB1 to FBBn, respectively.

The n wired OR switches are divided into B switch groups, each group including A switches. Global decode circuit portion GD selects, in accordance with a global select signal from each functional block FBA, any switch group, among B switch groups, corresponding to that functional block FBA. Local decode circuit group LDD selects, in accordance with a local select signal from each functional block FBA, any wired OR switch among A wired OR switches belonging to the switch group selected by the global decode circuit GDD and corresponding to the functional block FBA, and renders conductive the selected wired OR switch.

When n=16, for example, wired OR switch portion SS includes 16 wired OR switches for each of the functional blocks FBA1 to FBA16. Sixteen wired OR switches correspond to functional blocks FBB1 to FBB16, respectively.

Sixteen wired OR switches are divided into four switch groups each including four switches, and global decode circuit portion GDD includes four global decode circuits 540 corresponding to the four switch groups, as shown in FIG. 138. Local decode circuit LDD includes 16 local decode circuits 541 corresponding to 16 wired OR switches, respectively.

When the global select signals GGS1 and GGS2 are output from the corresponding functional block FBA, an output signal of any one global decode circuit 540 among four global decode circuits 40 attains the "H" level, and four local decode circuits 541 corresponding to the global decode circuit 540 are activated. When local select signals LLS1 to LLS4 are output from the corresponding functional block FBA, an output signal of any one local decode circuit 541 among the activated four local decode circuits 541 attains the "1T"level, and the wired OR switch corresponding to this local decode circuit 541 is rendered conductive. In this manner, functional blocks FBA1 to FBA16 can be connected in one-to-one correspondence to functional blocks FBB1 to FBB16 in a desired combination.

In Embodiment 24, as the decode circuit portion is configured to have a hierarchical structure, the number of lines for the select signals can be reduced, and therefore, the decode circuit portion can be made compact.

Embodiment 25

FIG. 139 is a block diagram representing a construction of a semiconductor integrated circuit device according to Embodiment 25 of the present invention. Referring to FIG. 139, the semiconductor integrated circuit device includes a plurality of (five in FIG. 139) functional blocks FBA1 to FBA5, five functional blocks FBB1 to FBB5, and a cross bar switch. Functional blocks FBA1 to FBA5 are divided into a plurality of groups, and in the example of FIG. 139, functional blocks FBA1 to FBA3 belong to a first group and functional blocks FBA4 and FBA5 belong to a second group. The decode circuit portion of cross bar switch is divided into a decode circuit portion DD1 corresponding to the first group and a decode circuit portion DD2 corresponding to the second group. The wired OR switch portion of the cross bar switch is divided into a wired OR switch portion SS1 corresponding to the first group and a wired OR switch portion SS2 corresponding to the second group. Functional blocks FBB1 to FBB5 are divided into functional blocks FBB1 to FBB3 corresponding to the first group and functional blocks FBB4 and FBB5 corresponding to the second group.

In the semiconductor integrated circuit device of the present embodiment, a power supply line PPL1 supplying a power supply voltage VCC1 to functional blocks FBA1 to FBA3, decode circuit portion DD1 and wired OR switch portion SS1 and functional blocks FBB1 to FBB3 is separately provided from a power supply line PPL2 supplying a power supply voltage VCC2 to functional blocks FBA4 and FBA5, decode circuit portion DD2, wired OR switch portion SS2 and functional blocks FBB4 and FBB5. Therefore, when functional blocks FBA1 to FBA3 and related portion only are to be activated, supply of power supply voltage VCC2 to power supply line PPL2 is stopped, whereby unnecessary power consumption can be avoided, and power consumption can be reduced.

Further, in the present semiconductor integrated circuit device, two functional elements can be formed simultaneously. Therefore, by forming two functional elements having the same function, parallel operation becomes possible, and high processing function can be achieved.

The present invention is generally applicable to a data processing system. Particularly, by applying the present invention to a system that requires processing of a large amount of data such as image or audio, a high speed processing system can be achieved.

As for the chip configuration, one main processing circuitry portion may be formed by one chip (semiconductor chip), or one basic operation block may be formed by one chip (semiconductor chip). Alternatively, one semiconductor processing device may be formed by one chip (semiconductor chip) as a system LSI.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a first processing unit;
   an internal bus; and,
   a plurality of operation units each comprising an operational block and an operational control unit,
   wherein said first processing unit issues an instruction to the operation units via said internal bus,
   wherein each operational block includes a memory array used for storing data and divided into plural entries, and a plurality of first processing elements each of which is arranged corresponding to a respective entry of said memory array and is for performing an arithmetic and logical operation, wherein each of said plural first processing elements performs an operation instructed by said operational control unit using data provided from first selected memory cells in corresponding entries in parallel and store result of said operation into second selected memory cells in said corresponding entries in parallel, and wherein said memory array has a first word line selected for activating the first selected memory cells of all the entries, and has a second word line selected for activating said second selected memory cells of all the entries.

2. The semiconductor device according to claim 1, further comprising a connection switching transfer circuit for transferring data among said plurality of first processing elements.

3. The semiconductor device according to claim 1, wherein
each of said plural entries is arranged corresponding to the respective columns of said memory cell array; and
a data transfer lines for transferring data between the entries and the corresponding first processing elements are arranged corresponding to the respective columns.

4. The semiconductor device according to claim 1, wherein
each of the memory cells is a multi-port memory cell having a write port and a read port, and
said plurality of data transfer lines include a write data line connected to the write ports of the memory cells of the corresponding entry and a read data line connected to the read ports of the memory cells of the corresponding entry.

5. The semiconductor device according to claim 4, further comprising:
a read cell selecting circuit for driving the read ports of memory cells at a same position in the respective entries of said memory cell array to a selected state, and
a write cell selecting circuit, provided separately from and operable in parallel with said read cell selecting circuit, for driving the write ports of memory cells at the same position in the respective entries of said memory cell array to a selected state.

6. The semiconductor device according to claim 1, wherein
said memory cell array is divided into a first memory array and a second memory array so as to divide each of said plurality of entries; and
said plurality of first processing elements are arranged between the first and second memory arrays, receive data from corresponding entries of said first and second memory arrays, and execute the designated operational processing on received data.

7. The semiconductor device according to claim 1, wherein
each of the first processing elements includes an arithmetic/logic portion for executing an arithmetic or logic operation as the designated operational processing, a register circuit for storing data applied from the corresponding entry, a result register for storing a result of operation of said arithmetic/logic portion, and a mask register for storing mask data for prohibiting the operation by said arithmetic/logic portion.

8. The semiconductor device according to claim 1, wherein
each of the memory cells is a multi-port memory having first and second ports that can be selected independently of each other;
said plurality of memory cells are arranged aligned in a first direction corresponding to one of the row and the column and in a second direction corresponding to another of the row and the column, and said semiconductor device further comprises:
a plurality of first word lines each arranged corresponding to the memory cells arranged aligned in said first direction and connected to the first ports of corresponding memory cells;
a plurality of first bit lines, each arranged corresponding to the memory cells arranged aligned in said second direction and coupled to the first ports of corresponding memory cells, for forming the data transfer lines;
a plurality of second word lines each arranged corresponding to the memory cells arranged aligned in said second direction and connected to the second ports of corresponding memory cells;
a plurality of second bit lines each arranged corresponding to the memory cells arranged aligned in said first direction and connected to the second ports of corresponding memory cells; and
a plurality of second processing elements arranged facing to and being capable of data transfer with said plurality of second bit lines.

9. The semiconductor device according to claim 8, further comprising
a path changing circuit for changing a data transfer route between said plurality of second bit lines and said plurality of second processing elements.

10. The semiconductor device according to claim 8, wherein
each of the entries stores a multi-bit data word as said multi-bit data, and said plurality of second processing elements performs an arithmetic or logic operation on applied multi-bit data words on a word-by-word basis.

11. The semiconductor device according to claim 8, wherein the second processing elements include processors arranged in a plurality of stages.

12. The semiconductor device according to claim 8, further comprising
an input/output circuit for transferring data between said plurality of second bit lines and an outside of the semiconductor device on an entry-by-entry basis.

13. The semiconductor device according to claim 8, further comprising:
a first shift redundancy repairing circuit arranged corresponding to the first word lines, for repairing a defective address by shifting correspondence between said plurality of first word lines and addresses in accordance with first defective address information;
a second shift redundancy repairing circuit arranged corresponding to the second word lines, for repairing a defective address by shifting correspondence between said plurality of second word lines and addresses in accordance with second defective address information;
a third shift redundancy repairing circuit arranged corresponding to said plurality of second bit lines, for shifting and switching correspondence between said plurality of second bit lines and said plurality of second processing circuits in accordance with said first defective address information, and
a fourth shift redundancy repairing circuit arranged corresponding to said plurality of first bit lines, for shifting and switching correspondence between said plurality of first bit lines and said plurality of first processing circuits in accordance with said second defective address information.

14. The semiconductor device according to claim 8, further comprising
a data transfer circuit, provided corresponding to said plurality of second processing elements, for transferring data among said plurality of second processing elements with a data transfer path being changeable.

15. The semiconductor device according to claim 1, further comprising:
 a plurality of bit lines, arranged corresponding to the respective memory columns of said memory cell array, each connected to memory cells of a corresponding column, said plurality of bit lines serving as said plurality of data transfer lines; and
 a redundancy circuit arranged corresponding to said plurality of first processing circuits for repairing a defective processing circuit by shifting and changing connection correspondence between the data transfer lines and the first processing circuits.

16. The semiconductor device according to claim 1, further comprising:
 a pointer circuit arranged common to respective entries of said memory cell array and designating an area in which significant data is stored in each entry, said pointer circuit designating an area for storing each multi-bit data when a plurality of multi bit data are stored in each of the entries.

17. A semiconductor device according to claim 1, wherein each of said first processing elements includes a processor, first and second registers, and a mask register.

18. The semiconductor device according to claim 17, wherein
 the second register stores a carry at a time of the operation of addition or subtraction; and
 said operational control unit stores the data stored in said second register to a corresponding bit position of a corresponding entry at completion of the operation.

19. The semiconductor device according to claim 17, wherein
 said mask register stores a multiplicand bit in the operation of multiplication; and
 said operational control unit operates such that: in accordance with the value stored in said mask register, addition of a multiplier bit of said corresponding entry and a multiplication result bit is performed selectively; result of the addition operation is stored in said first register and written to an original position of a corresponding multiplication result storing area in the corresponding entry; after selective addition of all bits of said multiplier; a bit position address of said multiplicand bit is incremented and a bit position address of said multiplication result bit is incremented by one; and similar operation is repeated on the multiplier, the bit position address indicating a bit location in the corresponding entry.

20. A semiconductor signal processing device, comprising:
 a first processing unit;
 an internal bus; and
 a plurality of operation units each comprising an operational block and an operational control unit,
 wherein each operational block includes:
 a memory cell mat divided into a plurality of entries, each of which includes a plurality of memory cells;
 a plurality of processing circuits, each of which couples with a corresponding entry and includes (i) a Booth register circuit for storing a result of decoding a set of data bits from a first area of the corresponding entry in accordance with second order Booth's algorithm, (ii) a processor receiving data bits from corresponding bit positions of the second and third areas of the corresponding entry, and performing an operational processing on the data bits received in accordance with the data stored in said Booth register, and (iii) a result register storing an output data of said processor; and
 a control circuit for transferring data from the first, second and third areas of each entry of said memory cell mat to each processing circuit corresponding to each entry for performing the operational processing, transferring and writing output data of said processor to the third area of the corresponding entry, and controlling the operational processing of the processing circuits,
 wherein the operation of processing performed by the processor is one of plural operations designated by the control circuit.

21. The semiconductor signal processing device according to claim 20, wherein
 said processor selectively performs, in accordance with the data value stored in said Booth register, on a set of data from said second and third areas, an operation of 1-bit shift or 2-bit shift, and inversion or non-inversion, and no operation of data from said second area, and adds a result of the operation to the data from said third area.

22. The semiconductor signal processing device according to claim 20, wherein
 each of the entries includes an even-numbered entry for storing even-numbered bits and an odd numbered entry for storing odd-numbered bits, and
 each processor receives, in parallel, data of corresponding bit positions of the even-numbered and odd-numbered entries of a corresponding entry and executes the operational processing.

* * * * *

UNITED STATES PATENT AND TRADEMARK OFFICE
CERTIFICATE OF CORRECTION

| | | |
|---|---|---|
| PATENT NO. | : 7,562,198 B2 | Page 1 of 1 |
| APPLICATION NO. | : 11/148369 | |
| DATED | : July 14, 2009 | |
| INVENTOR(S) | : Hideyuki Noda et al. | |

It is certified that error appears in the above-identified patent and that said Letters Patent is hereby corrected as shown below:

On the title page of the patent,

In Item "(75) Inventors:" change the last name of the third inventor from "Ariomoto" to --Arimoto--.

Signed and Sealed this

Second Day of November, 2010

David J. Kappos
*Director of the United States Patent and Trademark Office*